US012332567B2

(12) United States Patent
Niida et al.

(10) Patent No.: US 12,332,567 B2
(45) Date of Patent: Jun. 17, 2025

(54) COMPOSITION FOR FORMING SILICON-CONTAINING RESIST UNDERLAYER FILM, PATTERNING PROCESS, AND SILICON COMPOUND

(71) Applicant: SHIN-ETSU CHEMICAL CO., LTD., Tokyo (JP)

(72) Inventors: Keisuke Niida, Joetsu (JP); Yusuke Kai, Joetsu (JP); Tsutomu Ogihara, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 587 days.

(21) Appl. No.: 17/544,592

(22) Filed: Dec. 7, 2021

(65) Prior Publication Data

US 2022/0221793 A1 Jul. 14, 2022

(30) Foreign Application Priority Data

Dec. 23, 2020 (JP) ................................ 2020-214294

(51) Int. Cl.

| | |
|---|---|
| ***G03F 7/11*** | (2006.01) |
| ***C07F 7/18*** | (2006.01) |
| ***C08G 77/04*** | (2006.01) |
| ***C09D 183/04*** | (2006.01) |
| ***H01L 21/027*** | (2006.01) |

(52) U.S. Cl.

CPC .............. *G03F 7/11* (2013.01); *C07F 7/1804* (2013.01); *C08G 77/04* (2013.01); *C09D 183/04* (2013.01); *H01L 21/0274* (2013.01)

(58) Field of Classification Search

None

See application file for complete search history.

(56) References Cited

U.S. PATENT DOCUMENTS

| | | | | |
|---|---|---|---|---|
| 5,527,562 | A * | 6/1996 | Balaba | G02B 1/14 427/430.1 |
| 2004/0228902 | A1 | 11/2004 | Benz | |
| 2009/0136869 | A1 | 5/2009 | Ogihara et al. | |
| 2010/0003622 | A1 | 1/2010 | Matsumaru et al. | |
| 2011/0008735 | A1* | 1/2011 | Ohsawa | G03F 7/0397 430/326 |
| 2012/0052685 | A1 | 3/2012 | Ogihara et al. | |
| 2013/0210236 | A1* | 8/2013 | Ogihara | C09D 183/06 430/286.1 |
| 2013/0280912 | A1* | 10/2013 | Ogihara | C07F 7/1804 438/694 |
| 2020/0341377 | A1 | 10/2020 | Ogihara et al. | |

FOREIGN PATENT DOCUMENTS

| | | | |
|---|---|---|---|
| EP | 3 731 017 | A1 | 10/2020 |
| JP | 2008-033174 | A | 2/2008 |
| JP | 2009-126940 | A | 6/2009 |
| JP | 2012-053253 | A | 3/2012 |
| JP | 2013-167669 | A | 8/2013 |
| JP | 2013-224279 | A | 10/2013 |

OTHER PUBLICATIONS

May 31, 2022 Extended Search Report issued in European Patent Application No. 21213141.1.

Effenberger et al., "Synthesis of the Adrenergic Bronchodilators (R)-Terbutaline and (R)-Salbutamol from (R)-Cyanohydrins," The Journal of Organic Chemistry, Jun. 13, 1997, vol. 62, No. 12, pp. 3867-3873.

Brooks et al., "Cyclic DI-tert.-Butylsilyene Derivatives of Substituted Salicylic Acids and Related Compounds a Study by Gas Chromatography-Mass Spectrometry," Journal of Chromatography, 1988, vol. 441, pp. 13-29.

M. Maenhoudt et al. "Double Patterning scheme for sub-0.25 k1 single damascene structures at NA=0.75, I=193nm" Proc. SPIE vol. 5754 p. 1508 (2005).

* cited by examiner

*Primary Examiner* — Sean M DeGuire
*Assistant Examiner* — Andrew Preston Traywick
(74) *Attorney, Agent, or Firm* — Oliff PLC

(57) ABSTRACT

The present invention is a composition for forming a silicon-containing resist underlayer film, containing one or both of a hydrolysis product and a hydrolysis condensate of one or more silicon compounds (A-1) shown by the following general formula (1). This provides: a composition for forming a silicon-containing resist underlayer film with which it is possible to form a resist underlayer film having favorable adhesiveness to resist patterns regardless of whether in negative development or positive development, and also having favorable adhesiveness to finer patterns as in EUV photo-exposure; a patterning process; and a silicon compound.

(1)

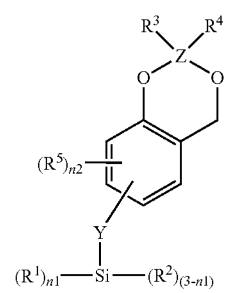

19 Claims, No Drawings

COMPOSITION FOR FORMING SILICON-CONTAINING RESIST UNDERLAYER FILM, PATTERNING PROCESS, AND SILICON COMPOUND

TECHNICAL FIELD

The present invention relates to: a composition for forming a silicon-containing resist underlayer film; a patterning process; and a silicon compound.

BACKGROUND ART

As Large-Scale Integrated circuits (LSIs) advance toward higher integration and higher processing speed, miniaturization of pattern size is rapidly progressing. Along with this miniaturization, the lithography technology has achieved formation of fine patterns by shortening the wavelength of a light source and by selecting a proper resist composition corresponding to the shortened wavelength.

Recently, a double patterning process has drawn attention as one miniaturization technology, in which a first pattern is formed by a first photo-exposure and development; then, a pattern is formed by a second photo-exposure exactly in the space of the first pattern (Non Patent Document 1). Many processes have been proposed as double patterning methods. Examples include a method (1) in which a photoresist pattern with a line-and-space interval of 1:3 is formed by a first photo-exposure and development; an underlying hard mask is processed by dry etching; another layer of hard mask is formed thereon; in the space portion formed by the first photo-exposure, a second line pattern is formed by photo-exposure and development for a photoresist film; and then, the hard mask is dry-etched to form a line-and-space pattern having a pitch with half the width of the first pattern pitch. There is also another method (2) in which a photoresist pattern with a space-and-line interval of 1:3 is formed by a first photo-exposure and development; an underlying hard mask is processed by dry etching, and coated with a photoresist film; a pattern is formed in the remaining part of the hard mask by a second photo-exposure; and then, the hard mask is dry-etched while using the photoresist film as a mask. In both of these methods, the hard mask is processed twice by dry etching.

Furthermore, to perform the dry etching only once, there is a method in which a negative resist material is used in the first photo-exposure and a positive resist material is used in the second photo-exposure. There is also another method in which a positive resist material is used in the first photo-exposure, and a negative resist material dissolved in a higher alcohol that has 4 or more carbon atoms and does not dissolve the positive resist material is used in the second photo-exposure.

As another method, a method has been proposed in which first patterns formed by a first photo-exposure and development are treated with a reactive metal compound to insolubilize the patterns; then, second patterns are newly formed between the first patterns by photo-exposure and development (Patent Document 1).

Meanwhile, the recent advents of ArF immersion lithography, EUV lithography, and so forth start to realize finer pattern formations. On the other hand, ultrafine patterns have such small contact areas that the patterns quite easily collapse. Suppressing such pattern collapse is an enormous challenge. Hence, the development of a silicon-containing resist underlayer film having a high effect of suppressing pattern collapse is urgently required.

As described, various techniques are considered for forming finer patterns, and a common issue among the techniques is to prevent the collapse of the formed fine patterns. To achieve this, further improvement of the adhesion between an upper layer resist pattern and a resist underlayer film is required.

CITATION LIST

Patent Literature

Patent Document 1: JP 2008-033174 A

Non Patent Literature

Non Patent Document 1: Proc. SPIE Vol. 5754 p 1508 (2005)

SUMMARY OF INVENTION

Technical Problem

The present invention has been made to solve the above-described problem. An object of the present invention is to provide: a composition for forming a silicon-containing resist underlayer film with which it is possible to form a resist underlayer film having favorable adhesiveness to resist patterns regardless of whether in negative development or positive development, and also having favorable adhesiveness to finer patterns as in EUV photo-exposure; a patterning process; and a silicon compound.

Solution to Problem

To solve the above-described problem, the present invention provides a composition for forming a silicon-containing resist underlayer film, comprising one or both of a hydrolysis product and a hydrolysis condensate of one or more silicon compounds (A-1) shown by the following general formula (1):

(1)

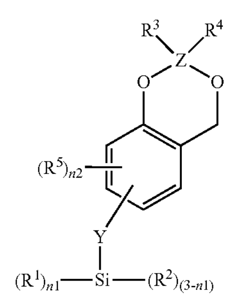

wherein in the general formula (1), $R^1$ represents a hydrogen atom or a monovalent organic group having 1 to 30 carbon atoms; $R^2$ represents an alkoxy group, an acyloxy group, or a halogen atom; n1 represents 0, 1, or 2; $R^3$ and $R^4$ each independently represent a hydrogen atom, or represent an organic group having 1 to 6 carbon atoms optionally containing a nitrogen atom, an oxygen atom, a sulfur atom, a halogen atom, or a silicon atom, $R^3$ and $R^4$ being optionally bonded with each other to form a ring; $R^5$ represents a monovalent organic group having 1 to 30 carbon atoms; n2 represents 0, 1, 2, or 3; Y represents a single bond or a divalent organic group having 1 to 6 carbon atoms optionally containing a silicon atom; and Z represents a carbon atom or a silicon atom.

Such a composition for forming a silicon-containing resist underlayer film makes it possible to form a resist underlayer film having favorable adhesiveness to resist patterns regardless of whether in negative development or positive development, and also having favorable adhesiveness to finer patterns as in EUV photo-exposure.

Furthermore, the present invention provides the composition for forming a silicon-containing resist underlayer film, wherein the composition for forming a silicon-containing resist underlayer film comprises one or both of a hydrolysis product and a hydrolysis condensate of a mixture of the silicon compound (A-1) and one or more silicon compounds (A-2) shown by the following general formula (2):

$$R^{6}{}_{m}Si(R^{7})_{(4-m)} \quad (2)$$

wherein in the general formula (2), $R^6$ represents a hydrogen atom or a monovalent organic group having 1 to 30 carbon atoms optionally containing a carbon-oxygen single bond, a carbon-oxygen double bond, a silicon-silicon bond, a carbon-nitrogen bond, a carbon-sulfur bond, a protective group that is decomposed with an acid, an iodine atom, a phosphorous atom, or a fluorine atom; $R^7$ represents an alkoxy group, an acyloxy group, or a halogen atom; and "m" represents 0, 1, 2, or 3.

Such a composition for forming a silicon-containing resist underlayer film makes it possible to form a resist underlayer film having more favorable adhesiveness to resist patterns regardless of whether in negative development or positive development, and also having more favorable adhesiveness to finer patterns as in EUV photo-exposure.

Furthermore, the present invention provides the composition for forming a silicon-containing resist underlayer film, further comprising a crosslinking catalyst.

Such a composition for forming a silicon-containing resist underlayer film makes it possible to form a resist underlayer film having even more favorable adhesiveness to resist patterns regardless of whether in negative development or positive development, and also having even more favorable adhesiveness to finer patterns as in EUV photo-exposure.

In this event, the crosslinking catalyst is preferably a sulfonium salt, an iodonium salt, a phosphonium salt, an ammonium salt, an alkaline metal salt, or a polysiloxane having a structure partially containing any of a sulfonium salt, an iodonium salt, a phosphonium salt, and an ammonium salt.

In the inventive composition for forming a silicon-containing resist underlayer film, such crosslinking catalysts are usable.

Furthermore, the inventive composition for forming a silicon-containing resist underlayer film preferably further comprises one or more compounds shown by the following general formula (P-0):

(P-0)

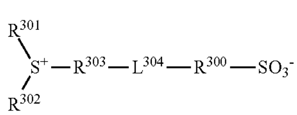

wherein $R^{300}$ represents a divalent organic group substituted with one or more fluorine atoms; $R^{301}$ and $R^{302}$ each independently represent a linear, branched, or cyclic monovalent hydrocarbon group having 1 to 20 carbon atoms optionally substituted with a hetero atom or optionally containing a hetero atom; $R^{303}$ represents a linear, branched, or cyclic divalent hydrocarbon group having 1 to 20 carbon atoms optionally substituted with a hetero atom or optionally containing a hetero atom; $R^{301}$ and $R^{302}$, or $R^{301}$ and $R^{303}$, are optionally bonded to each other to form a ring with a sulfur atom in the formula; and $L^{304}$ represents a single bond or a linear, branched, or cyclic divalent hydrocarbon group having 1 to 20 carbon atoms optionally substituted with a hetero atom or optionally containing a hetero atom.

When the compound shown by the general formula (P-0) is contained, it is possible to obtain, by combining the compound with the inventive composition for forming a silicon-containing resist underlayer film, a resist underlayer film which is capable of contributing to the formation of an upper layer resist having a rectangular cross section while maintaining the LWR of the upper layer resist.

In this case, the compound shown by the general formula (P-0) is preferably a compound shown by the following general formula (P-1):

(P-1)

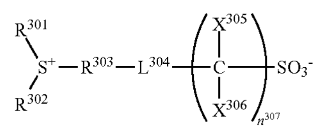

wherein $X^{303}$ and $X^{306}$ each independently represent a hydrogen atom, a fluorine atom, or a trifluoromethyl group, but not all of $X^{305}$'s and $X^{306}$'s are hydrogen atoms simultaneously; $n^{307}$ represents an integer of 1 to 4; and $R^{301}$, $R^{302}$, $R^{303}$, and $L^{304}$ are as defined above.

When the compound shown by the general formula (P-0) is a compound shown by the general formula (P-1), the advantageous effects of the present invention are exhibited more fully.

In addition, the present invention provides a patterning process comprising:

- forming an organic underlayer film on a body to be processed by using a coating-type organic underlayer film material;
- forming a silicon-containing resist underlayer film on the organic underlayer film by using the above-described composition for forming a silicon-containing resist underlayer film;
- forming a photoresist film on the silicon-containing resist underlayer film by using a photoresist composition;
- subjecting the photoresist film to exposure and development to form a resist pattern;
- transferring the pattern to the silicon-containing resist underlayer film by dry etching while using the photoresist film having the formed pattern as a mask;
- transferring the pattern to the organic underlayer film by dry etching while using the silicon-containing resist underlayer film having the transferred pattern as a mask; and
- further transferring the pattern to the body to be processed by dry etching while using the organic underlayer film having the transferred pattern as a mask.

According to such a patterning process, it is possible to form a fine pattern while suppressing pattern collapse in a patterning process in which a coating-type organic underlayer film is formed under a silicon-containing resist underlayer film either in the case of negative development or positive development.

Furthermore, the present invention provides a patterning process comprising:

forming a hard mask mainly containing carbon on a body to be processed by a CVD method;

forming a silicon-containing resist underlayer film on the CVD hard mask by using the above-described composition for forming a silicon-containing resist underlayer film;

forming a photoresist film on the silicon-containing resist underlayer film by using a photoresist composition;

subjecting the photoresist film to exposure and development to form a resist pattern;

transferring the pattern to the silicon-containing resist underlayer film by dry etching while using the photoresist film having the formed pattern as a mask;

transferring the pattern to the CVD hard mask by dry etching while using the silicon-containing resist underlayer film having the transferred pattern as a mask; and further transferring the pattern to the body to be processed by dry etching while using the CVD hard mask having the transferred pattern as a mask.

According to such a patterning process, it is possible to form a fine pattern while suppressing pattern collapse in a patterning process in which a CVD hard mask is formed under a silicon-containing resist underlayer film either in the case of negative development or positive development.

Furthermore, the resist pattern is preferably formed by a lithography using light with a wavelength of 10 nm or more to 300 nm or less, a direct drawing by electron beam, a nanoimprinting, or a combination thereof.

Furthermore, when the resist pattern is formed, the resist pattern is preferably developed by alkaline development or organic solvent development.

In the patterning process using the inventive composition for forming a silicon-containing resist underlayer film, such resist pattern formation means and development means can be employed suitably.

In this event, the body to be processed is preferably a semiconductor device substrate, or the semiconductor device substrate coated with a metal film, an alloy film, a metal carbide film, a metal oxide film, a metal nitride film, a metal oxycarbide film, or a metal oxynitride film.

In the patterning process using the inventive composition for forming a silicon-containing resist underlayer film, such a body to be processed can be processed to form a pattern.

Moreover, the metal of the body to be processed is preferably silicon, gallium, titanium, tungsten, hafnium, zirconium, chromium, germanium, copper, silver, gold, indium, arsenic, palladium, tantalum, iridium, aluminum, iron, molybdenum, cobalt, or an alloy thereof.

The body to be processed in the patterning process using the inventive composition for forming a silicon-containing resist underlayer film is preferably a metal given above.

In addition, the present invention provides a silicon compound shown by the following general formula (1):

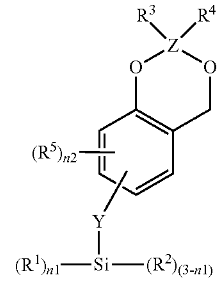

(1)

wherein in the general formula (1), $R^1$ represents a hydrogen atom or a monovalent organic group having 1 to 30 carbon atoms; $R^2$ represents an alkoxy group, an acyloxy group, or a halogen atom; n1 represents 0, 1, or 2; $R^3$ and $R^4$ each independently represent a hydrogen atom, or represent an organic group having 1 to 6 carbon atoms optionally containing a nitrogen atom, an oxygen atom, a sulfur atom, a halogen atom, or a silicon atom, $R^3$ and $R^4$ being optionally bonded with each other to form a ring; $R^5$ represents a monovalent organic group having 1 to 30 carbon atoms; n2 represents 0, 1, 2, or 3; Y represents a single bond or a divalent organic group having 1 to 6 carbon atoms optionally containing a silicon atom; and Z represents a carbon atom or a silicon atom.

Such a silicon compound gives a composition for forming a silicon-containing resist underlayer film with which it is possible to form a resist underlayer film having favorable adhesiveness to resist patterns regardless of whether in negative development or positive development, and also having favorable adhesiveness to finer patterns as in EUV photo-exposure.

Advantageous Effects of Invention

As described above, when a resist underlayer film is formed using the inventive composition for forming a silicon-containing resist underlayer film, the adhesiveness of the resist underlayer film to a resist pattern is favorable in both alkaline development (positive development) and organic solvent development (negative development). Therefore, a pattern can be formed without pattern collapse occurring and with favorable surface roughness. Furthermore, the resist underlayer film also makes it possible to suppress pattern collapse in finer patterns as in EUV photo-exposure. Meanwhile, in an actual semiconductor device manufacturing process, it can be assumed that not all patterning processes will be replaced with negative development, but that only ultrafine processes of a very small part of the process will be replaced and conventional positive development process will still remain. In this event, if a composition is made exclusively for a negative resist underlayer film or exclusively for a positive underlayer film, equipment and quality control of the composition both become complicated. In contrast, the inventive composition for forming a silicon-containing resist underlayer film, which can be applied to both positive and negative processes and can also be applied to finer EUV photo-exposure, can be used rationally regarding both equipment and quality control.

DESCRIPTION OF EMBODIMENTS

As stated above, it has been desired to develop a composition for forming a silicon-containing resist underlayer film with which it is possible to form a resist underlayer film having favorable adhesiveness to resist patterns regardless of whether in negative development or positive development, and also having favorable adhesiveness to finer patterns as in EUV photo-exposure.

As a conventional technique, a method is known in which the contact angle of an underlayer film is adjusted to the contact angle of an upper layer resist pattern in order to prevent pattern collapse in a pattern by negative development in ArF photo-exposure (JP 2012-237975 A, etc.). However, in EUV photo-exposure, in which pattern line width is finer, it is not possible to form a pattern line with a width that can be applied to advanced process, according to this method. Accordingly, the present inventors have earnestly studied and have managed to prevent, by introducing a functional group that can form a chemical bond between a resist underlayer film and an upper layer resist, collapse in fine patterns of both negative development and positive development formed by EUV photo-exposure. Thus, the present invention has been completed. In addition, a collapse prevention effect has also been achieved in ArF photo-exposure by introducing a partial structure having both the functional group that can form a chemical bond between a resist underlayer film and an upper layer resist by EUV photo-exposure and a functional group for adjusting the contact angle to the contact angle of the upper layer resist pattern as in the conventional technique.

That is, the present invention is a composition for forming a silicon-containing resist underlayer film, comprising one or both of a hydrolysis product and a hydrolysis condensate of one or more silicon compounds (A-1) shown by the following general formula (1):

(1)

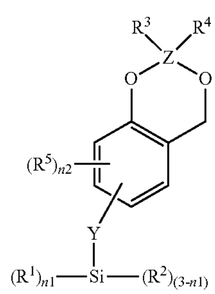

wherein in the general formula (1), R represents a hydrogen atom or a monovalent organic group having 1 to 30 carbon atoms; $R^2$ represents an alkoxy group, an acyloxy group, or a halogen atom; n1 represents 0, 1, or 2; $R^3$ and $R^4$ each independently represent a hydrogen atom, or represent an organic group having 1 to 6 carbon atoms optionally containing a nitrogen atom, an oxygen atom, a sulfur atom, a halogen atom, or a silicon atom, $R^3$ and $R^4$ being optionally bonded with each other to form a ring; $R^5$ represents a monovalent organic group having 1 to 30 carbon atoms; n2 represents 0, 1, 2, or 3; Y represents a single bond or a divalent organic group having 1 to 6 carbon atoms optionally containing a silicon atom; and Z represents a carbon atom or a silicon atom.

Hereinafter, the present invention will be described in detail, but the present invention is not limited thereto. Note that in the present specifications, Me represents a methyl group, Et represents an ethyl group, Ac represents an acetyl group, and Cl represents a chlorine atom.

<Composition for Forming Silicon-Containing Resist Underlayer Film>

The inventive composition for forming a silicon-containing resist underlayer film contains one or both of a hydrolysis product and a hydrolysis condensate of a silicon compound (A-1) shown by the following general formula (1). In addition, the inventive composition for forming a silicon-containing resist underlayer film can be obtained by subjecting the silicon compound (A-1) shown by the following general formula (1) to hydrolysis, hydrolysis condensation, or both hydrolysis and hydrolysis condensation. The inventive composition for forming a silicon-containing resist underlayer film has favorable adhesiveness to resist patterns in both negative development and positive development, since the benzylic position of the silicon compound (A-1) shown by the general formula (1) reacts with the upper layer resist pattern by the action of heat, acid, or both to form a bond.

(1)

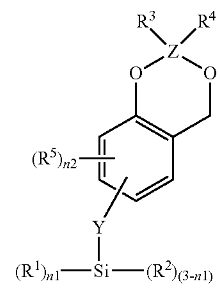

Below, a detailed description will be given regarding the silicon compound (A-1) shown by the general formula (1), the composition for forming a silicon-containing resist underlayer film containing one or both of a hydrolysis product and a hydrolysis condensate of the silicon compound (A-1), and a thermosetting silicon-containing material contained in this composition.

[Thermosetting Silicon-Containing Material]

In the present invention, a thermosetting silicon-containing material can be obtained by subjecting the silicon compound (A-1) shown by the general formula (1) to hydrolysis, hydrolysis condensation, or both. The silicon compound (A-1) shown by the general formula (1) has a characteristic structure that a phenolic hydroxy group and a benzyl alcohol are protected by forming a cyclic structure. In the present invention, it can be considered that a bond is formed between the benzylic position of the silicon compound (A-1) shown by the general formula (1) and a resist pattern in an exposed portion or an unexposed portion by the action of heat, acid, or both, as shown below. For example, it can be assumed that in an unexposed portion, the benzylic position of the silicon compound (A-1) shown by the general formula (1) and an aromatic ring (Ar) in the resist pattern react directly by the action of heat, acid, or both to form a bond (see upper part of following scheme). In an exposed portion, it can be assumed that a reactive species (aryl cation) is generated by the action of heat, acid, or both after a Z-containing protecting group has been removed, and the reactive species reacts with an aromatic ring (Ar) in the resist pattern to form a bond (see lower part of following scheme). Since a bond is formed between the benzylic position of the silicon compound (A-1) shown by the general formula (1) and the resist pattern to form a bond between the resist underlayer film and the upper layer resist pattern in this manner, the adhesiveness to a pattern is enhanced, and a film that is also excellent in pattern profile can be obtained as a result.

group, an undecyl group, a dodecyl group, a vinyl group, a propenyl group, a cyclopropyl group, a cyclobutyl group, a cyclopentyl group, a cyclohexyl group, a cycloheptyl group,

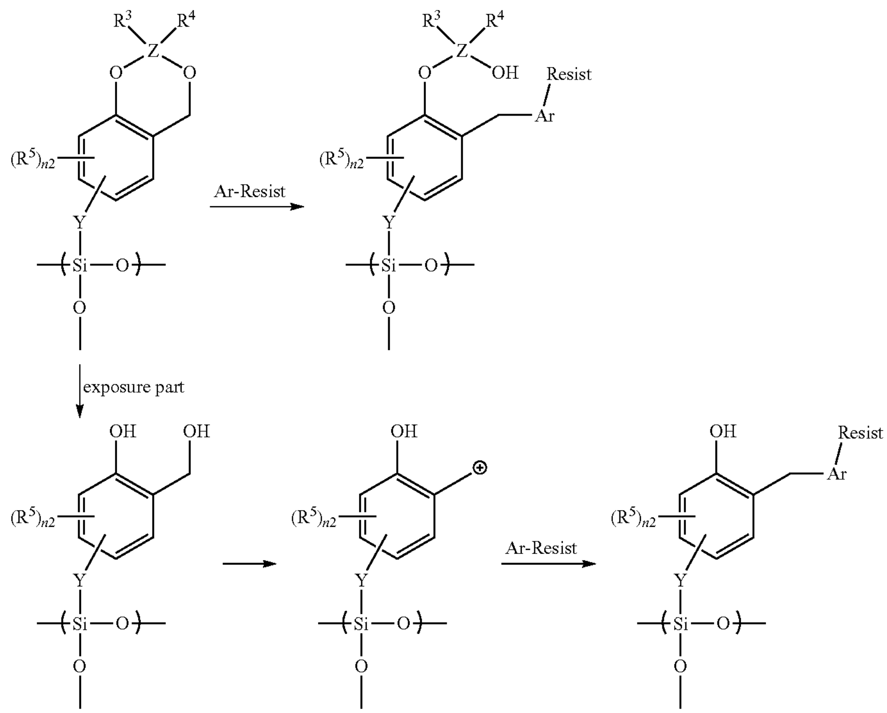

Note that in this event, the benzylic position of the silicon compound (A-1) shown by the general formula (1) can also react with a hydroxy group, a carboxy group, or the like in the resist pattern.

Furthermore, in this event, the benzylic position of the silicon compound (A-1) shown by the general formula (1) can also react with a compound that easily undergoes an aromatic electrophilic substitution reaction, for example, a compound having an electron-donating substituent or the like. Specific examples include resins having a phenolic hydroxy group such as a phenol-formamide resin and a polyhydroxystyrene resin.

In the case of ArF photo-exposure, in an unexposed portion, the cyclic protecting group of the silicon compound (A-1) shown by the general formula (1) does not become deprotected, and remains organic. Therefore, the cyclic protecting group has high affinity with the resist pattern, so that a film excellent in pattern profile in positive development can be obtained.

In the case of ArF photo-exposure, in an exposed portion, the cyclic protecting group of the silicon compound (A-1) shown by the general formula (1) can be easily deprotected by the action of heat, acid, or both, and a phenolic hydroxy group and a benzyl alcohol are produced, so that contact angle is reduced. Therefore, it is possible to obtain a film having enhanced adhesiveness to a pattern even in negative development and having an excellent pattern profile.

In the general formula (1), $R^1$ represents a hydrogen atom or a monovalent organic group having 1 to 30 carbon atoms. Preferable examples of the monovalent organic group having 1 to 30 carbon atoms include a methyl group, an ethyl group, a propyl group, a butyl group, a pentyl group, a hexyl group, a heptyl group, an octyl group, a nonyl group, a decyl group, an undecyl group, a dodecyl group, a vinyl group, a propenyl group, a cyclopropyl group, a cyclobutyl group, a cyclopentyl group, a cyclohexyl group, a cycloheptyl group, a norbornyl group, a glycidoxypropyl group, an aminopropyl group, a chloropropyl group, a phenyl group, a tolyl group, a hydroxyphenyl group, an anisyl group, an ethoxyphenyl group, a butoxyphenyl group, a naphthyl group, a hydroxynaphthyl group, and the like.

In the general formula (1), $R^2$ represents an alkoxy group, an acyloxy group, or a halogen atom. As the alkoxy group, a methoxy group, an ethoxy group, and the like are preferable. As the acyloxy group, an acetoxy group and the like are preferable. As the halogen atom, fluorine, chlorine, bromine, and the like are preferable.

In the general formula (1), n1 represents 0, 1, or 2. In this case, $R^1$ or $R^2$ may be identical or different. In the silicon compound (A-1) shown by the general formula (1), n1 is more preferably 0 or 1. That is, the following general formulae (1a) and (1b) are more preferable.

(1a)

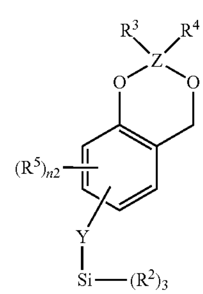

-continued (1b)

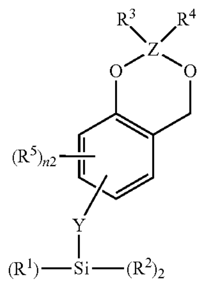

In the general formula (1), $R^3$ and $R^4$ each independently represent a hydrogen atom, or represent an organic group having 1 to 6 carbon atoms optionally containing a nitrogen atom, an oxygen atom, a sulfur atom, a halogen atom, or a silicon atom, and $R^3$ and $R^4$ may be bonded with each other to form a ring. As $R^3$ and $R^4$, a hydrogen atom, a methyl group, an ethyl group, a propyl group, an isopropyl group, a cyclopentyl group, a cyclohexyl group, a phenyl group, etc. are preferable.

Furthermore, as described above, $R^3$ and $R^4$ may be bonded with each other to form a cyclic structure, and examples of an alicyclic group formed by the bonding of $R^3$ and $R^4$ include the groups shown below. Note that the "Z" in the formulae indicate the carbon atom or silicon atom to which $R^3$ and $R^4$ are bonded.

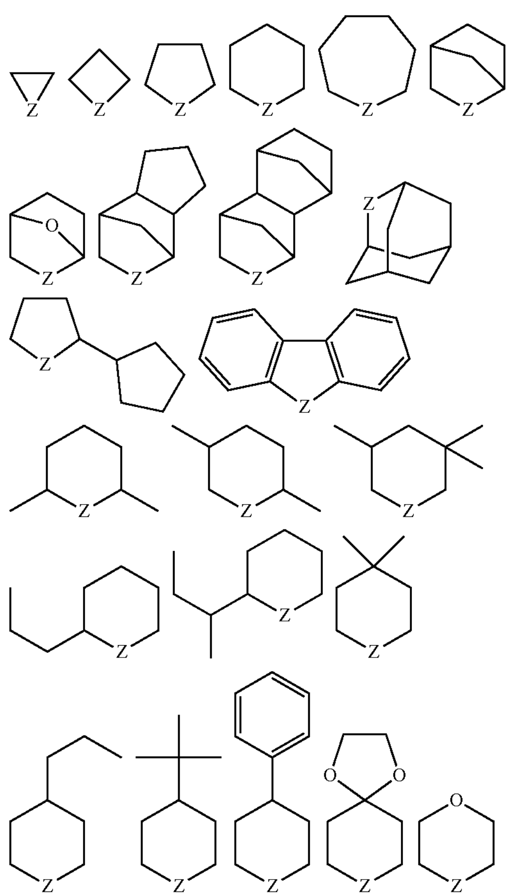

-continued

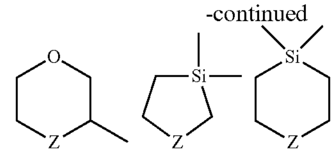

In the general formula (1), $R^3$ represents a monovalent organic group having 1 to 30 carbon atoms. Preferable examples of the monovalent organic group having 1 to 30 carbon atoms include a methyl group, an ethyl group, a propyl group, a butyl group, a pentyl group, a hexyl group, a heptyl group, an octyl group, a nonyl group, a decyl group, an undecyl group, a dodecyl group, a vinyl group, a propenyl group, a cyclopropyl group, a cyclobutyl group, a cyclopentyl group, a cyclohexyl group, a cycloheptyl group, a norbornyl group, a glycidoxypropyl group, an aminopropyl group, a chloropropyl group, a phenyl group, a tolyl group, a hydroxyphenyl group, an anisyl group, an ethoxyphenyl group, a butoxyphenyl group, a naphthyl group, a hydroxynaphthyl group, and the like.

In the general formula (1), n2 represents 0, 1, 2, or 3. When n2 is 2 or 3, $R^3$ may be identical or different. In the silicon compound (A-1) shown by the general formula (1), n2 is more preferably 0. That is, the following general formula (1c) is more preferable.

(1c)

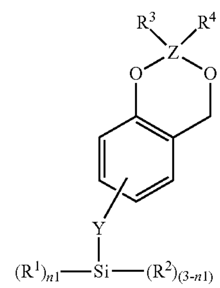

In the general formula (1), Y represents a single bond or a divalent organic group having 1 to 6 carbon atoms optionally containing a silicon atom. Preferable examples of the divalent organic group having 1 to 6 carbon atoms include a methylene group, an ethylene group, a propylene group, a butylene group, a pentylene group, a hexylene group, structural isomers of these groups, having a branched or cyclic structure, etc. In addition, one or more kinds selected from an ether oxygen atom, a carbonyl group, and a carbonyloxy group may be contained, and in such a case, these may be contained in any position as long as, in the position, they do not directly bond with the silicon atom (Si) in the formula.

In the general formula (1), Z represents a carbon atom or a silicon atom.

The silicon compound (A-1) can be obtained by protecting a diol with a compound having an $R^3R^4Z$ group (Z represents C or Si) as described below. To obtain the silicon compound (A-1), as described below, a salicyl alcohol derivative may be protected with an $R^3R^4Z$ group (protecting group) first, and then functional group conversion may be performed, or a protecting group may be introduced in the final stages. The salicyl alcohol derivative may be a commercially available product, or may be synthesized in the usual manner.

Methods for synthesizing the silicon compound in the general formula (1) in which Z is a carbon atom are not particularly limited. Examples include a method of mixing 5-bromo-2-hydroxybenzyl alcohol, 2,2-dimethoxypropane, and acetone in an $N_2$ atmosphere, adding a p-toluenesulfonic acid monohydrate, allowing a reaction to take place to synthesize c1, making Mg act on c1 to prepare a Grignard reagent, and then making the Grignard reagent react with tetramethoxysilane to synthesize c2.

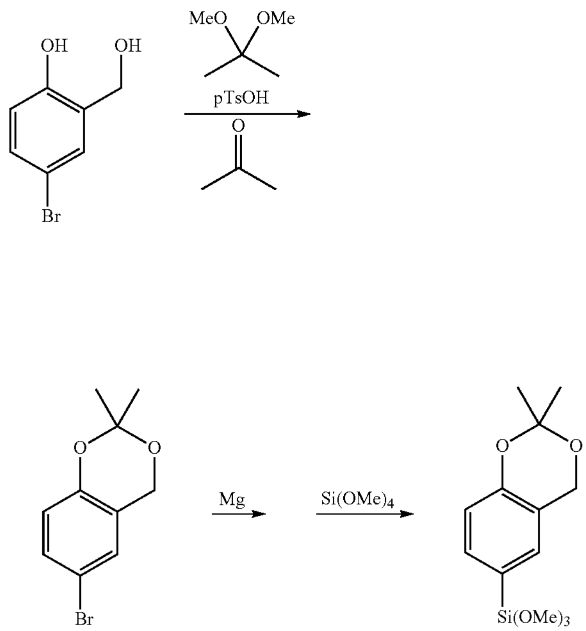

c1 c2

Methods for synthesizing the silicon compound in the general formula (1) in which Z is a silicon atom are not particularly limited. Examples include, as in the following formulae, a method of making 5-ethenyl-2-hydroxy-benzenemethanol and dimethyldichlorosilane react to synthesize a1, and making a1 react with trimethoxysilane in the presence of a platinum catalyst to synthesize a2 (method A); and a method of making 5-bromo-2-hydroxybenzyl alcohol and dimethyldichlorosilane react to synthesize b1, making Mg act on b1 to prepare a Grignard reagent, and then making the Grignard reagent react with tetramethoxysilane to synthesize b2 (method B).

(Method A)

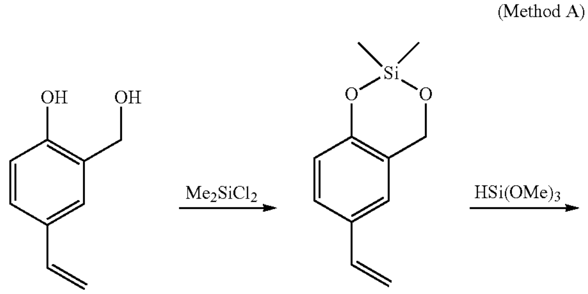

a1

-continued

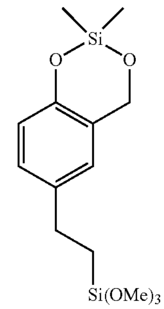

a2

(Method B)

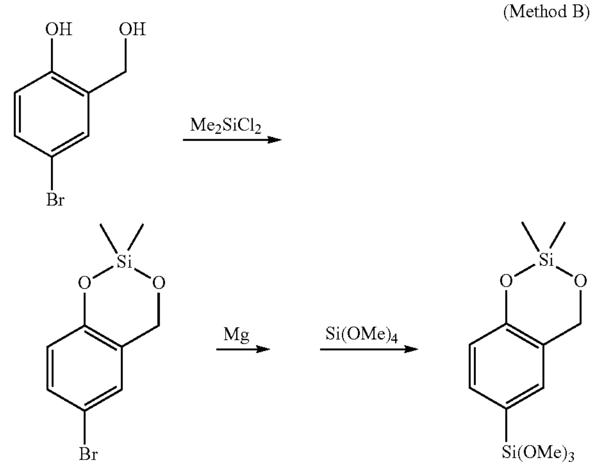

b1 b2

Examples of the silicon compound (A-1) shown by the general formula (1) include the following.

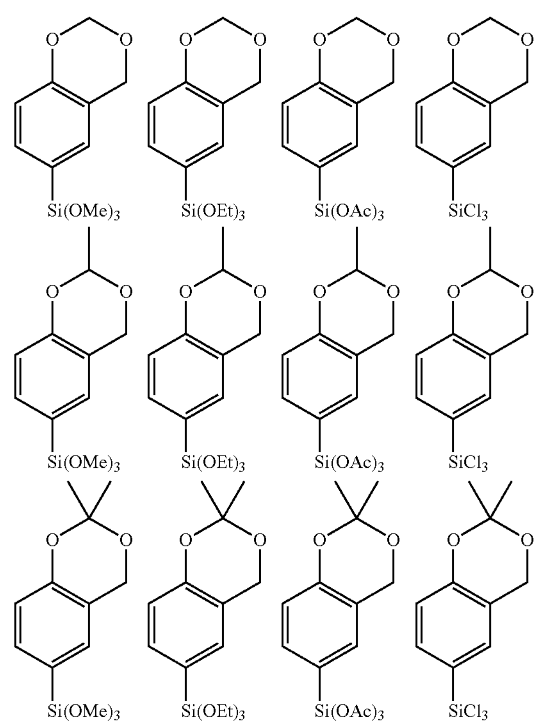

-continued
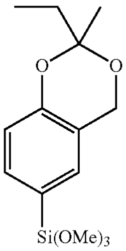
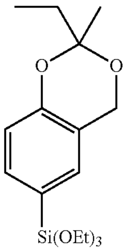
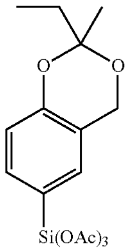
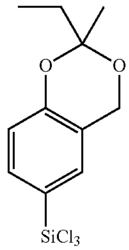
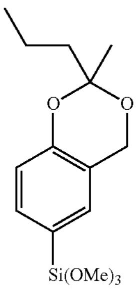
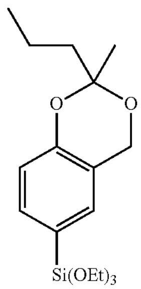
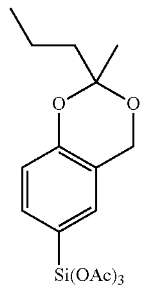
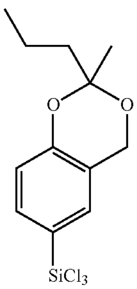
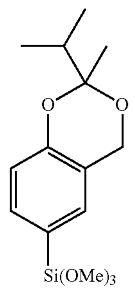
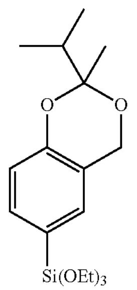
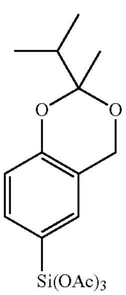
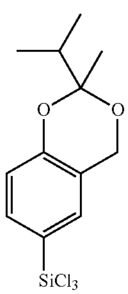
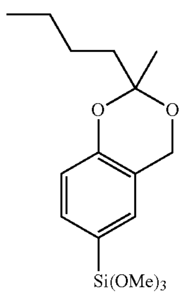
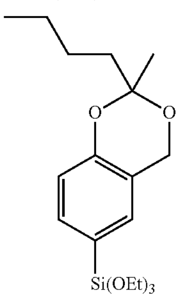
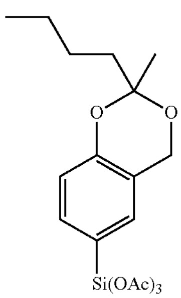
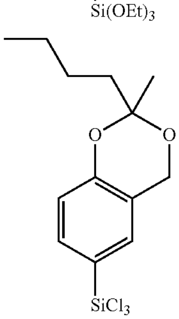
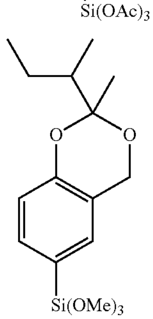
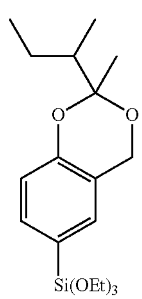
-continued
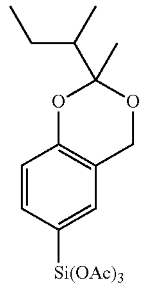
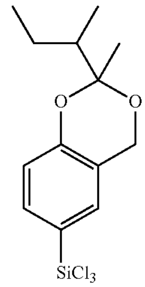
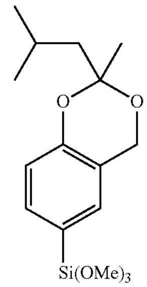
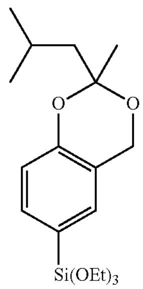
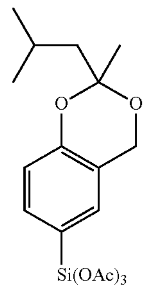
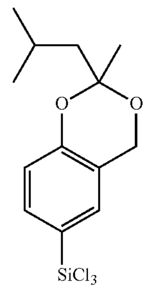
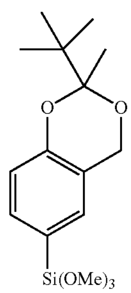
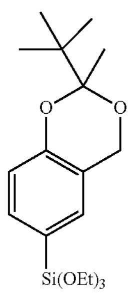
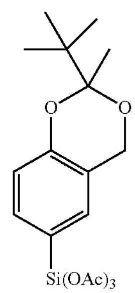
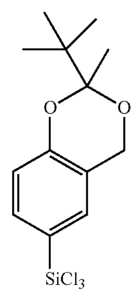
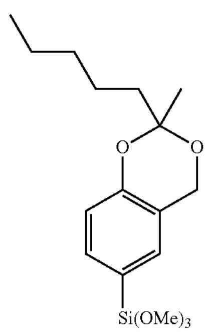
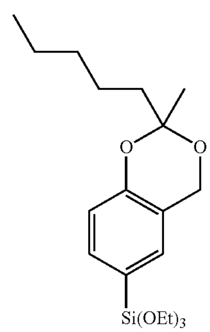
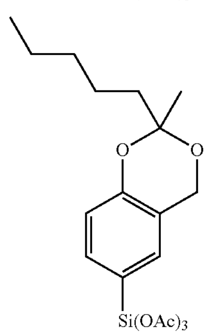
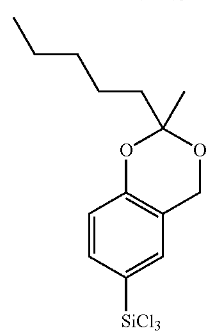

-continued
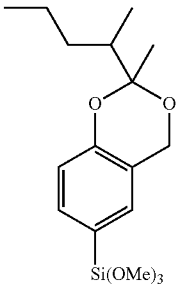
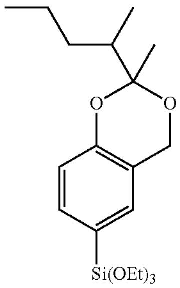
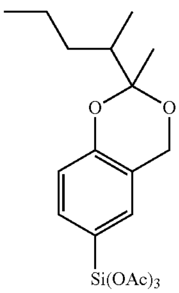
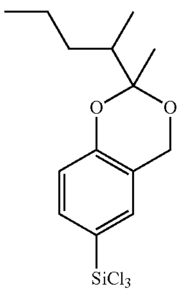
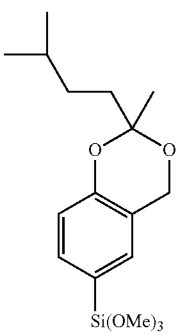
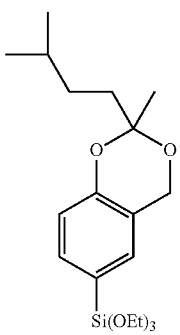
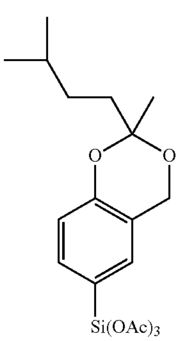
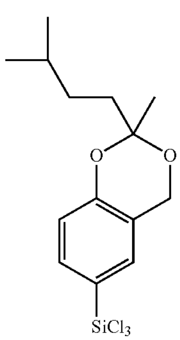
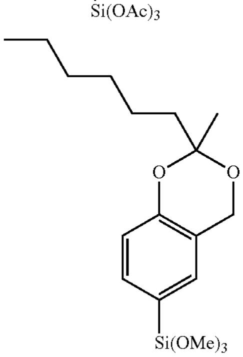
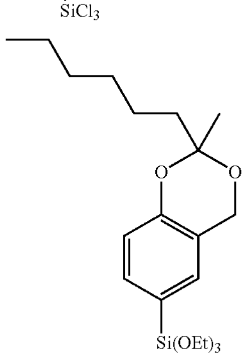
-continued
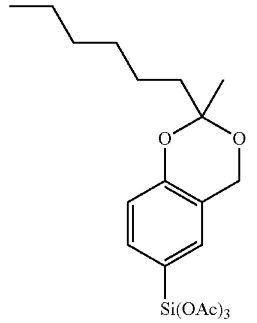
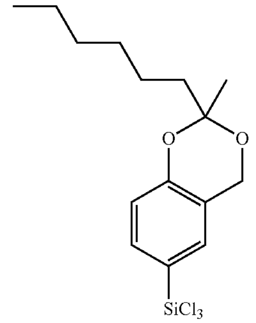
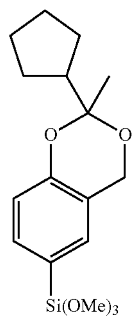
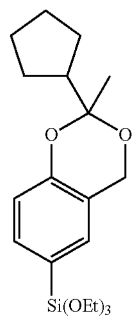
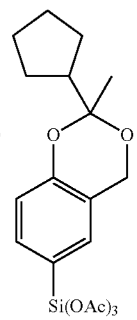
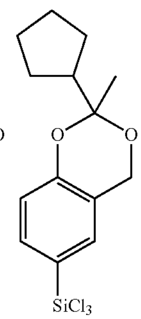
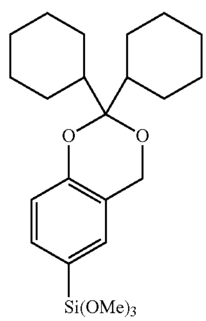
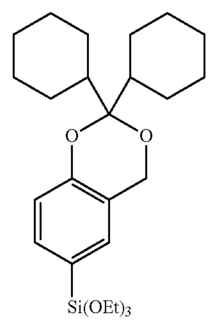
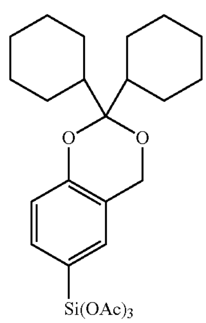
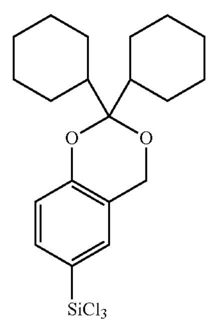
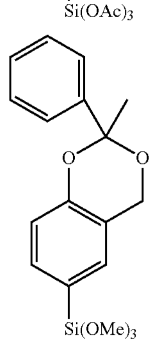
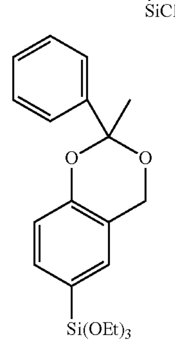
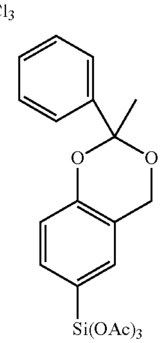

-continued
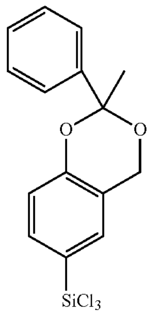
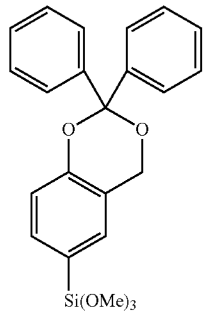
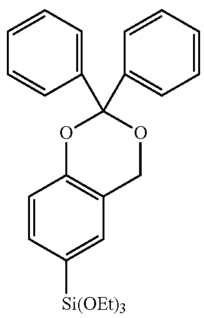
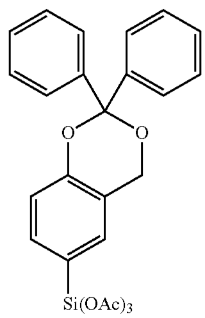
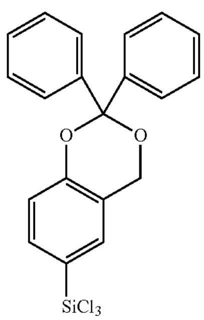
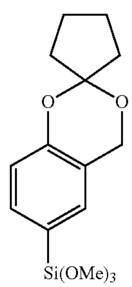
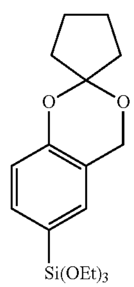
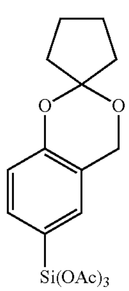
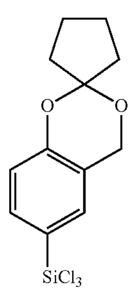
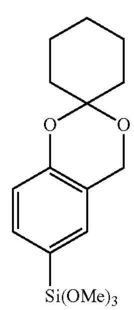
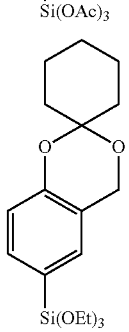
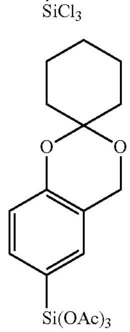
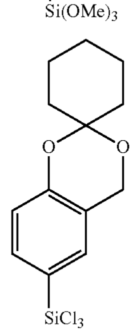
-continued
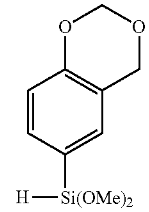
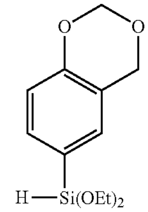
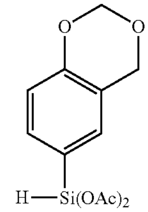
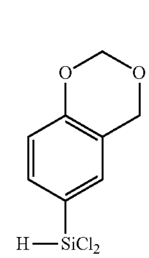
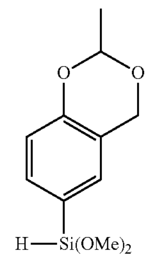
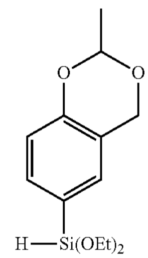
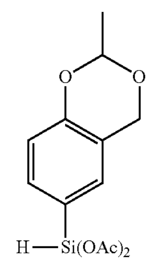
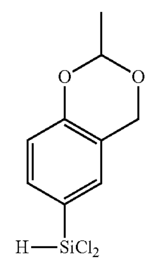
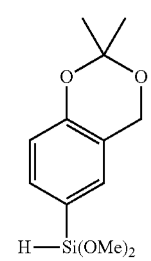
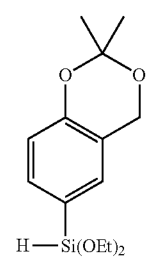
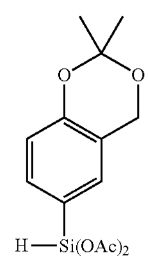
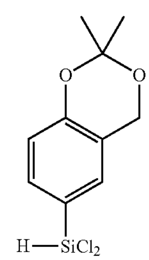
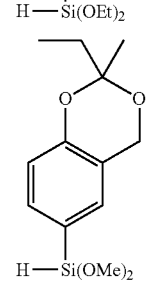
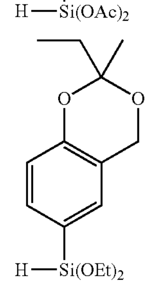
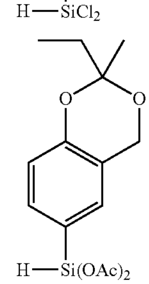
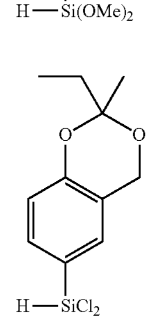
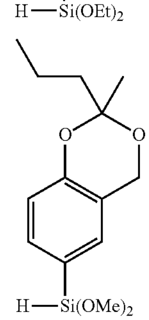
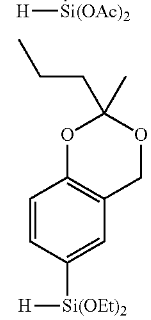

-continued
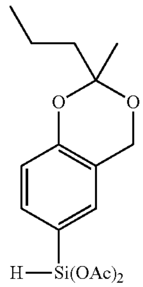
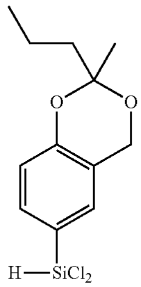
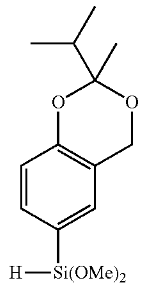
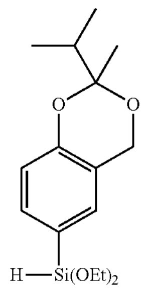
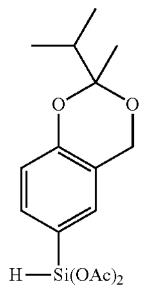
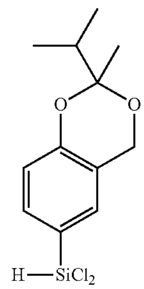
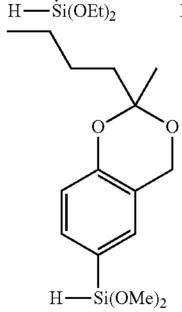
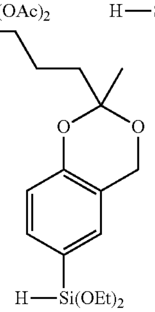
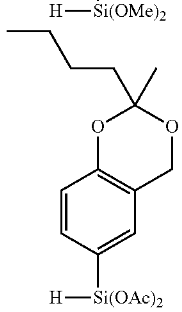
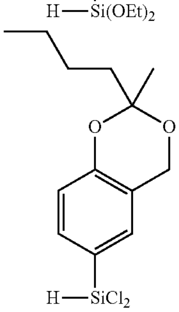
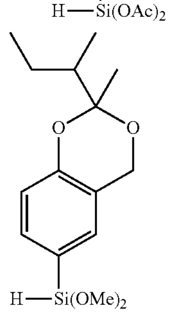
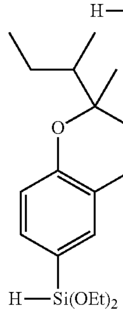
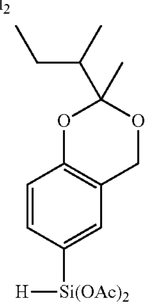
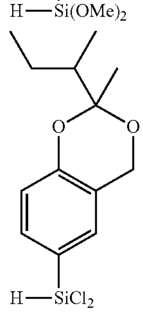
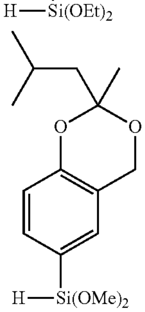
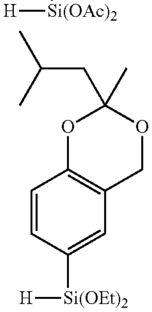
-continued
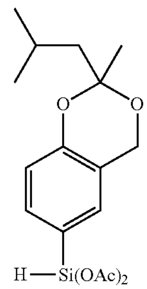
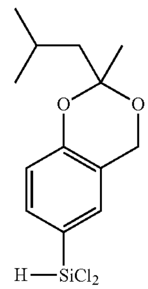
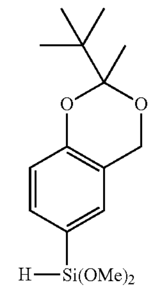
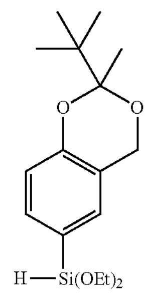
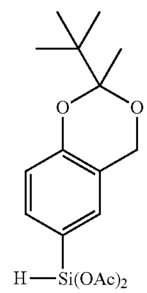
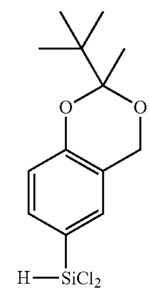
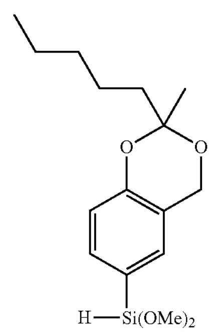
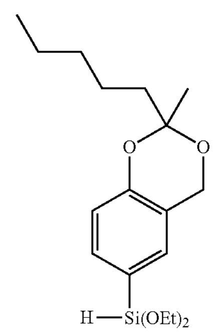
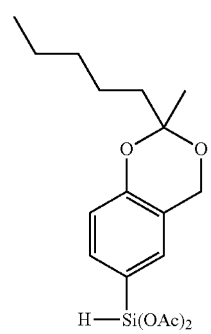
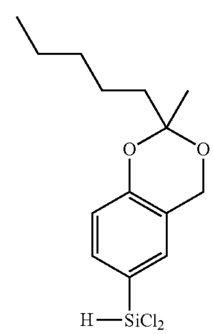
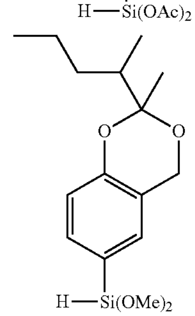
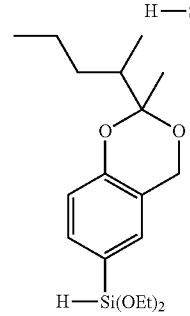

-continued
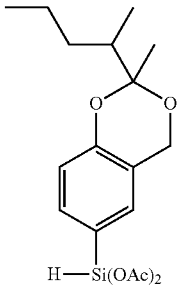
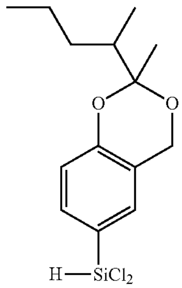
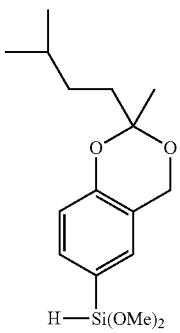
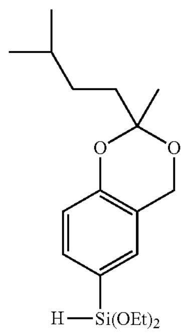
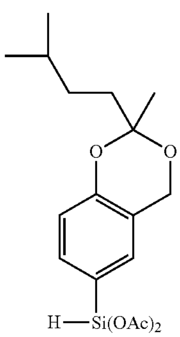
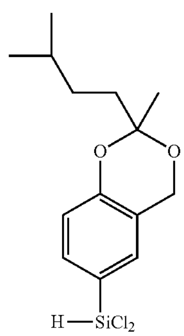
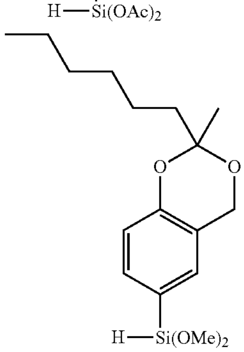
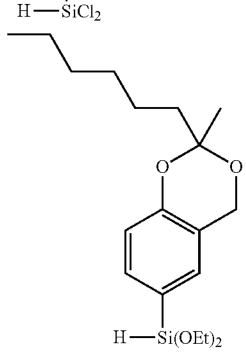
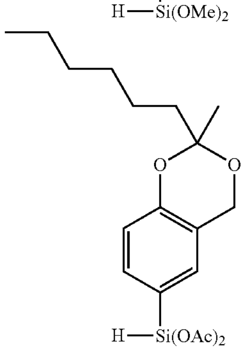
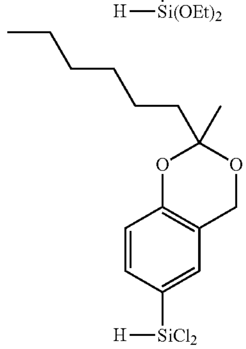
-continued
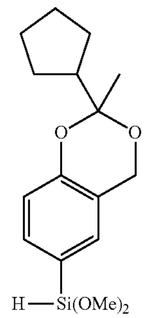
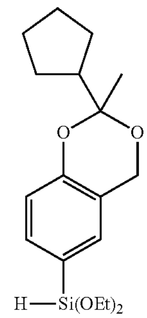
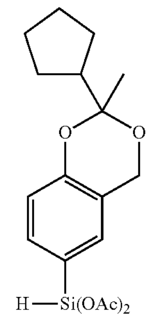
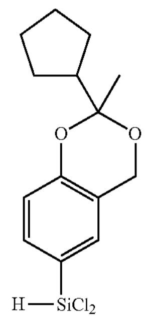
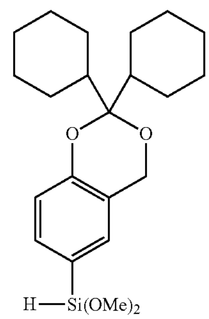
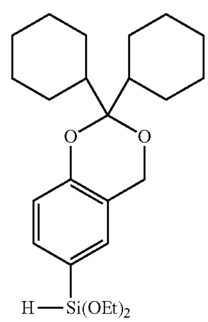
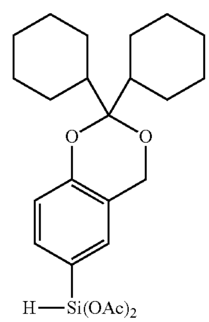
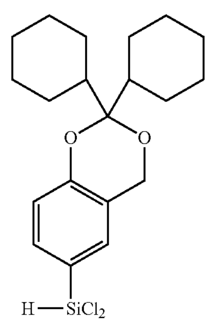
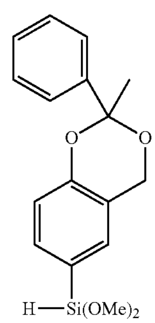
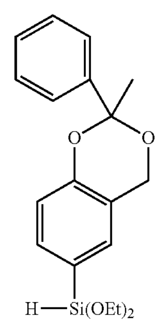
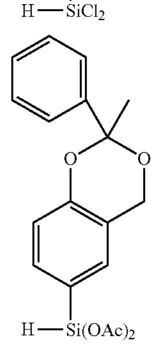
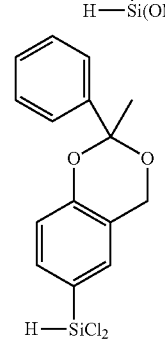
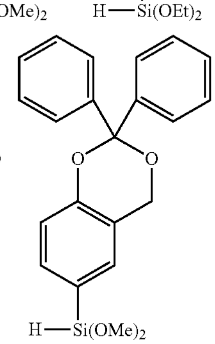

-continued
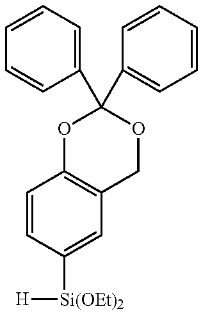
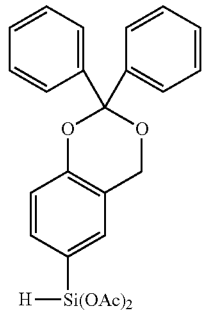
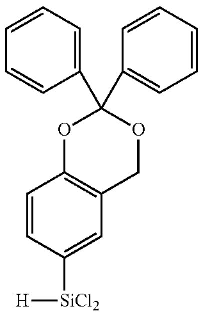
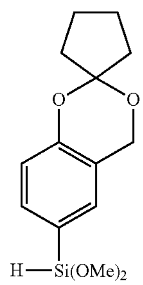
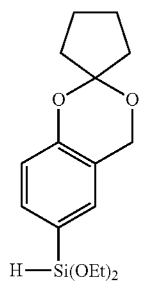
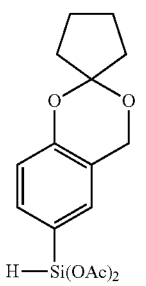
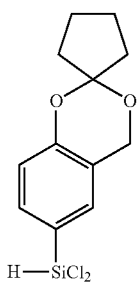
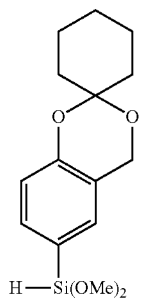
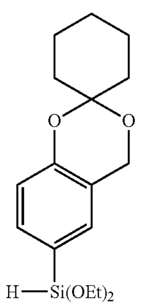
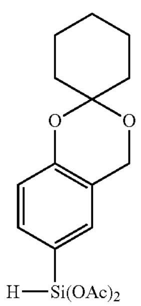
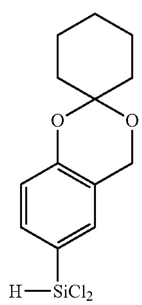
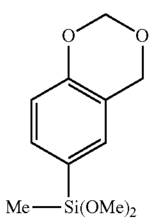
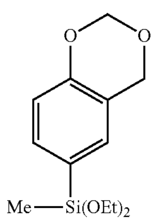
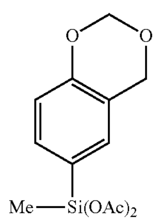
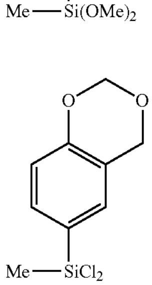
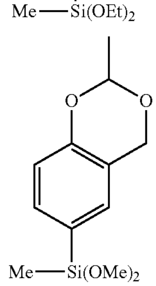
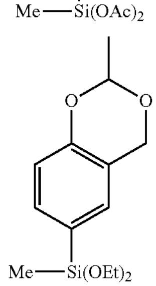
-continued
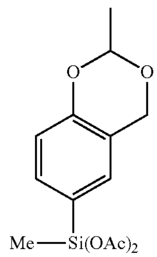
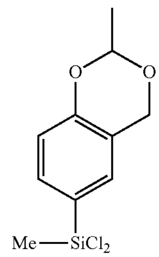
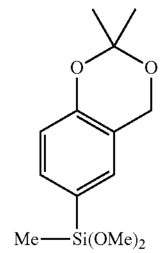
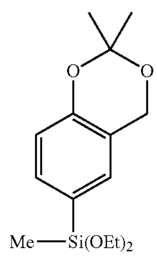
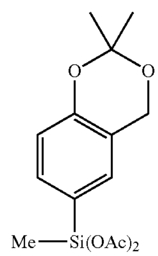
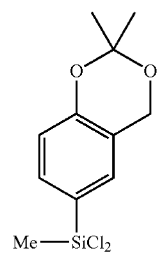
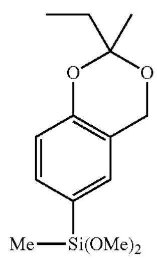
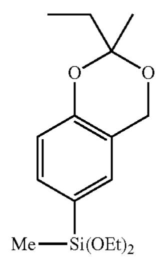
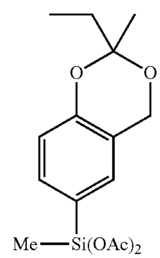
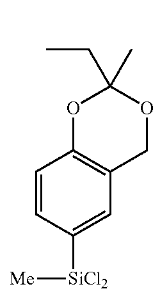
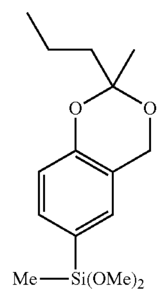
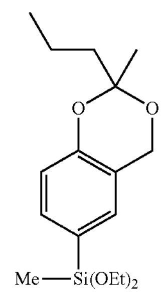
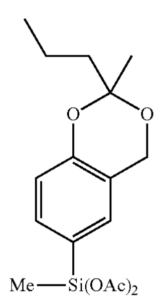
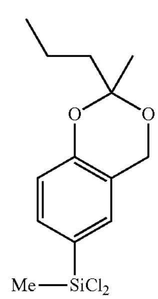
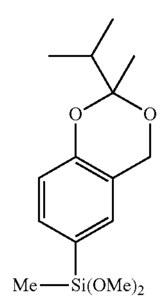
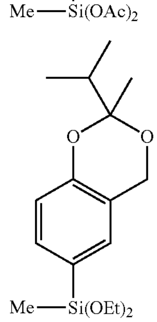
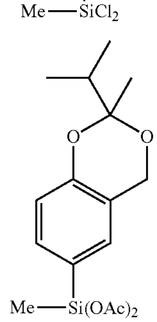
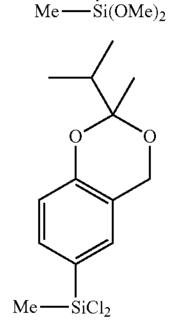

-continued
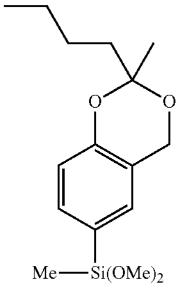
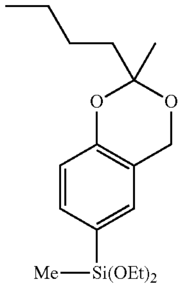
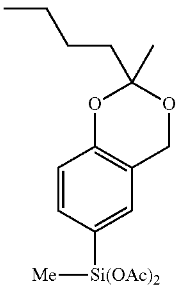
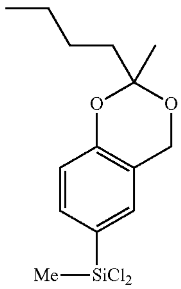
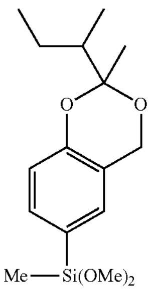
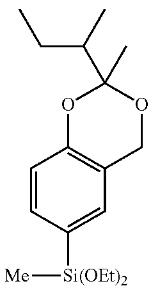
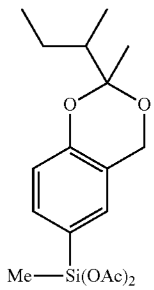
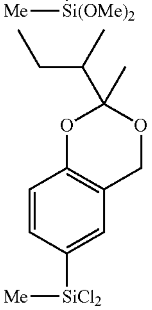
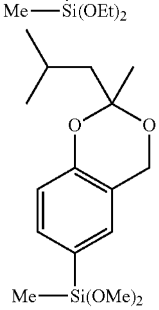
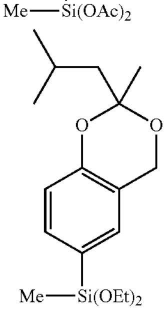
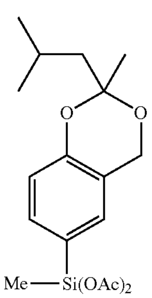
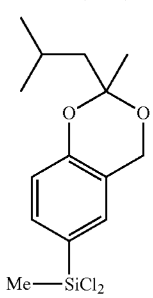
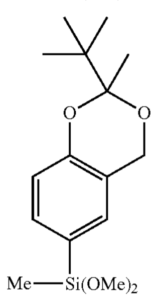
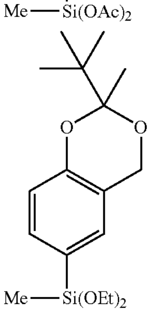
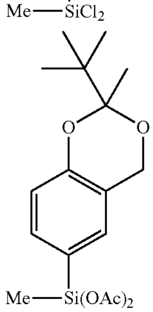
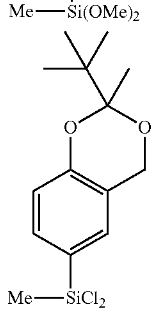
-continued
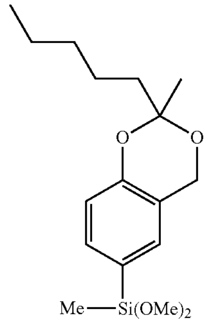
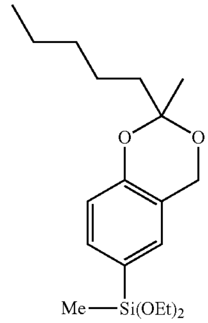
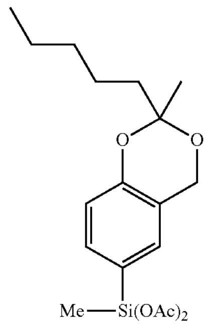
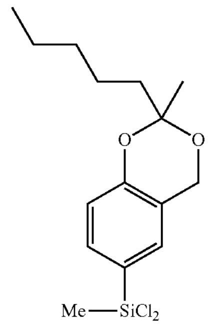
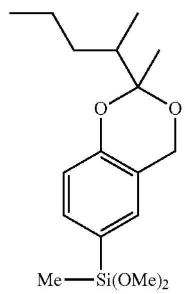
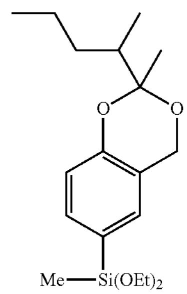
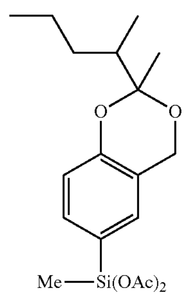
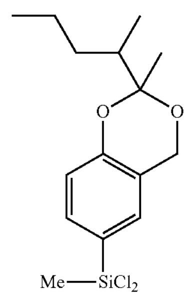
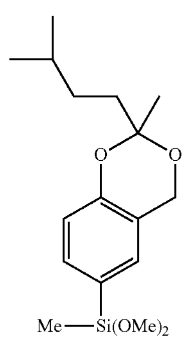
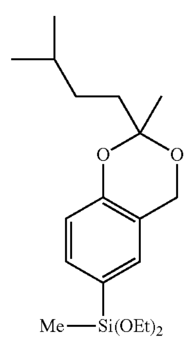

-continued
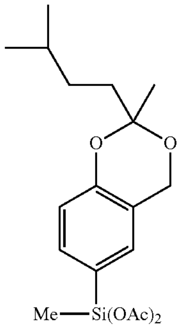
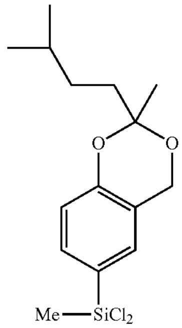
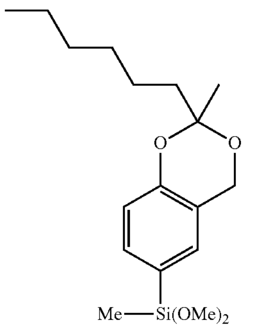
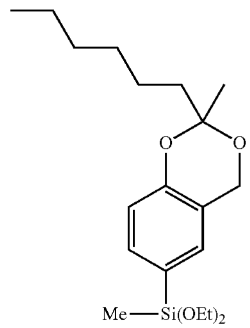
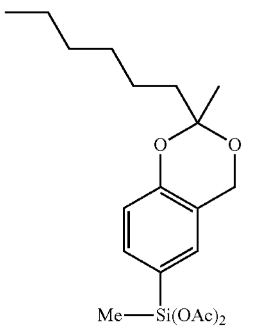
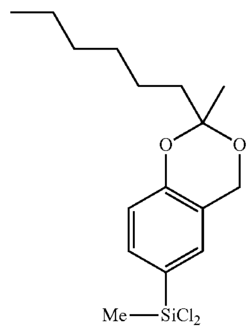
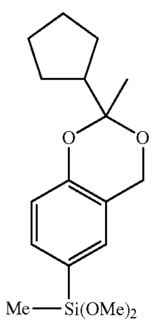
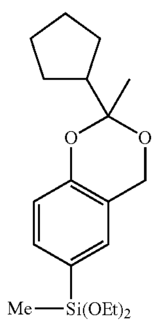
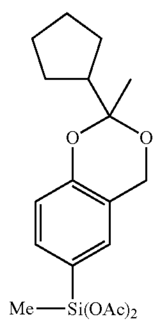
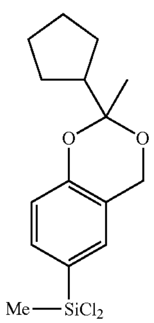
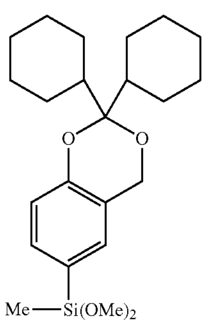
-continued
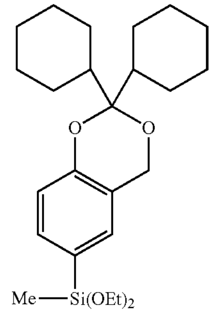
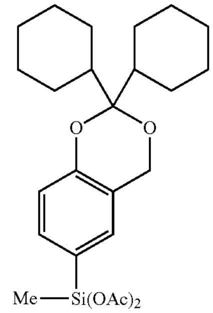
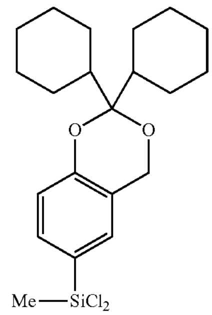
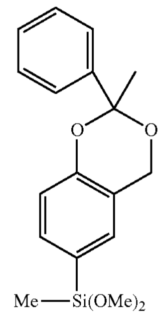
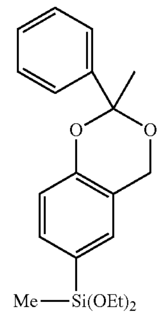
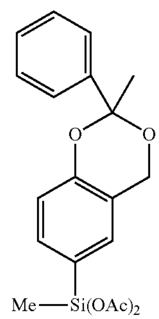
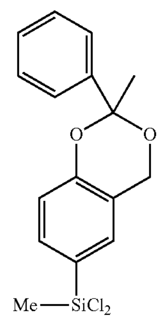
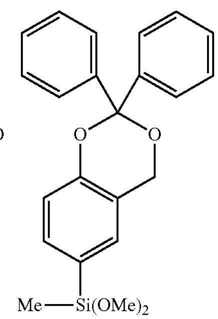
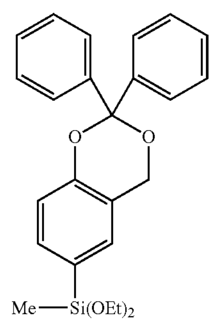
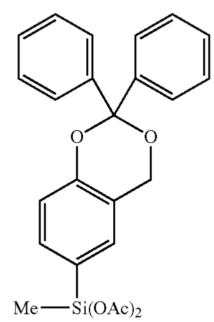
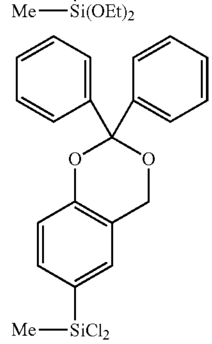
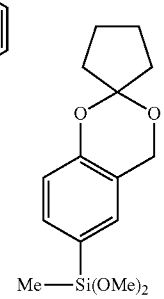
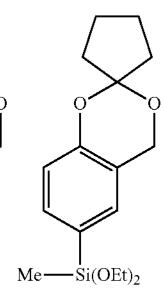

-continued
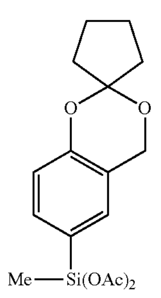
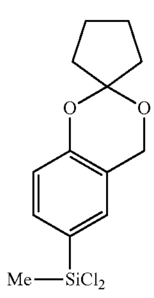
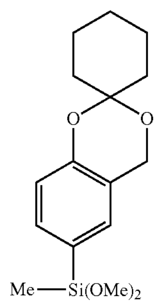
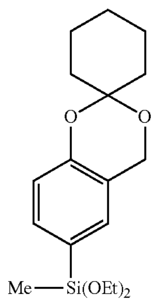
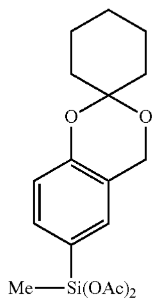
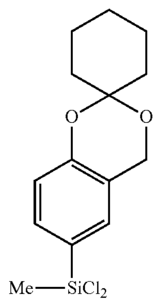
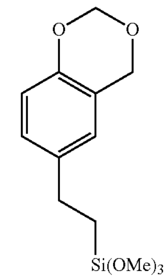
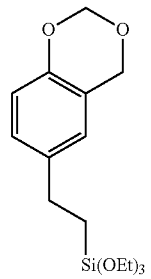
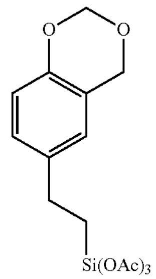
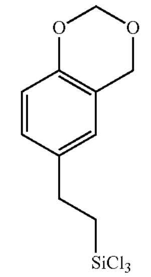
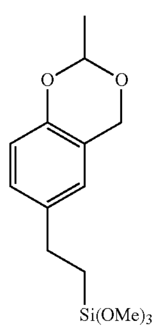
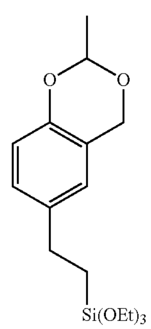
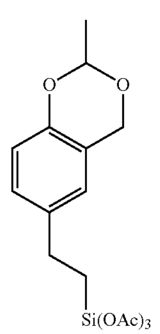
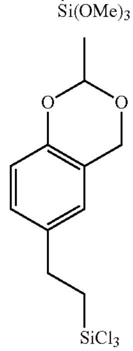
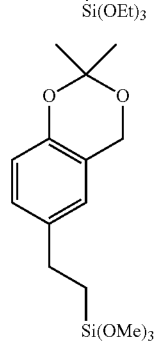
-continued
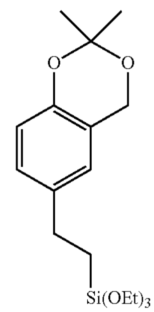
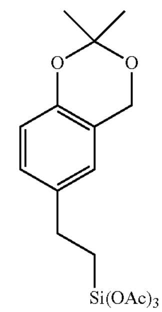
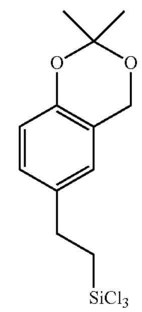
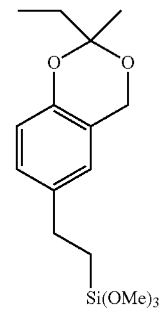
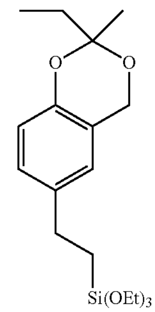
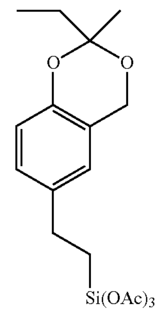
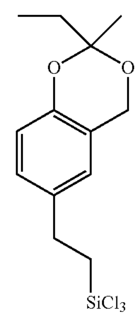
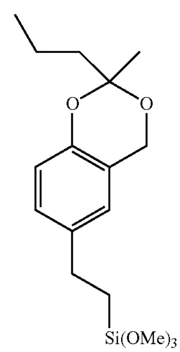
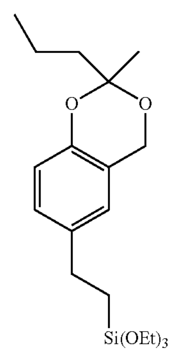
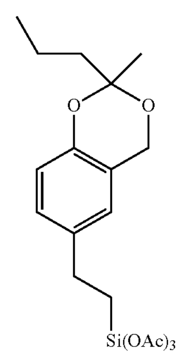
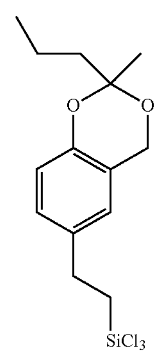
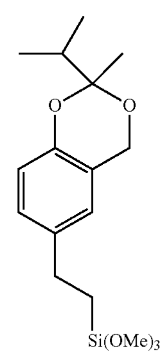
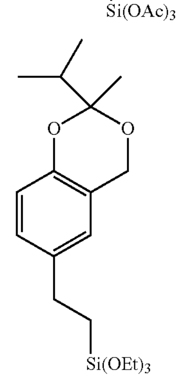
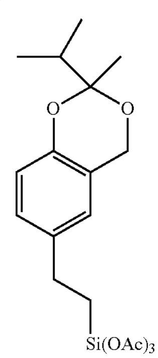
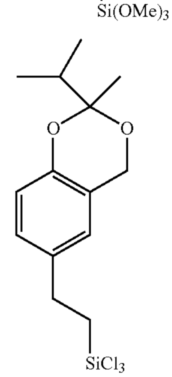

-continued
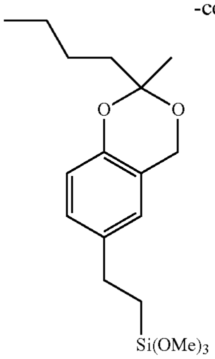
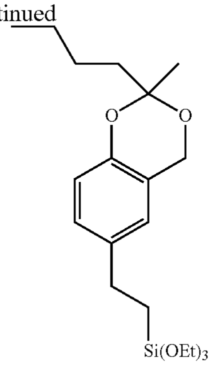
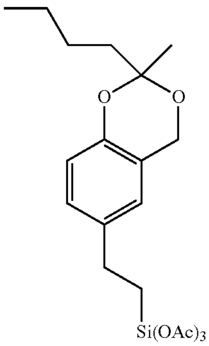
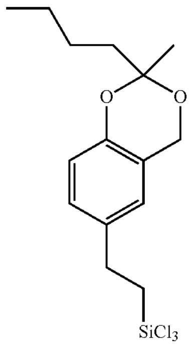
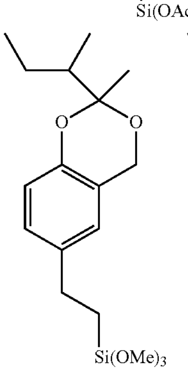
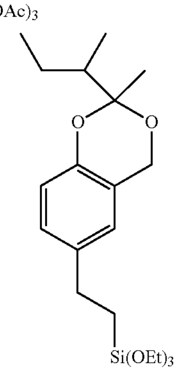
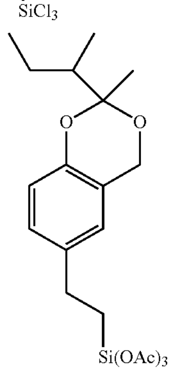
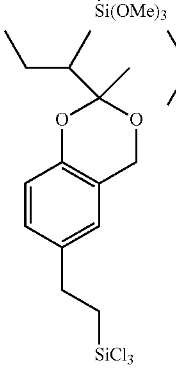
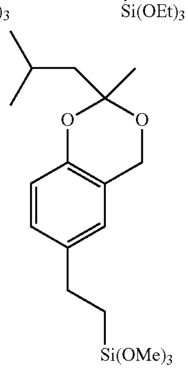
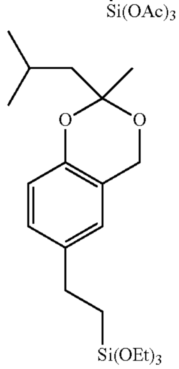
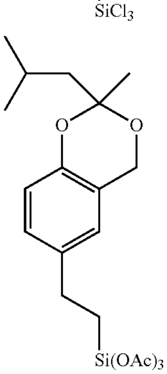
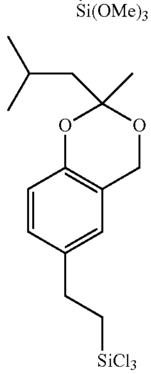
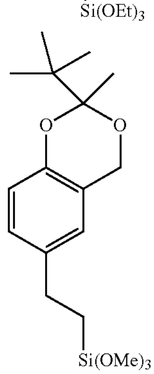
-continued
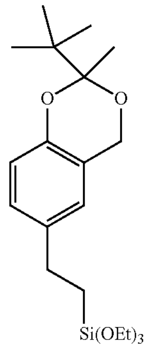
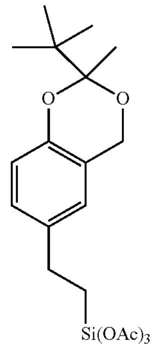
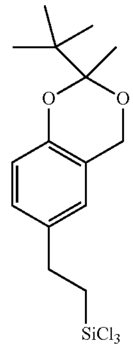
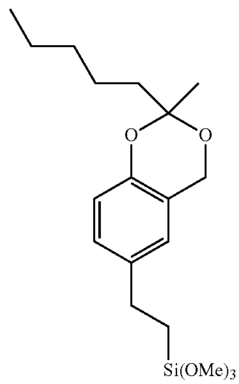
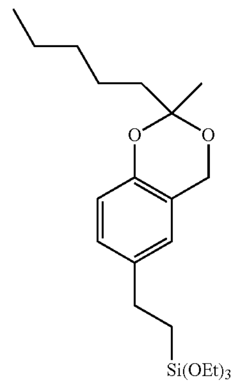
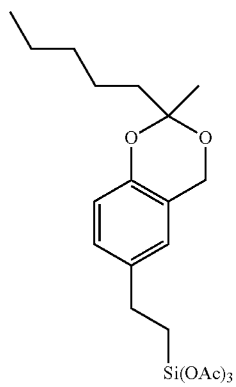
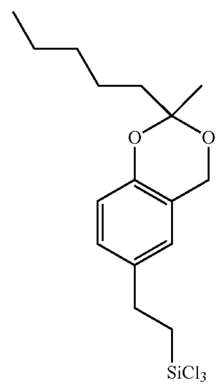
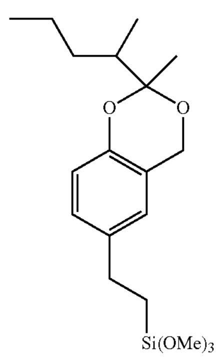
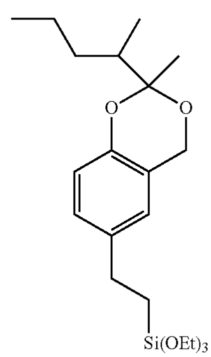

-continued
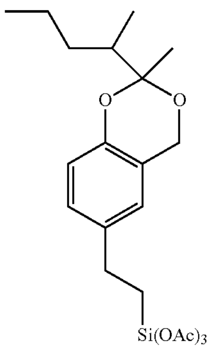
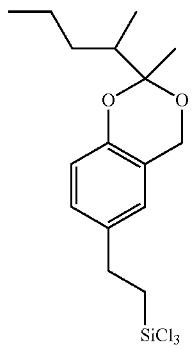
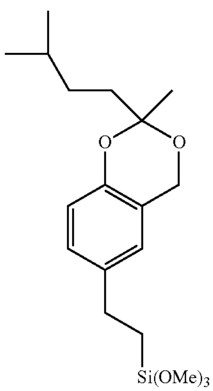
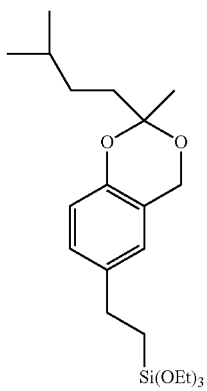
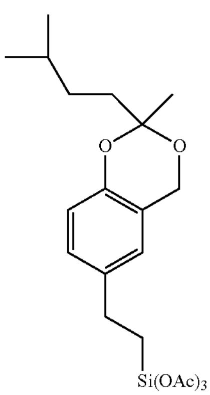
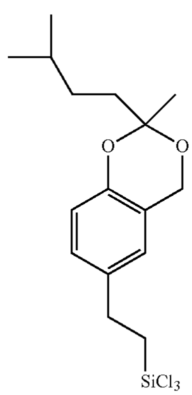
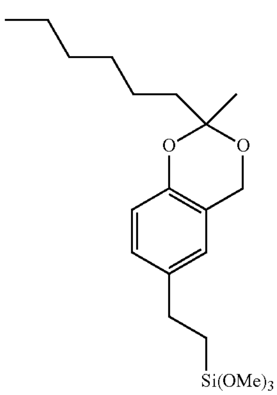
-continued
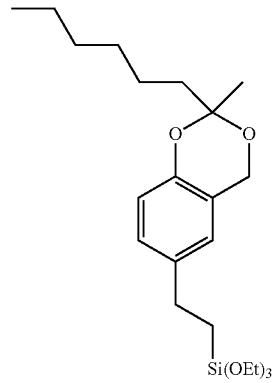
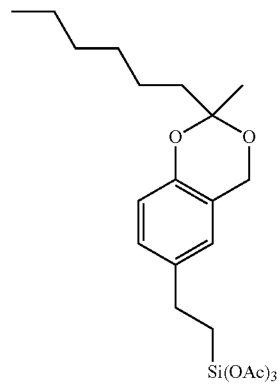
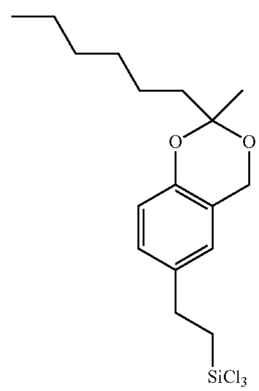
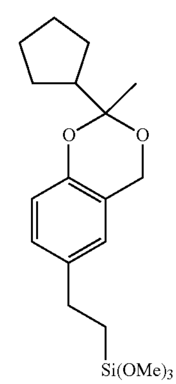
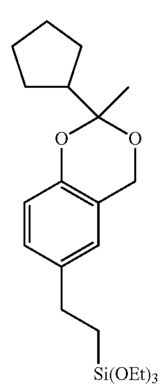
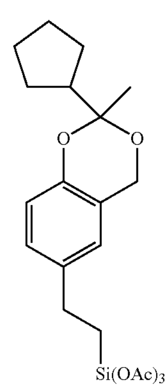
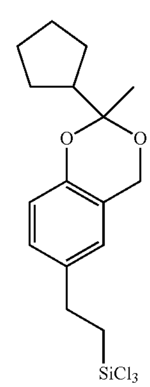

-continued
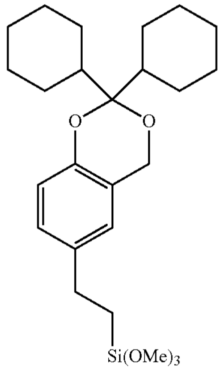
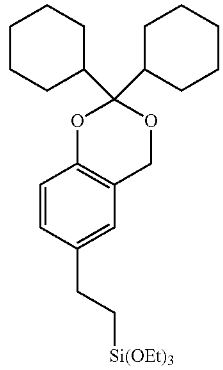
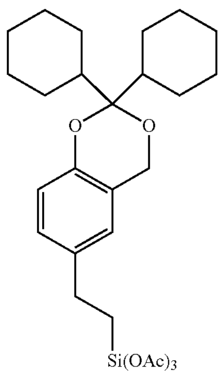
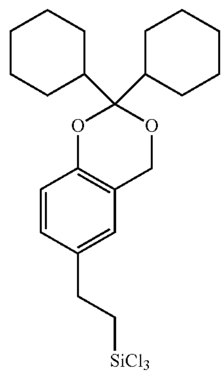
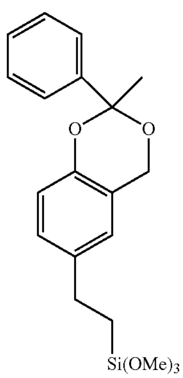
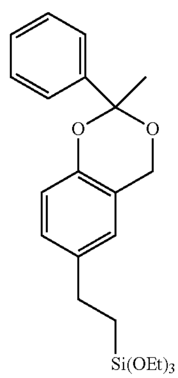
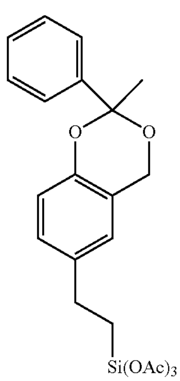
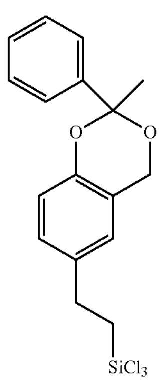
-continued
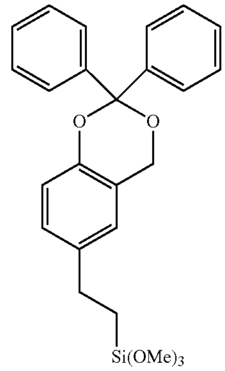
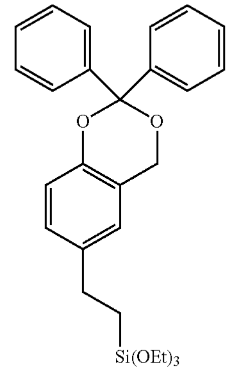
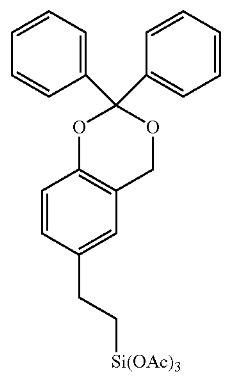
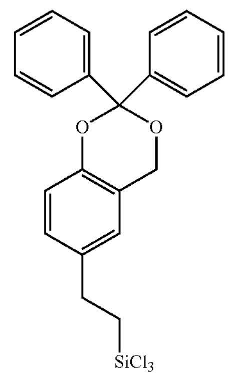
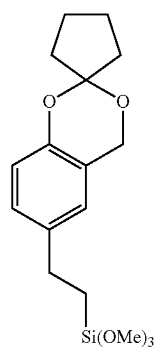
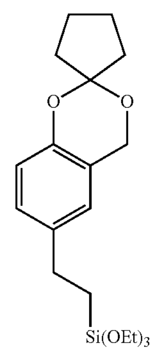
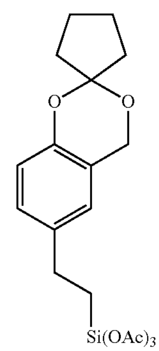
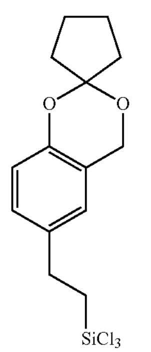
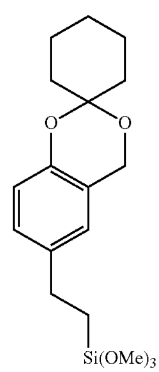

-continued
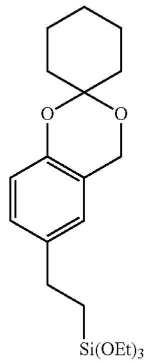
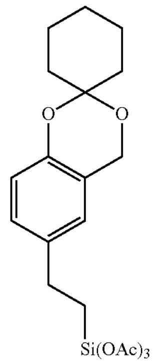
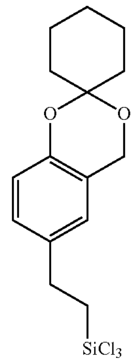
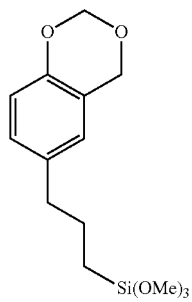
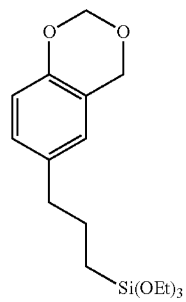
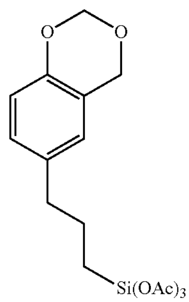
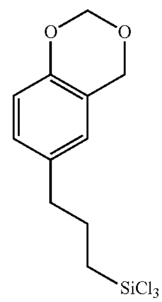
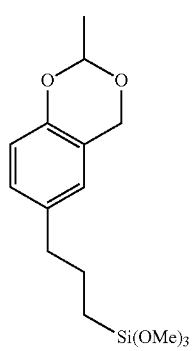
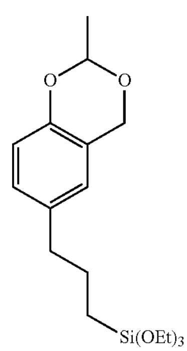
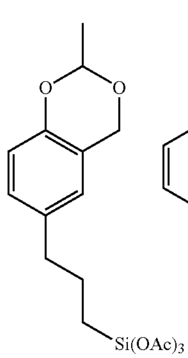
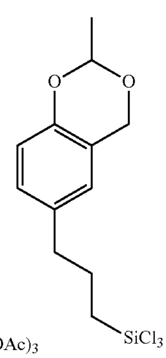
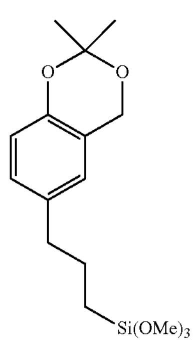
-continued
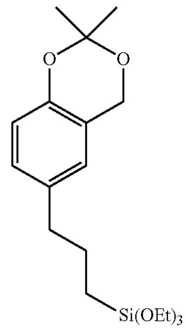
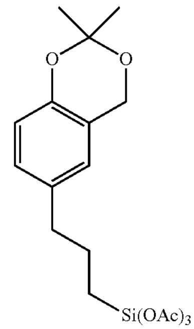
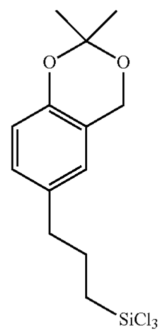
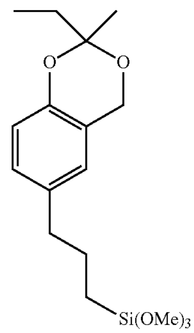
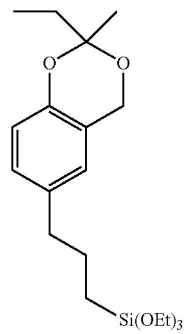
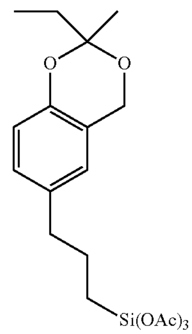
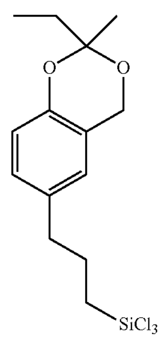
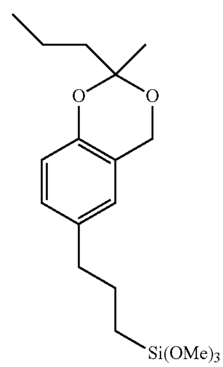
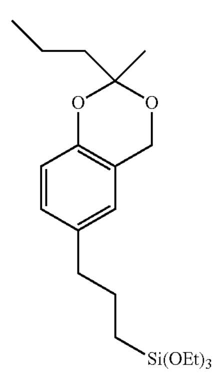
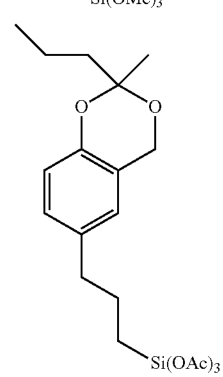

-continued
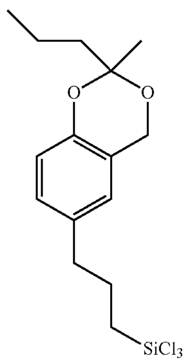
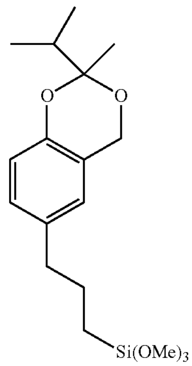
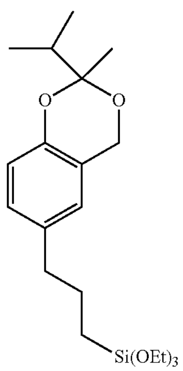
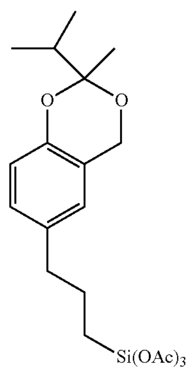
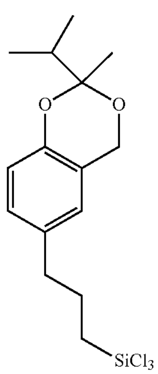
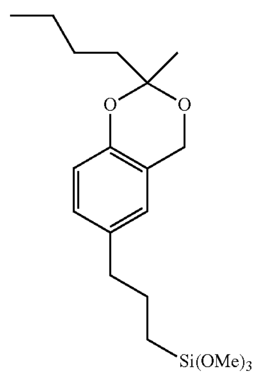
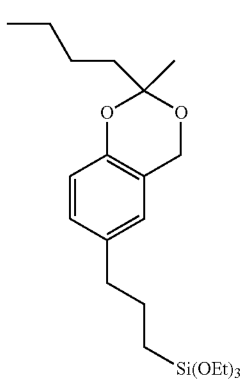
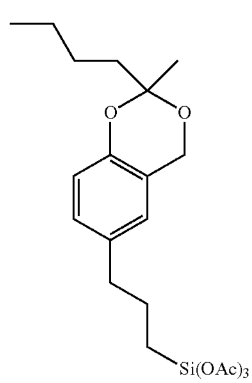
-continued
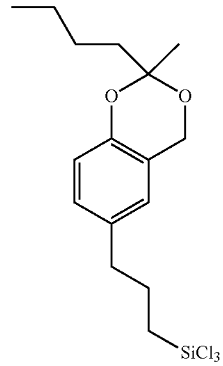
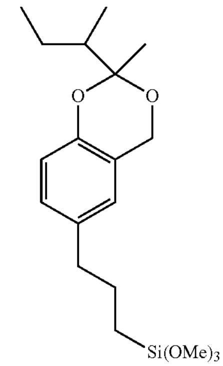
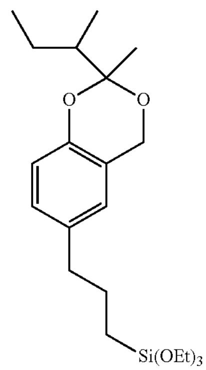
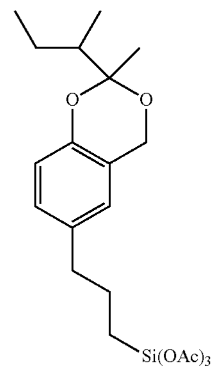
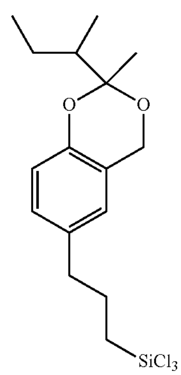
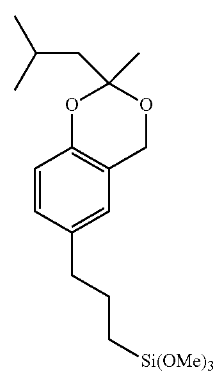
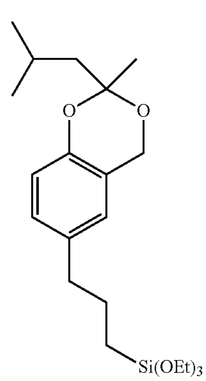
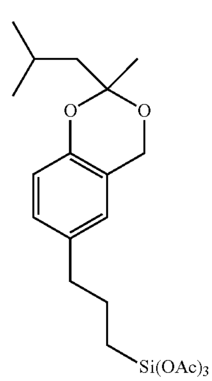

-continued
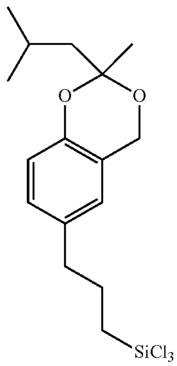
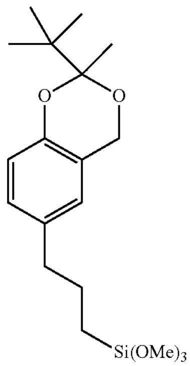
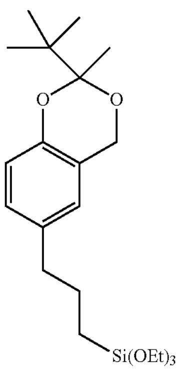
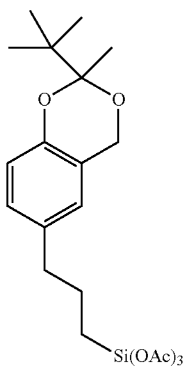
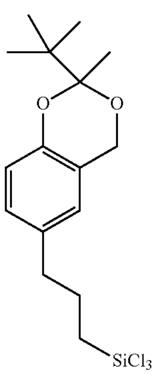
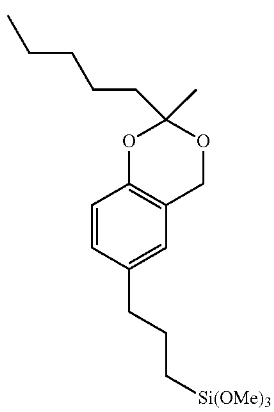
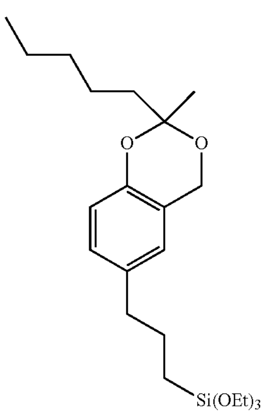
-continued
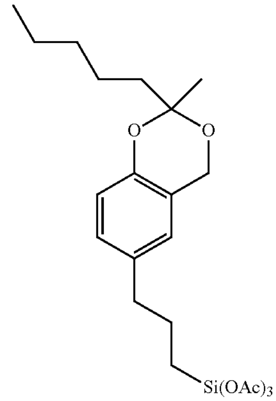
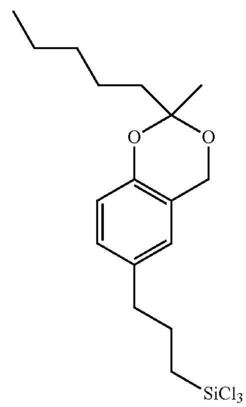
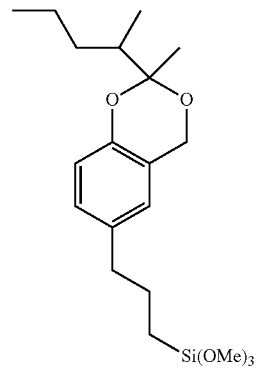
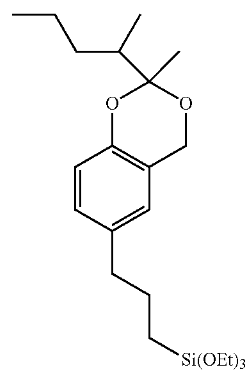
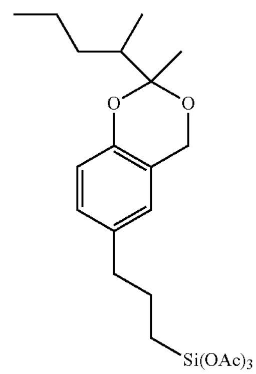
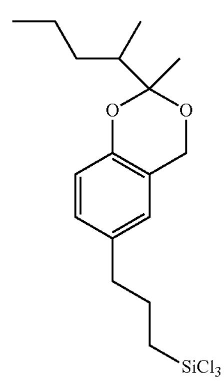
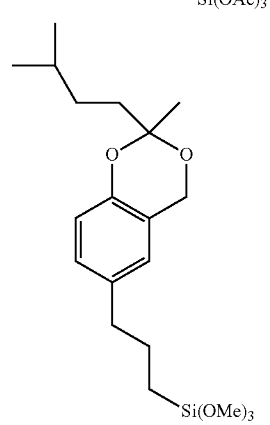

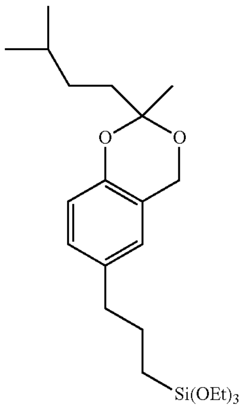
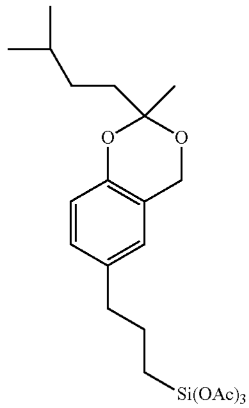
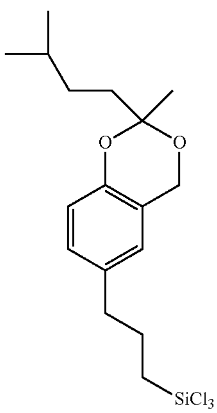
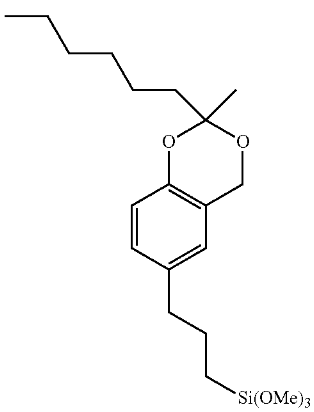
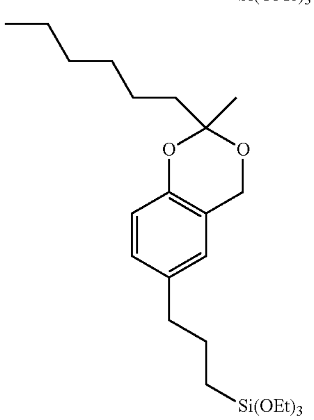
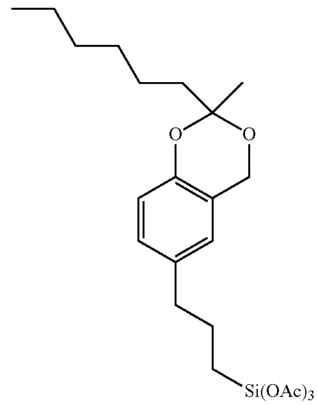
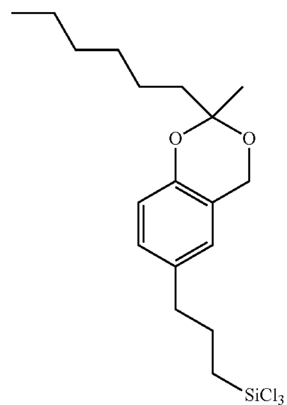
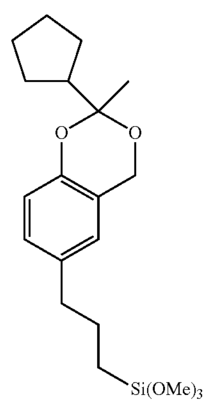
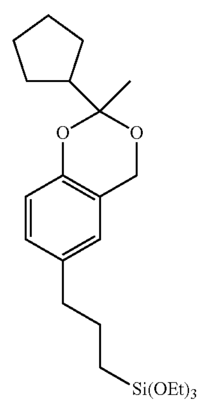
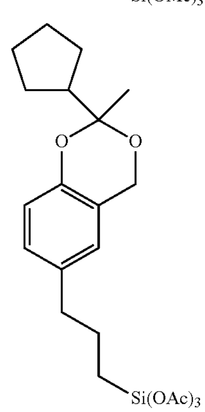
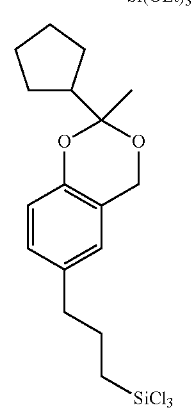

-continued
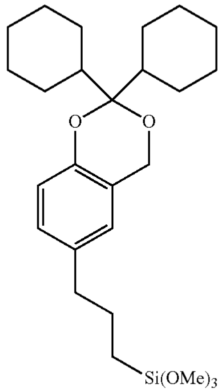
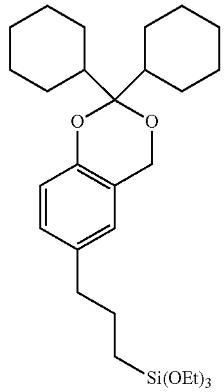
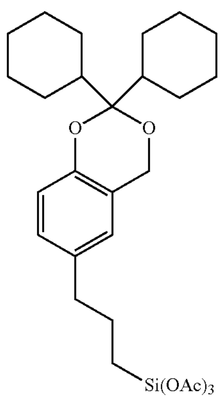
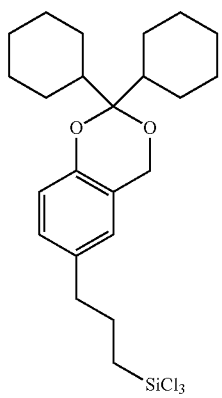
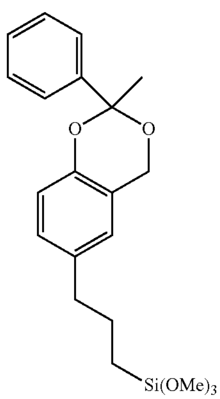
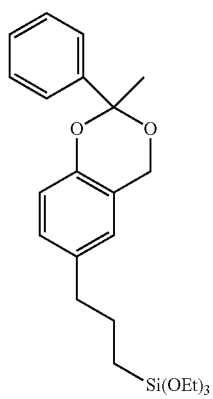
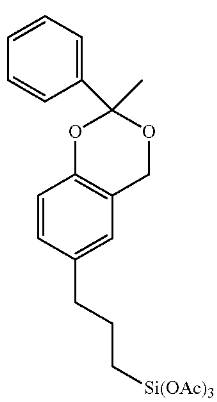
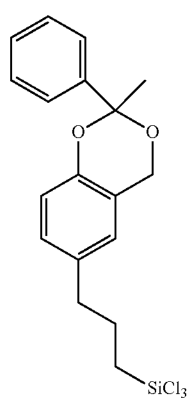
-continued
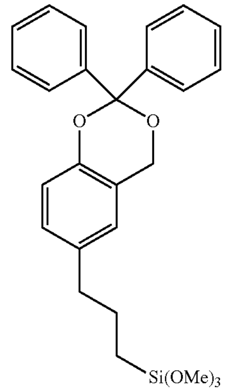
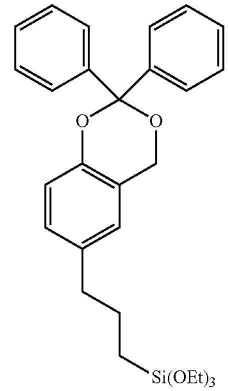
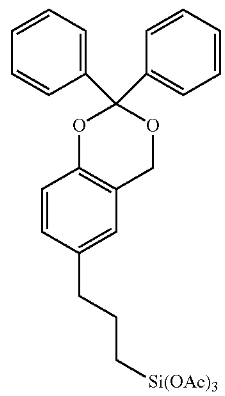
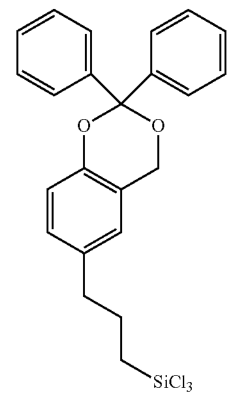
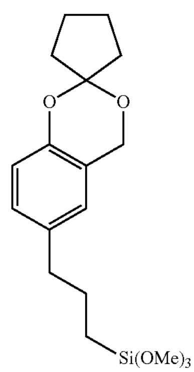
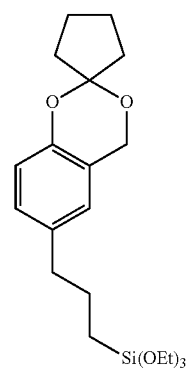
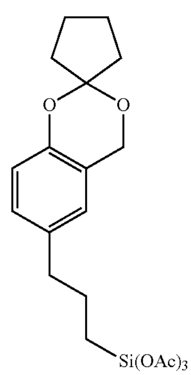
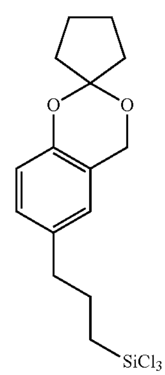

-continued
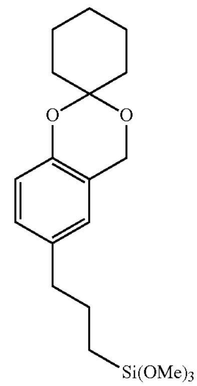
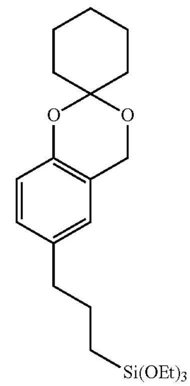
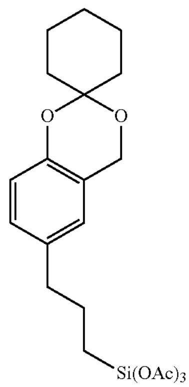
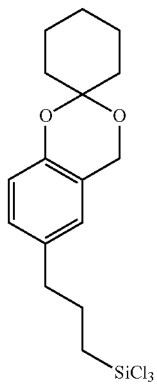
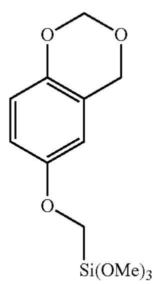
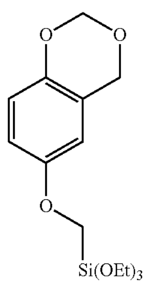
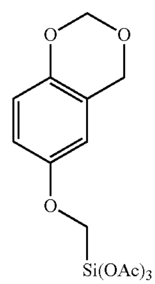
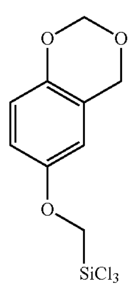
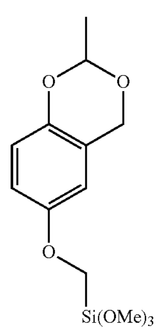
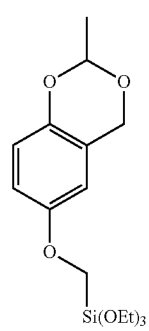
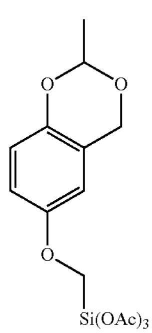
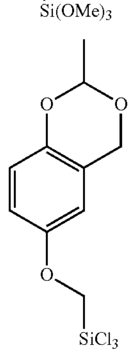
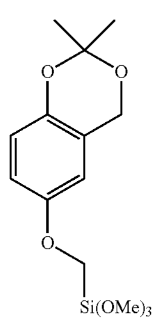
-continued
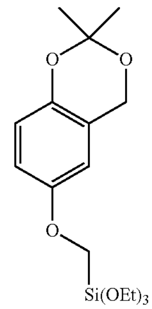
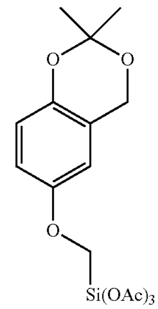
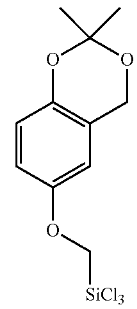
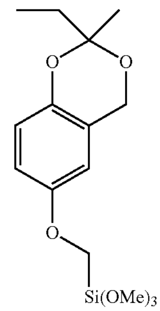
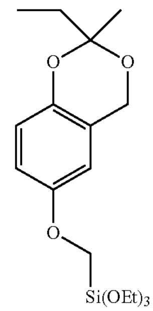
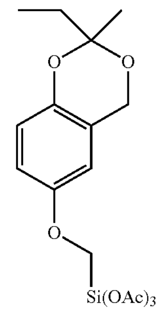
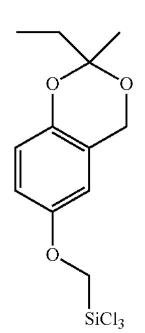
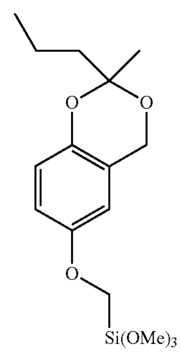
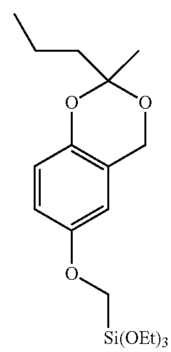
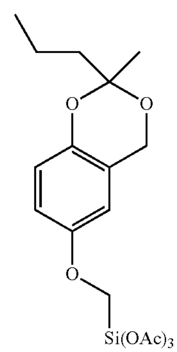
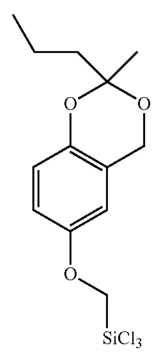
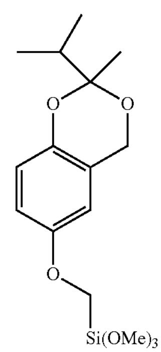
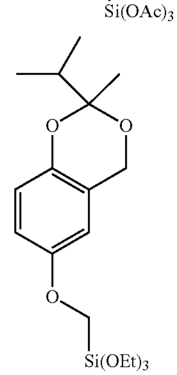
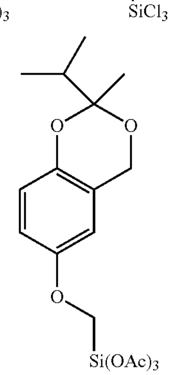
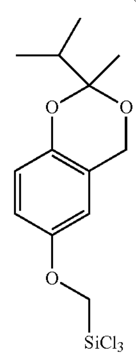

-continued
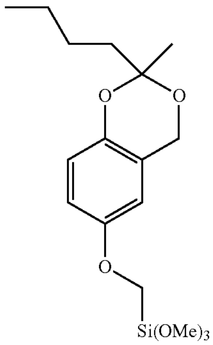
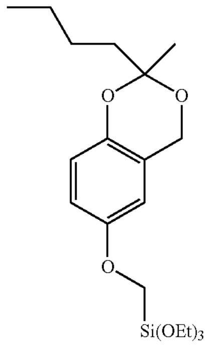
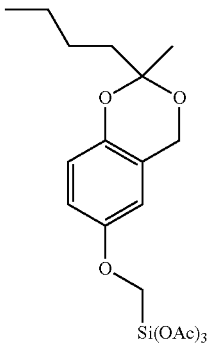
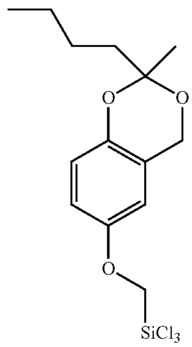
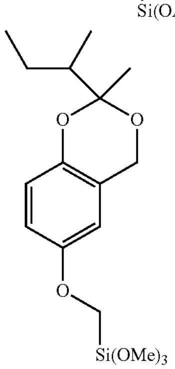
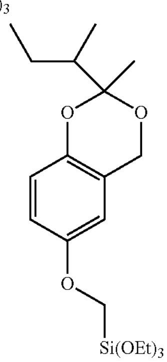
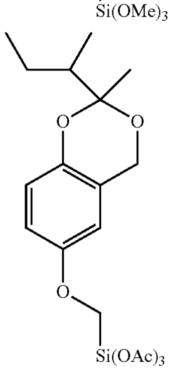
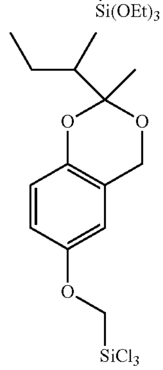
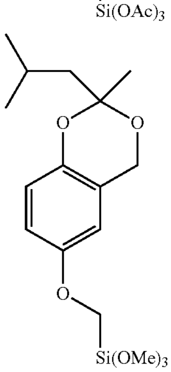
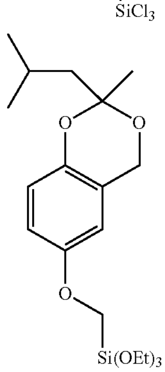
-continued
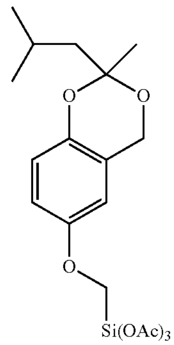
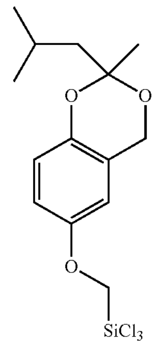
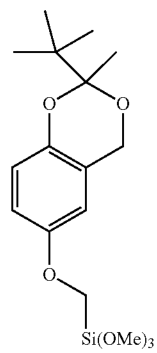
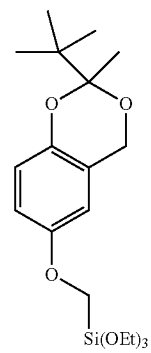
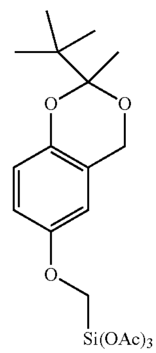
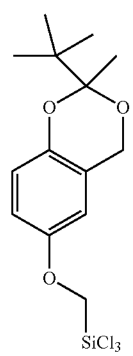
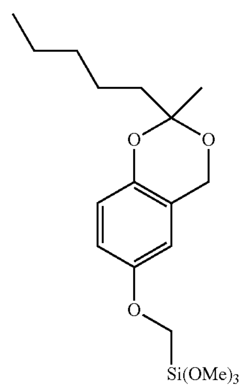
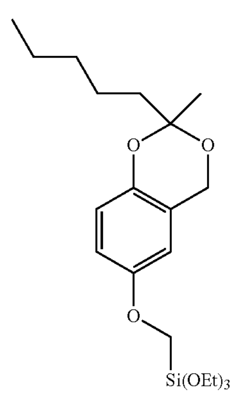
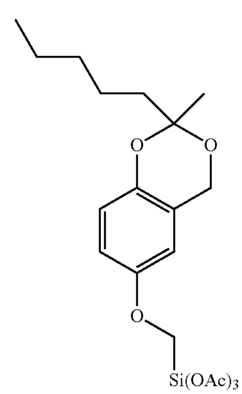

-continued
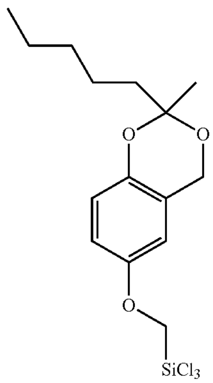
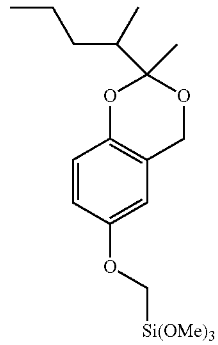
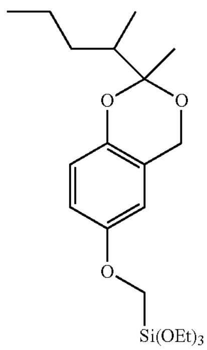
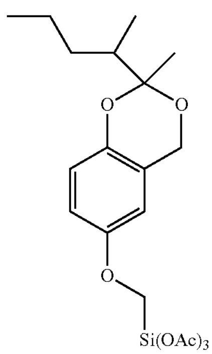
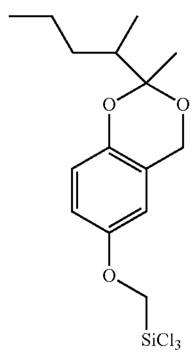
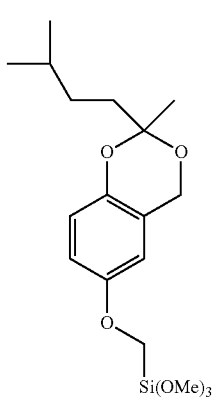
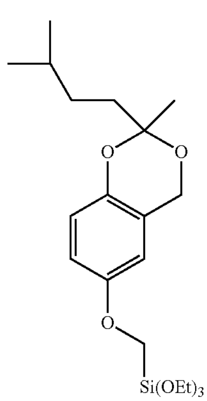
-continued
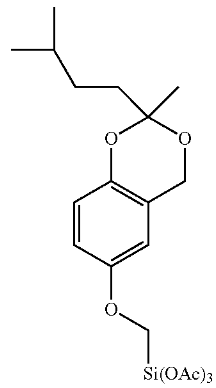
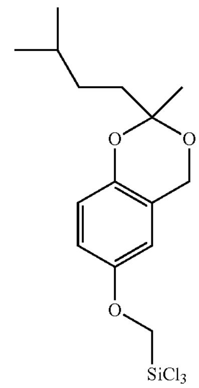
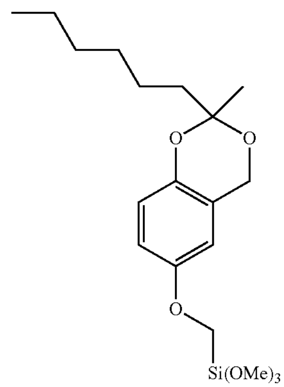
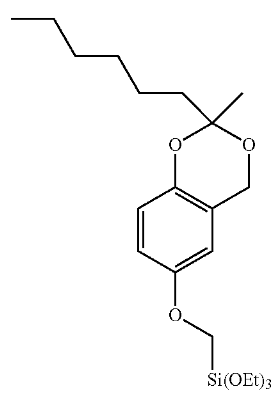
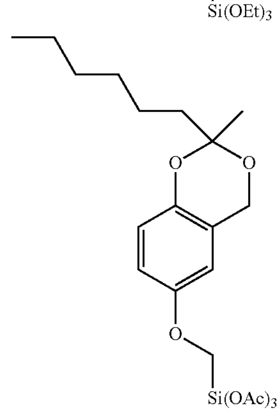

-continued
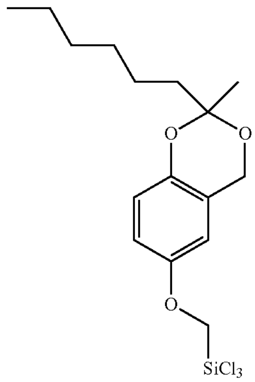
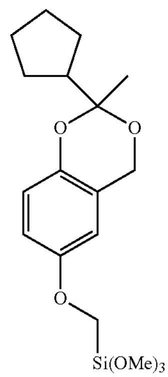
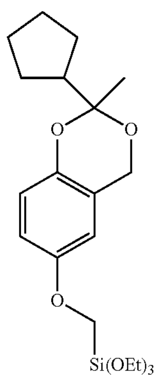
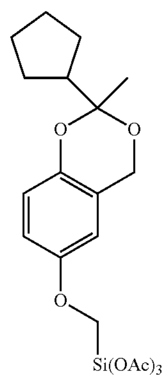
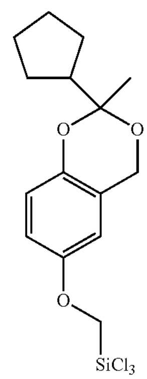
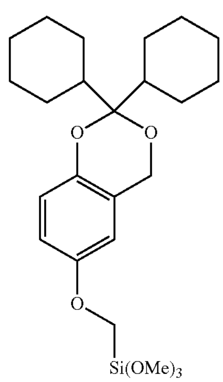
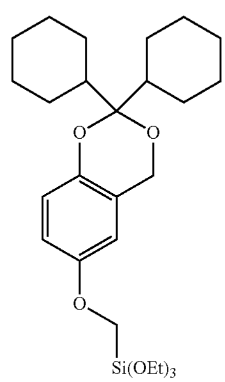
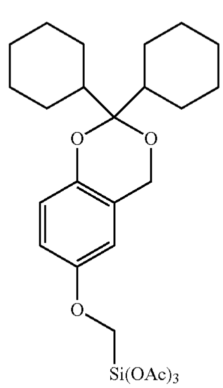
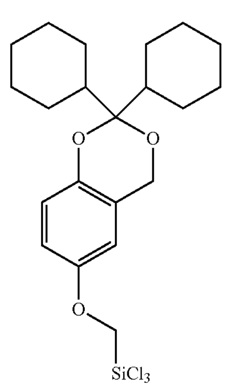
-continued
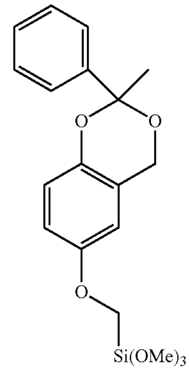
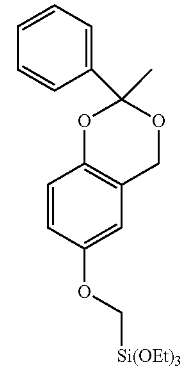
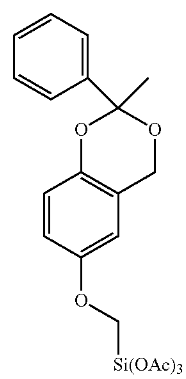
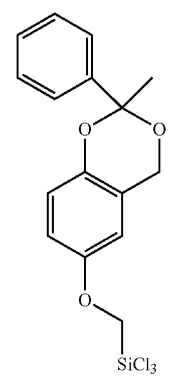
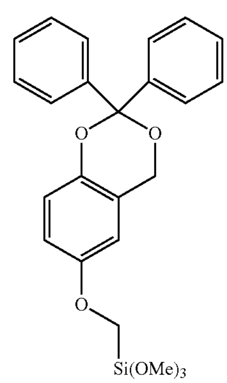
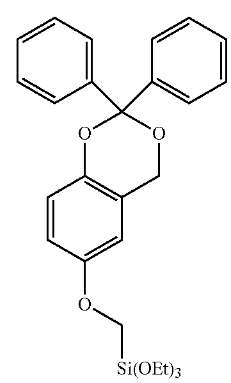
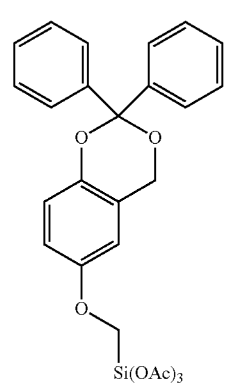
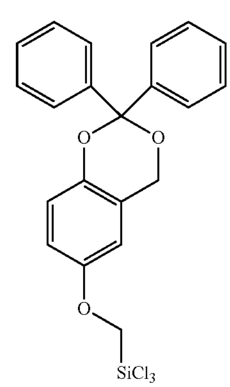

-continued
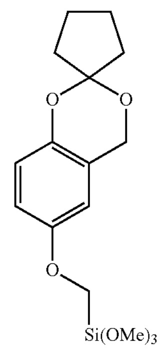
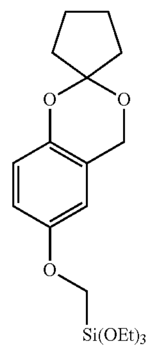
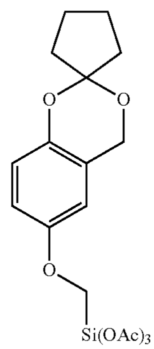
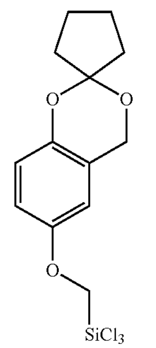
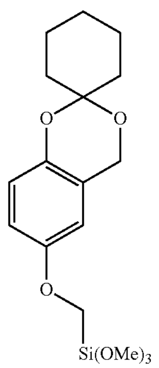
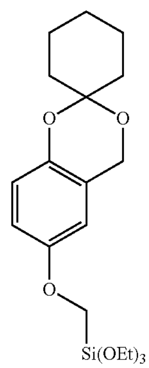
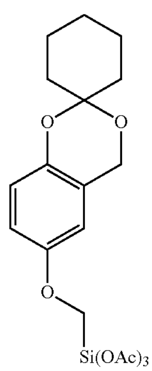
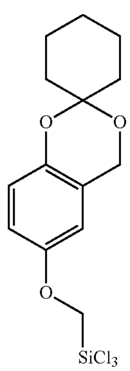
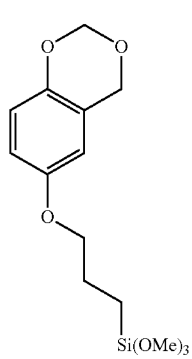
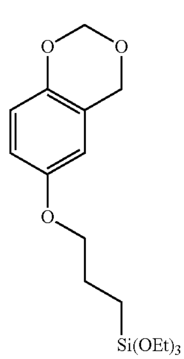
-continued
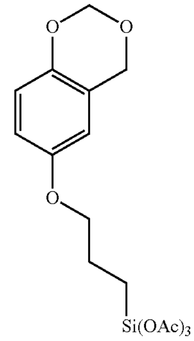
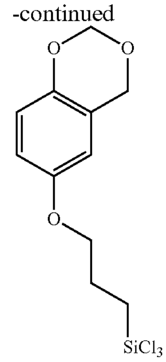
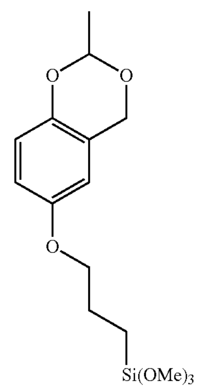
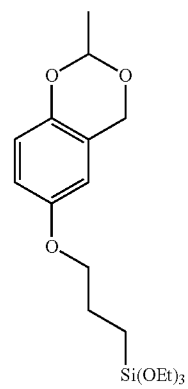
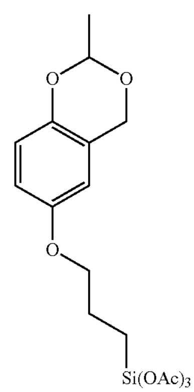
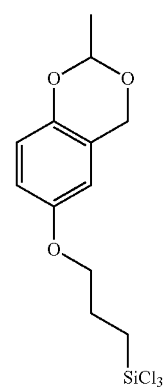
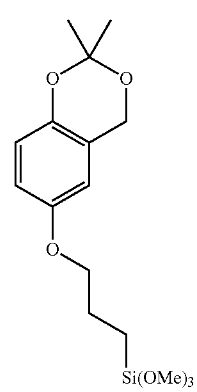
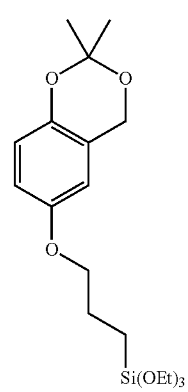

-continued
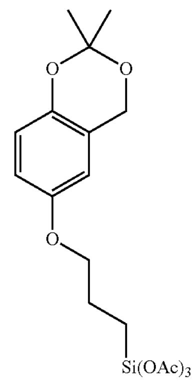
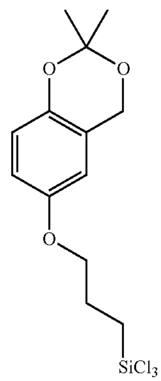
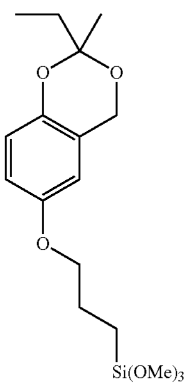
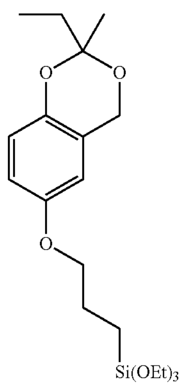
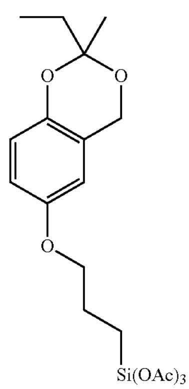
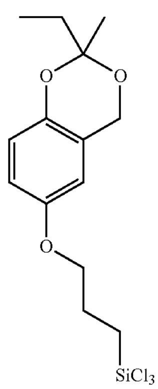
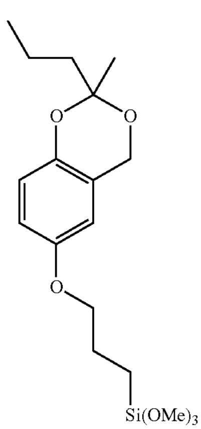
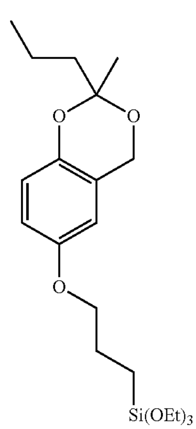
-continued
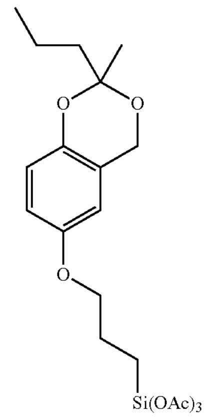
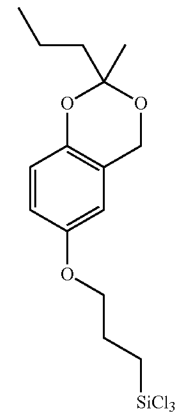
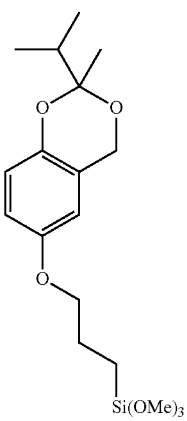
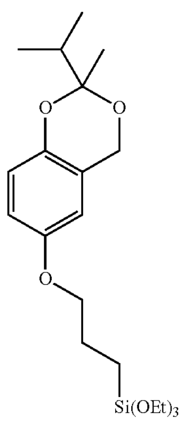
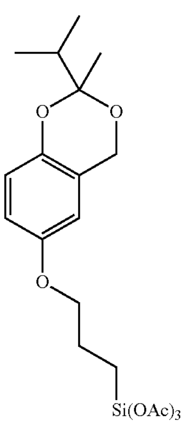
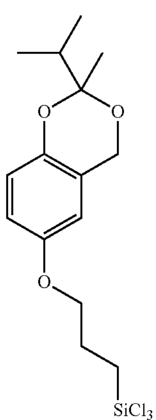
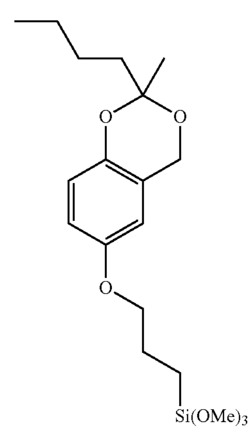
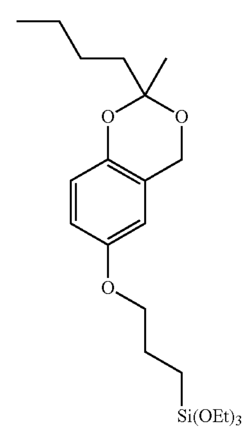

-continued
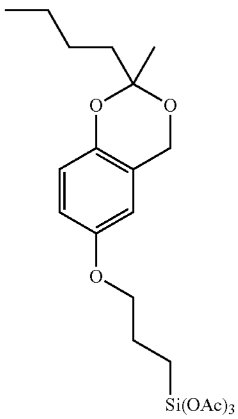
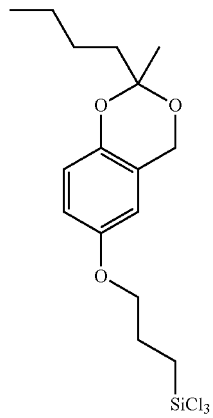
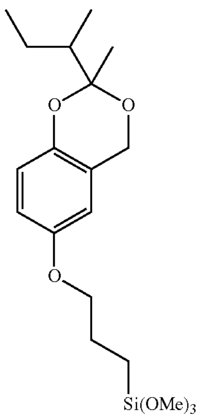
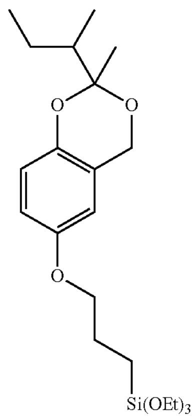
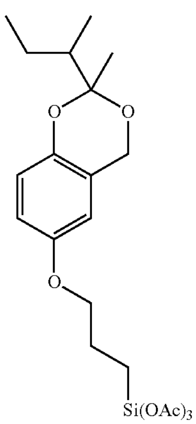
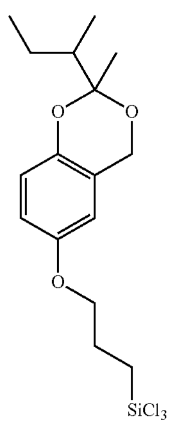
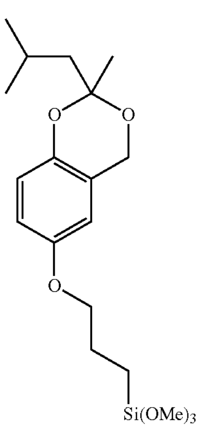
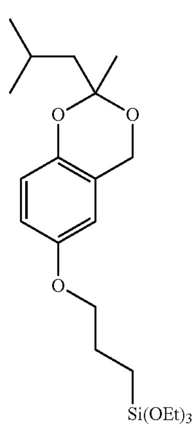
-continued
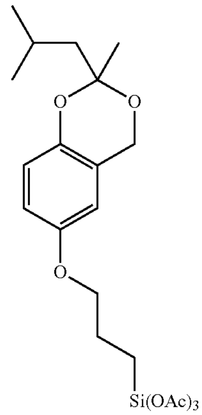
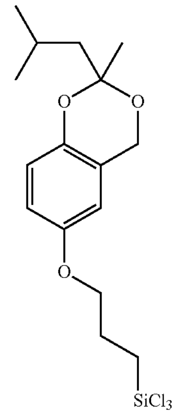
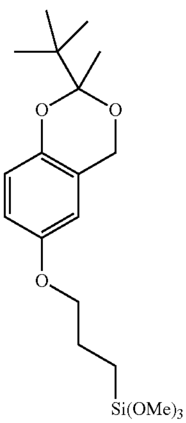
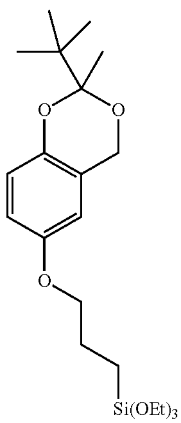
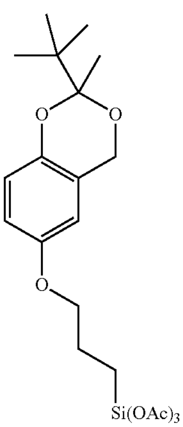
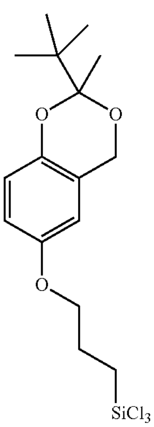
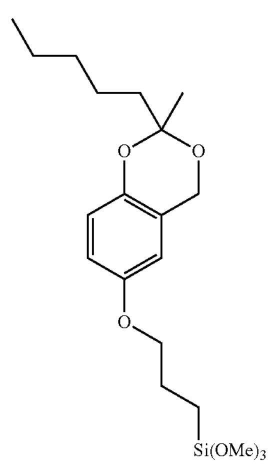
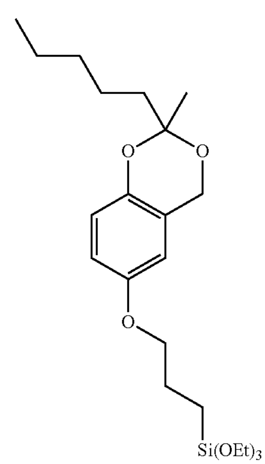

-continued
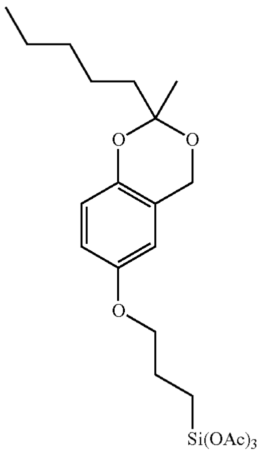
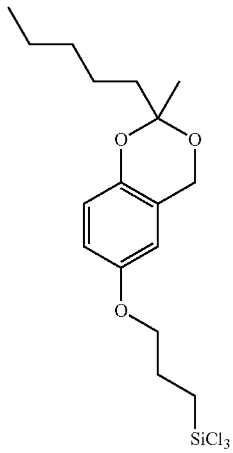
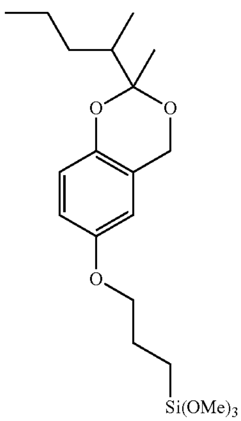
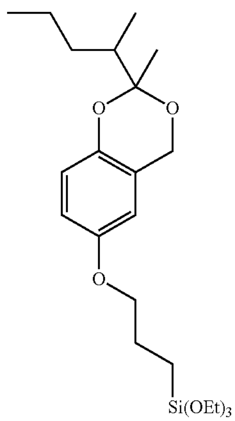
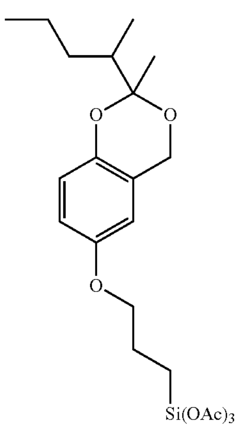
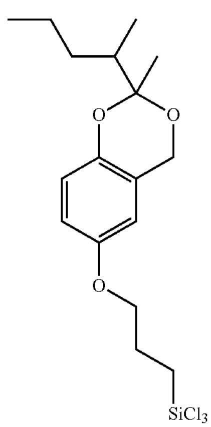
-continued
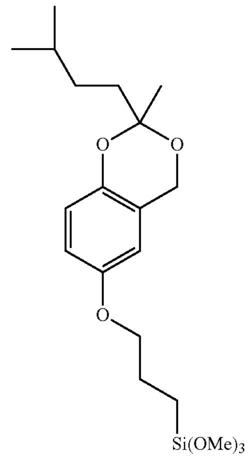
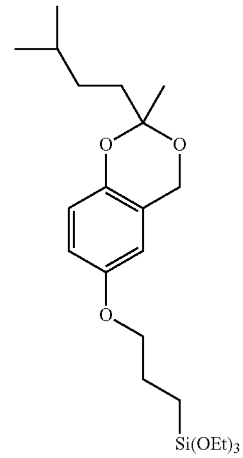
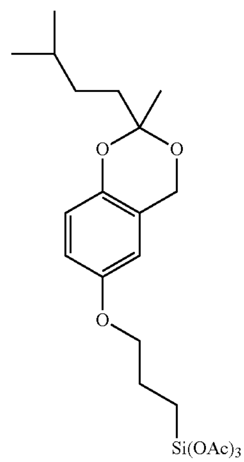
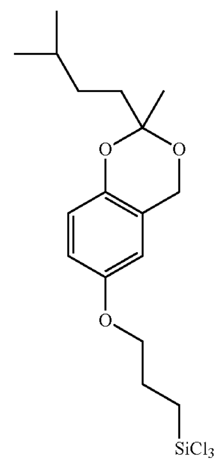
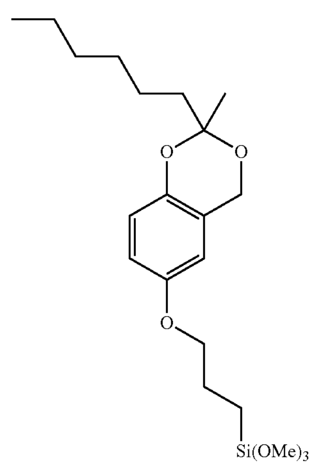

-continued
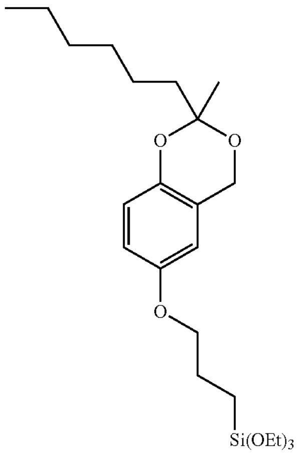
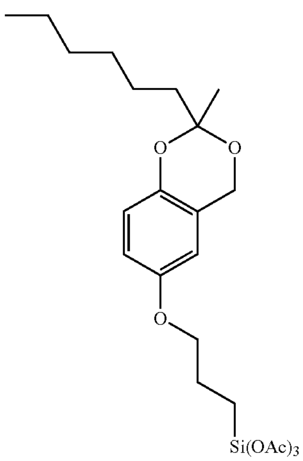
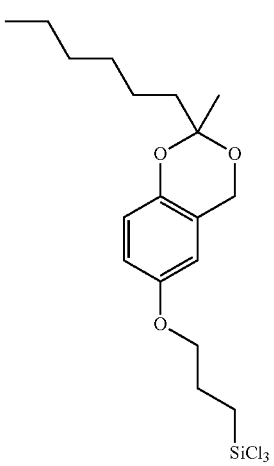
-continued
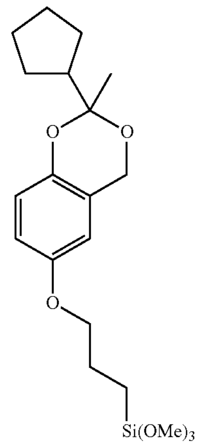
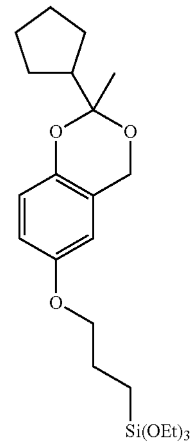
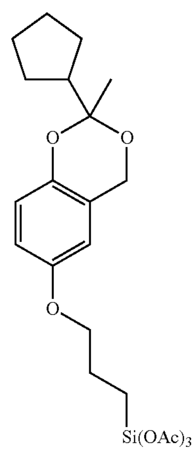
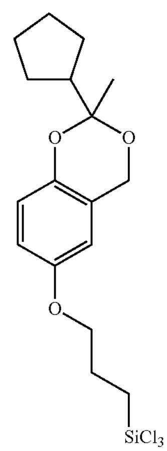
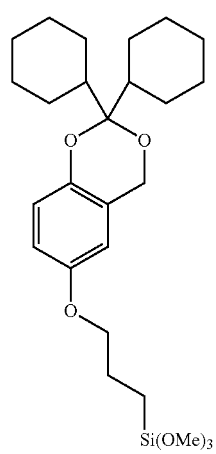
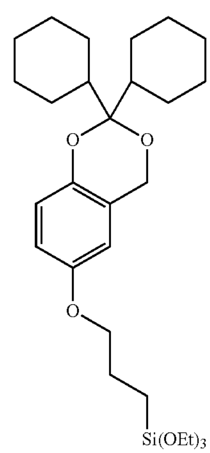

-continued
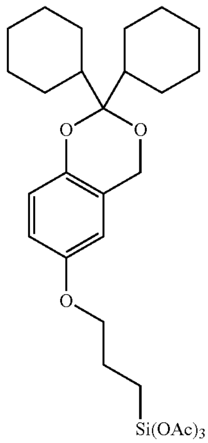
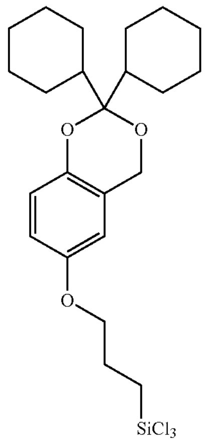
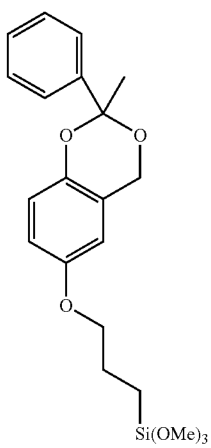
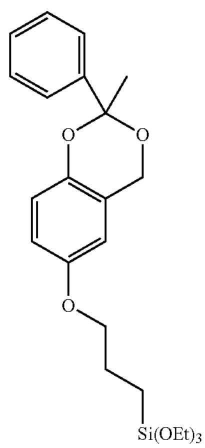
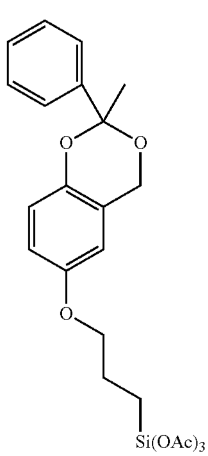
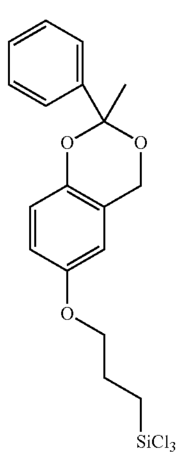
-continued
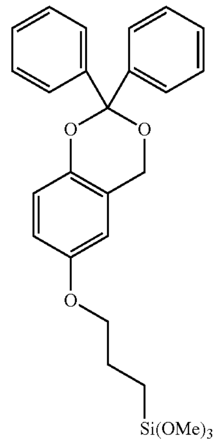
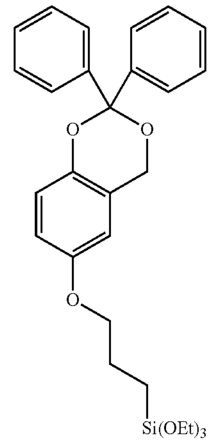
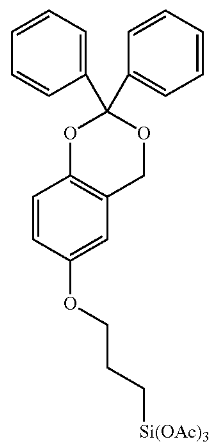
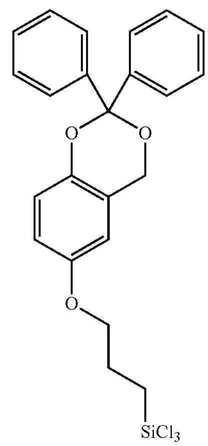
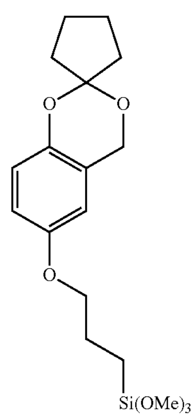
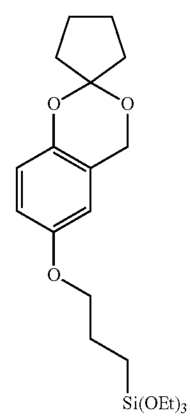
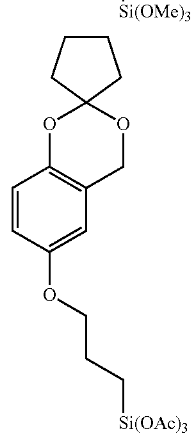
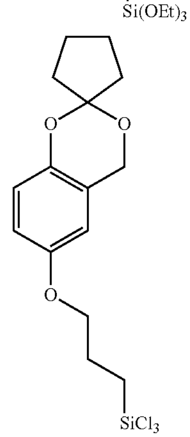

-continued
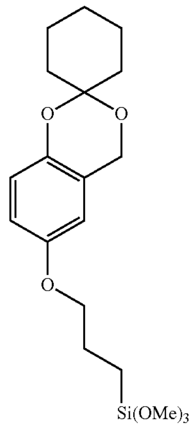
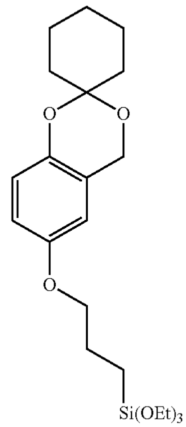
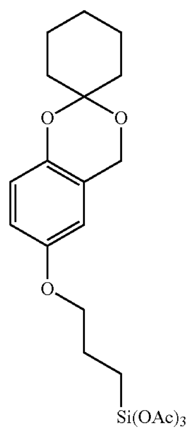
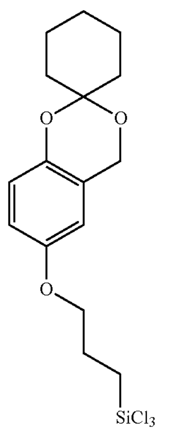
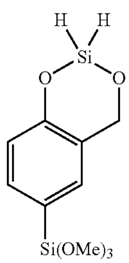
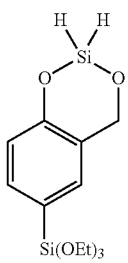
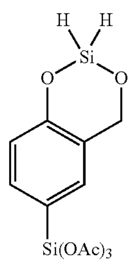
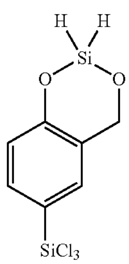
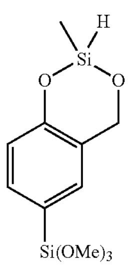
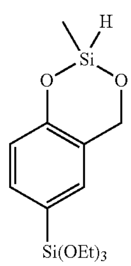
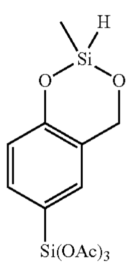
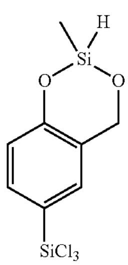
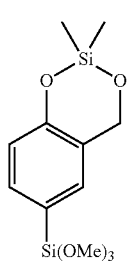
-continued
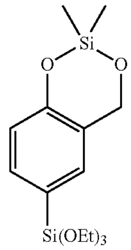
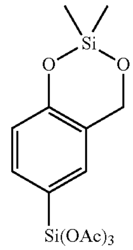
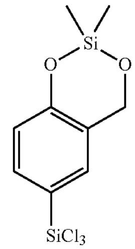
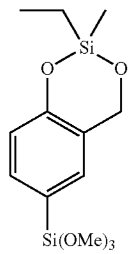
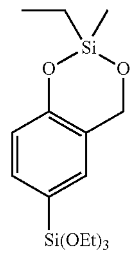
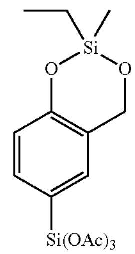
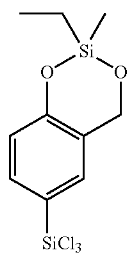
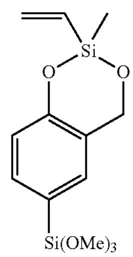
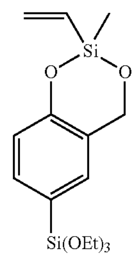
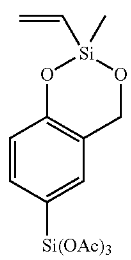
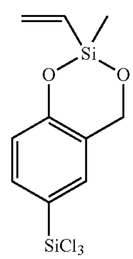
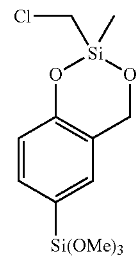
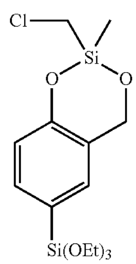
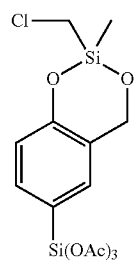
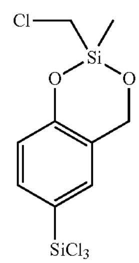
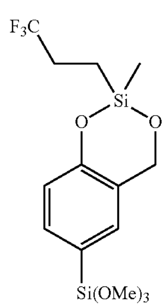
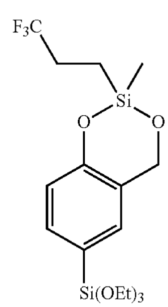
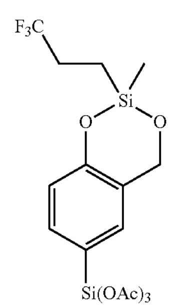

-continued
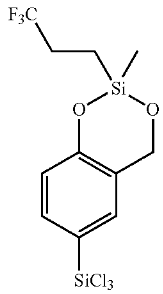
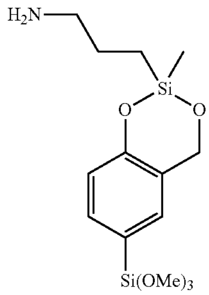
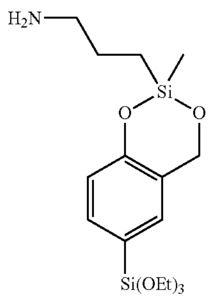
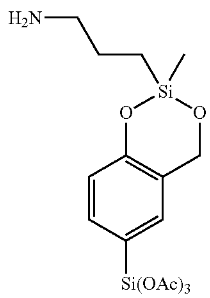
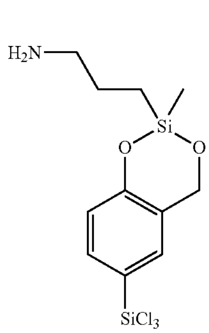
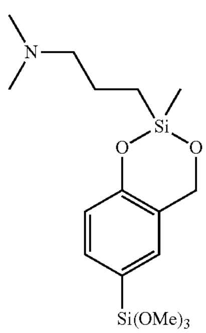
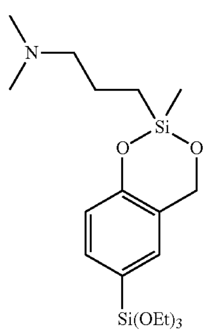
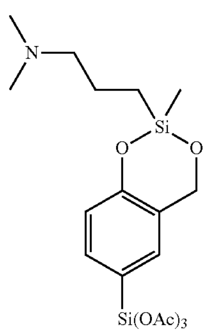
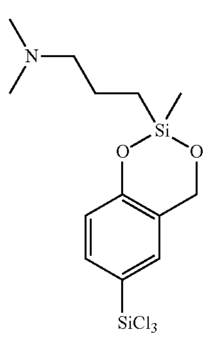
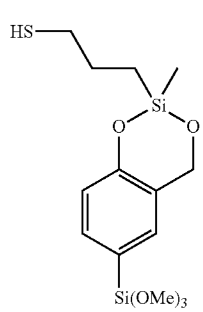
-continued
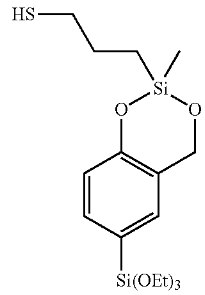
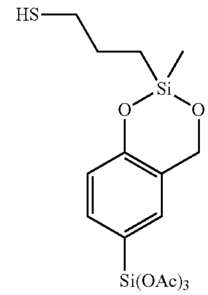
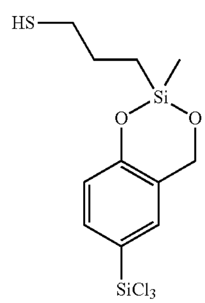
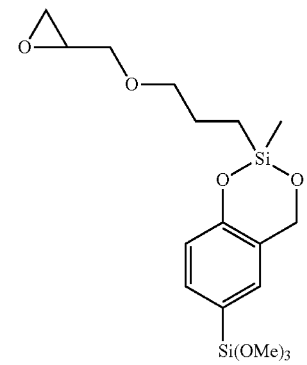
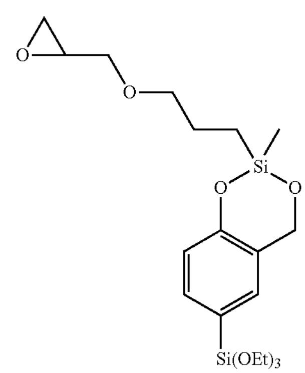
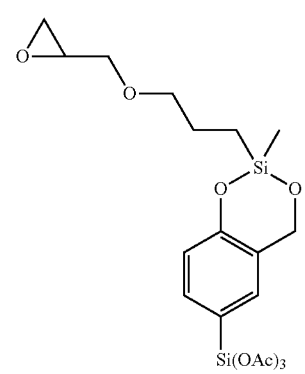

-continued
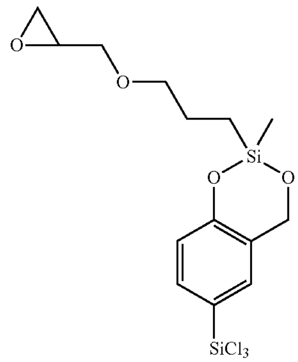
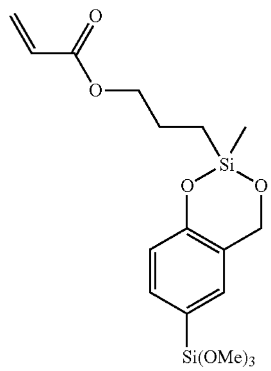
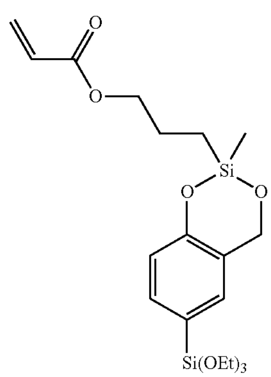
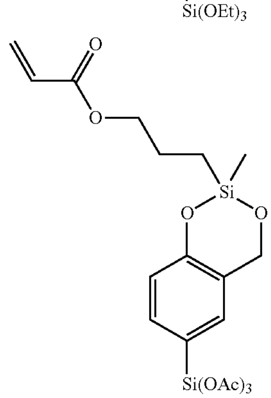
-continued
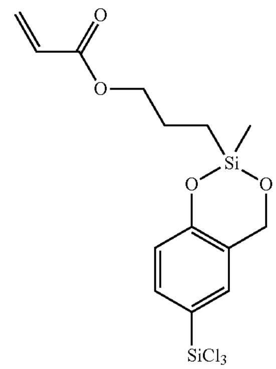
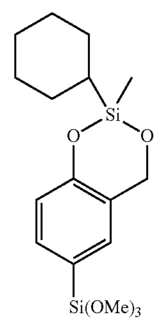
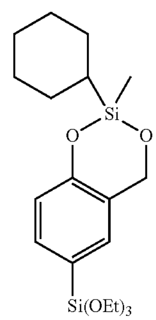
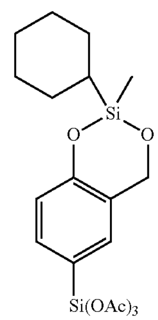
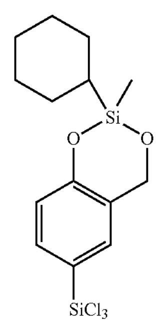
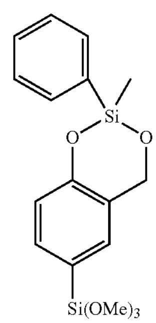
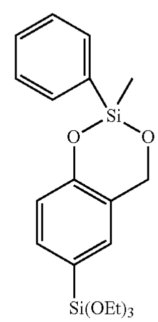
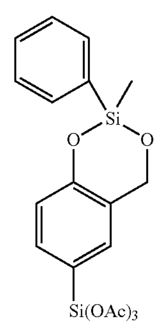
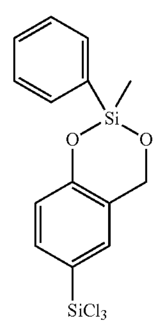
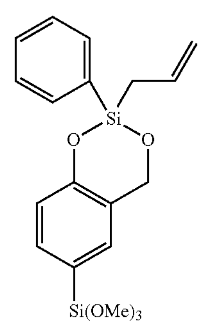
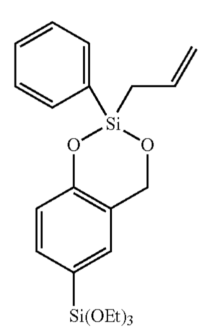
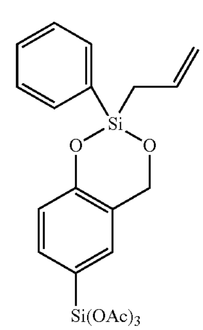

-continued
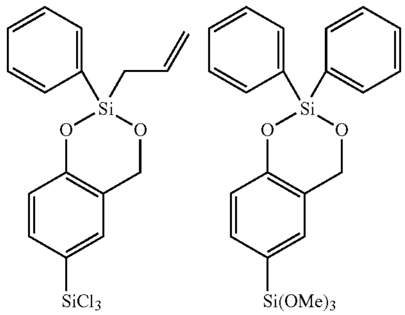
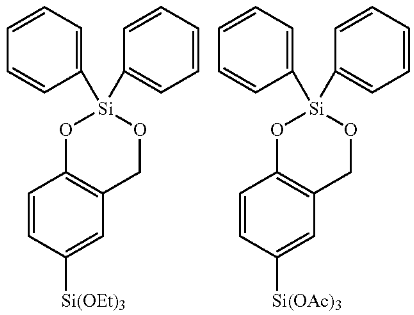
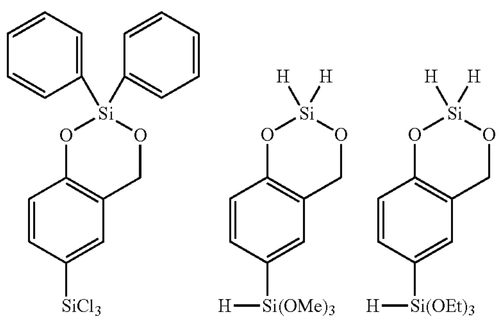
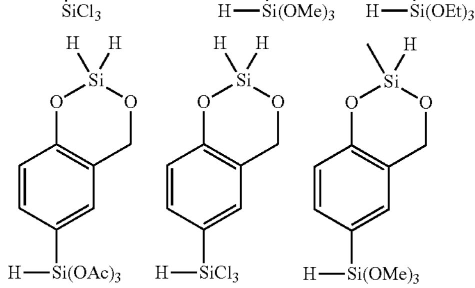
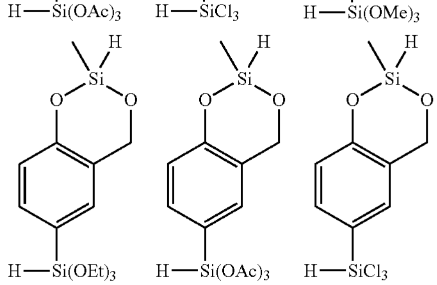
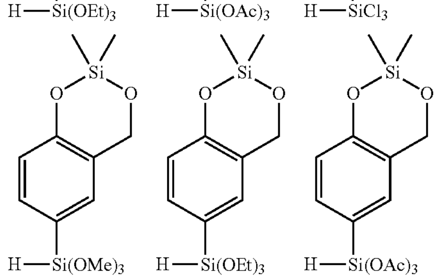
-continued
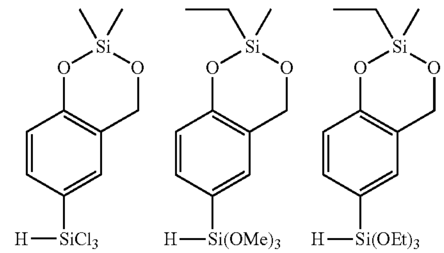
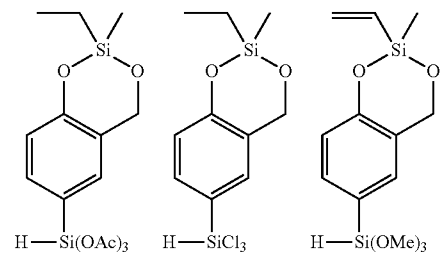
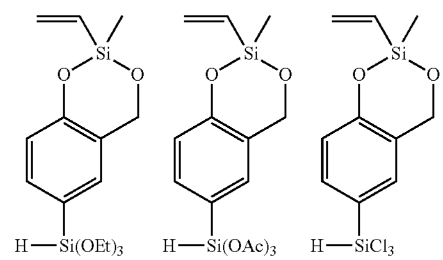
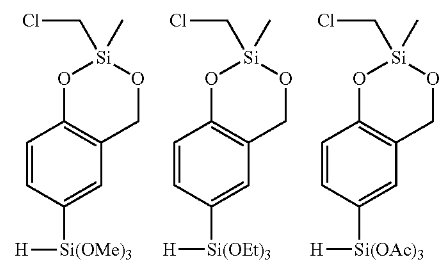
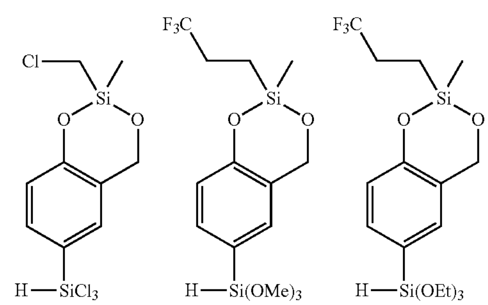
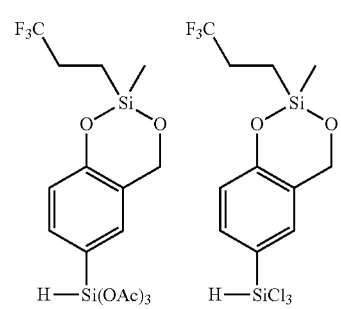

-continued
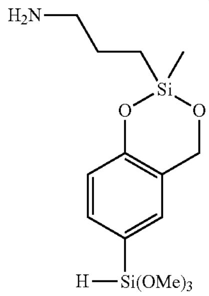
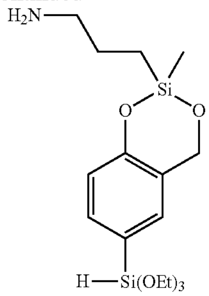
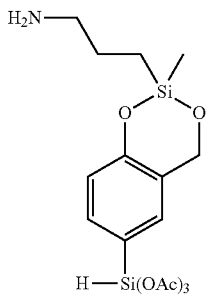
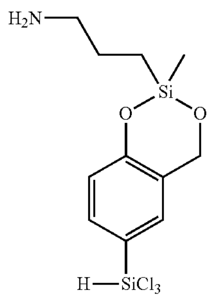
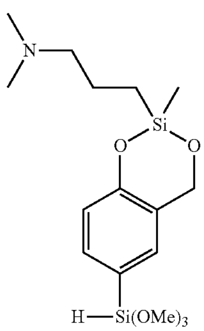
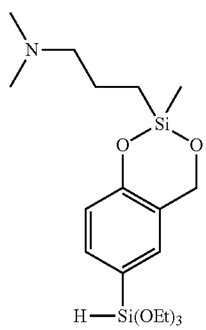
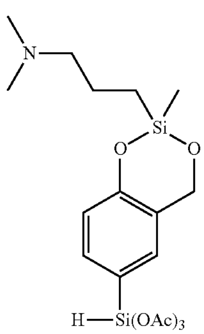
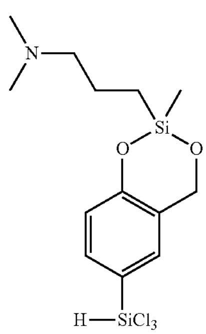
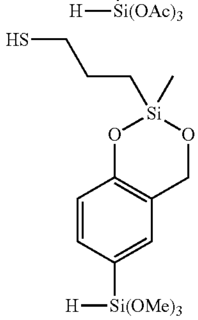
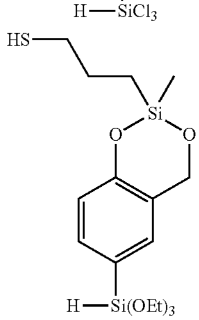
-continued
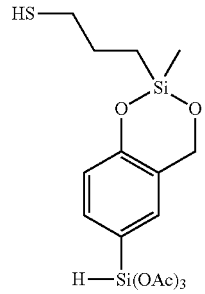
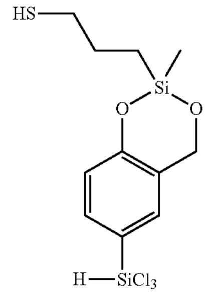
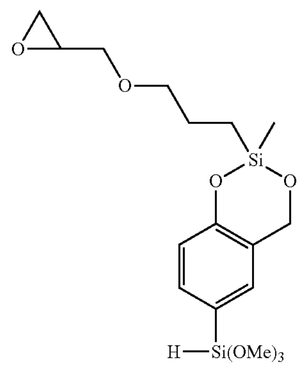
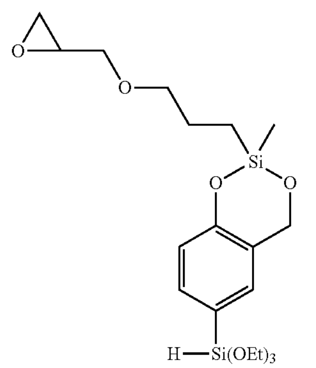
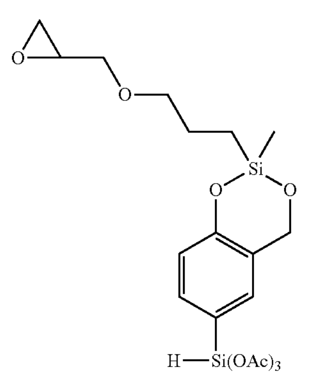

-continued
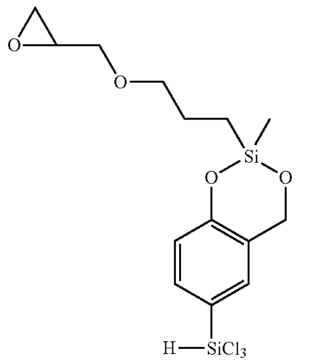
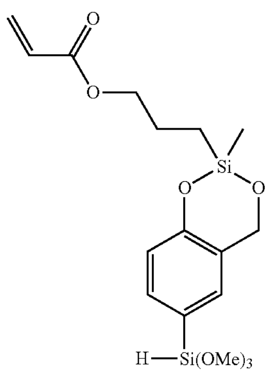
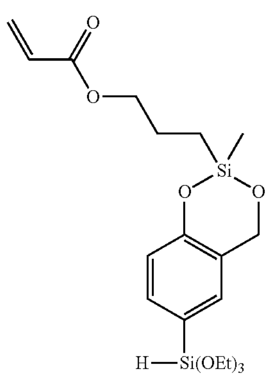
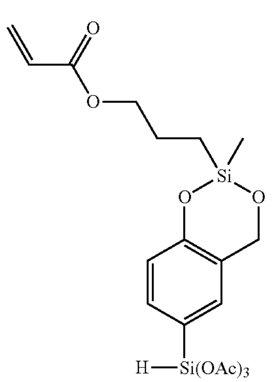
-continued
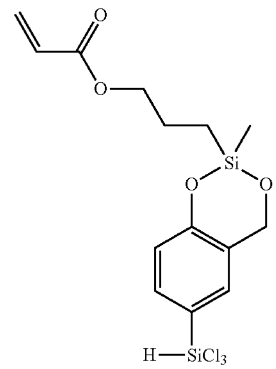
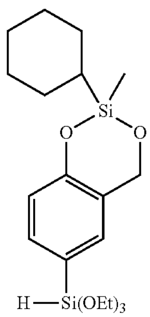
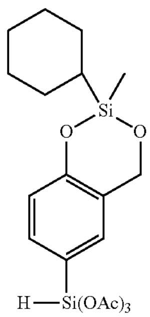
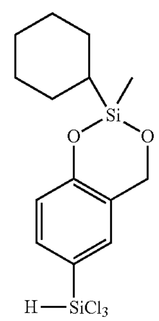
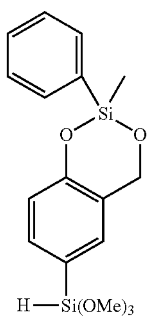
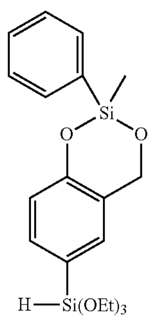
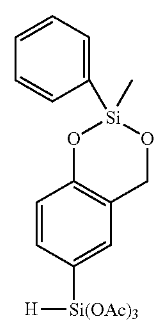
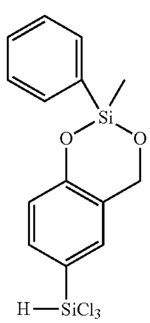
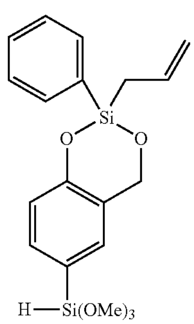
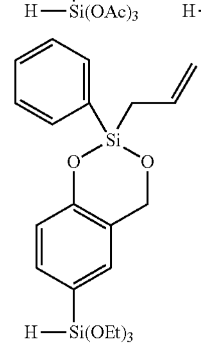
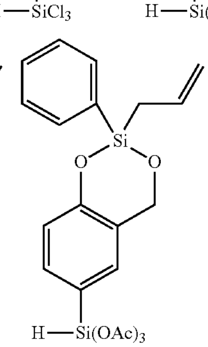
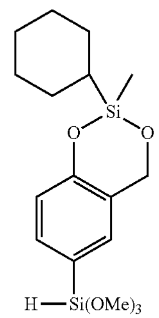

-continued
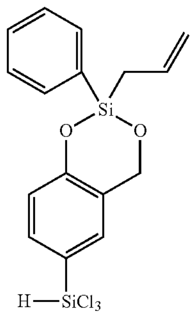
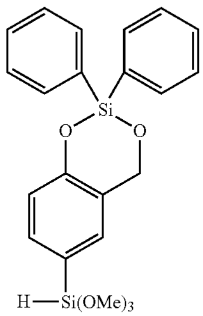
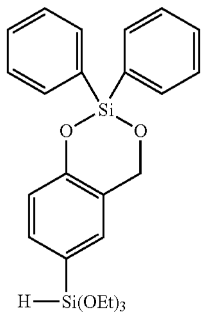
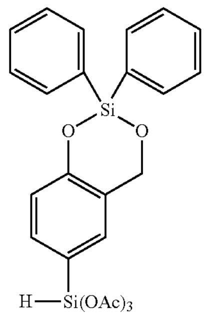
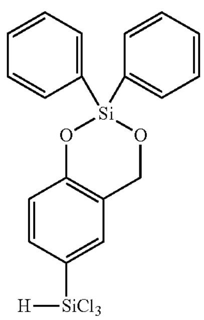
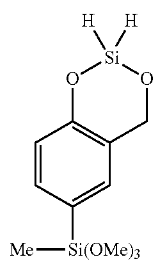
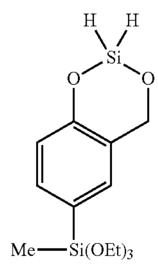
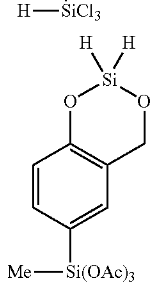
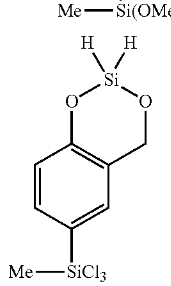
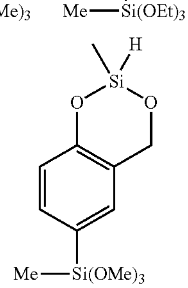
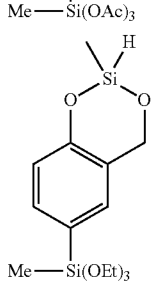
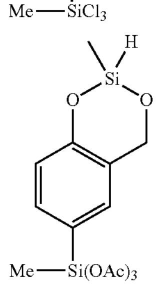
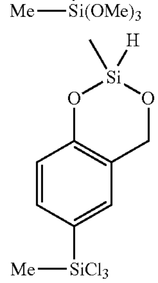
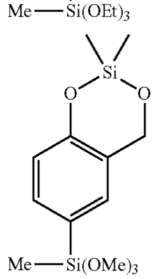
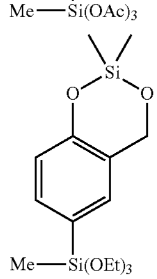
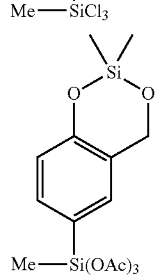
-continued
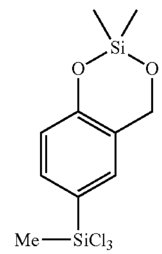
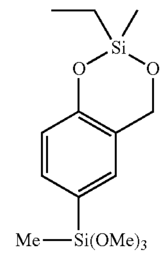
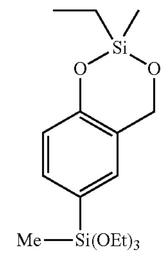
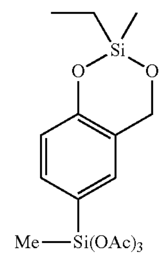
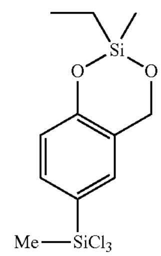
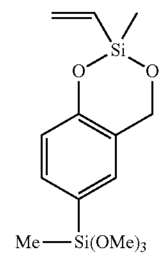
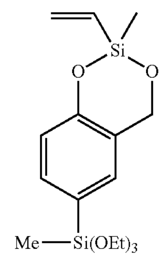
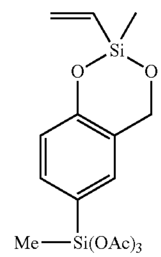
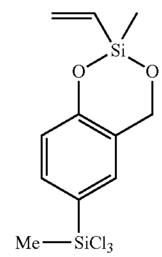
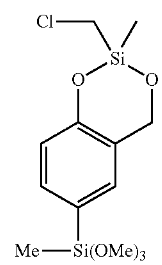
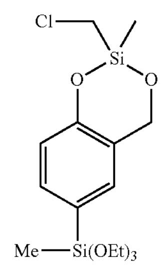
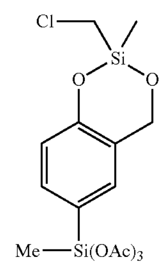
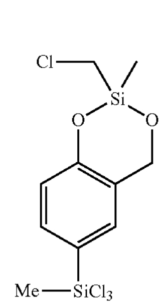
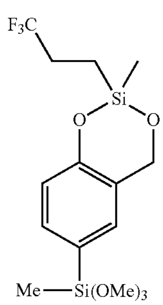
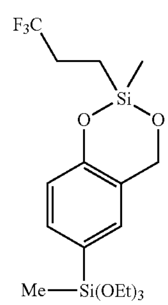
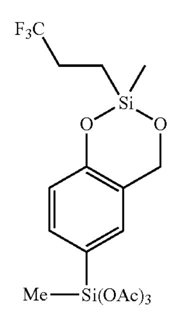
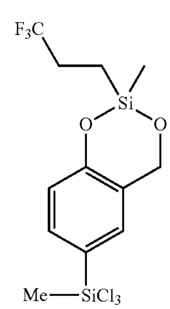

-continued
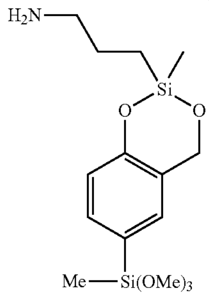
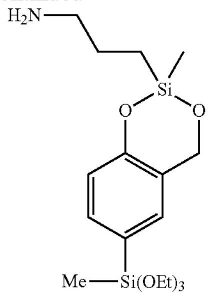
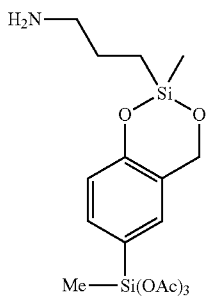
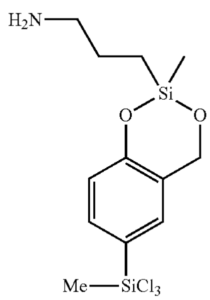
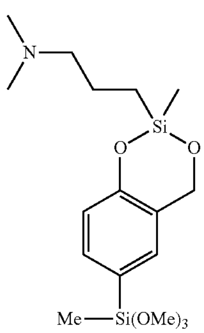
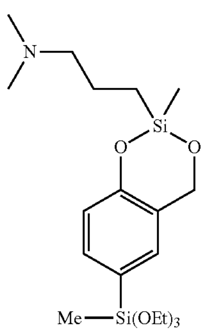
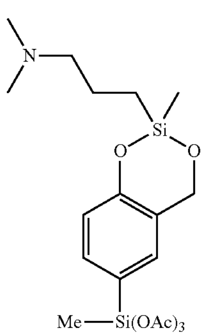
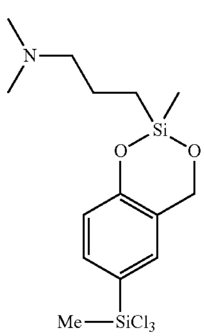
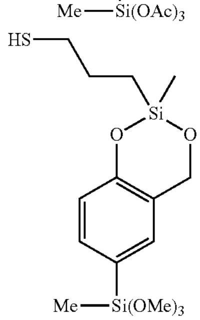
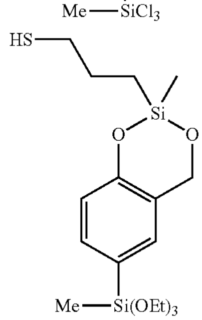
-continued
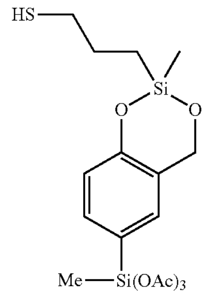
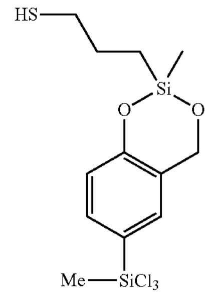
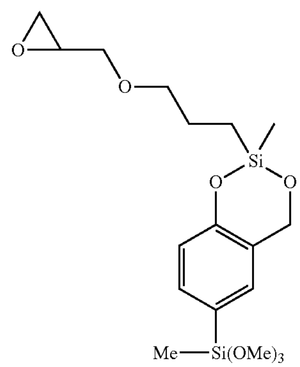
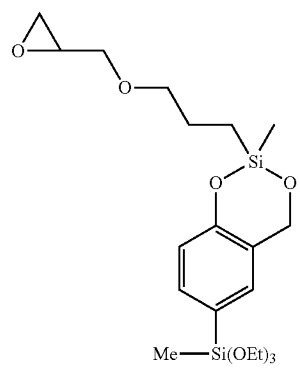
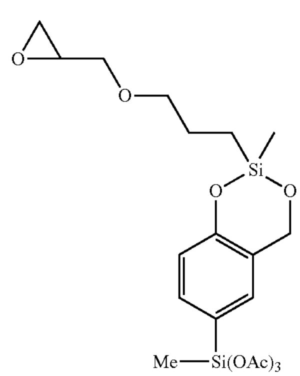

-continued
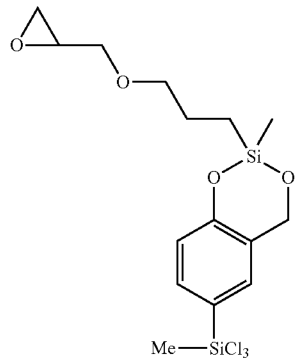
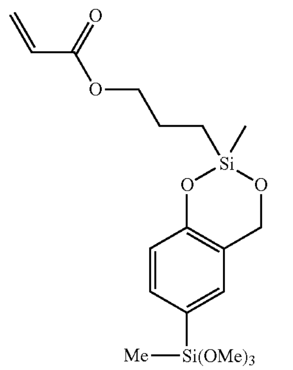
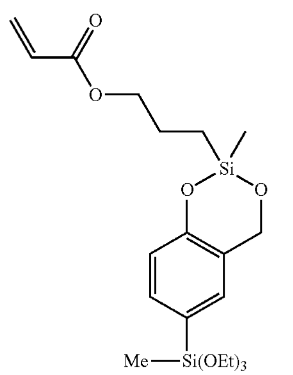
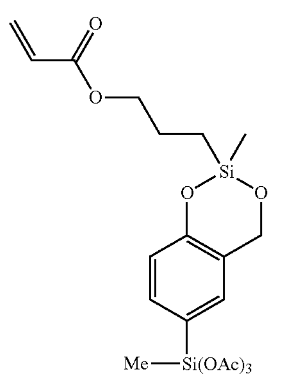
-continued
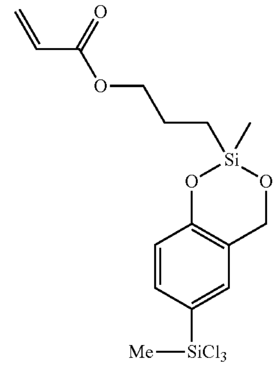
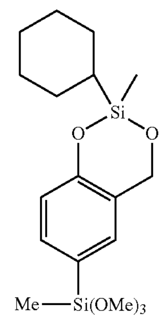
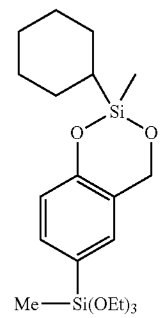
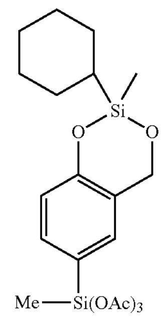
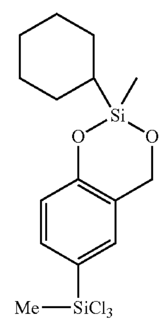
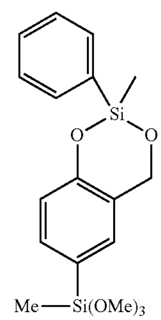
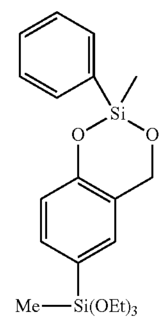
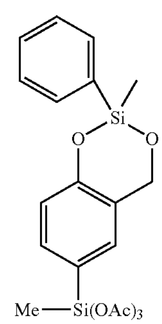
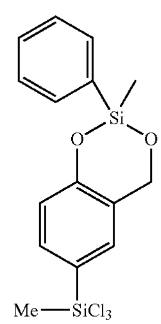
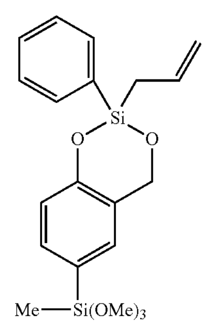
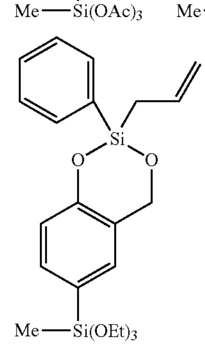
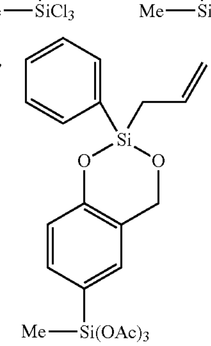

-continued
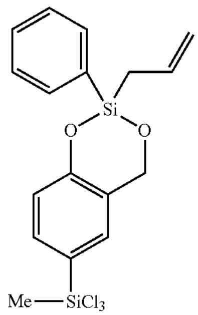
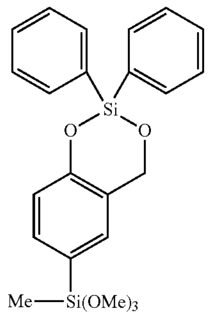
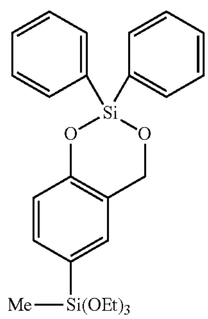
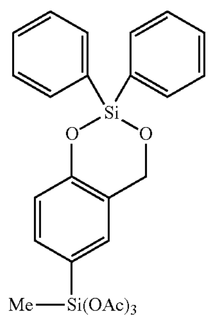
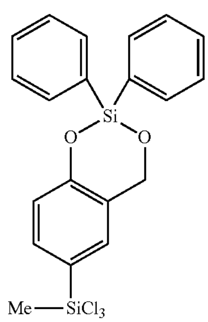
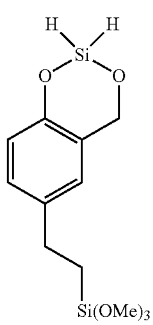
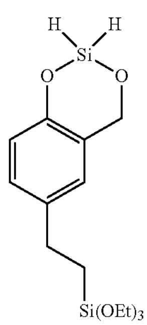
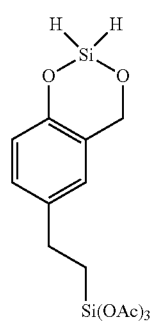
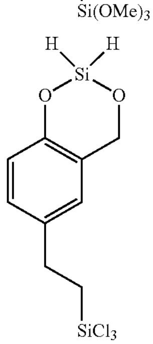
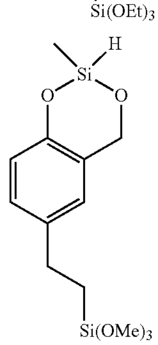
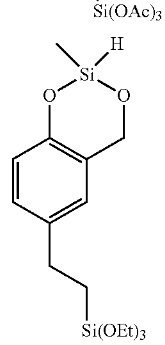
-continued
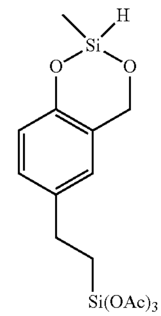
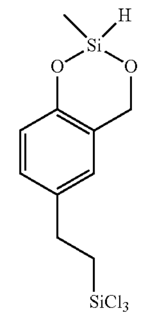
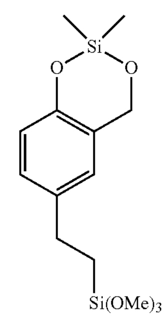
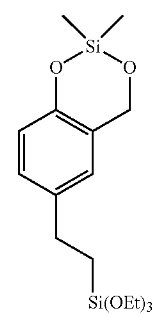
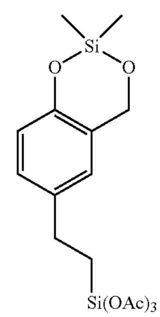
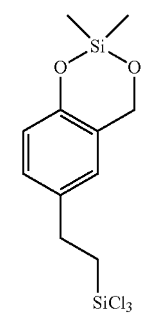
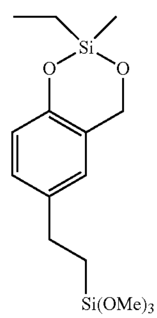
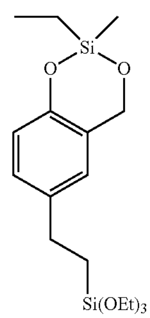
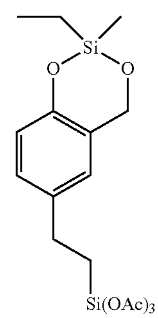
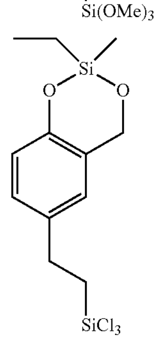
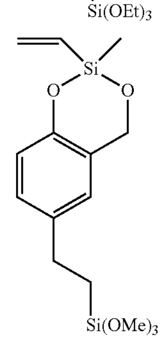
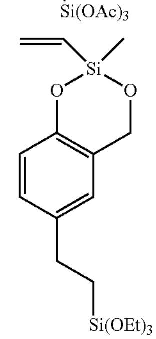
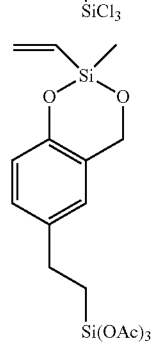
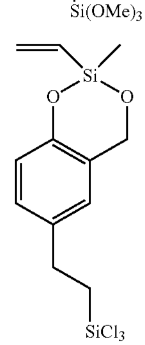
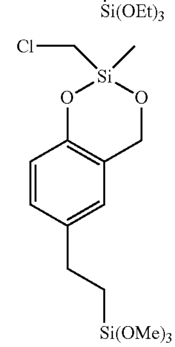

-continued
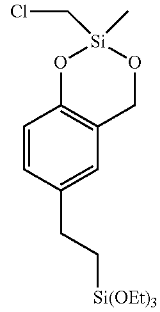
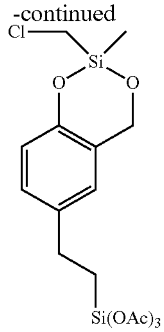
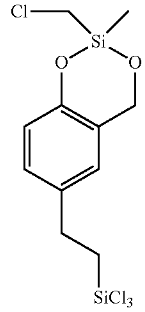
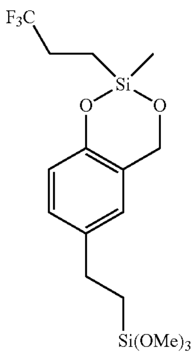
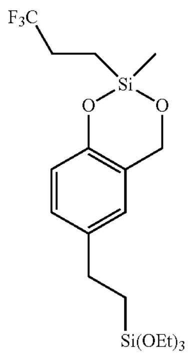
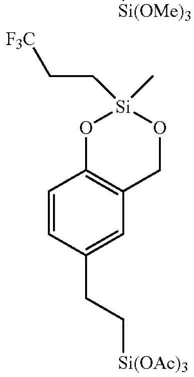
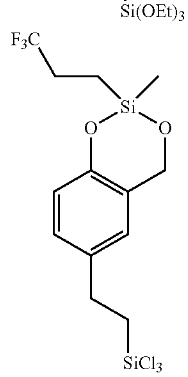
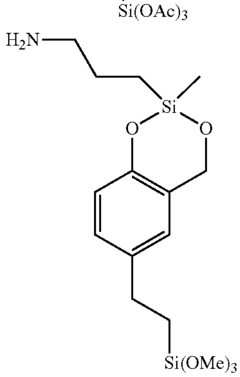
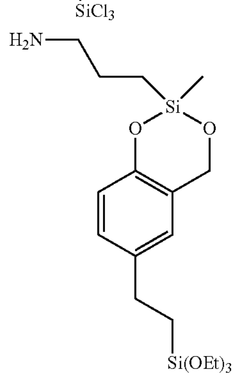
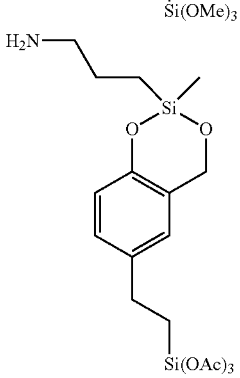
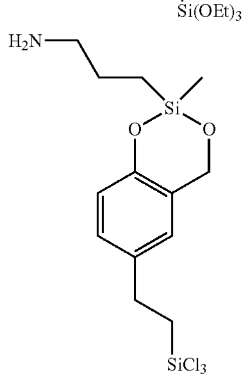
-continued
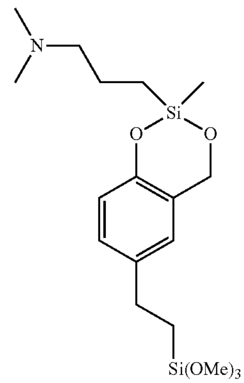
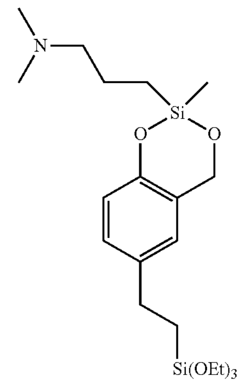
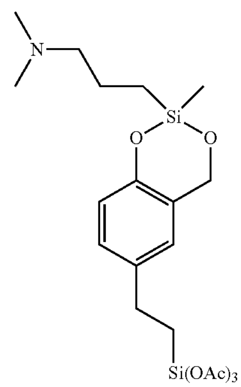
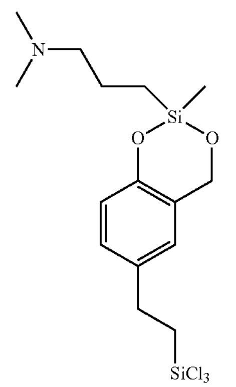
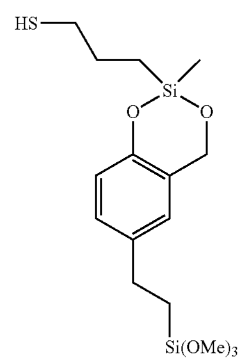
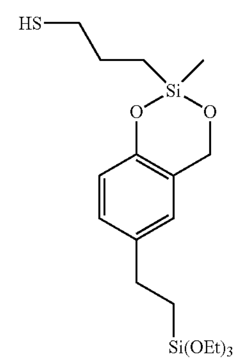
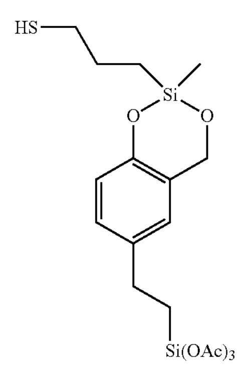
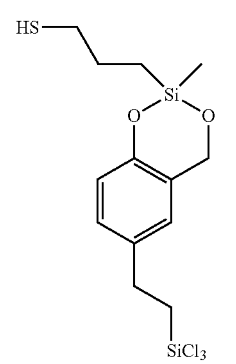

-continued
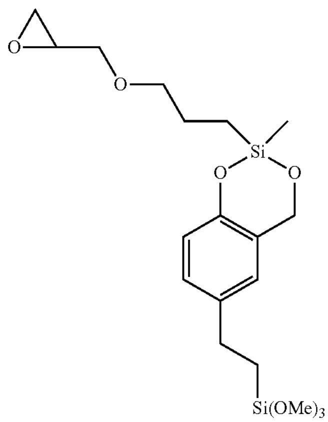
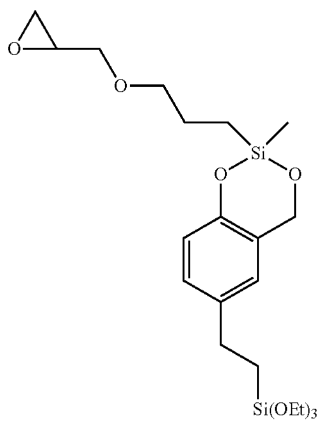
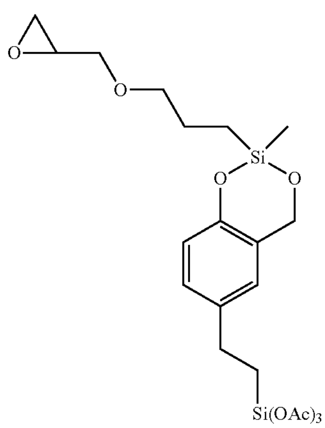
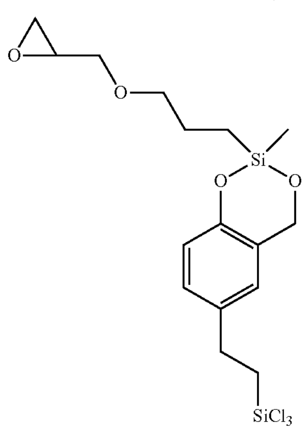
-continued
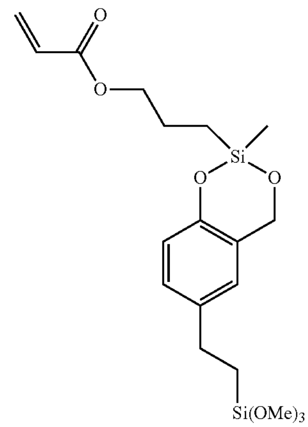
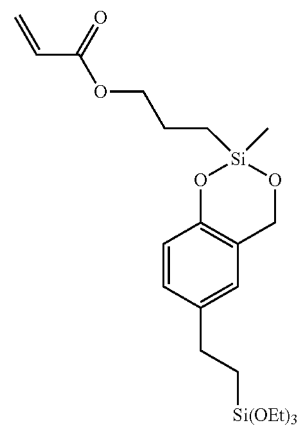
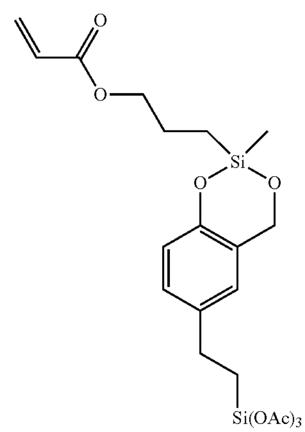
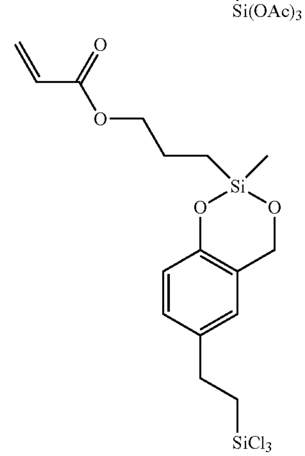

-continued
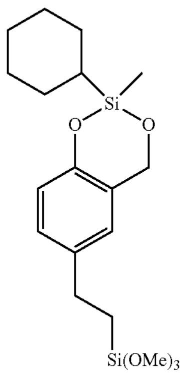
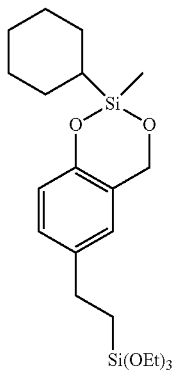
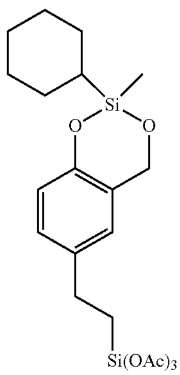
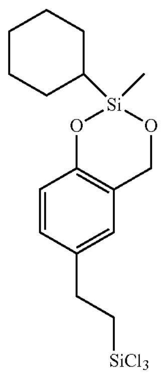
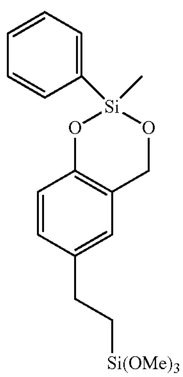
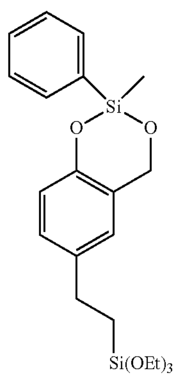
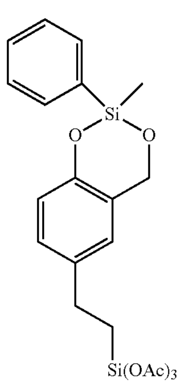
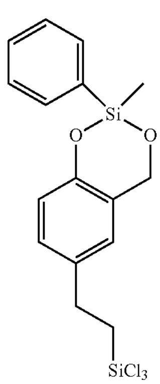
-continued
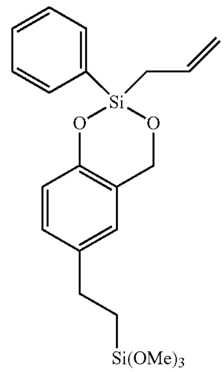
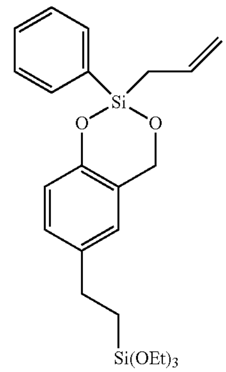
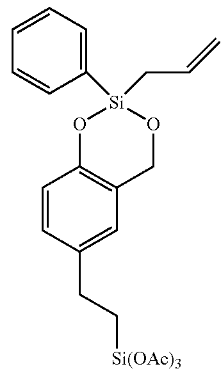
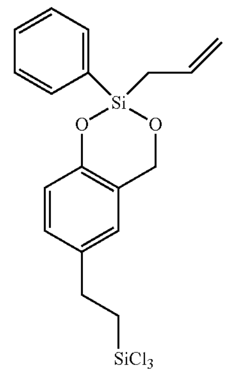
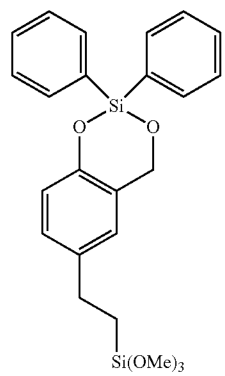
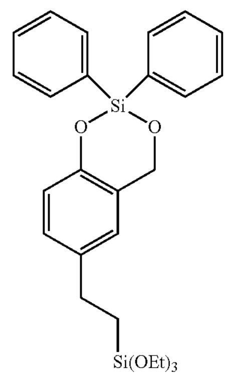
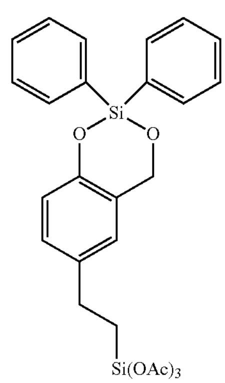
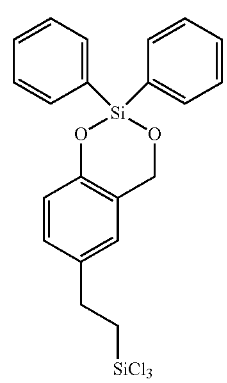

-continued
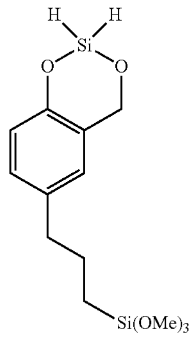
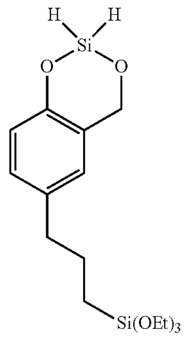
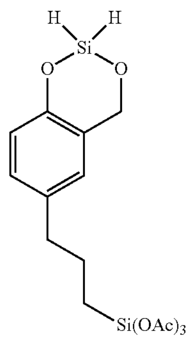
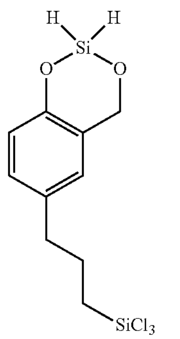
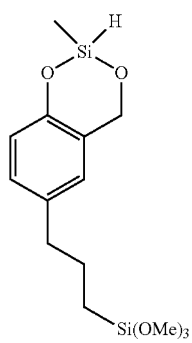
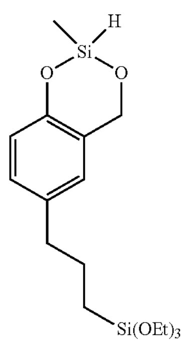
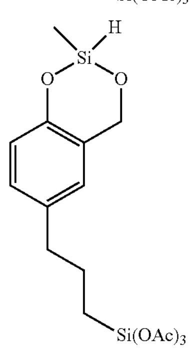
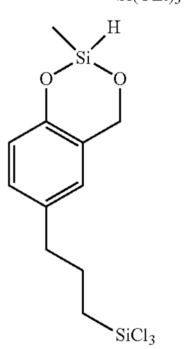
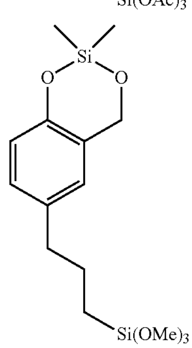
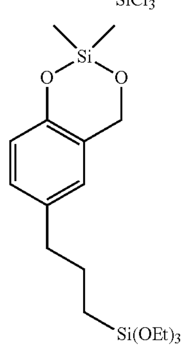
-continued
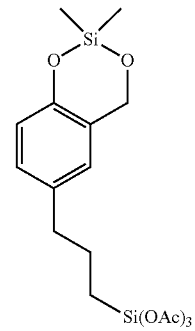
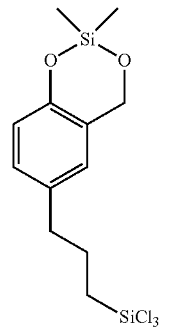
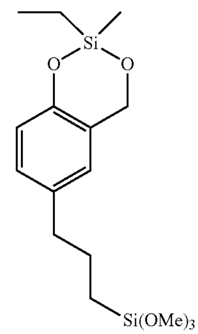
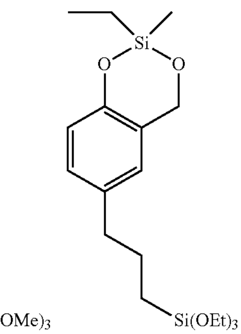
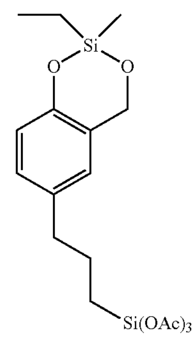
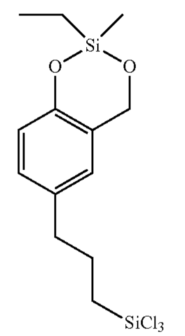
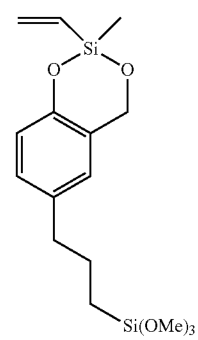
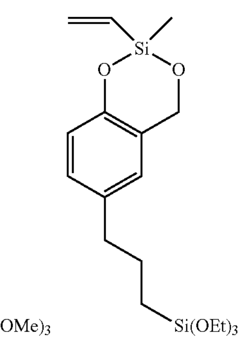
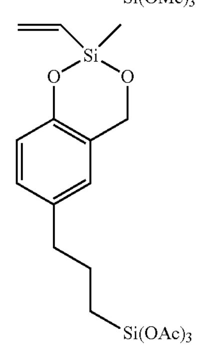
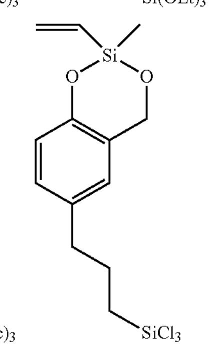

-continued
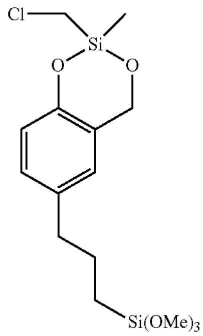
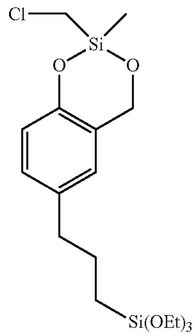
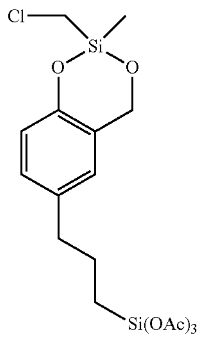
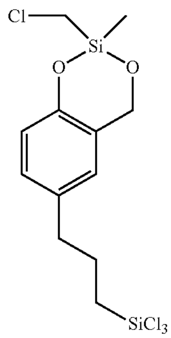
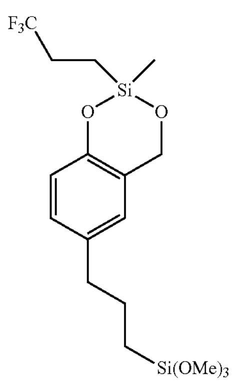
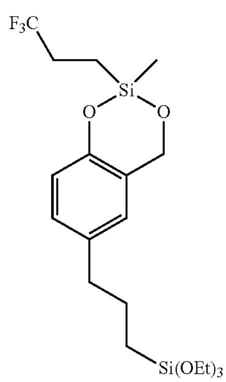
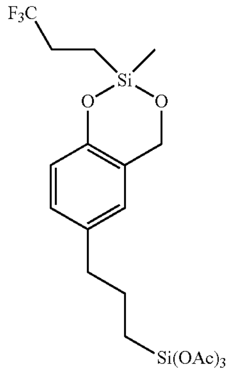
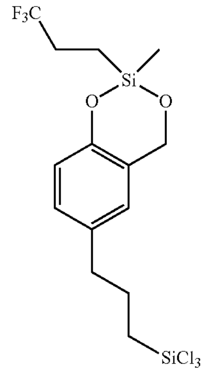
-continued
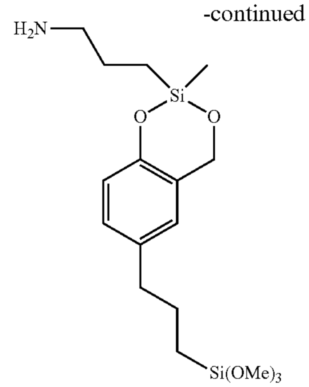
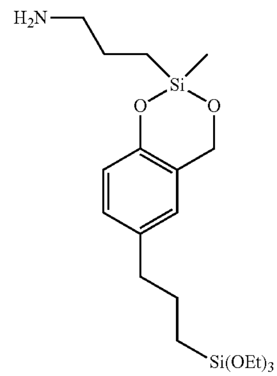
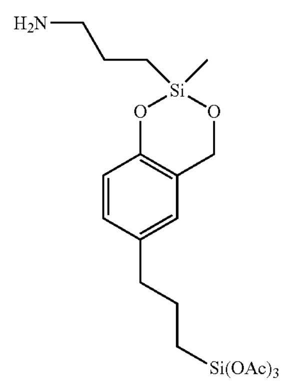
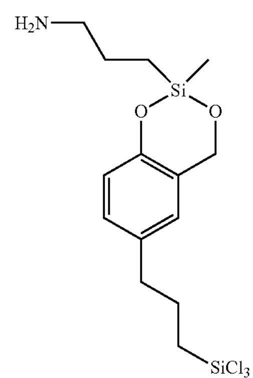
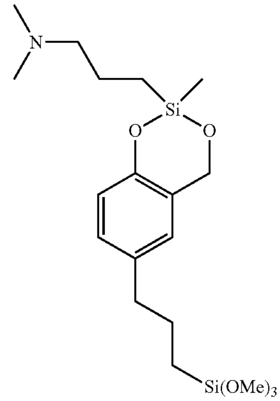

-continued
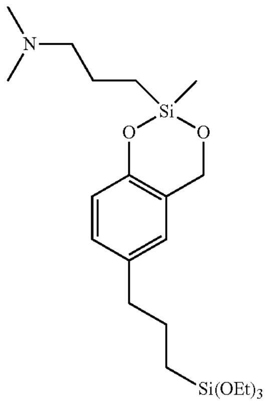
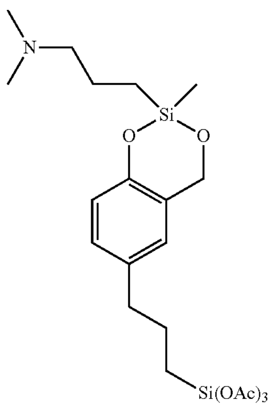
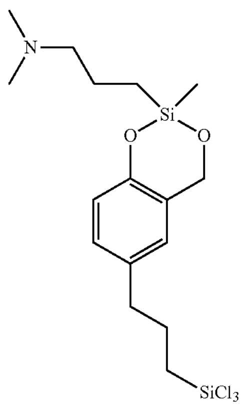
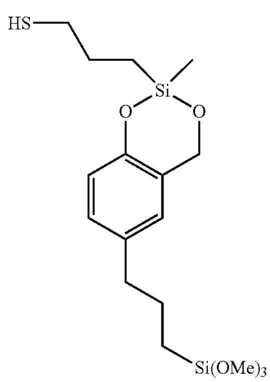
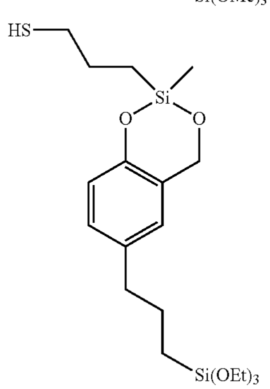
-continued
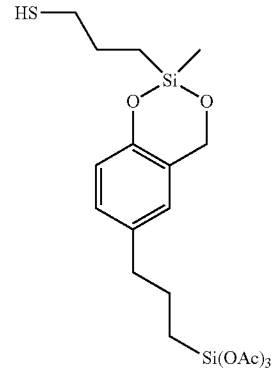
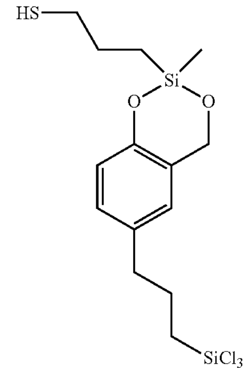
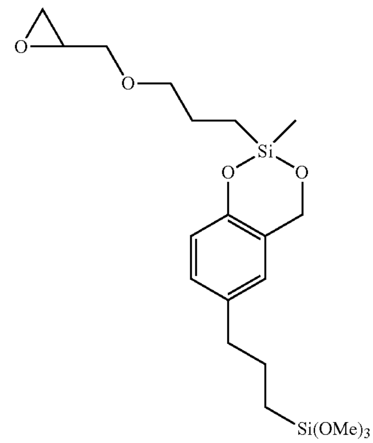
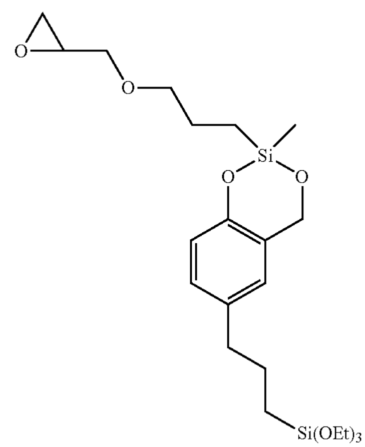
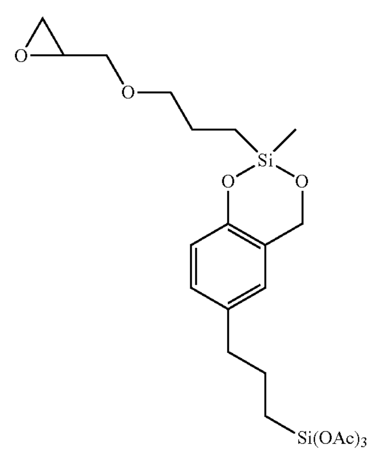

-continued
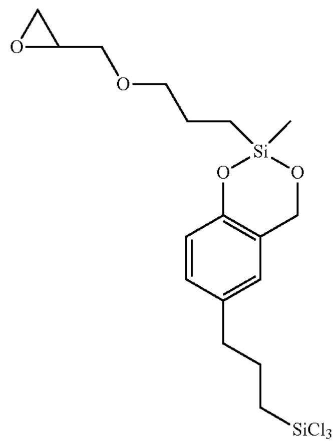
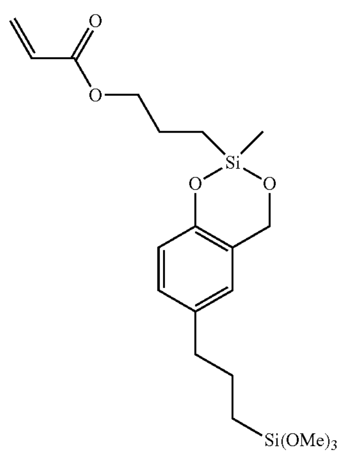
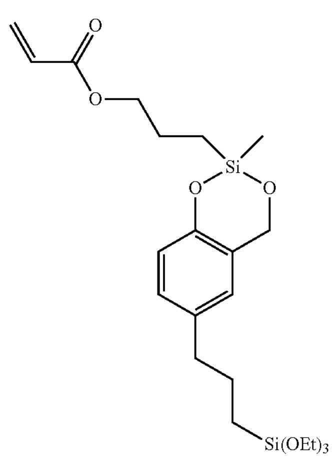
-continued
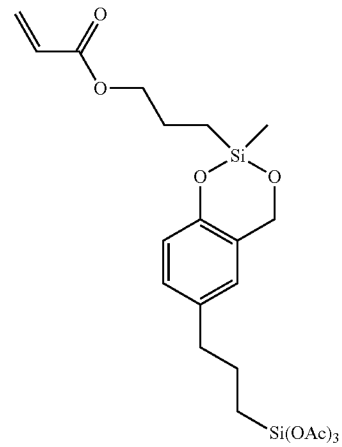
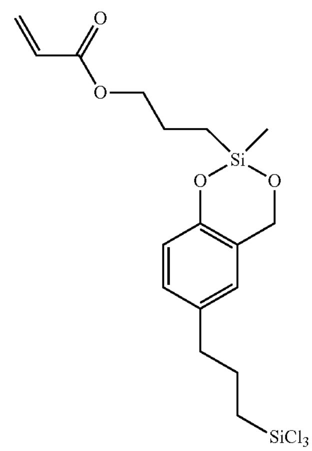
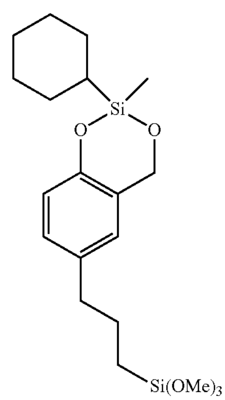
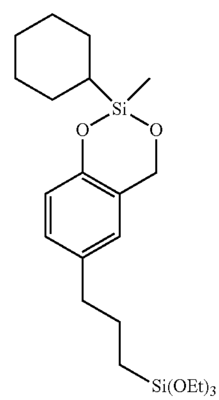
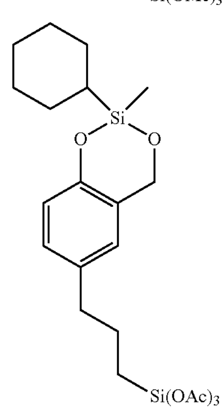
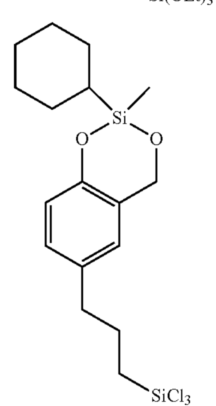

-continued
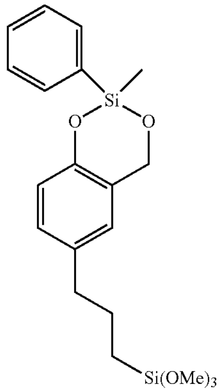
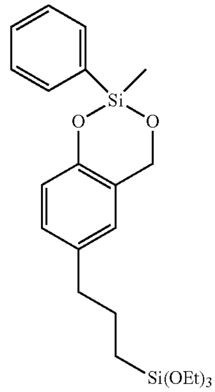
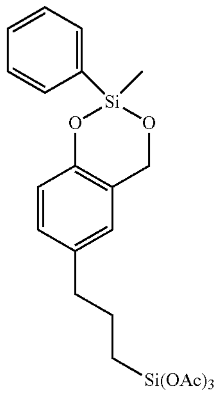
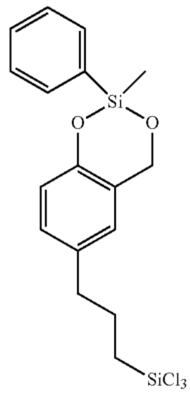
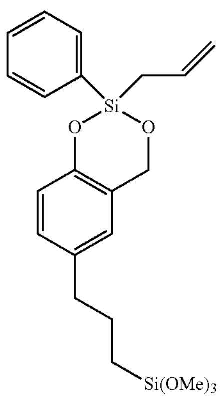
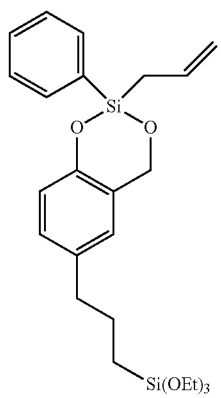
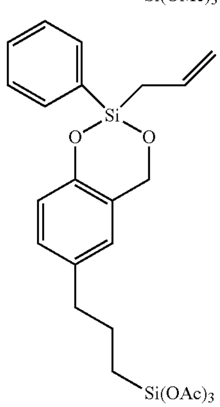
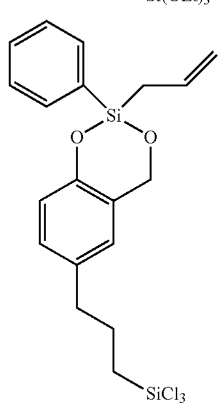
-continued
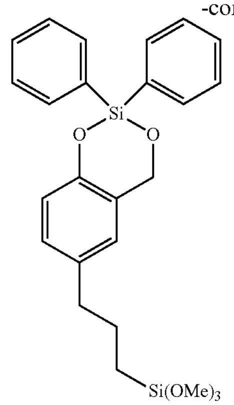
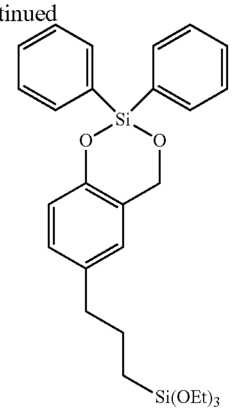
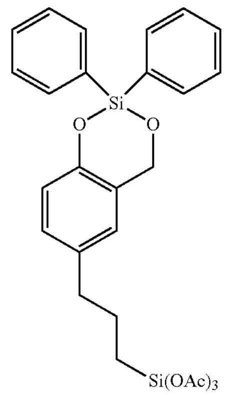
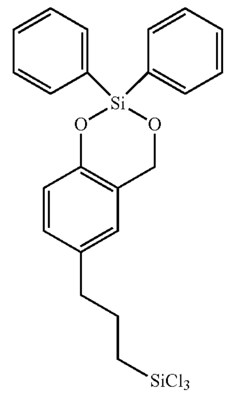
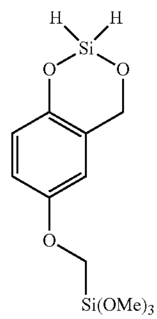
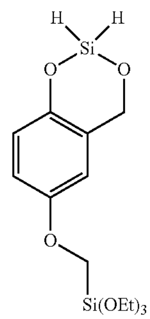
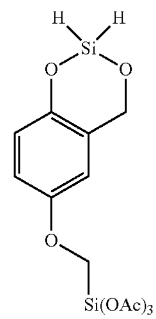
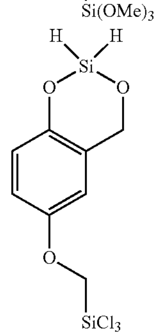
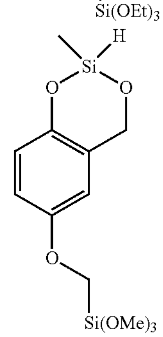
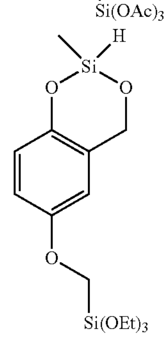
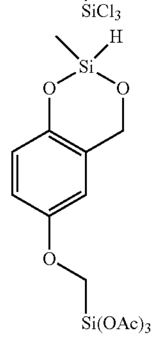
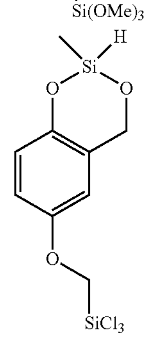
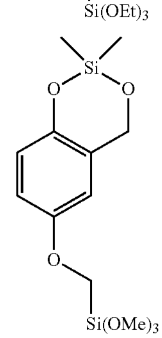

-continued
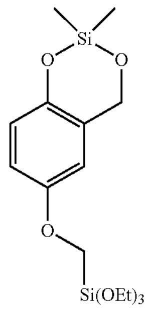
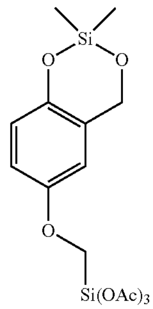
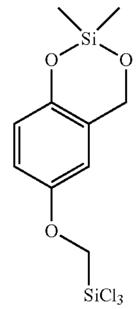
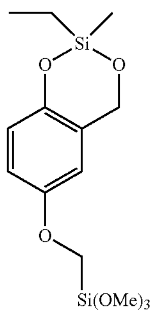
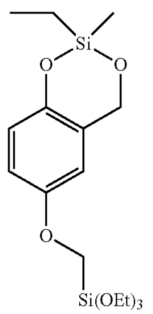
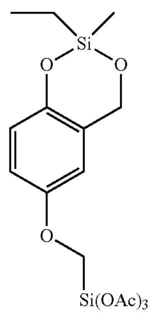
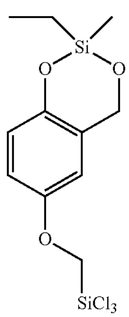
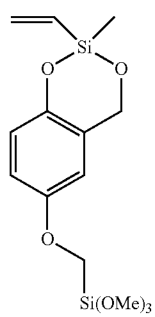
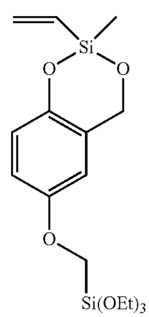
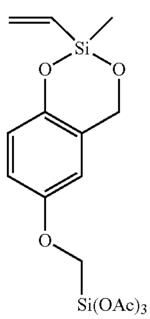
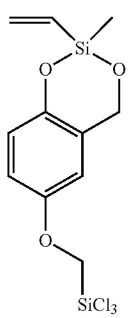
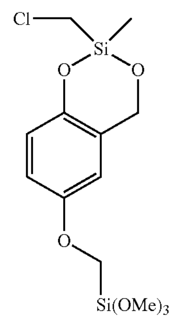
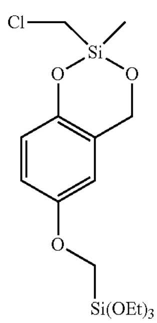
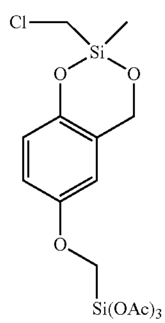
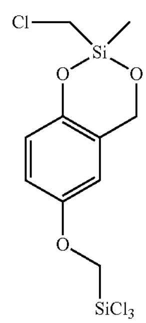
-continued
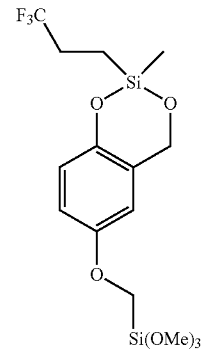
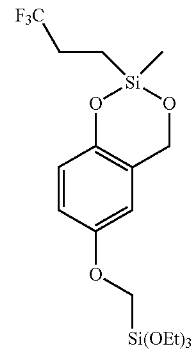
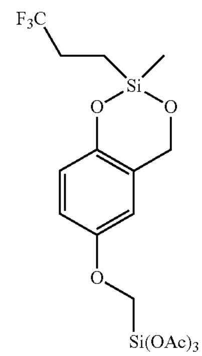
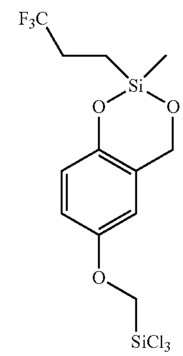
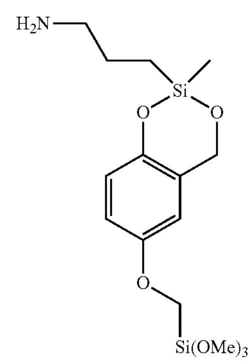
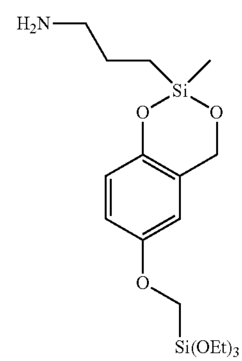
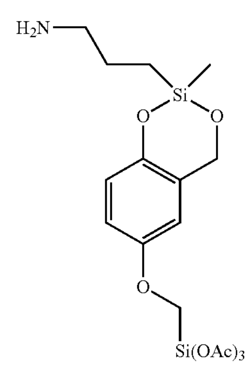
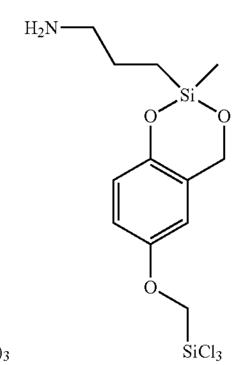

-continued
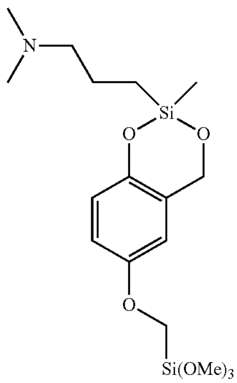
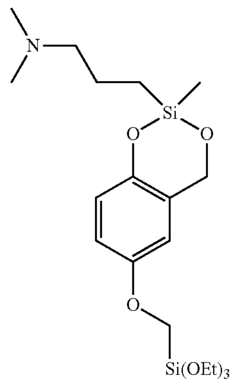
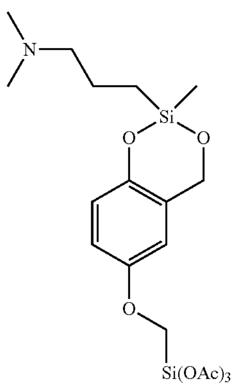
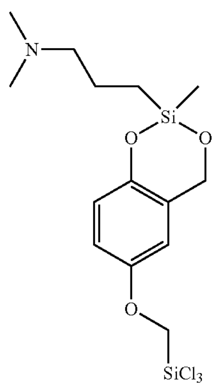
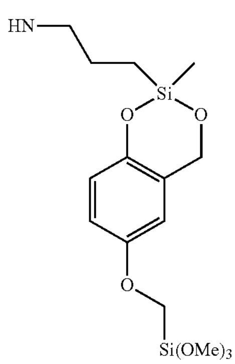
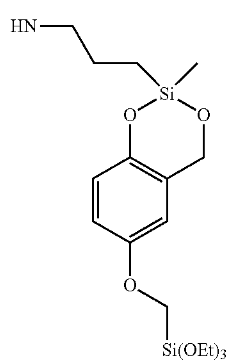
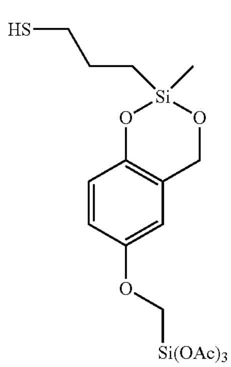
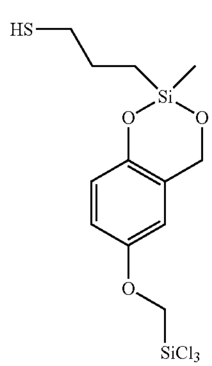
-continued
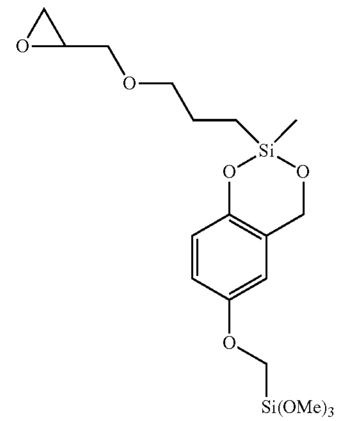
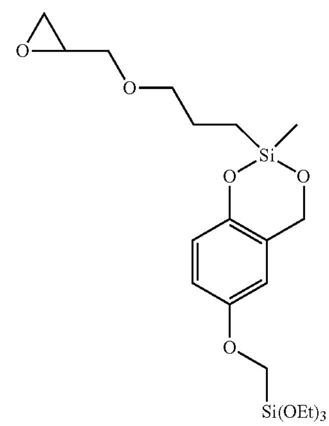
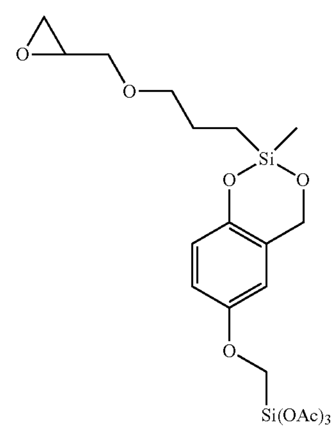
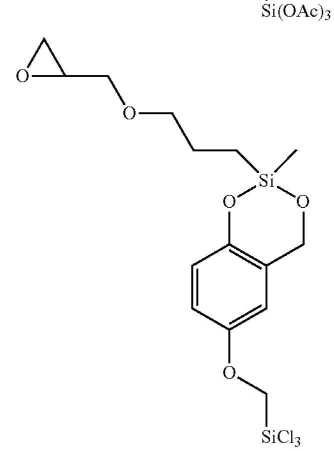

-continued
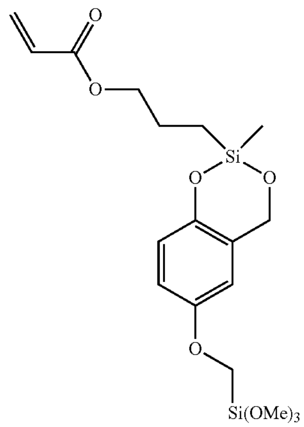
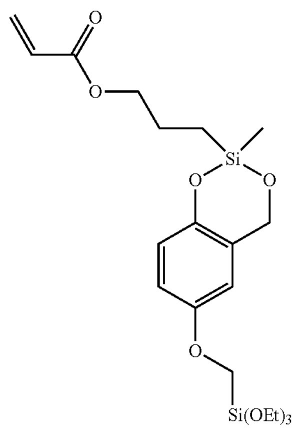
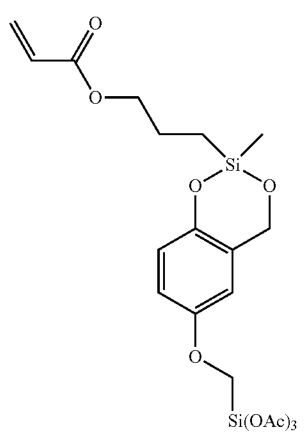
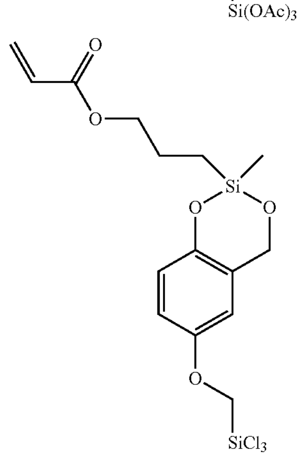
-continued
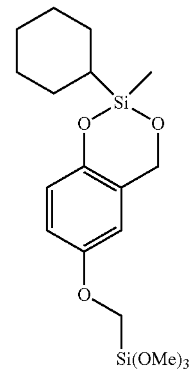
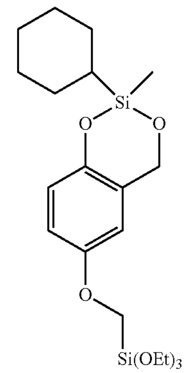
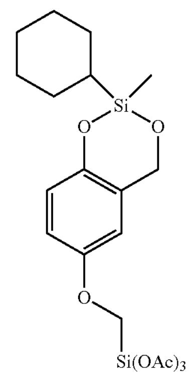
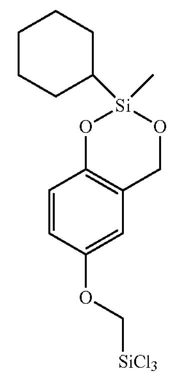
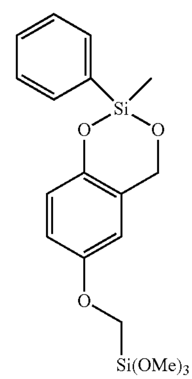
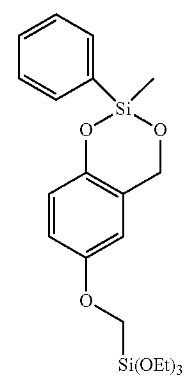
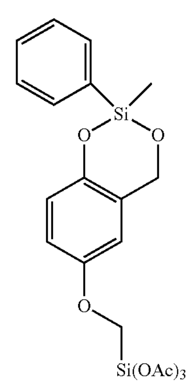
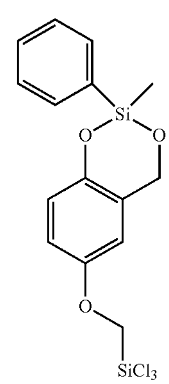

-continued
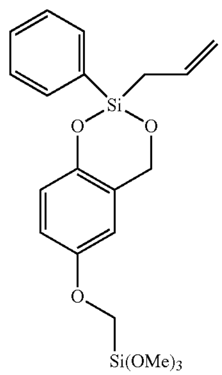
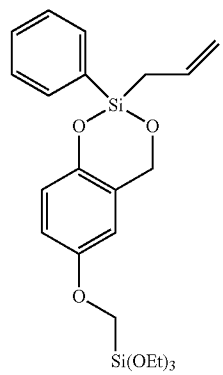
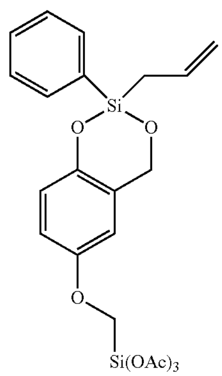
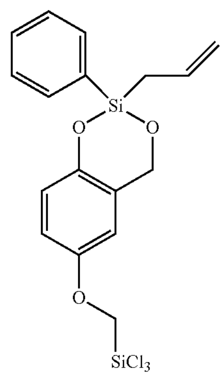
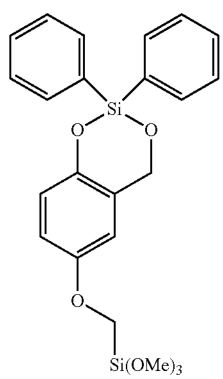
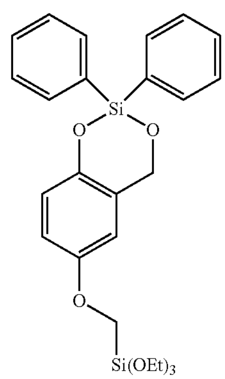
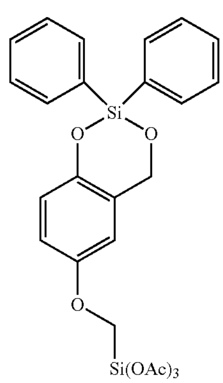
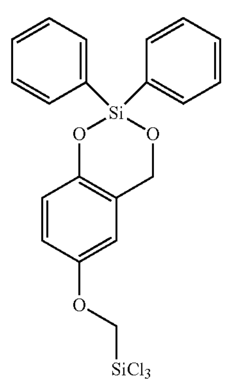
-continued
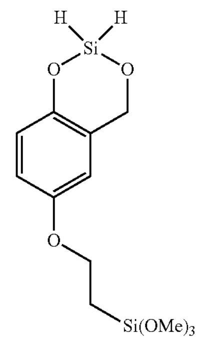
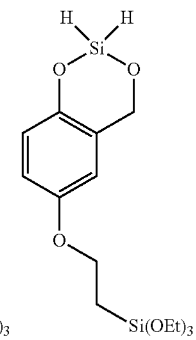
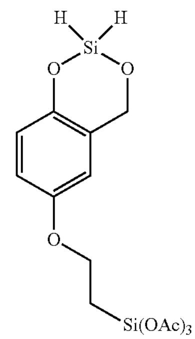
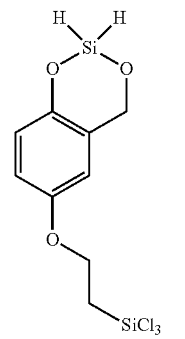
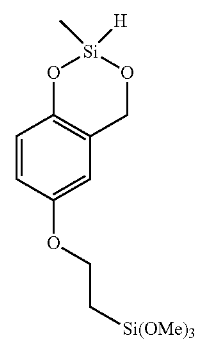
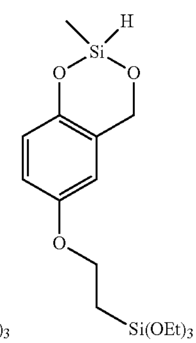
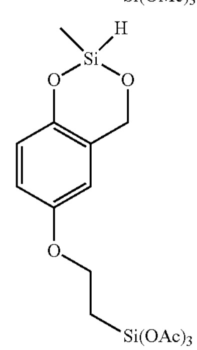
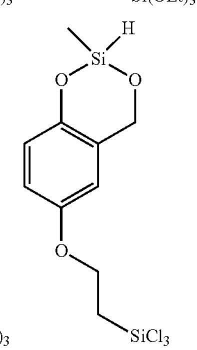
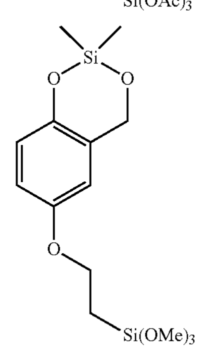
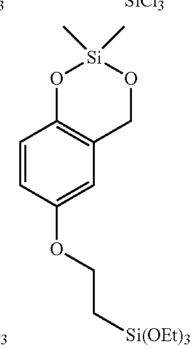

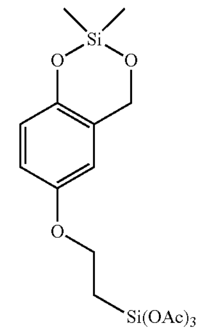
Si
O
O
O
Si(OAc)3
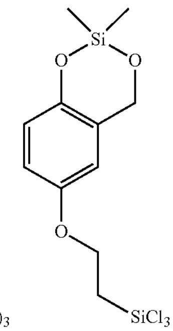
Si
O
O
O
SiCl3
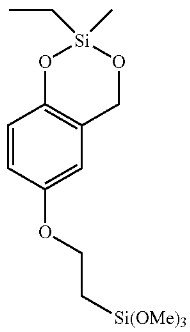
Si
O
O
O
Si(OMe)3
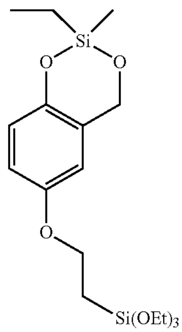
Si
O
O
O
Si(OEt)3
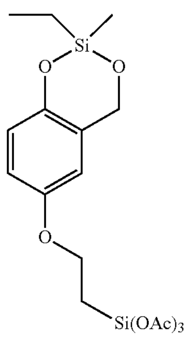
Si
O
O
O
Si(OAc)3
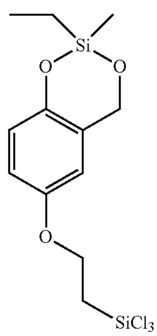
Si
O
O
O
SiCl3
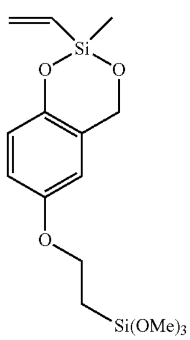
Si
O
O
O
Si(OMe)3
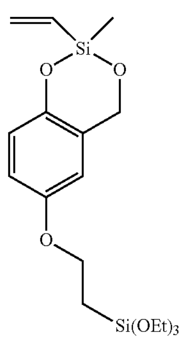
Si
O
O
O
Si(OEt)3
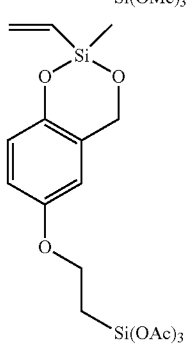
Si
O
O
O
Si(OAc)3
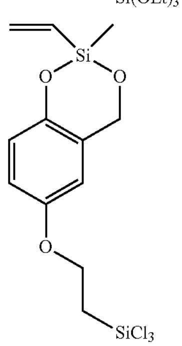
Si
O
O
O
SiCl3
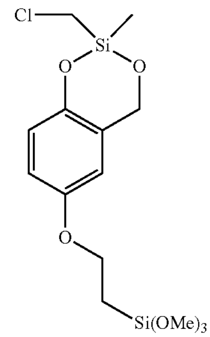
Cl
Si
O
O
O
Si(OMe)3
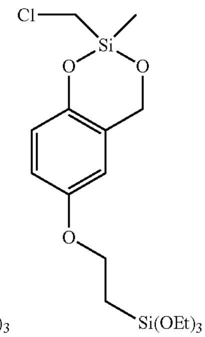
Cl
Si
O
O
O
Si(OEt)3
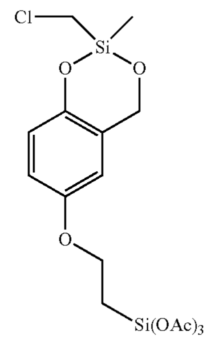
Cl
Si
O
O
O
Si(OAc)3
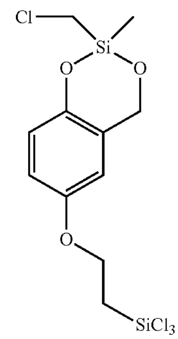
Cl
Si
O
O
O
SiCl3
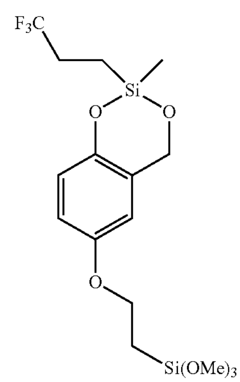
F3C
Si
O
O
O
Si(OMe)3
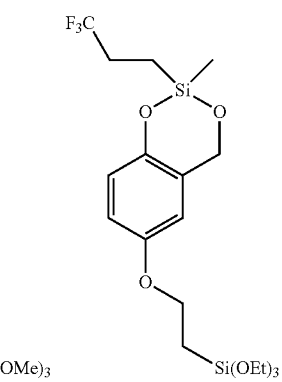
F3C
Si
O
O
O
Si(OEt)3
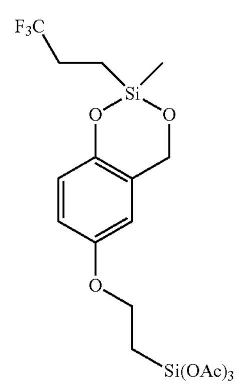
F3C
Si
O
O
O
Si(OAc)3
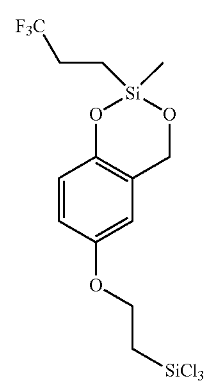
F3C
Si
O
O
O
SiCl3

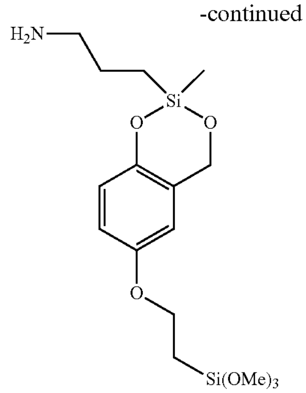
H2N
Si
O
O
O
Si(OMe)3
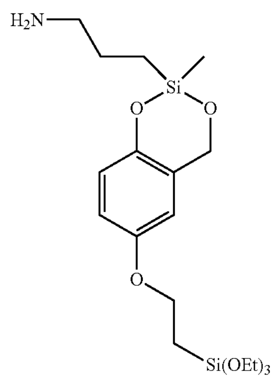
H2N
Si
O
O
O
Si(OEt)3
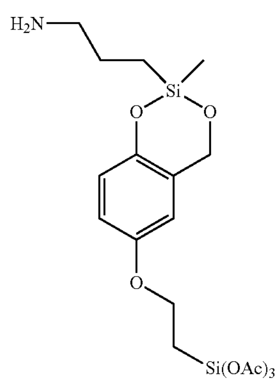
H2N
Si
O
O
O
Si(OAc)3
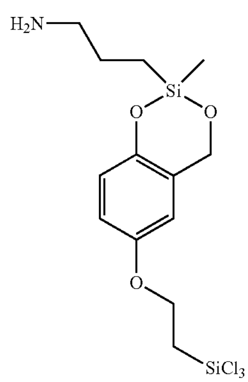
H2N
Si
O
O
O
SiCl3
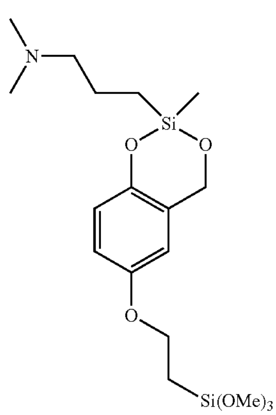
N
Si
O
O
O
Si(OMe)3
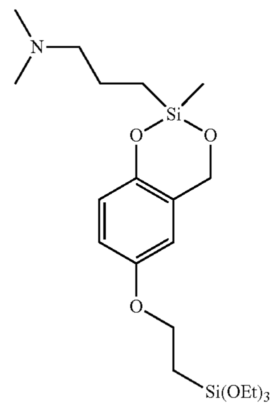
N
Si
O
O
O
Si(OEt)3
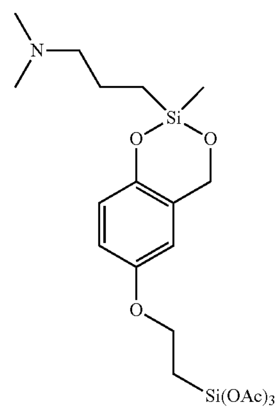
N
Si
O
O
O
Si(OAc)3
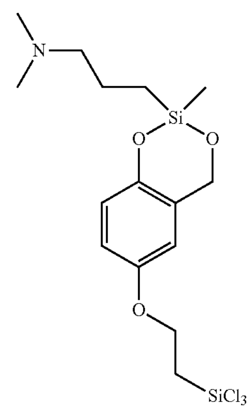
N
Si
O
O
O
SiCl3
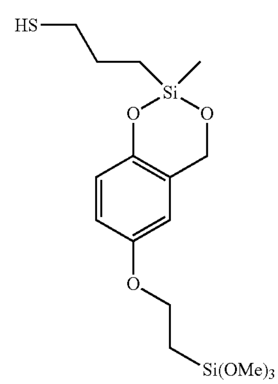
HS
Si
O
O
O
Si(OMe)3
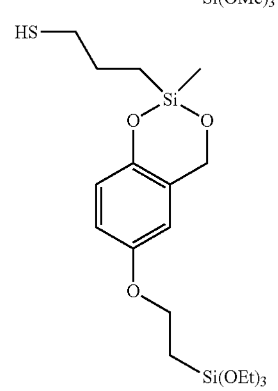
HS
Si
O
O
O
Si(OEt)3

-continued
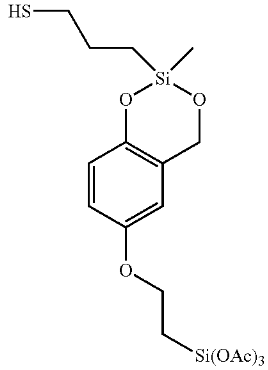
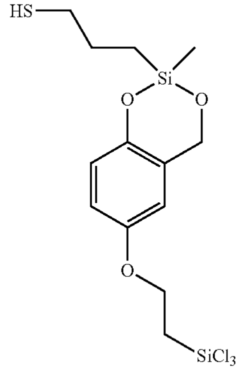
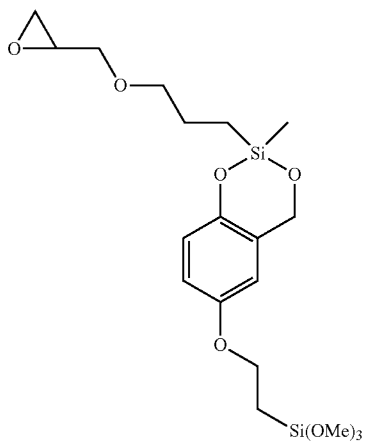
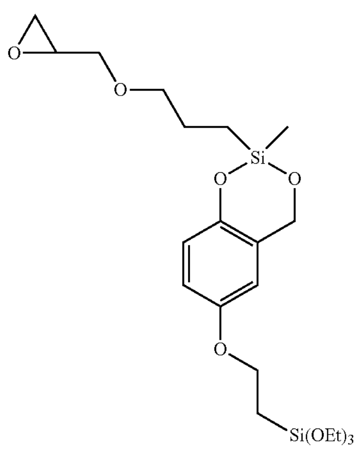
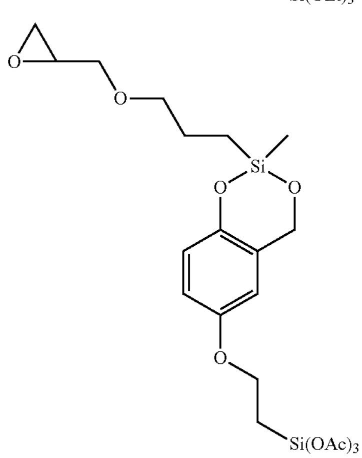
-continued
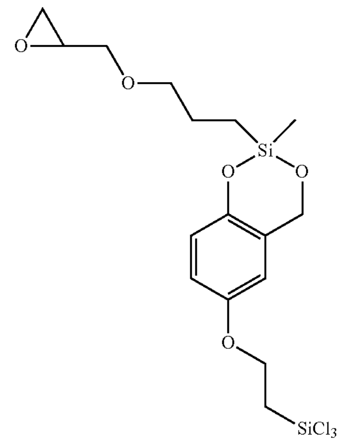
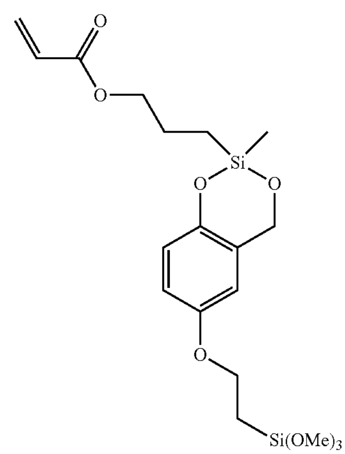
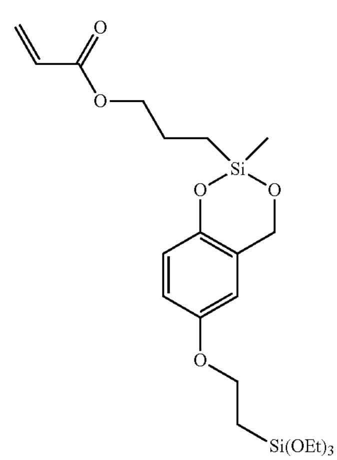

-continued
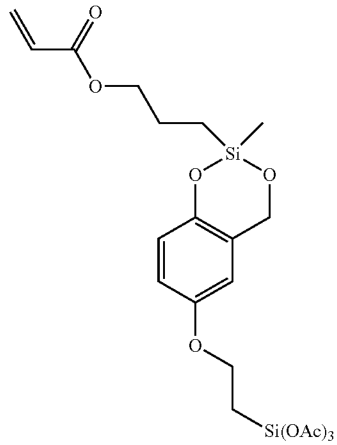
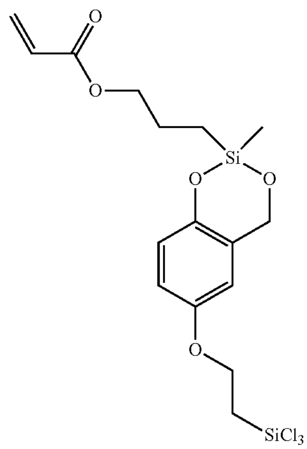
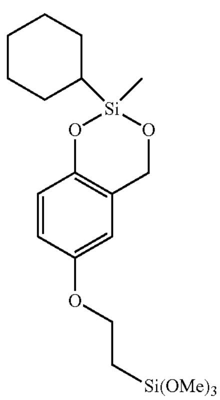
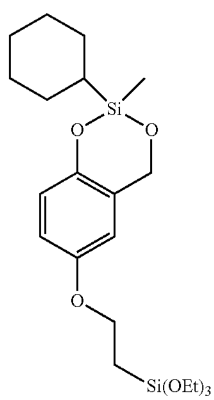
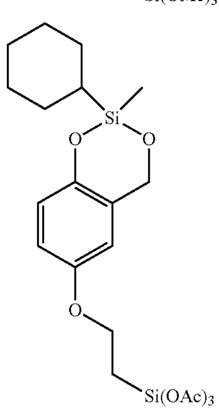
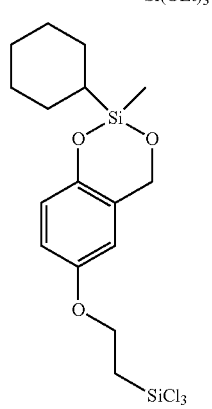
-continued
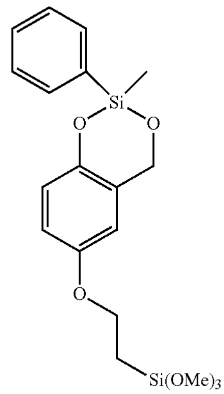
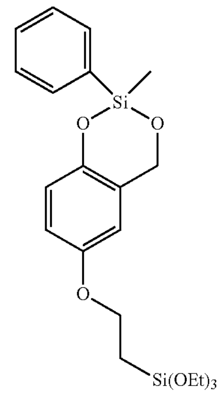
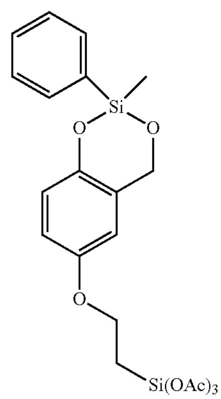
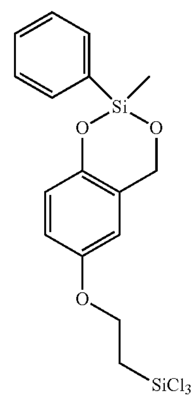
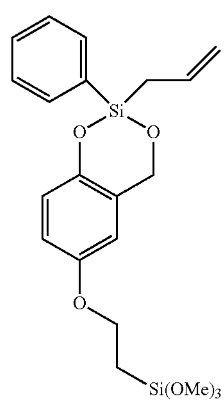
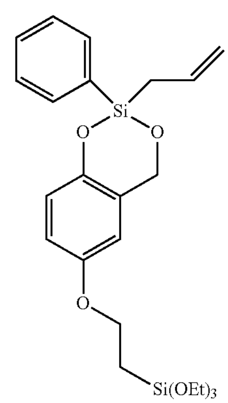
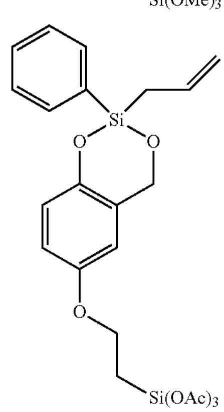
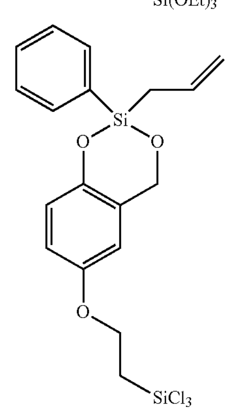

-continued

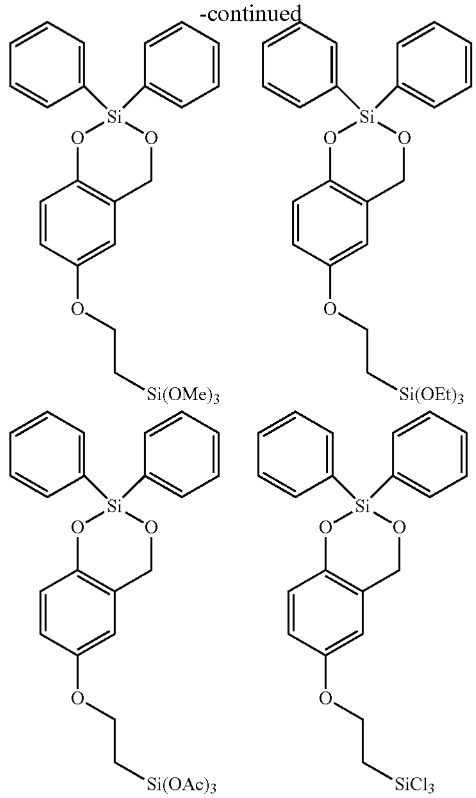

The present invention can provide a composition for forming a silicon-containing resist underlayer film containing one or both of a hydrolysis product and a hydrolysis condensate of a mixture of the silicon compound (A-1) and one or more silicon compounds (A-2) shown by the following general formula (2). In addition, the present invention can provide a composition for forming a silicon-containing resist underlayer film that can be obtained by subjecting a mixture of the silicon compound (A-1) and one or more silicon compounds (A-2) shown by the following general formula (2) to hydrolysis, hydrolysis condensation, or both hydrolysis and hydrolysis condensation.

$$R^6_m Si(R^7)_{(4-m)} \quad (2)$$

In the general formula (2), $R^6$ represents a hydrogen atom or a monovalent organic group having 1 to 30 carbon atoms optionally containing a carbon-oxygen single bond, a carbon-oxygen double bond, a silicon-silicon bond, a carbon-nitrogen bond, a carbon-sulfur bond, a protective group that is decomposed with an acid, an iodine atom, a phosphorous atom, or a fluorine atom.

In the general formula (2), $R^7$ represents an alkoxy group, an acyloxy group, or a halogen atom. Note that in the present invention, it is more preferable to use alkoxysilane as a hydrolysable monomer used in the thermosetting silicon-containing material.

In the general formula (2), "m" represents 0, 1, 2, or 3. Specifically, the silicon compound (A-2) has, on a silicon atom, 1, 2, 3, or 4 chlorine atoms, bromine atoms, iodine atoms, acetoxy groups, methoxy groups, ethoxy groups, propoxy groups, butoxy groups, or the like as the $R^6$ and the hydrolysable group $R^7$, and may further have, on a silicon atom, a hydrogen atom or the monovalent organic group having 1 to 30 carbon atoms as $R^6$.

Examples of the silicon compound (A-2) shown by the general formula (2) include the following.

Examples include tetramethoxysilane, tetraethoxysilane, tetrapropoxysilane, tetraisopropoxysilane, trimethoxysilane, triethoxysilane, tripropoxysilane, triisopropoxysilane, methyltrimethoxysilane, methyltriethoxysilane, methyltripropoxysilane, methyltriisopropoxysilane, ethyltrimethoxysilane, ethyltriethoxysilane, ethyltripropoxysilane, ethyltriisopropoxysilane, vinyltrimethoxysilane, vinyltriethoxysilane, vinyltripropoxysilane, vinyltriisopropoxysilane, propyltrimethoxysilane, propyltriethoxysilane, propyltripropoxysilane, propyltriisopropoxysilane, isopropyltrimethoxysilane, isopropyltriethoxysilane, isopropyltripropoxysilane, isopropyltriisopropoxysilane, butyltrimethoxysilane, butyltriethoxysilane, butyltripropoxysilane, butyltriisopropoxysilane, isobutyltrimethoxysilane, isobutyltriethoxysilane, sec-butyltrimethoxysilane, sec-butyltriethoxysilane, sec-butyltripropoxysilane, sec-butyltriisopropoxysilane, t-butyltrimethoxysilane, t-butyltriethoxysilane, t-butyltripropoxysilane, t-butyltriisopropoxysilane, allyltrimethoxysilane, allyltriethoxysilane, cyclopropyltrimethoxysilane, cyclopropyltriethoxysilane, cyclopropyltripropoxysilane, cyclopropyltriisopropoxysilane, cyclobutyltrimethoxysilane, cyclobutyltriethoxysilane, cyclobutyltripropoxysilane, cyclobutyltriisopropoxysilane, cyclopentyltrimethoxysilane, cyclopentyltriethoxysilane, cyclopentyltripropoxysilane, cyclopentyltriisopropoxysilane, cyclohexyltrimethoxysilane, cyclohexyltriethoxysilane, cyclohexyltripropoxysilane, cyclohexyltriisopropoxysilane, cyclohexenyltrimethoxysilane, cyclohexenyltriethoxysilane, cyclohexenyltripropoxysilane, cyclohexenyltriisopropoxysilane, cyclohexenylethyltrimethoxysilane, cyclohexenylethyltriethoxysilane, cyclohexenylethyltripropoxysilane, cyclohexenylethyltriisopropoxysilane, cyclooctyltrimethoxysilane, cyclooctyltriethoxysilane, cyclooctyltripropoxysilane, cyclooctyltriisopropoxysilane, cyclopentadienylpropyltrimethoxysilane, cyclopentadienylpropyltriethoxysilane, cyclopentadienylpropyltripropoxysilane, cyclopentadienylpropyltriisopropoxysilane, bicycloheptenyltrimethoxysilane, bicycloheptenyltriethoxysilane, bicycloheptenyltripropoxysilane, bicycloheptenyltriisopropoxysilane, bicycloheptyltrimethoxysilane, bicycloheptyltriethoxysilane, bicycloheptyltripropoxysilane, bicycloheptyltriisopropoxysilane, adamantyltrimethoxysilane, adamantyltriethoxysilane, adamantyltripropoxysilane, adamantyltriisopropoxysilane, phenyltrimethoxysilane, phenyltriethoxysilane, phenyltripropoxysilane, phenyltriisopropoxysilane, benzyltrimethoxysilane, benzyltriethoxysilane, benzyltripropoxysilane, benzyltriisopropoxysilane, anisyltrimethoxysilane, anisyltriethoxysilane, anisyltripropoxysilane, anisyltriisopropoxysilane, tolyltrimethoxysilane, tolyltriethoxysilane, tolyltripropoxysilane, tolyltriisopropoxysilane, phenethyltrimethoxysilane, phenethyltriethoxysilane, phenethyltripropoxysilane, phenethyltriisopropoxysilane, naphthyltrimethoxysilane, naphthyltriethoxysilane, naphthyltripropoxysilane, naphthyltriisopropoxysilane, dimethyldimethoxysilane, dimethyldiethoxysilane, methylethyldimethoxysilane, methylethyldiethoxysilane, dimethyldipropoxysilane, dimethyldiisopropoxysilane, diethyldimethoxysilane, diethyldiethoxysilane, diethyldipropoxysilane, diethyldiisopropoxysilane, dipropyldimethoxysilane, dipropyldiethoxysilane, dipropyldipropoxysilane, dipropyldiisopropoxysilane, diisopropyldimethoxysilane, diisopropyldiethoxysilane, diisopropyldipropoxysilane, diisopropyldiisopropoxysilane, dibutyldimethoxysilane, dibutyldiethoxysilane, dibutyldipropoxysilane, dibutyldiisopropoxysilane, di-sec-butyldimethoxysilane, di-sec-butyldiethoxysilane, di-sec-butyldipropoxysilane, di-sec-butyldiisopropoxysilane, di-t-butyldimethoxysilane, di-t-butyldiethoxysilane, di-t-butyldipropoxysilane, di-t-butyldiisopropoxysilane, dicyclopropyldimethoxysilane, dicyclopropyldiethoxysilane, dicyclopropyldipropoxysilane, dicyclopropyldiisopropoxysilane, dicyclobutyldimethoxysilane, dicyclobutyldiethoxysilane, dicyclobutyldipropoxysilane, dicyclobutyldiisopropoxysilane, dicyclopentyldimethoxysilane, dicyclopentyldiethoxysilane, dicyclopentyldipropoxysilane, dicyclopentyldiisopropoxysilane, dicyclohexyldimethoxysilane, dicyclohexyldiethoxysilane, dicyclohexyldipropoxysilane, dicyclohexyldiisopropoxysilane, dicyclohexenyldimethoxysilane, dicyclohexenyldiethoxysilane, dicyclohexenyldipropoxysilane, dicyclohexenyldiisopropoxysilane, dicyclohexenylethyldimethoxysilane, dicyclohexenylethyldiethoxysilane, dicyclohexenylethyldipropoxysilane, dicyclohexenylethyldiisopropoxysilane, dicyclooctyldimethoxysilane, dicyclooctyldiethoxysilane, dicyclooctyldipropoxysilane, dicyclooctyldiisopropoxysilane, dicyclopentadienylpropyldimethoxysilane, dicyclopentadienylpropyldiethoxysilane, dicyclopentadienylpropyldipropoxysilane, dicyclopentadienylpropyldiisopropoxysilane, bis(bicycloheptenyl)dimethoxysilane, bis(bicycloheptenyl)diethoxysilane, bis(bicycloheptenyl)dipropoxysilane, bis(bicycloheptenyl)diisopropoxysilane, bis(bicycloheptyl) dimethoxysilane, bis(bicycloheptyl)diethoxysilane, bis (bicycloheptyl)dipropoxysilane, bis(bicycloheptyl) diisopropoxysilane, diadamantyldimethoxysilane, diadamantyldiethoxysilane, diadamantyldipropoxysilane, diadamantyldiisopropoxysilane, diphenyldimethoxysilane, diphenyldiethoxysilane, methylphenyldimethoxysilane, methylphenyldiethoxysilane, diphenyldipropoxysilane, diphenyldiisopropoxysilane, trimethylmethoxysilane, trimethylethoxysilane, dimethylethylmethoxysilane, dimethylethylethoxysilane, dimethylphenylmethoxysilane, dimethylphenylethoxysilane, dimethylbenzylmethoxysilane, dimethylbenzylethoxysilane, dimethylphenethylmethoxysilane, dimethylphenethylethoxysilane, and the like.

Preferable examples of the general formula (2) include tetramethoxysilane, tetraethoxysilane, methyltrimethoxysilane, methyltriethoxysilane, ethyltrimethoxysilane, ethyltriethoxysilane, vinyltrimethoxysilane, vinyltriethoxysilane, propyltrimethoxysilane, propyltriethoxysilane, isopropyltrimethoxysilane, isopropyltriethoxysilane, butyltrimethoxysilane, butyltriethoxysilane, isobutyltrimethoxysilane, isobutyltriethoxysilane, allyltrimethoxysilane, allyltriethoxysilane, cyclopentyltrimethoxysilane, cyclopentyltriethoxysilane, cyclohexyltrimethoxysilane, cyclohexyltriethoxysilane, cyclohexenyltrimethoxysilane, cyclohexenyltriethoxysilane, phenyltrimethoxysilane, phenyltriethoxysilane, benzyltrimethoxysilane, benzyltriethoxysilane, tolyltrimethoxysilane, tolyltriethoxysilane, anisyltrimethoxysilane, anisyltriethoxysilane, phenethyltrimethoxysilane, phenethyltriethoxysilane, dimethyldimethoxysilane, dimethyldiethoxysilane, diethyldimethoxysilane, diethyldiethoxysilane, methylethyldimethoxysilane, methylethyldiethoxysilane, dipropyldimethoxysilane, dibutyldimethoxysilane, methylphenyldimethoxysilane, methylphenyldiethoxysilane, trimethylmethoxysilane, dimethylethylmethoxysilane, dimethylphenylmethoxysilane, dimethylbenzylmethoxysilane, dimethylphenethylmethoxysilane, and the like.

Other examples of the monovalent organic group shown by $R^6$ include organic groups having one or more carbon-oxygen single bonds or carbon-oxygen double bonds; specifically, organic groups having one or more groups selected from the group consisting of cyclic ether groups, ester groups, alkoxy groups, and a hydroxy group. Examples of the organic groups include ones shown by the following general formula (Sm-R).

$$(P\text{-}Q_1\text{-}(S_1)_{v1}\text{-}Q_2\text{-})_u\text{-}(T)_{v2}\text{-}Q_3\text{-}(S_2)_{v3}\text{-}Q_4\text{-} \qquad \text{(Sm-R)}$$

In the general formula (Sm-R), P represents a hydrogen atom, a cyclic ether group, a hydroxy group, an alkoxy group having 1 to 4 carbon atoms, an alkylcarbonyloxy group having 1 to 6 carbon atoms, or an alkylcarbonyl group having 1 to 6 carbon atoms; $Q_1$, $Q_2$, $Q_3$, and $Q_4$ each independently represent —$C_qH_{(2q-p)}P_p$—, where P is as defined above, "p" represents an integer of 0 to 3, and "q" represents an integer of 0 to 10, provided that q=0 means a single bond; "u" represents an integer of 0 to 3; $S_1$ and $S_2$ each independently represent —O—, —CO—, —OCO—, —COO—, or —OCOO—. v1, v2, and v3 each independently represent 0 or 1. In addition to these, T represents a divalent atom other than carbon, or a divalent group of an alicyclic, aromatic, or heterocyclic ring optionally containing a hetero atom such as an oxygen atom. As T, examples of the alicyclic, aromatic, or heterocyclic ring optionally containing a hetero atom such as an oxygen atom are shown below. In T, positions bonded to $Q_2$ and $Q_3$ are not particularly limited, and can be selected appropriately in consideration of reactivity dependent on steric factors, availability of commercial reagents used in the reaction, and so on.

T =

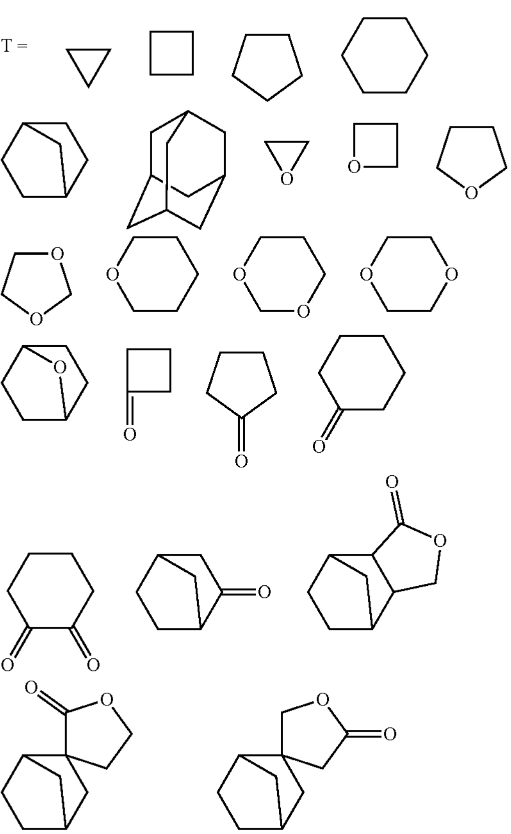

-continued
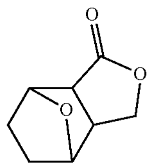
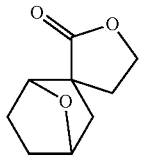
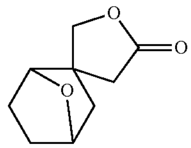
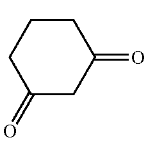
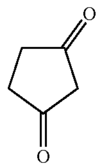
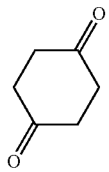
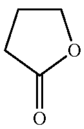
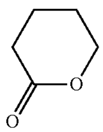
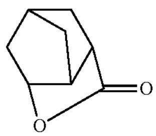
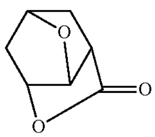
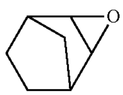
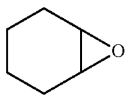
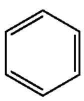
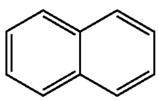
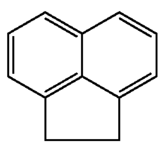
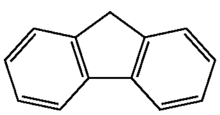
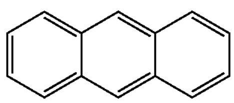
Preferable examples of the organic groups having one or more carbon-oxygen single bonds or carbon-oxygen double bonds in the general formula (Sm-R) include the following. Note that, in the following formulae, (Si) is depicted to show a bonding site to Si.
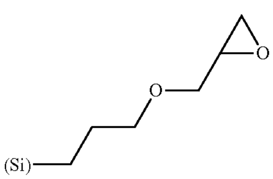
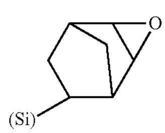
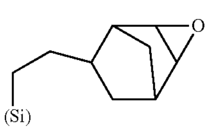
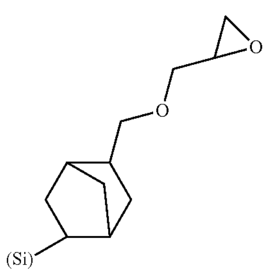
-continued
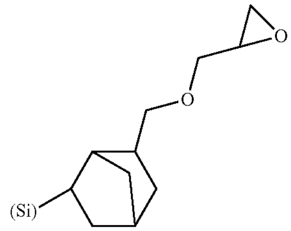
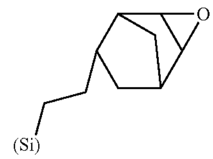
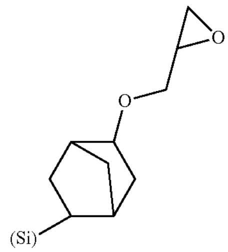
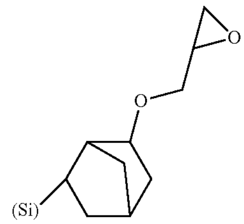
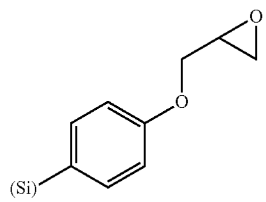
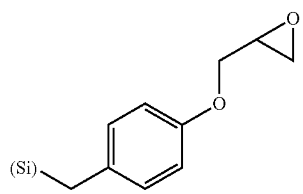
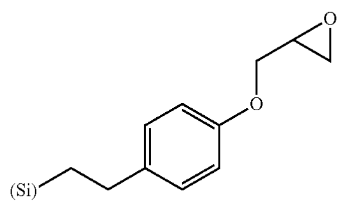
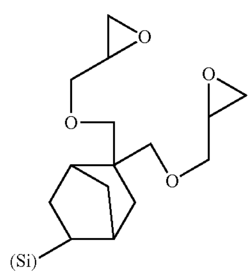
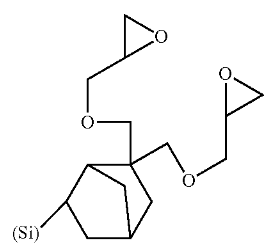
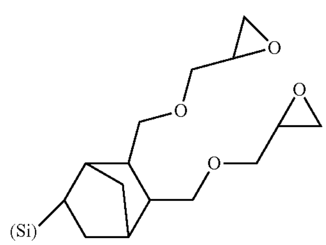

-continued
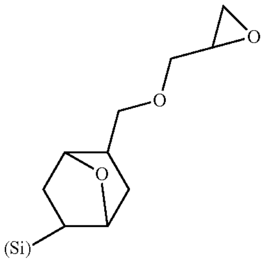
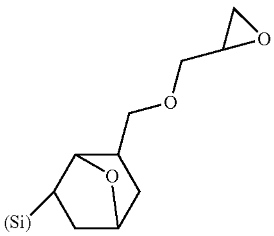
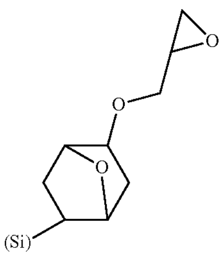
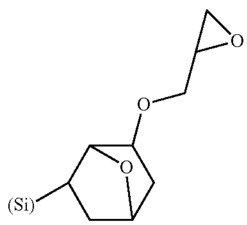
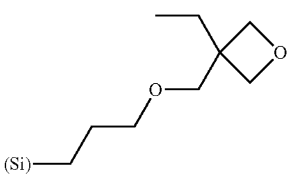
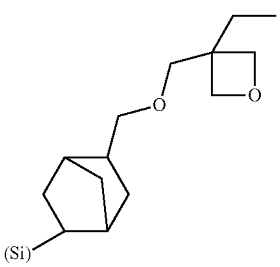
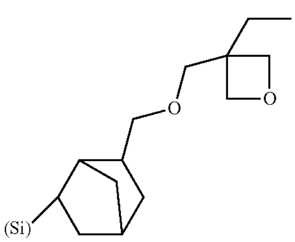
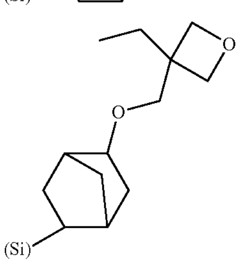
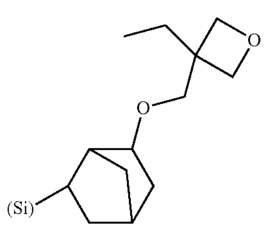
-continued
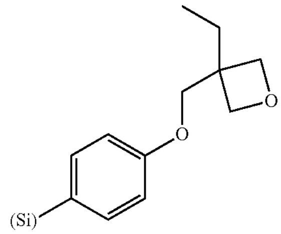
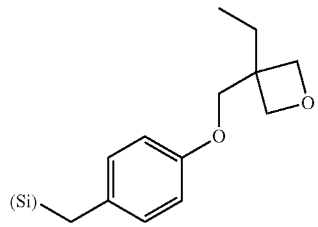
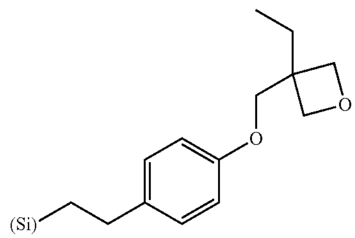
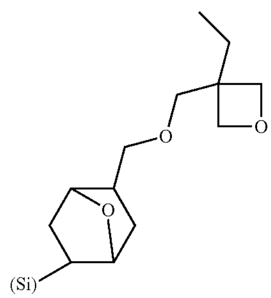
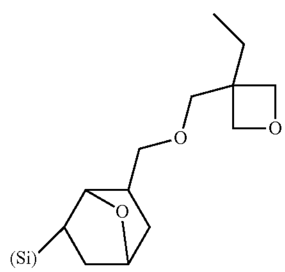
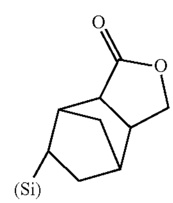
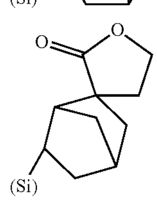
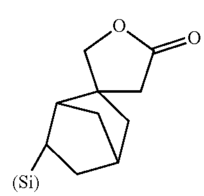
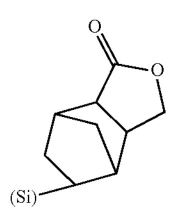
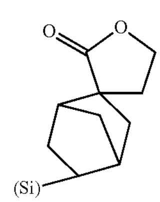

-continued
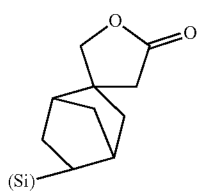
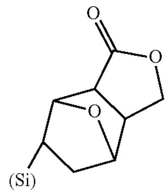
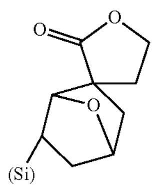
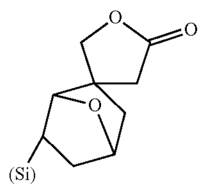
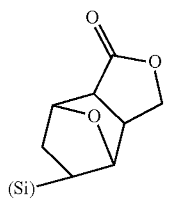
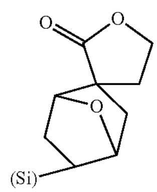
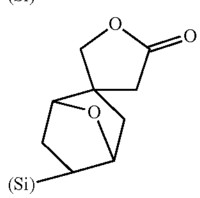
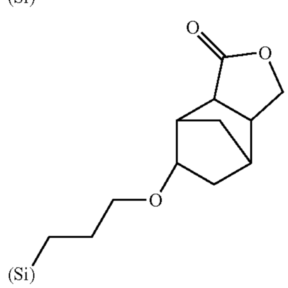
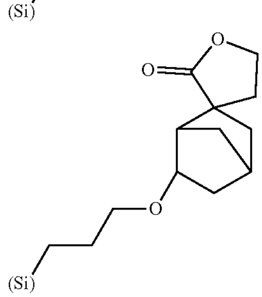
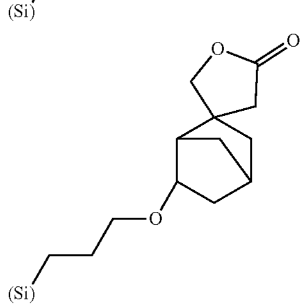
-continued
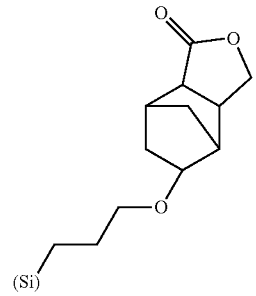
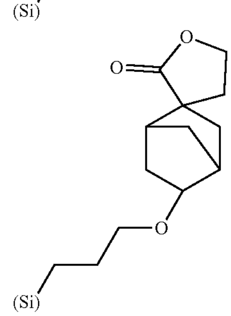
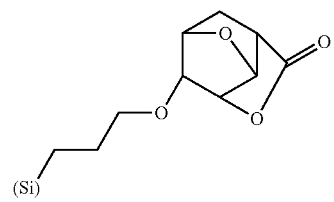
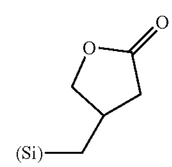
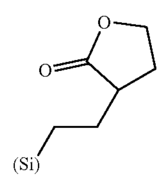
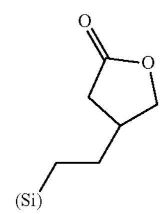
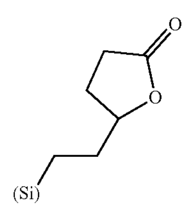
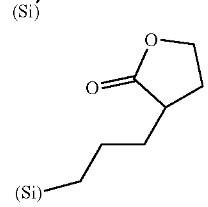
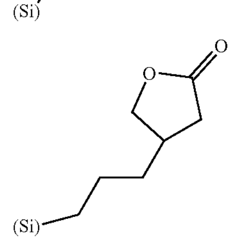
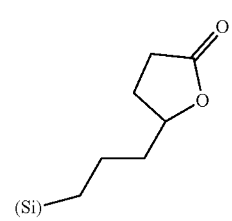
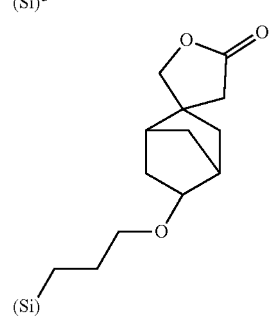

-continued
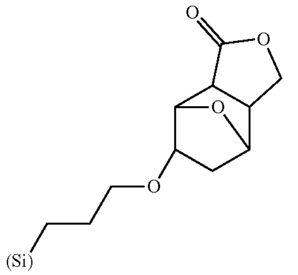
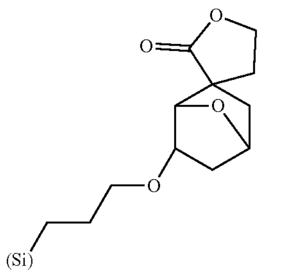
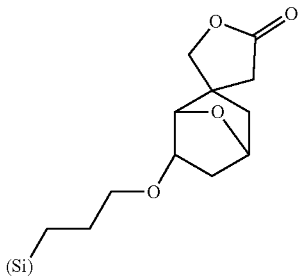
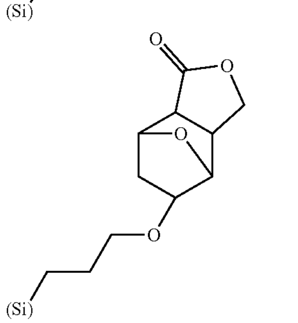
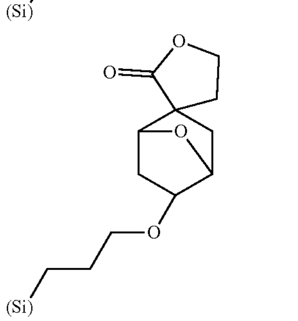
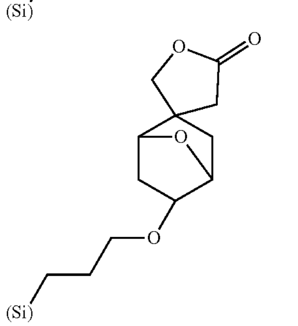
-continued
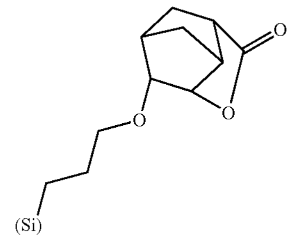
In these formulae, (Si) is depicted to show a bonding position, and does not constitute $R^6$.
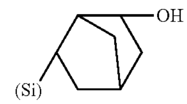
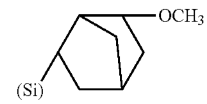
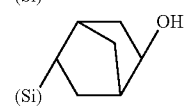
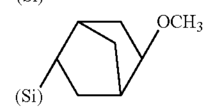
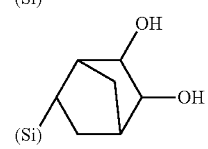
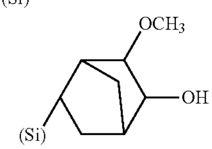
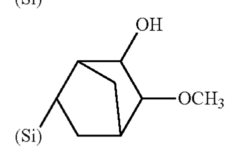
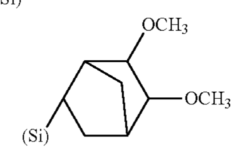
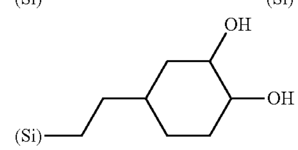
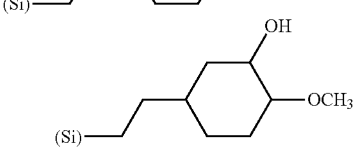
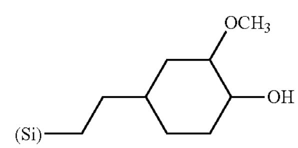
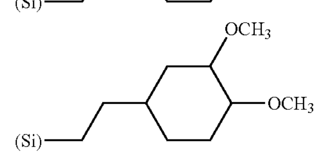
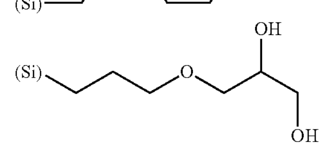
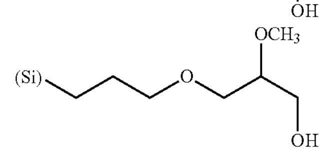

-continued
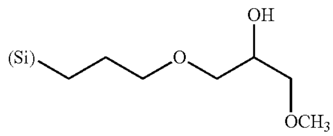
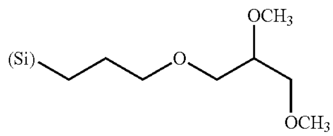
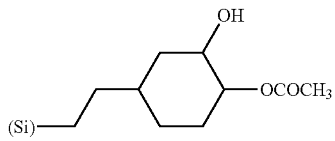
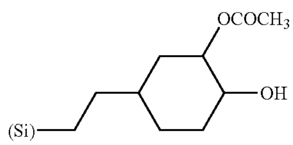
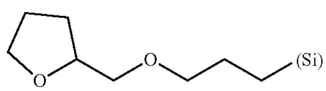
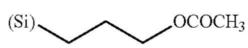
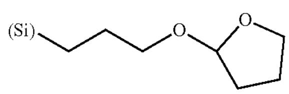
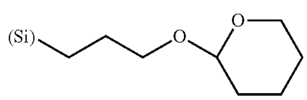
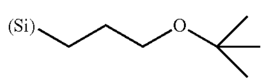
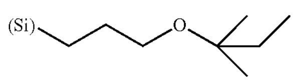
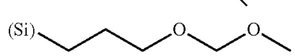
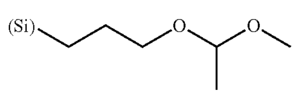
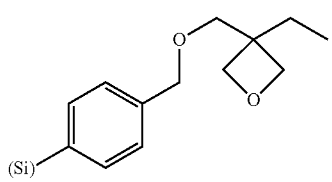
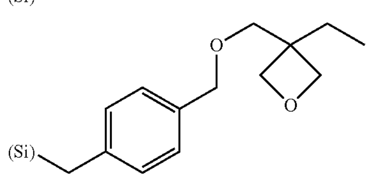
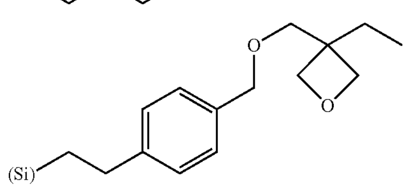
-continued
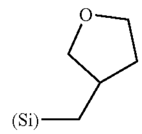
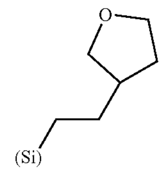
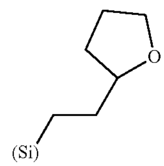
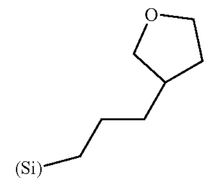
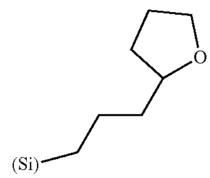
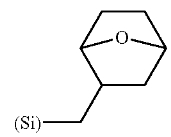
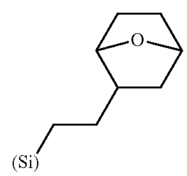
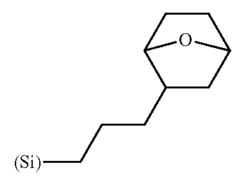
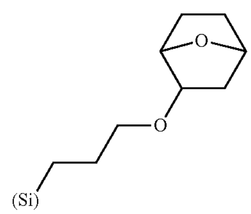
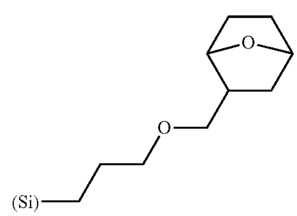
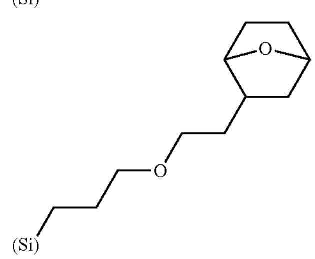
In these formulae, (Si) is depicted to show a bonding position, and does not constitute $R^6$.
Moreover, as an example of the organic group of $R^6$ an organic group containing a silicon-silicon bond can also be used. Specific examples thereof include the following.

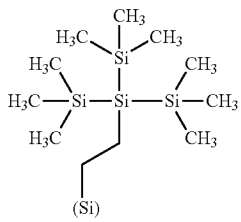

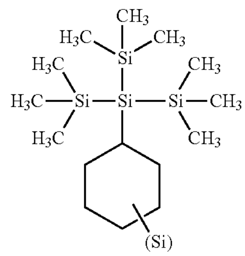

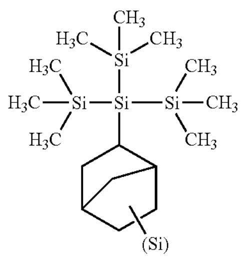

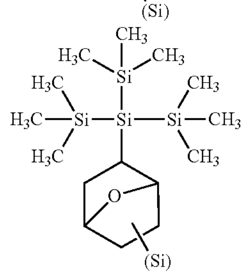

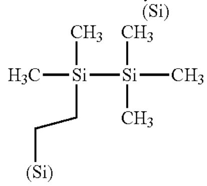

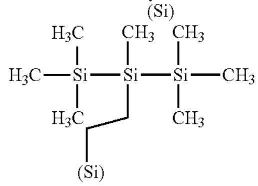

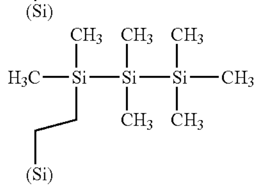

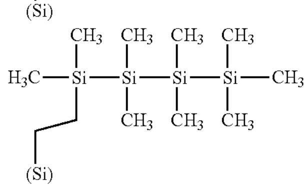

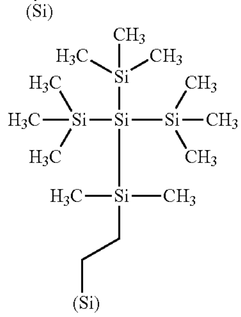

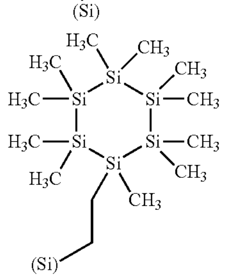

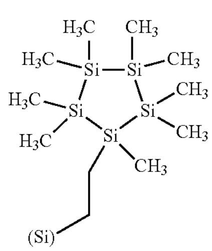

In these formulae, (Si) is depicted to show a bonding position, and does not constitute $R^6$.

Further, as an example of the organic group of $R^6$, an organic group having a protective group that is decomposed with an acid can also be used. Specific examples thereof include organic groups shown from paragraphs (0058) and (0059) of JP 2013-167669 A; and organic groups obtained from silicon compounds shown in paragraph (0060) of JP 2013-224279 A.

Furthermore, as an example of the organic group of $R^6$, an organic group having a fluorine atom can also be used. Specific examples thereof include organic groups obtained from silicon compounds shown from paragraphs (0062) and (0063) of JP 2012-053253 A.

[Method for Synthesizing Thermosetting Silicon-Containing Material]

(Synthesis Method 1: Acid Catalyst)

In the present invention, the thermosetting silicon-containing material can be produced by, for example, hydrolysis or hydrolysis condensation of the silicon compound (A-1) shown by the general formula (1) alone or a mixture of the silicon compound (A-1) and one or more kinds of the silicon compound (A-2) shown by the general formula (2) (hereinafter, referred to as monomer) in the presence of an acid catalyst. Hereinafter, hydrolysis, hydrolysis condensation, or both of these will be referred to as simply hydrolysis condensation.

Examples of the acid catalyst used in this event include organic acids such as formic acid, acetic acid, oxalic acid, maleic acid, methanesulfonic acid, benzenesulfonic acid, and toluenesulfonic acid; inorganic acids such as hydrofluoric acid, hydrochloric acid, hydrobromic acid, sulfuric acid, nitric acid, perchloric acid, and phosphoric acid; and the like. The catalyst can be used in an amount of $1\times10^{-6}$ to 10 mol, preferably $1\times10^{-5}$ to 5 mol, more preferably $1\times10^{-4}$ to 1 mol, relative to 1 mol of the monomer.

When the thermosetting silicon-containing material is obtained from these monomers by the hydrolysis condensation, water is preferably added in an amount of 0.01 to 100 mol, more preferably 0.05 to 50 mol, further preferably 0.1 to 30 mol, per mol of the hydrolysable substituent bonded to the monomer. When the amount is within this range, a reaction device can be made small and economical.

As the operation method, the monomer is added to a catalyst aqueous solution to initiate the hydrolysis condensation reaction. In this event, an organic solvent may be added to the catalyst aqueous solution, or the monomer may be diluted with an organic solvent, or both of these operations may be performed. The reaction temperature may be 0 to 100° C., preferably 5 to 80° C. As a preferable method, when the monomer is added dropwise, the temperature is maintained at 5 to 80° C., and then the mixture is aged at 20 to 80° C.

The organic solvent which can be added to the catalyst aqueous solution or with which the monomer can be diluted is preferably methanol, ethanol, 1-propanol, 2-propanol, 1-butanol, 2-butanol, 2-methyl-1-propanol, acetone, acetonitrile, tetrahydrofuran, toluene, hexane, ethyl acetate, methyl ethyl ketone, methyl isobutyl ketone, cyclohexanone, methyl amyl ketone, ethylene glycol, propylene glycol, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, butanediol monopropyl ether, propylene glycol monopropyl ether, ethylene glycol monopropyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, t-butyl propionate, propylene glycol mono-t-butyl ether acetate, γ-butyrolactone, mixtures thereof, and the like.

Among these organic solvents, water-soluble solvents are preferable. Examples thereof include alcohols such as methanol, ethanol, 1-propanol, and 2-propanol; polyhydric alcohols such as ethylene glycol and propylene glycol; polyhydric alcohol condensate derivatives such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, and ethylene glycol monopropyl ether; acetone, acetonitrile, tetrahydrofuran, and the like. Among these, particularly preferable is one having a boiling point of 100° C. or lower.

Note that the organic solvent is used in an amount of preferably 0 to 1,000 ml, particularly preferably 0 to 500 ml, relative to 1 mol of the monomer. When the organic solvent is used in a small amount, only a small reaction vessel is required, and this is economical.

Then, if necessary, neutralization reaction of the catalyst is carried out to obtain a reaction mixture aqueous solution. In this event, the amount of an alkaline substance usable for the neutralization is preferably 0.1 to 2 equivalents relative to the acid used as the catalyst. This alkaline substance may be any substance as long as it shows alkalinity in water.

Subsequently, by-products such as alcohol produced by the hydrolysis condensation reaction are preferably removed from the reaction mixture by a procedure such as removal under reduced pressure. In this event, the reaction mixture is heated at a temperature of preferably 0 to 100° C., more preferably 10 to 90° C., further preferably 15 to 80° C., although the temperature depends on the kinds of the added organic solvent, the alcohol produced in the reaction, and so forth. Additionally, in this event, the degree of vacuum is preferably atmospheric pressure or less, more preferably 80 kPa or less in absolute pressure, further preferably 50 kPa or less in absolute pressure, although the degree of vacuum varies depending on the kinds of the organic solvent, alcohol, etc. to be removed, as well as exhausting equipment, condensation equipment, and heating temperature. In this case, it is difficult to accurately know the amount of alcohol to be removed, but it is desirable to remove about 80 mass % or more of the produced alcohol, etc.

Next, the acid catalyst used in the hydrolysis condensation may be removed from the reaction mixture. As a method for removing the acid catalyst, the thermosetting silicon-containing material is mixed with water, and the thermosetting silicon-containing material is extracted with an organic solvent. Preferably, the organic solvent used in this event is capable of dissolving the thermosetting silicon-containing material, and achieves two-layer separation when mixed with water. Examples of the organic solvent include methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, cyclopentyl methyl ether, mixtures thereof, and the like.

Further, it is also possible to use a mixture of a water-soluble organic solvent and a slightly-water-soluble organic solvent. Preferable examples of the mixture include methanol-ethyl acetate mixture, ethanol-ethyl acetate mixture, 1-propanol-ethyl acetate mixture, 2-propanol-ethyl acetate mixture, butanediol monomethyl ether-ethyl acetate mixture, propylene glycol monomethyl ether-ethyl acetate mixture, ethylene glycol monomethyl ether-ethyl acetate mixture, butanediol monoethyl ether-ethyl acetate mixture, propylene glycol monoethyl ether-ethyl acetate mixture, ethylene glycol monoethyl ether-ethyl acetate mixture, butanediol monopropyl ether-ethyl acetate mixture, propylene glycol monopropyl ether-ethyl acetate mixture, ethylene glycol monopropyl ether-ethyl acetate mixture, methanol-methyl isobutyl ketone mixture, ethanol-methyl isobutyl ketone mixture, 1-propanol-methyl isobutyl ketone mixture, 2-propanol-methyl isobutyl ketone mixture, propylene glycol monomethyl ether-methyl isobutyl ketone mixture, ethylene glycol monomethyl ether-methyl isobutyl ketone mixture, propylene glycol monoethyl ether-methyl isobutyl ketone mixture, ethylene glycol monoethyl ether-methyl isobutyl ketone mixture, propylene glycol monopropyl ether-methyl isobutyl ketone mixture, ethylene glycol monopropyl ether-methyl isobutyl ketone mixture, methanol-cyclopentyl methyl ether mixture, ethanol-cyclopentyl methyl ether mixture, 1-propanol-cyclopentyl methyl ether mixture, 2-propanol-cyclopentyl methyl ether mixture, propylene glycol monomethyl ether-cyclopentyl methyl ether mixture, ethylene glycol monomethyl ether-cyclopentyl methyl ether mixture, propylene glycol monoethyl ether-cyclopentyl methyl ether mixture, ethylene glycol monoethyl ether-cyclopentyl methyl ether mixture, propylene glycol monopropyl ether-cyclopentyl methyl ether mixture, ethylene glycol monopropyl ether-cyclopentyl methyl ether mixture, methanol-propylene glycol methyl ether acetate mixture, ethanol-propylene glycol methyl ether acetate mixture, 1-propanol-propylene glycol methyl ether acetate mixture, 2-propanol-propylene glycol methyl ether acetate mixture, propylene glycol monomethyl ether-propylene glycol methyl ether acetate mixture, ethylene glycol monomethyl ether-propylene glycol methyl ether acetate mixture, propylene glycol monoethyl ether-propylene glycol methyl ether acetate mixture, ethylene glycol monoethyl ether-propylene glycol methyl ether acetate mixture, propylene glycol monopropyl ether-propylene glycol methyl ether acetate mixture, ethylene glycol monopropyl ether-propylene glycol methyl ether acetate mixture, and the like. However, the combination is not limited thereto.

Although the mixing ratio of the water-soluble organic solvent and the slightly-water-soluble organic solvent is appropriately selected, the amount of the water-soluble organic solvent may be 0.1 to 1,000 parts by mass, preferably 1 to 500 parts by mass, further preferably 2 to 100 parts by mass, based on 100 parts by mass of the slightly-water-soluble organic solvent.

Subsequently, the thermosetting silicon-containing material solution may be washed with neutral water. As the neutral water, what is commonly called deionized water or ultrapure water may be used. The amount of the neutral water may be 0.01 to 100 L, preferably 0.05 to 50 L, more preferably 0.1 to 5 L, relative to 1 L of the thermosetting silicon-containing material solution. This washing procedure may be performed by putting both the thermosetting silicon-containing material solution and neutral water into the same container, followed by stirring and then leaving to stand to separate the aqueous layer. The washing may be performed once or more, preferably once to approximately five times.

Other methods for removing the acid catalyst include a method using an ion-exchange resin, and a method in which the acid catalyst is removed after neutralization with an epoxy compound such as ethylene oxide and propylene oxide. These methods can be appropriately selected in accordance with the acid catalyst used in the reaction.

In this water-washing operation, a part of the thermosetting silicon-containing material escapes into the aqueous layer, so that substantially the same effect as fractionation operation is obtained in some cases. Hence, the number of water-washing operations and the amount of washing water may be appropriately selected in view of the catalyst removal effect and the fractionation effect.

To a solution of either the thermosetting silicon-containing material with the acid catalyst still remaining or the thermosetting silicon-containing material with the acid catalyst having been removed, a final solvent may be added for solvent exchange under reduced pressure to obtain a desired silicon-containing material solution. In this event, the temperature during the solvent exchange is preferably 0 to 100° C., more preferably 10 to 90° C., further preferably 15 to 80° C., depending on the kinds of the reaction solvent and the extraction solvent to be removed. Moreover, the degree of vacuum in this event is preferably atmospheric pressure or less, more preferably 80 kPa or less in absolute pressure, further preferably 50 kPa or less in absolute pressure, although the degree of vacuum varies depending on the kinds of the extraction solvent to be removed, exhausting equipment, condensation equipment, and heating temperature.

In this event, the thermosetting silicon-containing material may become unstable by the solvent exchange. This occurs due to incompatibility of the thermosetting silicon-containing material with the final solvent. Thus, in order to prevent this phenomenon, a monohydric, dihydric, or polyhydric alcohol having cyclic ether as a substituent as shown in paragraphs (0181) and (0182) of JP 2009-126940 A may be added as a stabilizer. The alcohol may be added in an amount of 0 to 25 parts by mass, preferably 0 to 15 parts by mass, more preferably 0 to 5 parts by mass, based on 100 parts by mass of the thermosetting silicon-containing material in the solution before the solvent exchange. When the alcohol is added, the amount is preferably 0.5 parts by mass or more. If necessary, the monohydric, dihydric, or polyhydric alcohol having cyclic ether as a substituent may be added to the solution before the solvent exchange, and then the solvent exchange operation may be performed.

If the thermosetting silicon-containing material is concentrated above a certain concentration, the condensation reaction may further progress, so that the thermosetting silicon-containing material becomes no longer soluble in an organic solvent. Thus, it is preferable to maintain the solution state with a proper concentration. Meanwhile, if the concentration is too low, the amount of solvent is excessive. Hence, the solution state with a proper concentration is economical and preferable. The concentration in this state is preferably 0.1 to 20 mass %.

The final solvent added to the thermosetting silicon-containing material solution is preferably an alcohol-based solvent or a monoalkyl ether derivative. Particularly preferable alcohol-based solvents include ethylene glycol, diethylene glycol, triethylene glycol, propylene glycol, dipropylene glycol, butanediol, and the like. Specifically, preferable examples of monoalkyl ether derivatives include butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, and the like.

When these solvents are used as the main component, a non-alcohol-based solvent can also be added as an adjuvant solvent. Examples of the adjuvant solvent include acetone, tetrahydrofuran, toluene, hexane, ethyl acetate, cyclohexanone, methyl amyl ketone, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, cyclopentyl methyl ether, and the like.

As an alternative reaction operation using an acid catalyst, water or a water-containing organic solvent is added to the monomer or an organic solution of the monomer to start the hydrolysis reaction. In this event, the catalyst may be added to the monomer or the organic solution of the monomer, or may be added to the water or the water-containing organic solvent. The reaction temperature may be 0 to 100° C., preferably 10 to 80° C. As a preferable method, when the water is added dropwise, the mixture is heated to 10 to 50° C., and then further heated to 20 to 80° C. for aging.

When the organic solvent is used, a water-soluble solvent is preferable. Examples thereof include alcohols such as methanol, ethanol, 1-propanol, 2-propanol, 1-butanol, 2-butanol, and 2-methyl-1-propanol; polyhydric alcohol condensate derivatives such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether; acetone, tetrahydrofuran, acetonitrile, mixtures thereof, and the like.

The organic solvent is used in an amount of preferably 0 to 1,000 ml, particularly preferably 0 to 500 ml, relative to 1 mol of the monomer. When the organic solvent is used in a small amount, only a small reaction vessel is required, and this is economical. The obtained reaction mixture may be subjected to post-treatment by the same procedure as described above to obtain a thermosetting silicon-containing material.

(Synthesis Method 2: Alkali Catalyst)

Alternatively, the thermosetting silicon-containing material can be produced, for example, by hydrolysis condensation of a mixture of the silicon compound (A-1) shown by the general formula (1) and one or more silicon compounds (A-2) shown by the general formula (2) in the presence of an alkali catalyst. Examples of the alkali catalyst used in this event include methylamine, ethylamine, propylamine, butylamine, ethylenediamine, hexamethylenediamine, dimethylamine, diethylamine, ethylmethylamine, trimethylamine, triethylamine, tripropylamine, tributylamine, cyclohexylamine, dicyclohexylamine, monoethanolamine, diethanolamine, dimethyl monoethanolamine, monomethyl diethanolamine, triethanolamine, diazabicyclooctane, diazabicyclocyclononene, diazabicycloundecene, hexamethylenetetramine, aniline, N,N-dimethylaniline, pyridine, N,N- dimethylaminopyridine, pyrrole, piperazine, pyrrolidine, piperidine, picoline, tetramethylammonium hydroxide, choline hydroxide, tetrapropylammonium hydroxide, tetrabutylammonium hydroxide, ammonia, lithium hydroxide, sodium hydroxide, potassium hydroxide, barium hydroxide, calcium hydroxide, and the like. The catalyst can be used in an amount of $1\times10^{-6}$ mol to 10 mol, preferably $1\times10^{-5}$ mol to 5 mol, more preferably $1\times10^{-4}$ mol to 1 mol, relative to 1 mol of the monomer.

When the thermosetting silicon-containing material is obtained from the monomer by the hydrolysis condensation, water is preferably added in an amount of 0.1 to 50 mol per mol of the hydrolysable substituent bonded to the monomer. When the amount is within this range, a device used for the reaction can be made small and economical.

As the operation method, the monomer is added to a catalyst aqueous solution to start the hydrolysis condensation reaction. In this event, an organic solvent may be added to the catalyst aqueous solution, or the monomer may be diluted with an organic solvent, or both of these operations may be performed. The reaction temperature may be 0 to 100° C., preferably 5 to 80° C. As a preferable method, when the monomer is added dropwise, the temperature is maintained at 5 to 80° C., and then the mixture is aged at 20 to 80° C.

As the organic solvent which can be added to the alkali catalyst aqueous solution or with which the monomer can be diluted, the same organic solvents as those exemplified as the organic solvents which can be added to the acid catalyst aqueous solution are preferably used. Note that the organic solvent is used in an amount of preferably 0 to 1,000 ml relative to 1 mol of the monomer because the reaction can be performed economically.

Then, if necessary, neutralization reaction of the catalyst is carried out to obtain a reaction mixture aqueous solution. In this event, the amount of an acidic substance usable for the neutralization is preferably 0.1 to 2 equivalents relative to the alkaline substance used as the catalyst. This acidic substance may be any substance as long as it shows acidity in water.

Subsequently, by-products such as alcohol produced by the hydrolysis condensation reaction are preferably removed from the reaction mixture by a procedure such as removal under reduced pressure. In this event, the reaction mixture is heated at a temperature of preferably 0 to 100° C., more preferably 10 to 90° C., further preferably 15 to 80° C., although the temperature depends on the kinds of the added organic solvent and alcohol produced in the reaction. Moreover, the degree of vacuum in this event is preferably atmospheric pressure or less, more preferably 80 kPa or less in absolute pressure, further preferably 50 kPa or less in absolute pressure, although the degree of vacuum varies depending on the kinds of the organic solvent and alcohol to be removed, as well as exhausting equipment, condensation equipment, and heating temperature. In this case, it is difficult to accurately know the amount of alcohol to be removed, but it is desirable to remove about 80 mass % or more of the produced alcohol.

Next, to remove the alkali catalyst used in the hydrolysis condensation, the thermosetting silicon-containing material is extracted with an organic solvent. Preferably, the organic solvent used in this event is capable of dissolving the thermosetting silicon-containing material, and achieves two-layer separation when mixed with water. Further, it is also possible to use a mixture of a water-soluble organic solvent and a slightly-water-soluble organic solvent.

As concrete examples of the organic solvent used for removing the alkali catalyst, it is possible to use the aforementioned organic solvents specifically exemplified for the acid catalyst removal or the same mixture of the water-soluble organic solvent and the water-insoluble organic solvent.

Preferably, the organic solvent used in this event is capable of dissolving the thermosetting silicon-containing material, and achieves two-layer separation when mixed with water. Examples of the organic solvent include methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl amyl ketone, propylene glycol monomethyl ether, ethylene glycol monomethyl ether, propylene glycol monoethyl ether, ethylene glycol monoethyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, cyclopentyl methyl ether, and the like, and mixtures thereof.

Although the mixing ratio of the water-soluble organic solvent and the slightly-water-soluble organic solvent is appropriately selected, the amount of the water-soluble organic solvent may be 0.1 to 1,000 parts by mass, preferably 1 to 500 parts by mass, further preferably 2 to 100 parts by mass, based on 100 parts by mass of the slightly-water-soluble organic solvent.

Subsequently, the thermosetting silicon-containing material solution may be washed with neutral water. As the neutral water, what is commonly called deionized water or ultrapure water may be used. The amount of the neutral water may be 0.01 to 100 L, preferably 0.05 to 50 L, more preferably 0.1 to 5 L, relative to 1 L of the thermosetting silicon-containing material solution. This washing procedure may be performed by putting both the thermosetting silicon-containing material solution and neutral water into the same container, followed by stirring and then leaving to stand to separate the aqueous layer. The washing may be performed once or more, preferably once to approximately five times.

To the washed thermosetting silicon-containing material solution, a final solvent may be added for solvent exchange under reduced pressure to obtain a desired thermosetting silicon-containing material solution. In this event, the temperature during the solvent exchange is preferably 0 to 100° C., more preferably 10 to 90° C., further preferably 15 to 80° C., depending on the kinds of the extraction solvent to be removed. Moreover, the degree of vacuum in this event is preferably atmospheric pressure or less, more preferably 80 kPa or less in absolute pressure, further preferably 50 kPa or less in absolute pressure, although the degree of vacuum varies depending on the kinds of the extraction solvent to be removed, exhausting equipment, condensation equipment, and heating temperature.

The final solvent added to the thermosetting silicon-containing material solution is preferably an alcohol-based solvent or a monoalkyl ether. Particularly preferable alcohol-based solvents include ethylene glycol, diethylene glycol, triethylene glycol, etc. Specifically, preferable examples of monoalkyl ether include propylene glycol monomethyl ether, ethylene glycol monomethyl ether, propylene glycol monoethyl ether, ethylene glycol monoethyl ether, propylene glycol monopropyl ether, ethylene glycol monopropyl ether, and the like.

As an alternative reaction operation using an alkali catalyst, water or a water-containing organic solvent is added to the monomer or an organic solution of the monomer to initiate the hydrolysis reaction. In this event, the catalyst may be added to the monomer or the organic solution of the monomer, or may be added to the water or the water-containing organic solvent. The reaction temperature may be 0 to 100° C., preferably 10 to 80° C. As a preferable method, when the water is added dropwise, the mixture is heated to 10 to 50° C., and then further heated to 20 to 80° C. for aging.

The organic solvent usable for the organic solution of the monomer or the water-containing organic solvent is preferably a water-soluble solvent. Examples thereof include alcohols such as methanol, ethanol, 1-propanol, 2-propanol, 1-butanol, 2-butanol, and 2-methyl-1-propanol; polyhydric alcohol condensate derivatives such as propylene glycol monomethyl ether, ethylene glycol monomethyl ether, propylene glycol monoethyl ether, ethylene glycol monoethyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether; acetone, tetrahydrofuran, acetonitrile, mixtures thereof, and the like.

The molecular weight of the thermosetting silicon-containing material obtained by the above synthesis method 1 or 2 can be adjusted not only through the selection of the monomers, but also through reaction condition control during the polymerization, and it is preferable to use the thermosetting silicon-containing material having a weight-average molecular weight of 100,000 or less, more preferably 200 to 50,000, further preferably 300 to 30,000. When the weight-average molecular weight is 100,000 or less, the generation of foreign matters or coating spots does not occur.

Regarding data on the weight-average molecular weight, the molecular weight is expressed in terms of polystyrene which is obtained by gel permeation chromatography (GPC) using a refractive index (RI) detector, tetrahydrofuran as an eluent, and polystyrene as a reference substance.

The inventive composition for forming a silicon-containing resist underlayer film can further contain a crosslinking catalyst as described below.

In the present invention, the thermosetting silicon-containing material can be produced from the hydrolysable monomer under conditions using the acid or alkali catalyst. Furthermore, it is possible to use, as a component of a resist underlayer film composition, a polysiloxane derivative produced from a mixture of this monomer with a hydrolysable metal compound shown by the following general formula (Mm) under the conditions using the acid or alkali catalyst.

$$U(OR^8)_{m8}(OR^9)_{m9} \quad \text{(Mm)}$$

In the formula, $R^8$ and $R^9$ each represent an organic group having 1 to 30 carbon atoms; m8+m9 represents the same number as a valence determined by the kind of U; m8 and m9 each represent an integer of 0 or more; and U represents an element belonging to the group III, IV, V, XIII, XIV, or XV in the periodic table, except for carbon and silicon.

Examples of the hydrolysable metal compound (Mm) used in this event include the following.

When U is boron, examples of the compound shown by the general formula (Mm) include, as hydrolysable metal compounds, boron methoxide, boron ethoxide, boron propoxide, boron butoxide, boron amyloxide, boron hexyloxide, boron cyclopentoxide, boron cyclohexyloxide, boron allyloxide, boron phenoxide, boron methoxyethoxide, boric acid, boron oxide, and the like.

When U is aluminum, examples of the compound shown by the general formula (Mm) include, as hydrolysable metal compounds, aluminum methoxide, aluminum ethoxide, aluminum propoxide, aluminum butoxide, aluminum amyloxide, aluminum hexyloxide, aluminum cyclopentoxide, aluminum cyclohexyloxide, aluminum allyloxide, aluminum phenoxide, aluminum methoxyethoxide, aluminum ethoxyethoxide, aluminum dipropoxy(ethyl acetoacetate), aluminum dibutoxy(ethyl acetoacetate), aluminum propoxy bis(ethyl acetoacetate), aluminum butoxy bis(ethyl acetoacetate), aluminum 2,4-pentanedionate, aluminum 2,2,6,6-tetramethyl-3,5-heptanedionate, and the like.

When U is gallium, examples of the compound shown by the general formula (Mm) include, as hydrolysable metal compounds, gallium methoxide, gallium ethoxide, gallium propoxide, gallium butoxide, gallium amyloxide, gallium hexyloxide, gallium cyclopentoxide, gallium cyclohexyloxide, gallium allyloxide, gallium phenoxide, gallium methoxyethoxide, gallium ethoxyethoxide, gallium dipropoxy(ethyl acetoacetate), gallium dibutoxy(ethyl acetoacetate), gallium propoxy bis(ethyl acetoacetate), gallium butoxy bis(ethyl acetoacetate), gallium 2,4-pentanedionate, gallium 2,2,6,6-tetramethyl-3,5-heptanedionate, and the like.

When U is yttrium, examples of the compound shown by the general formula (Mm) include, as hydrolysable metal compounds, yttrium methoxide, yttrium ethoxide, yttrium propoxide, yttrium butoxide, yttrium amyloxide, yttrium hexyloxide, yttrium cyclopentoxide, yttrium cyclohexyloxide, yttrium allyloxide, yttrium phenoxide, yttrium methoxyethoxide, yttrium ethoxyethoxide, yttrium dipropoxy(ethyl acetoacetate), yttrium dibutoxy(ethyl acetoacetate), yttrium propoxy bis(ethyl acetoacetate), yttrium butoxy bis(ethyl acetoacetate), yttrium 2,4-pentanedionate, yttrium 2,2,6,6-tetramethyl-3,5-heptanedionate, and the like.

When U is germanium, examples of the compound shown by the general formula (Mm) include, as hydrolysable metal compounds, germanium methoxide, germanium ethoxide, germanium propoxide, germanium butoxide, germanium amyloxide, germanium hexyloxide, germanium cyclopentoxide, germanium cyclohexyloxide, germanium allyloxide, germanium phenoxide, germanium methoxyethoxide, germanium ethoxyethoxide, and the like.

When U is titanium, examples of the compound shown by the general formula (Mm) include, as hydrolysable metal compounds, titanium methoxide, titanium ethoxide, titanium propoxide, titanium butoxide, titanium amyloxide, titanium hexyloxide, titanium cyclopentoxide, titanium cyclohexyloxide, titanium allyloxide, titanium phenoxide, titanium methoxyethoxide, titanium ethoxyethoxide, titanium dipropoxy bis(ethyl acetoacetate), titanium dibutoxy bis(ethyl acetoacetate), titanium dipropoxy bis(2,4-pentanedionate), titanium dibutoxy bis(2,4-pentanedionate), and the like.

When U is hafnium, examples of the compound shown by the general formula (Mm) include, as hydrolysable metal compounds, hafnium methoxide, hafnium ethoxide, hafnium propoxide, hafnium butoxide, hafnium amyloxide, hafnium hexyloxide, hafnium cyclopentoxide, hafnium cyclohexyloxide, hafnium allyloxide, hafnium phenoxide, hafnium methoxyethoxide, hafnium ethoxyethoxide, hafnium dipropoxy bis(ethyl acetoacetate), hafnium dibutoxy bis(ethyl acetoacetate), hafnium dipropoxy bis(2,4-pentanedionate), hafnium dibutoxy bis(2,4-pentanedionate), and the like.

When U is tin, examples of the compound shown by the general formula (Mm) include, as hydrolysable metal compounds, methoxy tin, ethoxy tin, propoxy tin, butoxy tin, phenoxy tin, methoxyethoxy tin, ethoxyethoxy tin, tin 2,4-pentanedionate, tin 2,2,6,6-tetramethyl-3,5-heptanedionate, and the like.

When U is arsenic, examples of the compound shown by the general formula (Mm) include, as hydrolysable metal compounds, methoxy arsenic, ethoxy arsenic, propoxy arsenic, butoxy arsenic, phenoxy arsenic, and the like.

When U is antimony, examples of the compound shown by the general formula (Mm) include, as hydrolysable metal compounds, methoxy antimony, ethoxy antimony, propoxy antimony, butoxy antimony, phenoxy antimony, antimony acetate, antimony propionate, and the like.

When U is niobium, examples of the compound shown by the general formula (Mm) include, as hydrolysable metal compounds, methoxy niobium, ethoxy niobium, propoxy niobium, butoxy niobium, phenoxy niobium, and the like.

When U is tantalum, examples of the compound shown by the general formula (Mm) include, as hydrolysable metal compounds, methoxy tantalum, ethoxy tantalum, propoxy tantalum, butoxy tantalum, phenoxy tantalum, and the like.

When U is bismuth, examples of the compound shown by the general formula (Mm) include, as hydrolysable metal compounds, methoxy bismuth, ethoxy bismuth, propoxy bismuth, butoxy bismuth, phenoxy bismuth, and the like.

When U is phosphorus, examples of the compound shown by the general formula (Mm) include, as hydrolysable metal compounds, trimethyl phosphate, triethyl phosphate, tripropyl phosphate, trimethyl phosphite, triethyl phosphite, tripropyl phosphite, diphosphorous pentaoxide, and the like.

When U is vanadium, examples of the compound shown by the general formula (Mm) include, as hydrolysable metal compounds, vanadium oxide bis(2,4-pentanedionate), vanadium 2,4-pentanedionate, vanadium tributoxide oxide, vanadium tripropoxide oxide, and the like.

When U is zirconium, examples of the compound shown by the general formula (Mm) include, as hydrolysable metal compounds, methoxy zirconium, ethoxy zirconium, propoxy zirconium, butoxy zirconium, phenoxy zirconium, zirconium dibutoxide bis(2,4-pentanedionate), zirconium dipropoxide bis(2,2,6,6-tetramethyl-3,5-heptanedionate), and the like.

(Crosslinking Catalyst)

In the present invention, a crosslinking catalyst (Xc) may be blended into the composition for forming a silicon-containing resist underlayer film. An example of the blendable crosslinking catalyst includes a compound shown by the following general formula (Xc0):

$$L_aH_bA \qquad \text{(Xc0)}$$

where L represents lithium, sodium, potassium, rubidium, cesium, sulfonium, iodonium, phosphonium, or ammonium; A represents a non-nucleophilic counter ion; "a" represents an integer of 1 or more; "b" represents an integer of 0 or 1 or more; and a+b represents a valence of the non-nucleophilic counter ion.

Examples of the crosslinking catalyst used in the present invention as specific (Xc0) include a sulfonium salt of the following general formula (Xc-1), an iodonium salt of the following general formula (Xc-2), a phosphonium salt of the following general formula (Xc-3), an ammonium salt of the following general formula (Xc-4), an alkaline metal salt, and the like.

Examples of the sulfonium salt (Xc-1), the iodonium salt (Xc-2), and the phosphonium salt (Xc-3) include the following.

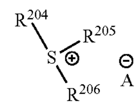

(Xc-1)

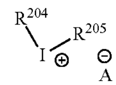

(Xc-2)

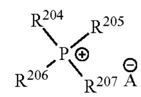

(Xc-3)

Meanwhile, an example of the ammonium salt (Xc-4) includes the following.

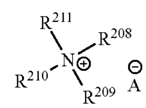

(Xc-4)

In the formulae, $R^{204}$, $R^{205}$, $R^{206}$, and $R^{207}$ each represent a linear, branched, or cyclic alkyl group, alkenyl group, oxoalkyl group, or oxoalkenyl group having 1 to 12 carbon atoms, a substituted or unsubstituted aryl group having 6 to 20 carbon atoms, or an aralkyl group or aryloxoalkyl group having 7 to 12 carbon atoms; some or all of the hydrogen atoms of these groups are optionally substituted with an alkoxy group or the like. Additionally, $R^{205}$ and $R^{206}$ may form a ring; when a ring is formed, $R^{205}$ and $R^{206}$ each represent an alkylene group having 1 to 6 carbon atoms. $A^-$ represents a non-nucleophilic counter ion. $R^{208}$, $R^{209}$, $R^{210}$, and $R^{211}$ are the same as $R^{204}$, $R^{205}$, $R^{206}$, and $R^{207}$, or may be each a hydrogen atom. $R^{208}$ and $R^{209}$, or $R^{208}$, $R^{209}$ and $R^{210}$, may form a ring; when a ring is formed, $R^{208}$ and $R^{209}$, or $R^{208}$, $R^{209}$ and $R^{210}$, represent an alkylene group having 3 to 10 carbon atoms.

$R^{204}$, $R^{205}$, $R^{206}$, $R^{207}$, $R^{208}$, $R^{209}$, $R^{210}$, and $R^{11}$ may be identical to or different from one another. Specifically, examples of the alkyl group include a methyl group, an ethyl group, a propyl group, an isopropyl group, an n-butyl group, a sec-butyl group, a tert-butyl group, a pentyl group, a hexyl group, a heptyl group, an octyl group, a cyclopentyl group, a cyclohexyl group, a cycloheptyl group, a cyclopropylmethyl group, a 4-methylcyclohexyl group, a cyclohexylmethyl group, a norbornyl group, an adamantyl group, and the like. Examples of the alkenyl group include a vinyl group, an allyl group, a propenyl group, a butenyl group, a hexenyl group, a cyclohexenyl group, and the like. Examples of the oxoalkyl group include a 2-oxocyclopentyl group, a 2-oxocyclohexyl group, a 2-oxopropyl group, a 2-cyclopentyl-2-oxoethyl group, a 2-cyclohexyl-2-oxoethyl group, a 2-(4-methylcyclohexyl)-2-oxoethyl group, and the like. Examples of the oxoalkenyl group include an acryloyl group, a methacryloyl group, a crotoyl group, and the like. Examples of the aryl group include a phenyl group, a naphthyl group, and the like; alkoxyphenyl groups such as a p-methoxyphenyl group, an m-methoxyphenyl group, an o-methoxyphenyl group, an ethoxyphenyl group, a p-tert-butoxyphenyl group, and an m-tert-butoxyphenyl group; alkylphenyl groups such as a 2-methylphenyl group, a 3-methylphenyl group, a 4-methylphenyl group, an ethylphenyl group, a 4-tert-butylphenyl group, a 4-butylphenyl group, and a dimethylphenyl group; alkylnaphthyl groups such as a methylnaphthyl group and an ethylnaphthyl group; alkoxynaphthyl groups such as a methoxynaphthyl group and an ethoxynaphthyl group; dialkylnaphthyl groups such as a dimethylnaphthyl group and a diethylnaphthyl group; dialkoxynaphthyl groups such as a dimethoxynaphthyl group and a diethoxynaphthyl group; and the like. Examples of the aralkyl group include a benzyl group, a phenylethyl group, a phenethyl group, and the like. Examples of the aryloxoalkyl group include 2-aryl-2-oxoethyl groups such as a 2-phenyl-2-oxoethyl group, a 2-(1-naphthyl)-2-oxoethyl group, and a 2-(2-naphthyl)-2-oxoethyl group; and the like.

Examples of the non-nucleophilic counter ion A include monovalent ions such as hydroxide ion, formate ion, acetate ion, propionate ion, butanoate ion, pentanoate ion, hexanoate ion, heptanoate ion, octanoate ion, nonanoate ion, decanoate ion, oleate ion, stearate ion, linoleate ion, linolenate ion, benzoate ion, phthalate ion, isophthalate ion, terephthalate ion, salicylate ion, trifluoroacetate ion, monochloroacetate ion, dichloroacetate ion, trichloroacetate ion, fluoride ion, chloride ion, bromide ion, iodide ion, nitrate ion, nitrite ion, chlorate ion, bromate ion, methanesulfonate ion, paratoluenesulfonate ion, and monomethylsulfate ion; monovalent or divalent ions such as oxalate ion, malonate ion, methylmalonate ion, ethylmalonate ion, propylmalonate ion, butylmalonate ion, dimethylmalonate ion, diethylmalonate ion, succinate ion, methylsuccinate ion, glutarate ion, adipate ion, itaconate ion, maleate ion, fumarate ion, citraconate ion, citrate ion, carbonate ion, sulfate ion, and the like.

Examples of the alkaline metal salt include salts of lithium, sodium, potassium, cesium, magnesium, and calcium; monovalent salts such as hydroxide, formate, acetate, propionate, butanoate, pentanoate, hexanoate, heptanoate, octanoate, nonanoate, decanoate, oleate, stearate, linoleate, linolenate, benzoate, phthalate, isophthalate, terephthalate, salicylate, trifluoroacetate, monochloroacetate, dichloroacetate, and trichloroacetate; monovalent or divalent salts such as oxalate, malonate, methylmalonate, ethylmalonate, propylmalonate, butylmalonate, dimethylmalonate, diethylmalonate, succinate, methylsuccinate, glutarate, adipate, itaconate, maleate, fumarate, citraconate, citrate, carbonate, and the like.

Specific examples of the sulfonium salt (Xc-1) include triphenylsulfonium formate, triphenylsulfonium acetate, triphenylsulfonium propionate, triphenylsulfonium butanoate, triphenylsulfonium benzoate, triphenylsulfonium phthalate, triphenylsulfonium isophthalate, triphenylsulfonium terephthalate, triphenylsulfonium salicylate, triphenylsulfonium trifluoromethanesulfonate, triphenylsulfonium trifluoroacetate, triphenylsulfonium monochloroacetate, triphenylsulfonium dichloroacetate, triphenylsulfonium trichloroacetate, triphenylsulfonium hydroxide, triphenylsulfonium nitrate, triphenylsulfonium chloride, triphenylsulfonium bromide, triphenylsulfonium oxalate, triphenylsulfonium malonate, triphenylsulfonium methylmalonate, triphenylsulfonium ethylmalonate, triphenylsulfonium propylmalonate, triphenylsulfonium butylmalonate, triphenylsulfonium dimethylmalonate, triphenylsulfonium diethylmalonate, triphenylsulfonium succinate, triphenylsulfonium methylsuccinate, triphenylsulfonium glutarate, triphenylsulfonium adipate, triphenylsulfonium itaconate, bistriphenylsulfonium oxalate, triphenylsulfonium maleate, triphenylsulfonium fumarate, triphenylsulfonium citraconate, triphenylsulfonium citrate, triphenylsulfonium carbonate, bistriphenylsulfonium oxalate, bistriphenylsulfonium maleate, bistriphenylsulfonium fumarate, bistriphenylsulfonium citraconate, bistriphenylsulfonium citrate, bistriphenylsulfonium carbonate, and the like.

Specific examples of the iodonium salt (Xc-2) include diphenyliodonium formate, diphenyliodonium acetate, diphenyliodonium propionate, diphenyliodonium butanoate, diphenyliodonium benzoate, diphenyliodonium phthalate, diphenyliodonium isophthalate, diphenyliodonium terephthalate, diphenyliodonium salicylate, diphenyliodonium trifluoro methanesulfonate, diphenyliodonium trifluoroacetate, diphenyliodonium monochloroacetate, diphenyliodonium dichloroacetate, diphenyliodonium trichloroacetate, diphenyliodonium hydroxide, diphenyliodonium nitrate, diphenyliodonium chloride, diphenyliodonium bromide, diphenyliodonium iodide, diphenyliodonium oxalate, diphenyliodonium maleate, diphenyliodonium fumarate, diphenyliodonium citraconate, diphenyliodonium citrate, diphenyliodonium carbonate, bisdiphenyliodonium oxalate, bisdiphenyliodonium maleate, bisdiphenyliodonium fumarate, bisdiphenyliodonium citraconate, bisdiphenyliodonium citrate, bisdiphenyliodonium carbonate, and the like.

Specific examples of the phosphonium salt (Xc-3) include tetraethylphosphonium formate, tetraethylphosphonium acetate, tetraethylphosphonium propionate, tetraethylphosphonium butanoate, tetraethylphosphonium benzoate, tetraethylphosphonium phthalate, tetraethylphosphonium isophthalate, tetraethylphosphonium terephthalate, tetraethylphosphonium salicylate, tetraethylphosphonium trifluoromethanesulfonate, tetraethylphosphonium trifluoroacetate, tetraethylphosphonium monochloroacetate, tetraethylphosphonium dichloroacetate, tetraethylphosphonium trichloroacetate, tetraethylphosphonium hydroxide, tetraethylphosphonium nitrate, tetraethylphosphonium chloride, tetraethylphosphonium bromide, tetraethylphosphonium iodide, tetraethylphosphonium oxalate, tetraethylphosphonium maleate, tetraethylphosphonium fumarate, tetraethylphosphonium citraconate, tetraethylphosphonium citrate, tetraethylphosphonium carbonate, bistetraethylphosphonium oxalate, bistetraethylphosphonium maleate, bistetraethylphosphonium fumarate, bistetraethylphosphonium citraconate, bistetraethylphosphonium citrate, bistetraethylphosphonium carbonate, tetraphenylphosphonium formate, tetraphenylphosphonium acetate, tetraphenylphosphonium propionate, tetraphenylphosphonium butanoate, tetraphenylphosphonium benzoate, tetraphenylphosphonium phthalate, tetraphenylphosphonium isophthalate, tetraphenylphosphonium terephthalate, tetraphenylphosphonium salicylate, tetraphenylphosphonium trifluoromethanesulfonate, tetraphenylphosphonium trifluoroacetate, tetraphenylphosphonium monochloroacetate, tetraphenylphosphonium dichloroacetate, tetraphenylphosphonium trichloroacetate, tetraphenylphosphonium hydroxide, tetraphenylphosphonium nitrate, tetraphenylphosphonium chloride, tetraphenylphosphonium bromide, tetraphenylphosphonium iodide, tetraphenylphosphonium oxalate, tetraphenylphosphonium maleate, tetraphenylphosphonium fumarate, tetraphenylphosphonium citraconate, tetraphenylphosphonium citrate, tetraphenylphosphonium carbonate, bistetraphenylphosphonium oxalate, bistetraphenylphosphonium maleate, bistetraphenylphosphonium fumarate, bistetraphenylphosphonium citraconate, bistetraphenylphosphonium citrate, bistetraphenylphosphonium carbonate, and the like.

Specific examples of the ammonium salt (Xc-4) include tetramethylammonium formate, tetramethylammonium acetate, tetramethylammonium propionate, tetramethylammonium butanoate, tetramethylammonium benzoate, tetramethylammonium phthalate, tetramethylammonium isophthalate, tetramethylammonium terephthalate, tetramethylammonium salicylate, tetramethylammonium trifluoromethanesulfonate, tetramethylammonium trifluoroacetate, tetramethylammonium monochloroacetate, tetramethylammonium dichloroacetate, tetramethylammonium trichloroacetate, tetramethylammonium hydroxide, tetramethylammonium nitrate, tetramethylammonium chloride, tetramethylammonium bromide, tetramethylammonium iodide, tetramethylammonium monomethylsulfate, tetramethylammonium oxalate, tetramethylammonium malonate, tetramethylammonium maleate, tetramethylammonium fumarate, tetramethylammonium citraconate, tetramethylammonium citrate, tetramethylammonium carbonate, bistetramethylammonium oxalate, bistetramethylammonium malonate, bistetramethylammonium maleate, bistetramethylammonium fumarate, bistetramethylammonium citraconate, bistetramethylammonium citrate, bistetramethylammonium carbonate, tetraethylammonium formate, tetraethylammonium acetate, tetraethylammonium propionate, tetraethylammonium butanoate, tetraethylammonium benzoate, tetraethylammonium phthalate, tetraethylammonium isophthalate, tetraethylammonium terephthalate, tetraethylammonium salicylate, tetraethylammonium trifluoromethanesulfonate, tetraethylammonium trifluoroacetate, tetraethylammonium monochloroacetate, tetraethylammonium dichloroacetate, tetraethylammonium trichloroacetate, tetraethylammonium hydroxide, tetraethylammonium nitrate, tetraethylammonium chloride, tetraethylammonium bromide, tetraethylammonium iodide, tetraethylammonium monomethylsulfate, tetraethylammonium oxalate, tetraethylammonium malonate, tetraethylammonium maleate, tetraethylammonium fumarate, tetraethylammonium citraconate, tetraethylammonium citrate, tetraethylammonium carbonate, bistetraethylammonium oxalate, bistetraethylammonium malonate, bistetraethylammonium maleate, bistetraethylammonium fumarate, bistetraethylammonium citraconate, bistetraethylammonium citrate, bistetraethylammonium carbonate, tetrapropylammonium formate, tetrapropylammonium acetate, tetrapropylammonium propionate, tetrapropylammonium butanoate, tetrapropylammonium benzoate, tetrapropylammonium phthalate, tetrapropylammonium isophthalate, tetrapropylammonium terephthalate, tetrapropylammonium salicylate, tetrapropylammonium trifluoromethanesulfonate, tetrapropylammonium trifluoroacetate, tetrapropylammonium monochloroacetate, tetrapropylammonium dichloroacetate, tetrapropylammonium trichloroacetate, tetrapropylammonium hydroxide, tetrapropylammonium nitrate, tetrapropylammonium chloride, tetrapropylammonium bromide, tetrapropylammonium iodide, tetrapropylammonium monomethylsulfate, tetrapropylammonium oxalate, tetrapropylammonium malonate, tetrapropylammonium maleate, tetrapropylammonium fumarate, tetrapropylammonium citraconate, tetrapropylammonium citrate, tetrapropylammonium carbonate, bistetrapropylammonium oxalate, bistetrapropylammonium malonate, bistetrapropylammonium maleate, bistetrapropylammonium fumarate, bistetrapropylammonium citraconate, bistetrapropylammonium citrate, bistetrapropylammonium carbonate, tetrabutylammonium formate, tetrabutylammonium acetate, tetrabutylammonium propionate, tetrabutylammonium butanoate, tetrabutylammonium benzoate, tetrabutylammonium phthalate, tetrabutylammonium isophthalate, tetrabutylammonium terephthalate, tetrabutylammonium salicylate, tetrabutylammonium trifluoromethanesulfonate, tetrabutylammonium trifluoroacetate, tetrabutylammonium monochloroacetate, tetrabutylammonium dichloroacetate, tetrabutylammonium trichloroacetate, tetrabutylammonium hydroxide, tetrabutylammonium nitrate, tetrabutylammonium chloride, tetrabutylammonium bromide, tetrabutylammonium iodide, tetrabutylammonium methanesulfonate, tetrabutylammonium monomethylsulfate, tetrabutylammonium oxalate, tetrabutylammonium malonate, tetrabutylammonium maleate, tetrabutylammonium fumarate, tetrabutylammonium citraconate, tetrabutylammonium citrate, tetrabutylammonium carbonate, bistetrabutylammonium oxalate, bistetrabutylammonium malonate, bistetrabutylammonium maleate, bistetrabutylammonium fumarate, bistetrabutylammonium citraconate, bistetrabutylammonium citrate, bistetrabutylammonium carbonate, trimethylphenylammonium formate, trimethylphenylammonium acetate, trimethylphenylammonium propionate, trimethylphenylammonium butanoate, trimethylphenylammonium benzoate, trimethylphenylammonium phthalate, trimethylphenylammonium isophthalate, trimethylphenylammonium terephthalate, trimethylphenylammonium salicylate, trimethylphenylammonium trifluoromethanesulfonate, trimethylphenylammonium trifluoroacetate, trimethylphenylammonium monochloroacetate, trimethylphenylammonium dichloroacetate, trimethylphenylammonium trichloroacetate, trimethylphenylammonium hydroxide, trimethylphenylammonium nitrate, trimethylphenylammonium chloride, trimethylphenylammonium bromide, trimethylphenylammonium iodide, trimethylphenylammonium methanesulfonate, trimethylphenylammonium monomethylsulfate, trimethylphenylammonium oxalate, trimethylphenylammonium malonate, trimethylphenylammonium maleate, trimethylphenylammonium fumarate, trimethylphenylammonium citraconate, trimethylphenylammonium citrate, trimethylphenylammonium carbonate, bistrimethylphenylammonium oxalate, bistrimethylphenylammonium malonate, bistrimethylphenylammonium maleate, bistrimethylphenylammonium fumarate, bistrimethylphenylammonium citraconate, bistrimethylphenylammonium citrate, bistrimethylphenylammonium carbonate, triethylphenylammonium formate, triethylphenylammonium acetate, triethylphenylammonium propionate, triethylphenylammonium butanoate, triethylphenylammonium benzoate, triethylphenylammonium phthalate, triethylphenylammonium isophthalate, triethylphenylammonium terephthalate, triethylphenylammonium salicylate, triethylphenylammonium trifluoromethanesulfonate, triethylphenylammonium trifluoroacetate, triethylphenylammonium monochloroacetate, triethylphenylammonium dichloroacetate, triethylphenylammonium trichloroacetate, triethylphenylammonium hydroxide, triethylphenylammonium nitrate, triethylphenylammonium chloride, triethylphenylammonium bromide, triethylphenylammonium iodide, triethylphenylammonium methanesulfonate, triethylphenylammonium monomethylsulfate, triethylphenylammonium oxalate, triethylphenylammonium malonate, triethylphenylammonium maleate, triethylphenylammonium fumarate, triethylphenylammonium citraconate, triethylphenylammonium citrate, triethylphenylammonium carbonate, bistriethylphenylammonium oxalate, bistriethylphenylammonium malonate, bistriethylphenylammonium maleate, bistriethylphenylammonium fumarate, bistriethylphenylammonium citraconate, bistriethylphenylammonium citrate, bistriethylphenylammonium carbonate, benzyldimethylphenylammonium formate, benzyldimethylphenylammonium acetate, benzyldimethylphenylammonium propionate, benzyldimethylphenylammonium butanoate, benzyldimethylphenylammonium benzoate, benzyldimethylphenylammonium phthalate, benzyldimethylphenylammonium isophthalate, benzyldimethylphenylammonium terephthalate, benzyldimethylphenylammonium salicylate, benzyldimethylphenylammonium trifluoromethanesulfonate, benzyldimethylphenylammonium trifluoroacetate, benzyldimethylphenylammonium monochloroacetate, benzyldimethylphenylammonium dichloroacetate, benzyldimethylphenylammonium trichloroacetate, benzyldimethylphenylammonium hydroxide, benzyldimethylphenylammonium nitrate, benzyldimethylphenylammonium chloride, benzyldimethylphenylammonium bromide, benzyldimethylphenylammonium iodide, benzyldimethylphenylammonium methanesulfonate, benzyldimethylphenylammonium monomethylsulfate, benzyldimethylphenylammonium oxalate, benzyldimethylphenylammonium malonate, benzyldimethylphenylammonium maleate, benzyldimethylphenylammonium fumarate, benzyldimethylphenylammonium citraconate, benzyldimethylphenylammonium citrate, benzyldimethylphenylammonium carbonate, bisbenzyldimethylphenylammonium oxalate, bisbenzyldimethylphenylammonium malonate, bisbenzyldimethylphenylammonium maleate, bisbenzyldimethylphenylammonium fumarate, bisbenzyldimethylphenylammonium citraconate, bisbenzyldimethylphenylammonium citrate, bisbenzyldimethylphenylammonium carbonate, and the like.

Examples of the alkaline metal salt include lithium formate, lithium acetate, lithium propionate, lithium butanoate, lithium benzoate, lithium phthalate, lithium isophthalate, lithium terephthalate, lithium salicylate, lithium trifluoromethanesulfonate, lithium trifluoroacetate, lithium monochloroacetate, lithium dichloroacetate, lithium trichloroacetate, lithium hydroxide, lithium nitrate, lithium chloride, lithium bromide, lithium iodide, lithium methanesulfonate, lithium hydrogen oxalate, lithium hydrogen malonate, lithium hydrogen maleate, lithium hydrogen fumarate, lithium hydrogen citraconate, lithium hydrogen citrate, lithium hydrogen carbonate, lithium oxalate, lithium malonate, lithium maleate, lithium fumarate, lithium citraconate, lithium citrate, lithium carbonate, sodium formate, sodium acetate, sodium propionate, sodium butanoate, sodium benzoate, sodium phthalate, sodium isophthalate, sodium terephthalate, sodium salicylate, sodium trifluoromethanesulfonate, sodium trifluoroacetate, sodium monochloroacetate, sodium dichloroacetate, sodium trichloroacetate, sodium hydroxide, sodium nitrate, sodium chloride, sodium bromide, sodium iodide, sodium methanesulfonate, sodium hydrogen oxalate, sodium hydrogen malonate, sodium hydrogen maleate, sodium hydrogen fumarate, sodium hydrogen citraconate, sodium hydrogen citrate, sodium hydrogen carbonate, sodium oxalate, sodium malonate, sodium maleate, sodium fumarate, sodium citraconate, sodium citrate, sodium carbonate, potassium formate, potassium acetate, potassium propionate, potassium butanoate, potassium benzoate, potassium phthalate, potassium isophthalate, potassium terephthalate, potassium salicylate, potassium trifluoromethanesulfonate, potassium trifluoroacetate, potassium monochloroacetate, potassium dichloroacetate, potassium trichloroacetate, potassium hydroxide, potassium nitrate, potassium chloride, potassium bromide, potassium iodide, potassium methanesulfonate, potassium hydrogen oxalate, potassium hydrogen malonate, potassium hydrogen maleate, potassium hydrogen fumarate, potassium hydrogen citraconate, potassium hydrogen citrate, potassium hydrogen carbonate, potassium oxalate, potassium malonate, potassium maleate, potassium fumarate, potassium citraconate, potassium citrate, potassium carbonate, and the like.

In the present invention, a polysiloxane (Xc-10) having a structure partially containing the sulfonium salt, the iodonium salt, the phosphonium salt, or the ammonium salt may be blended as the crosslinking catalyst (Xc) into the composition for forming a silicon-containing resist underlayer film.

As a raw material for producing (Xc-10) used here, it is possible to employ a compound shown by the following general formula (Xm):

$$R^{1A}_{A1}R^{2A}_{A2}R^{3A}_{A3}Si(OR^{0A})_{(4-A1-A2-A3)} \qquad \text{(Xm)}$$

where $R^{0A}$ represents a hydrocarbon group having 1 to 6 carbon atoms; at least one of $R^{1A}$, $R^{2A}$, and $R^{3A}$ represents an organic group having the ammonium salt, the sulfonium salt, the phosphonium salt, or the iodonium salt; the other(s) of $R^{1A}$, $R^{2A}$, and $R^{3A}$ represent a hydrogen atom or a monovalent organic group having 1 to 30 carbon atoms; and A1, A2, and A3 each represent 0 or 1, given that $1 \leq A1+A2+A3 \leq 3$.

Here, examples of $R^{0A}$ include a methyl group, an ethyl group, an n-propyl group, an iso-propyl group, an n-butyl group, an iso-butyl group, a sec-butyl group, a tert-butyl group, an n-pentyl group, a cyclopentyl group, an n-hexyl group, a cyclohexyl group, and a phenyl group.

An example of Xm includes the following general formula (Xm-1), which shows a hydrolysable silicon compound having a structure partially containing a sulfonium salt:

(Xm-1)

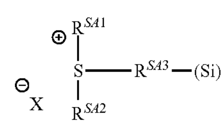

In the formula, $R^{SA1}$ and $R^{SA2}$ each represent a linear, branched, or cyclic alkyl group, alkenyl group, oxoalkyl group, or oxoalkenyl group having 1 to 20 carbon atoms, a substituted or unsubstituted aryl group having 6 to 20 carbon atoms, or an aralkyl group or aryloxyalkyl group having 7 to 20 carbon atoms; and some or all of the hydrogen atoms of these groups are optionally substituted with an alkoxy group, an amino group, an alkylamino group, a halogen atom, or the like. Moreover, $R^{SA1}$ and $R^{SA2}$ may form a ring together with a sulfur atom bonded to $R^{SA1}$ and $R^{SA2}$; and when a ring is formed, $R^{SA1}$ and $R^{SA2}$ each represent an alkylene group having 1 to 6 carbon atoms. $R^{SA3}$ represents a linear, branched, or cyclic alkylene group or alkenylene group having 1 to 20 carbon atoms, or a substituted or unsubstituted arylene group or aralkylene group having 6 to 20 carbon atoms; and some or all of the hydrogen atoms of these groups are optionally substituted with an alkoxy group, an amino group, an alkylamino group, or the like. $R^{SA1}$, $R^{SA2}$, and $R^{SA3}$ may have an oxygen atom or a nitrogen atom in the chain or ring thereof.

Examples of X include hydroxide ion, formate ion, acetate ion, propionate ion, butanoate ion, pentanoate ion, hexanoate ion, heptanoate ion, octanoate ion, nonanoate ion, decanoate ion, oleate ion, stearate ion, linoleate ion, linolenate ion, benzoate ion, p-methylbenzoate ion, p-t-butylbenzoate ion, phthalate ion, isophthalate ion, terephthalate ion, salicylate ion, trifluoroacetate ion, monochloroacetate ion, dichloroacetate ion, trichloroacetate ion, nitrate ion, chlorate ion, perchlorate ion, bromate ion, iodate ion, oxalate ion, malonate ion, methylmalonate ion, ethylmalonate ion, propylmalonate ion, butylmalonate ion, dimethylmalonate ion, diethylmalonate ion, succinate ion, methylsuccinate ion, glutarate ion, adipate ion, itaconate ion, maleate ion, fumarate ion, citraconate ion, citrate ion, carbonate ion, and the like.

Specific examples include the following ($X^-$ is as defined above).

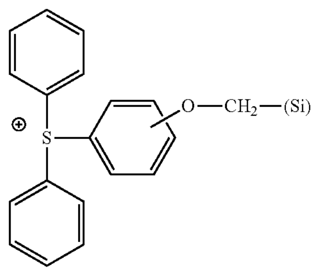

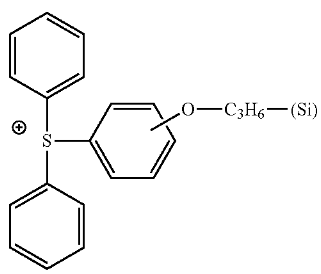

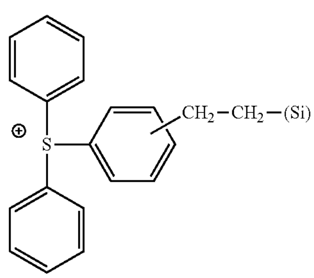

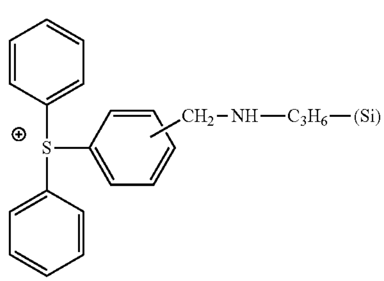

-continued

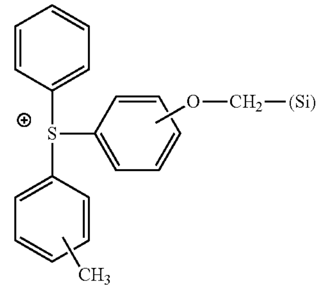

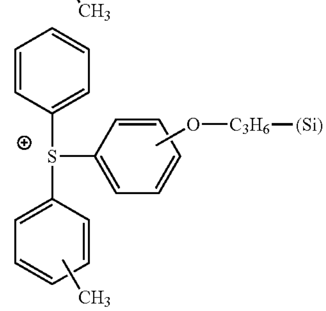

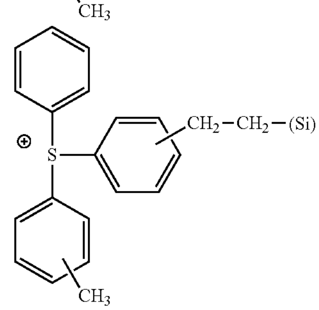

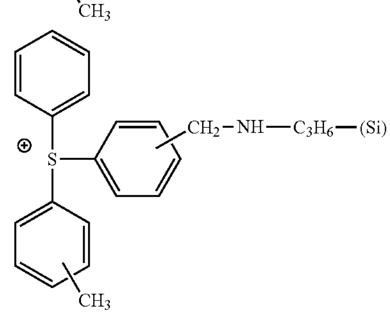

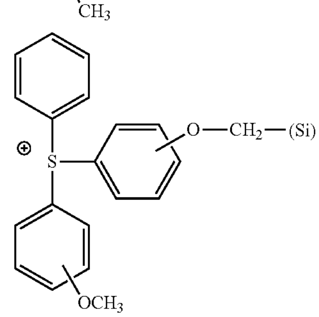

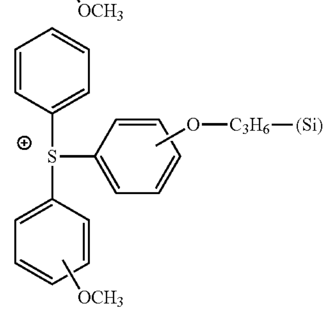

-continued

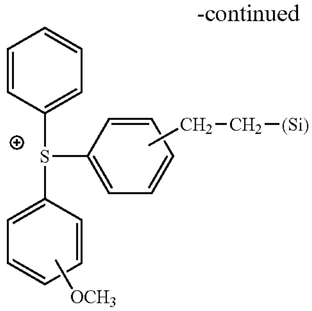

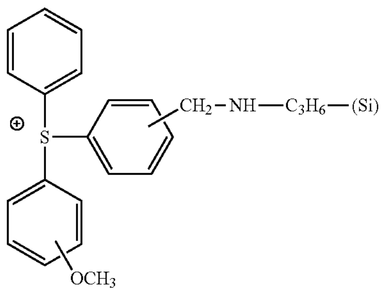

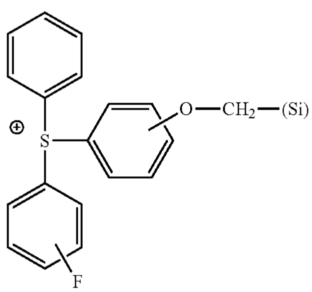

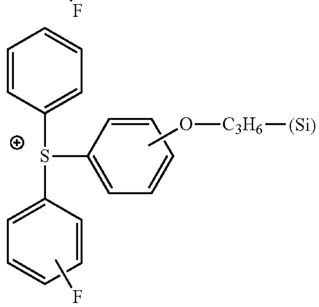

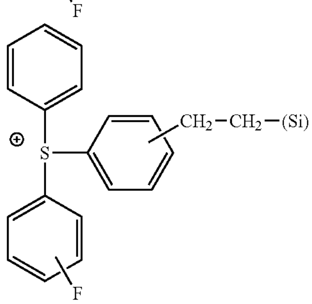

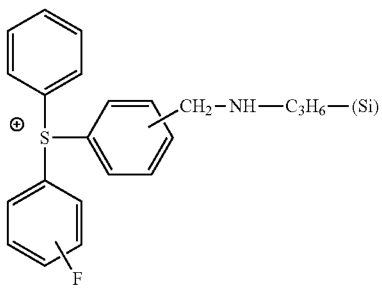

-continued

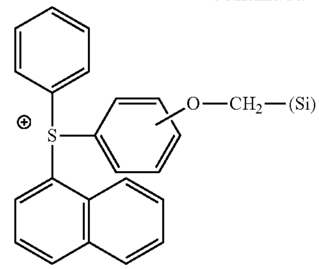

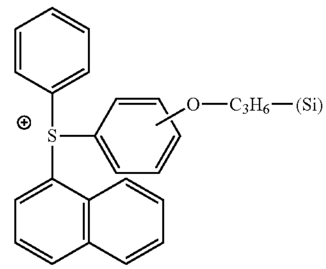

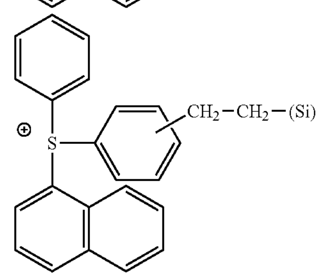

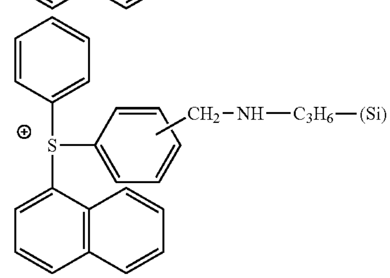

For example, a hydrolysable silicon compound having a structure partially containing an iodonium salt can be shown by the following general formula (Xm-2):

$$R^{IA1}-\overset{\oplus}{I}-R^{IA2}-(Si) \qquad \overset{\ominus}{X} \tag{Xm-2}$$

In the formula, $R^{IA1}$ represents a linear, branched, or cyclic alkyl group, alkenyl group, oxoalkyl group, or oxoalkenyl group having 1 to 20 carbon atoms, a substituted or unsubstituted aryl group having 6 to 20 carbon atoms, or an aralkyl group or an aryloxoalkyl group having 7 to 20 carbon atoms; some or all of the hydrogen atoms of this group are optionally substituted with an alkoxy group, an amino group, an alkylamino group, a halogen atom, or the like. Moreover, $R^{IA1}$ and $R^{IA2}$ may form a ring together with a iodine atom bonded to $R^{IA1}$ and $R^{IA2}$; and when a ring is formed, $R^{IA1}$ and $R^{IA2}$ each represent an alkylene group having 1 to 6 carbon atoms. $R^{IA2}$ represents a linear, branched, or cyclic alkylene group or alkenylene group having 1 to 20 carbon atoms, or a substituted or unsubstituted arylene group or aralkylene group having 6 to 20 carbon atoms; and some or all of the hydrogen atoms of these groups are optionally substituted with an alkoxy group, an amino group, an alkylamino group, or the like. $R^{IA1}$ and $R^{IA2}$ may have an oxygen atom or nitrogen atom in the chain or ring thereof.

Specific examples include the following ($X^-$ is as defined above).

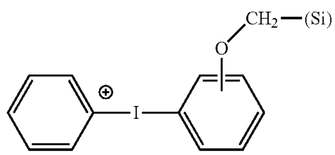

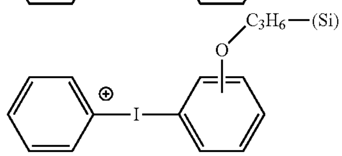

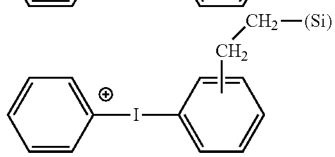

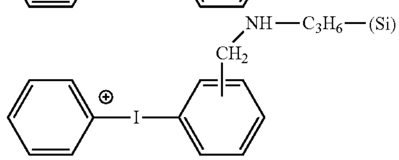

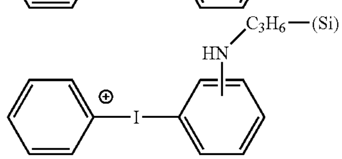

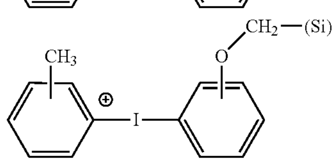

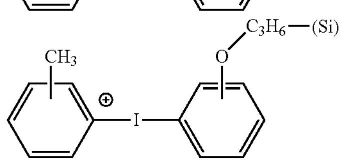

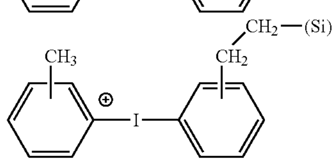

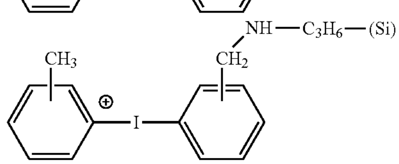

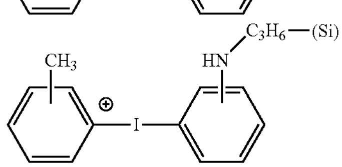

-continued

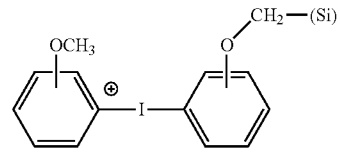

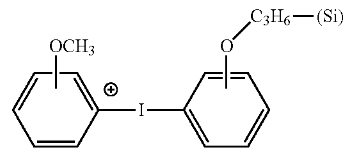

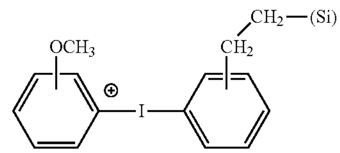

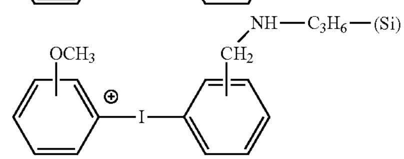

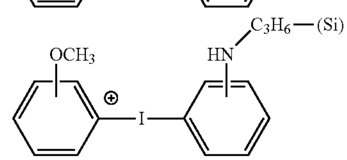

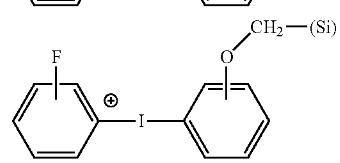

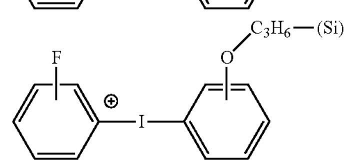

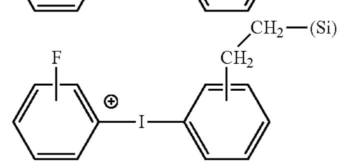

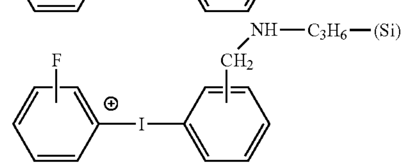

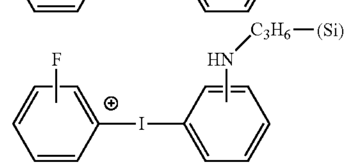

For example, a hydrolysable silicon compound having a structure partially containing a phosphonium salt can be shown by the following general formula (Xm-3):

(Xm-3)

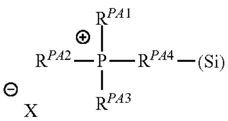

In the formula, $R^{PA1}$, $R^{PA2}$, and $R^{PA3}$ each represent a linear, branched, or cyclic alkyl group, alkenyl group, oxoalkyl group, or oxoalkenyl group having 1 to 20 carbon atoms, a substituted or unsubstituted aryl group having 6 to 20 carbon atoms, or an aralkyl group or an aryloxoalkyl group having 7 to 20 carbon atoms; and some or all of the hydrogen atoms of these groups are optionally substituted with an alkoxy group, an amino group, an alkylamino group, a halogen atom, or the like. Moreover, $R^{PA1}$ and $R^{PA2}$ may form a ring together with a phosphorus atom bonded to $R^{PA1}$ and $R^{PA2}$; and when a ring is formed, $R^{PA1}$ and $R^{PA2}$ each represent an alkylene group having 1 to 6 carbon atoms. $R^{PA4}$ represents a linear, branched, or cyclic alkylene group or alkenylene group having 1 to 20 carbon atoms, or a substituted or unsubstituted arylene group or aralkylene group having 6 to 20 carbon atoms; and some or all of the hydrogen atoms of these groups are optionally substituted with an alkoxy group, an amino group, an alkylamino group, or the like. $R^{PA1}$, $R^{PA2}$, $R^{PA3}$, and $R^{PA4}$ may have an oxygen atom or nitrogen atom in the chain or ring thereof.

Specific examples include the following ($X^-$ is as defined above).

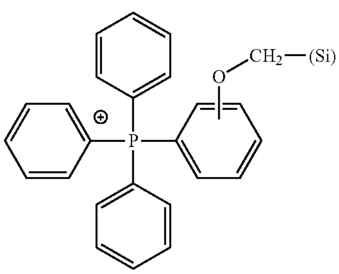

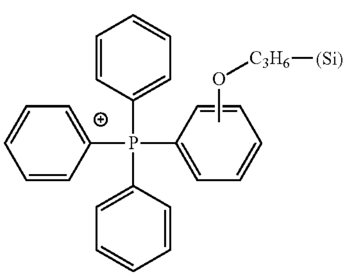

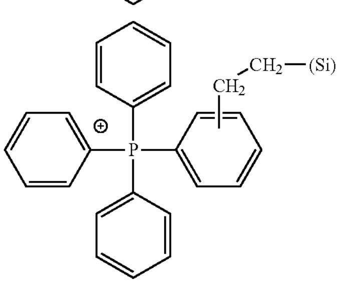

-continued

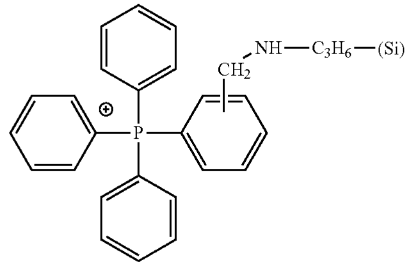

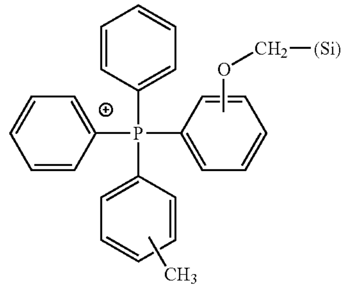

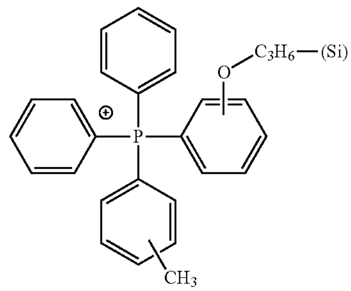

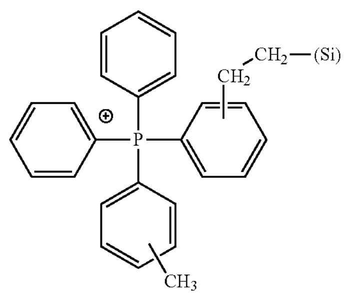

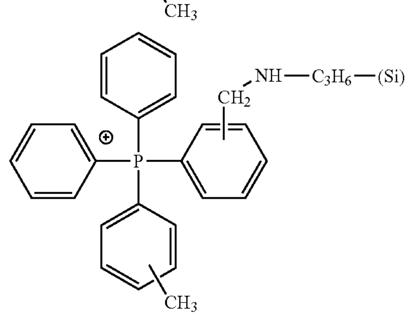

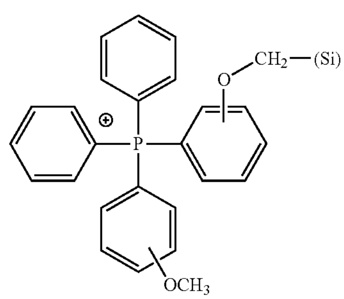

-continued
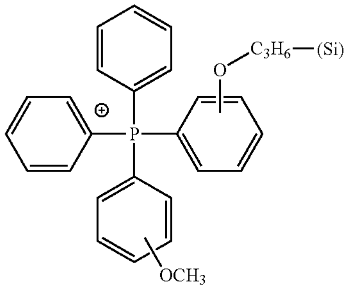
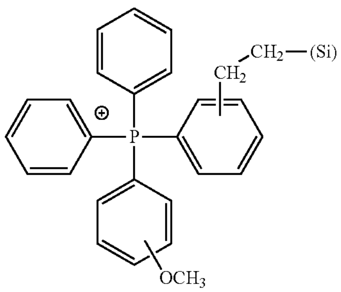
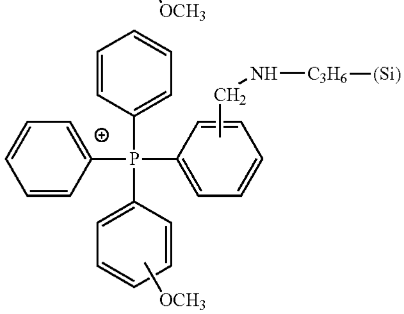
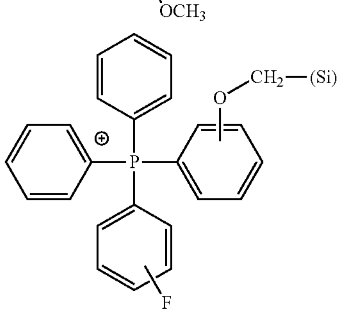
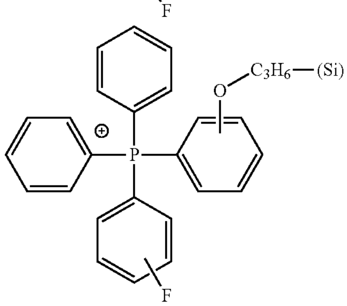
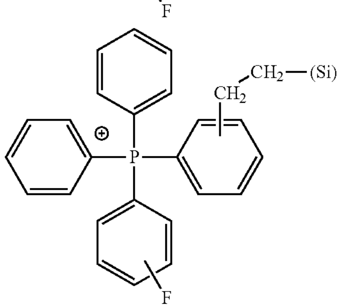
-continued
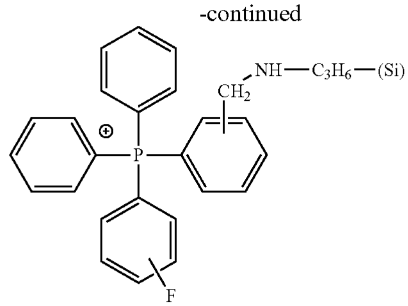
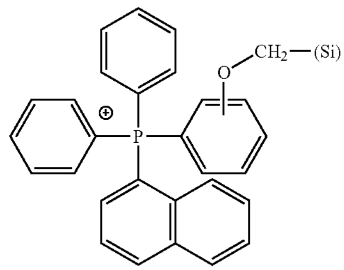
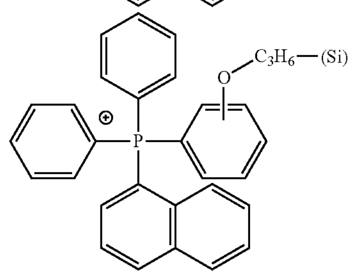
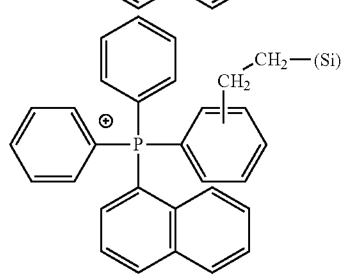
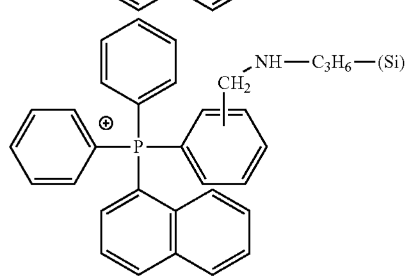
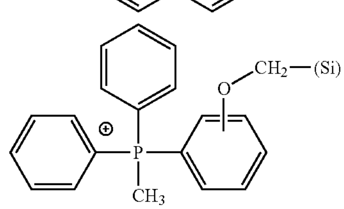
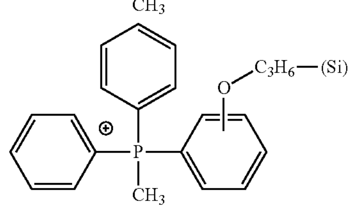

-continued
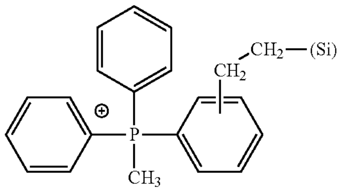
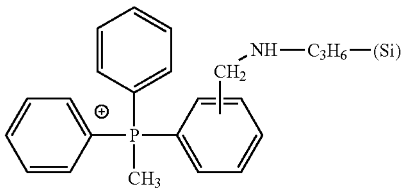
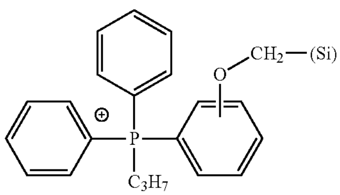
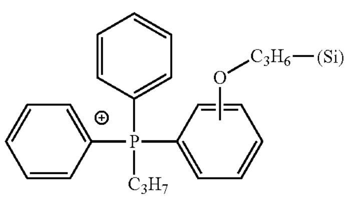
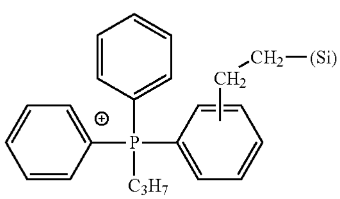
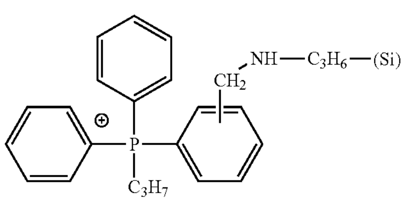
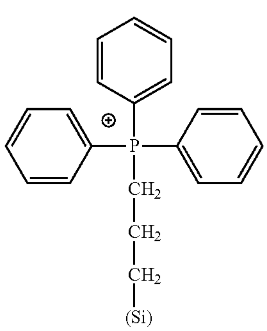
-continued
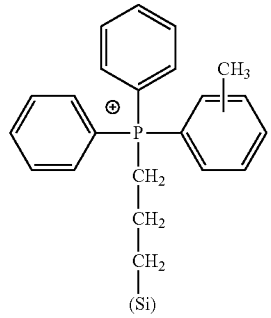
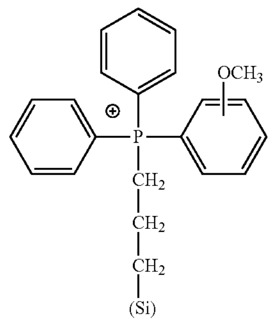
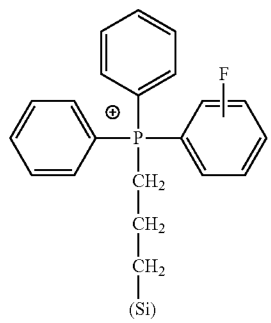
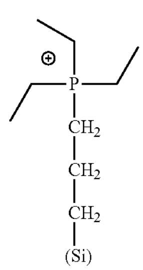
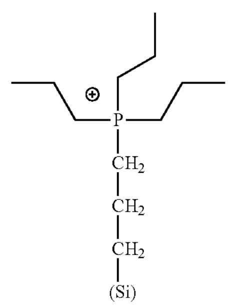
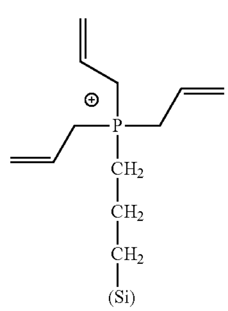
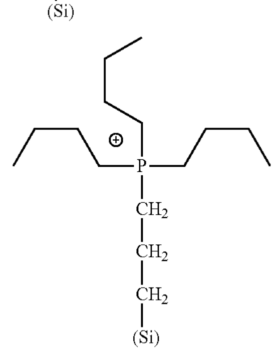
For example, a hydrolysable silicon compound having a structure partially containing an ammonium salt can be shown by the following general formula (Xm-4):

(Xm-4)

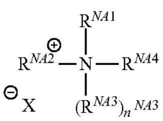

In the formula, $R^{NA1}$, $R^{NA2}$, and $R^{NA3}$ each represent hydrogen or a monovalent organic group such as a linear, branched, or cyclic alkyl group, alkenyl group, oxoalkyl group, or oxoalkenyl group having 1 to 20 carbon atoms, a substituted or unsubstituted aryl group having 6 to 20 carbon atoms, or an aralkyl group or aryloxyalkyl group having 7 to 20 carbon atoms; and some or all of the hydrogen atoms of these groups are optionally substituted with an alkoxy group, an amino group, an alkylamino group, or the like. Moreover, $R^{NA1}$ and $R^{NA2}$ may form a ring together with a nitrogen atom bonded to $R^{NA1}$ and $R^{NA2}$; and when a ring is formed, $R^{NA1}$ and $R^{NA2}$ each represent an alkylene group having 1 to 6 carbon atoms or a cyclic heterocyclic ring or heteroaromatic ring containing nitrogen. $R^{NA4}$ represents a divalent organic group such as a linear, branched, or cyclic alkylene group or alkenylene group having 1 to 23 carbon atoms, or a substituted or unsubstituted arylene group having 6 to 29 carbon atoms; and some or all of the hydrogen atoms of these groups are optionally substituted with an alkoxy group, an amino group, an alkylamino group, or the like. In the case where $R^{NA1}$ and $R^{NA2}$, or $R^{NA1}$ and $R^{NA4}$ form a cyclic structure which further contains unsaturated nitrogen; $n^{NA3}=0$; in the other cases, $n^{NA3}=1$.

Specific examples include the following ($X^-$ is as defined above).

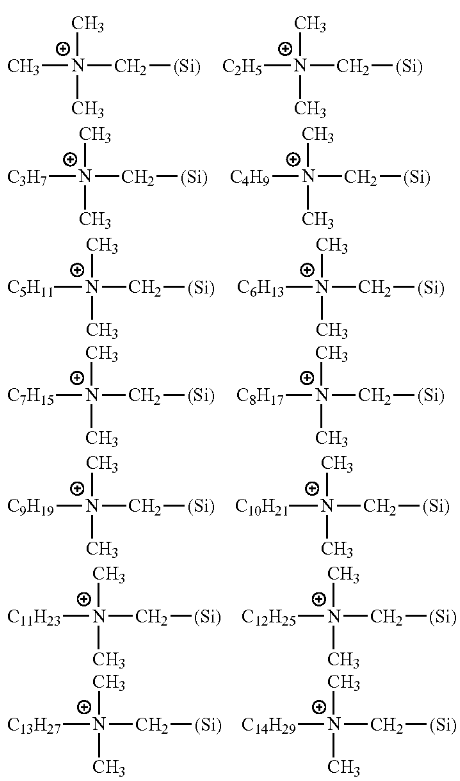

-continued

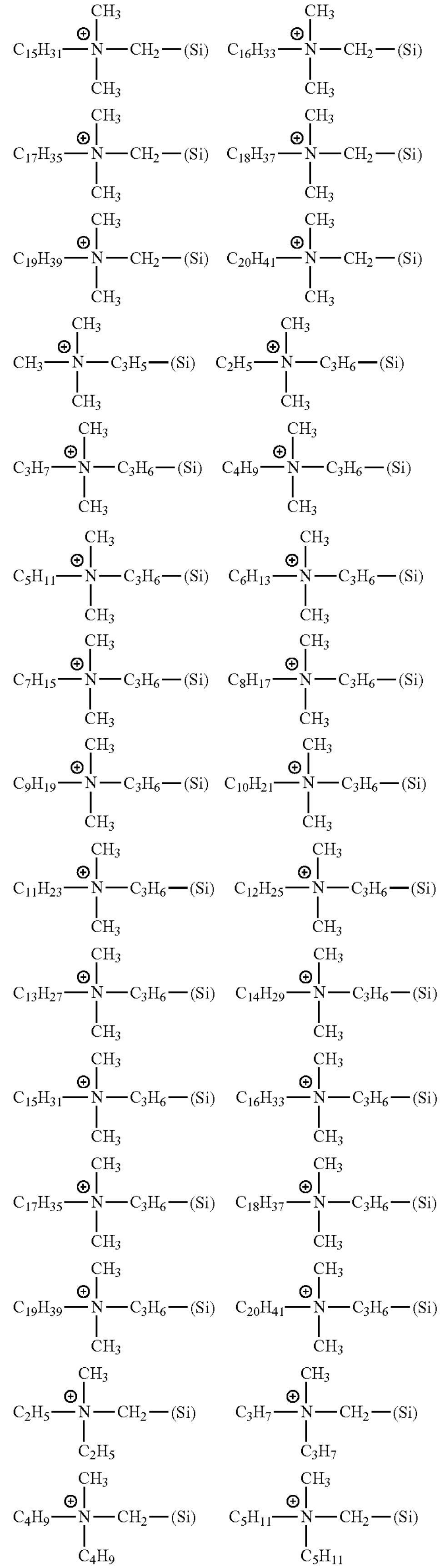

-continued
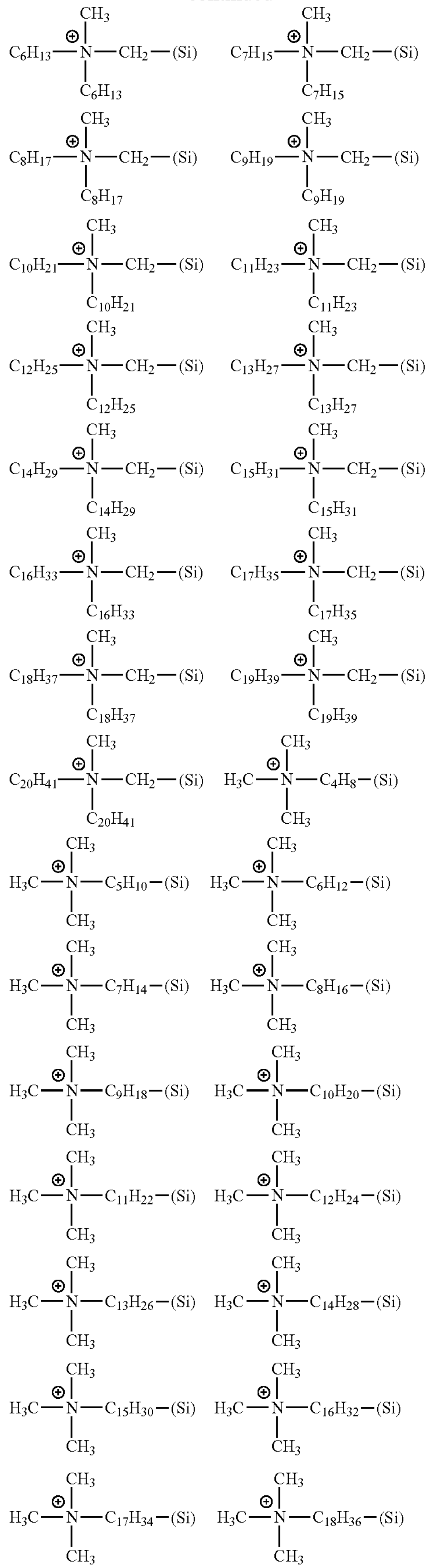
-continued
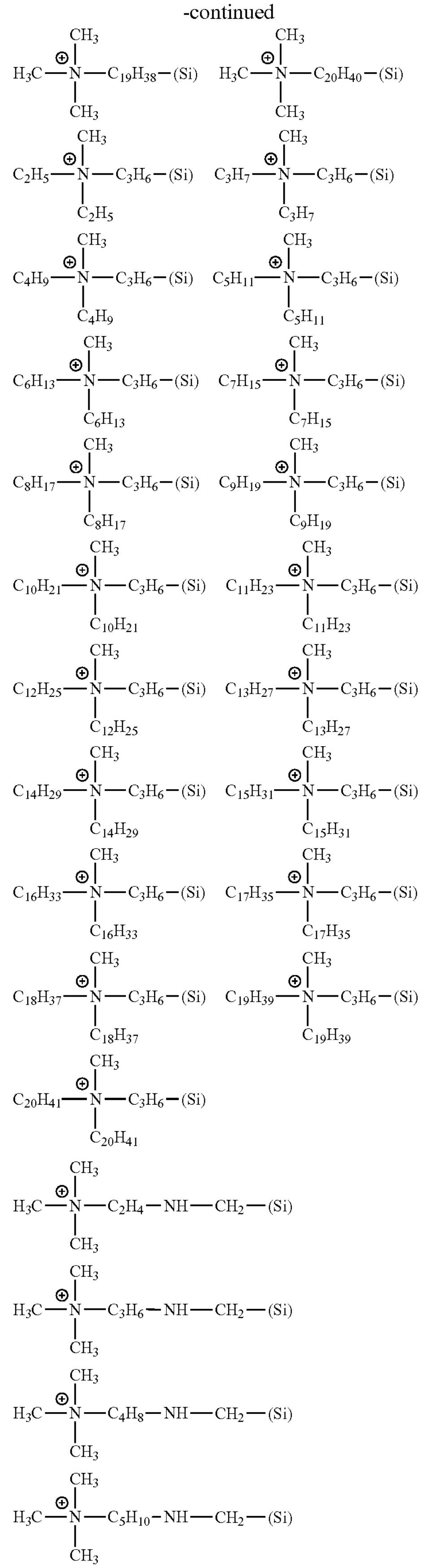

-continued
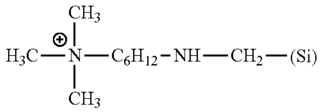
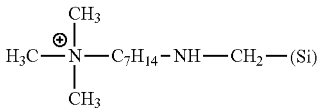
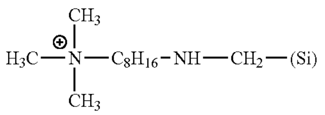
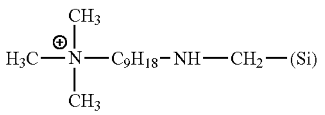
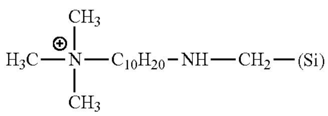
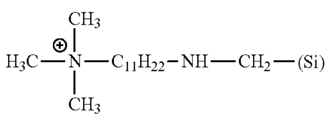
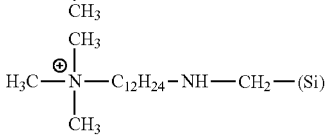
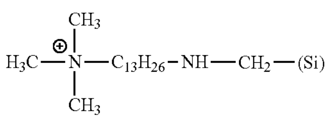
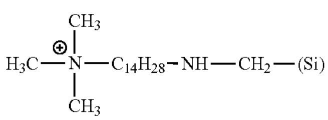
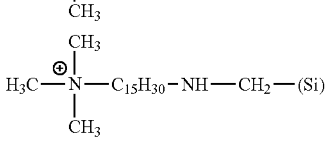
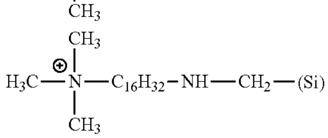
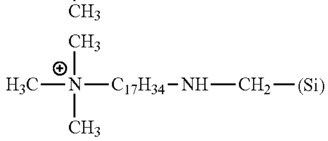
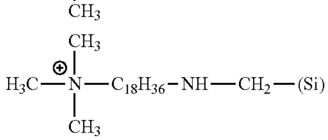
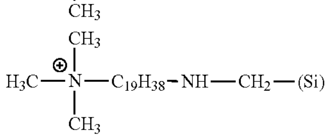
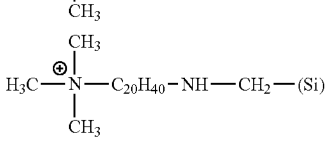
-continued
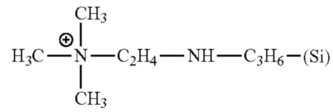
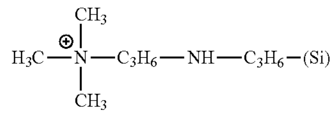
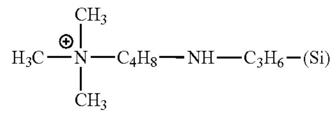
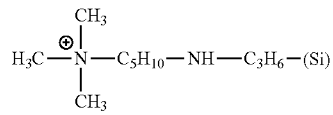
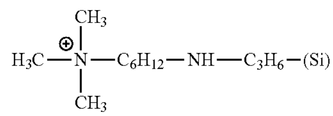
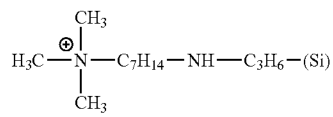
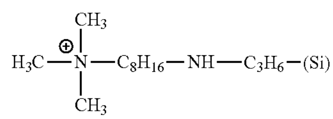
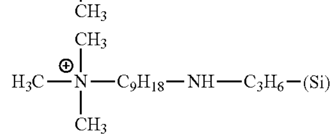
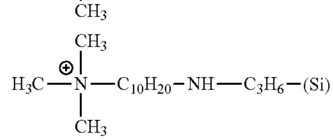
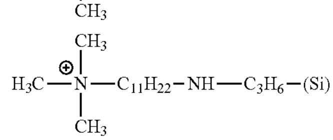
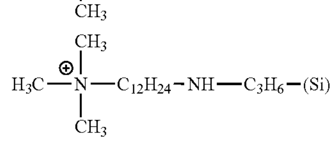
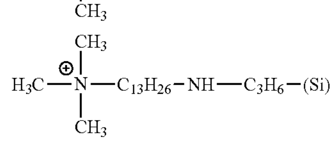
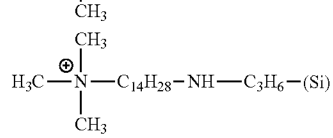
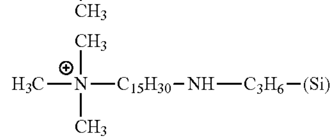
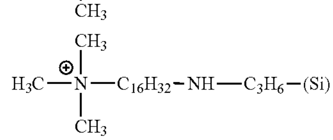

-continued
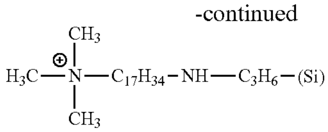
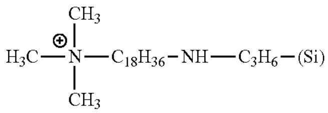
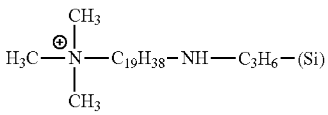
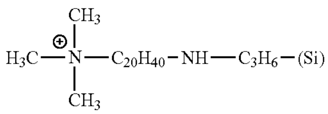
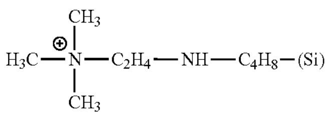
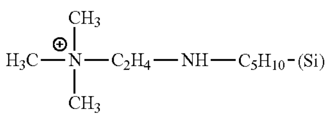
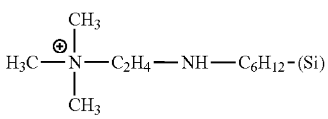
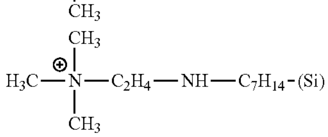
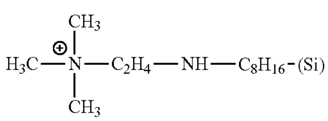
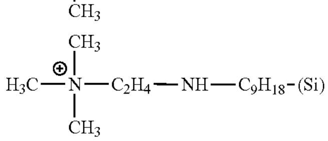
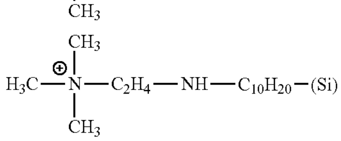
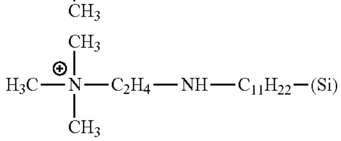
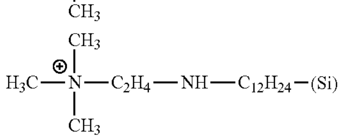
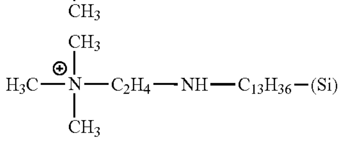
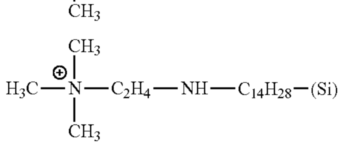
-continued
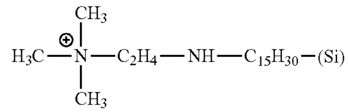
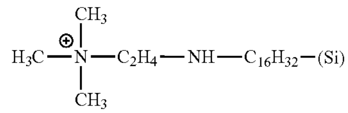
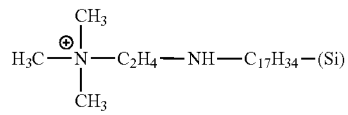
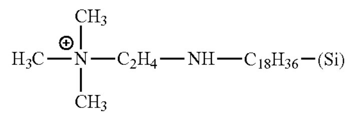
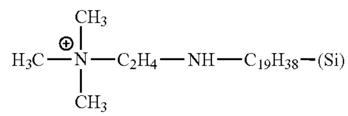
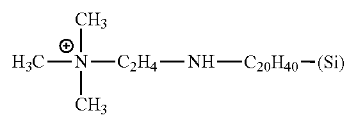
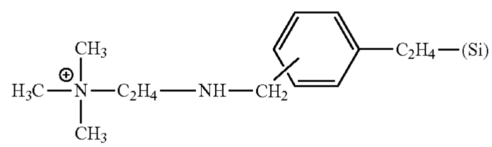
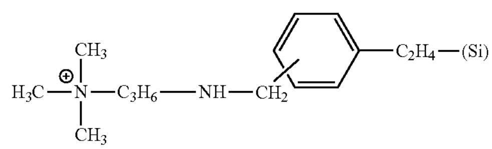
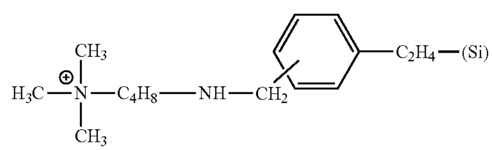
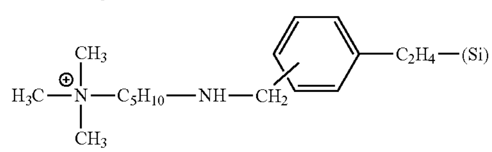
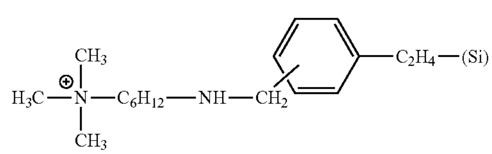
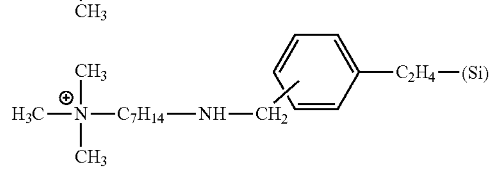
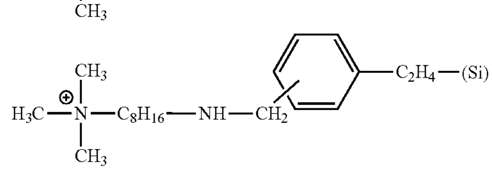

-continued
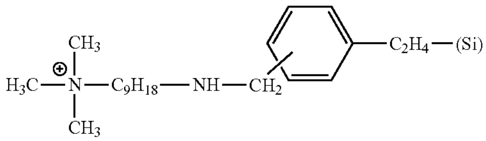
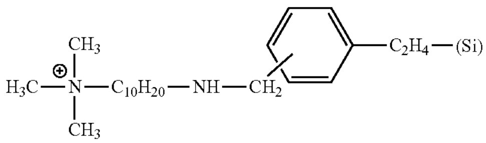
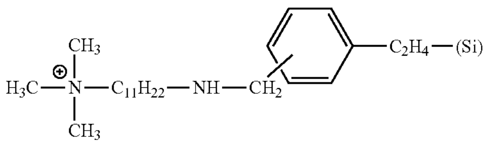
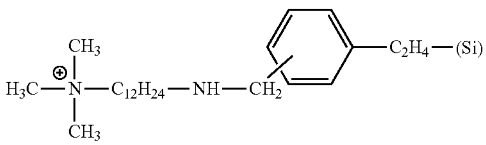
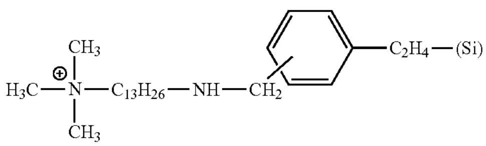
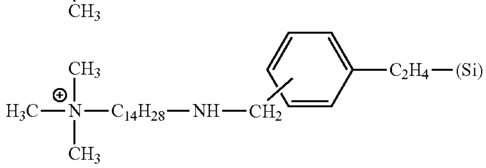
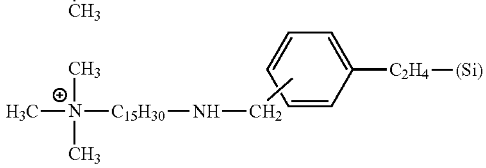
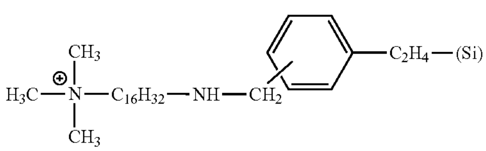
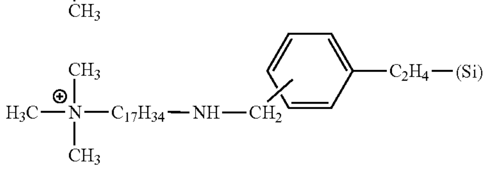
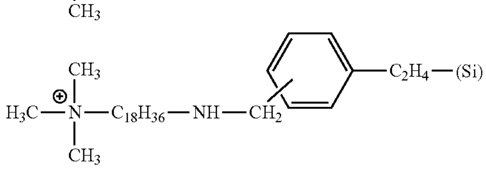
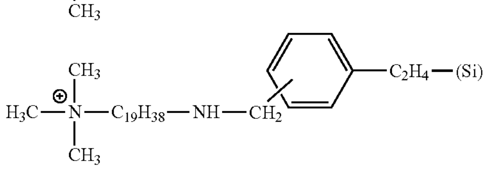
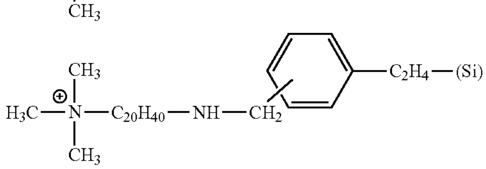
-continued
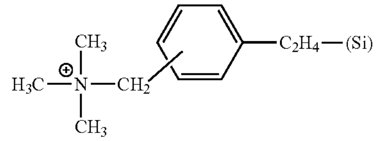
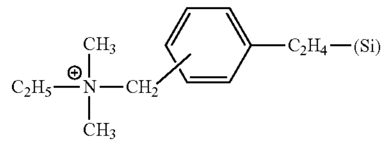
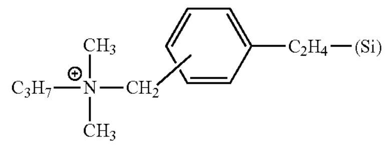
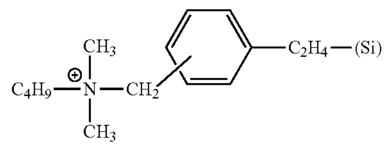
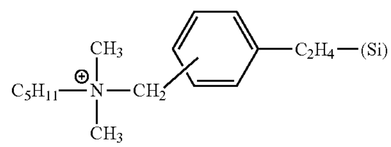
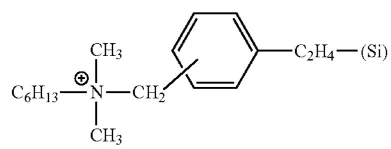
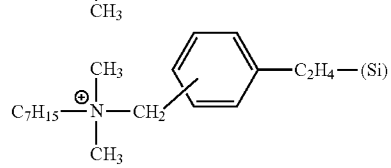
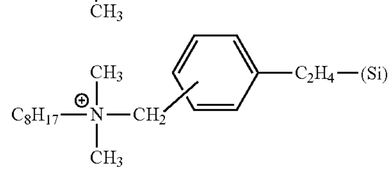
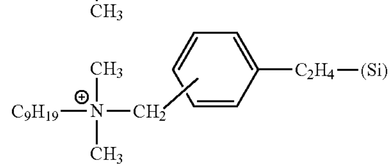
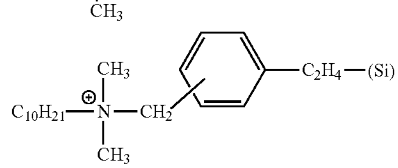
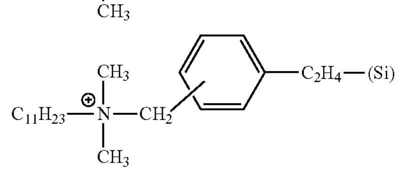
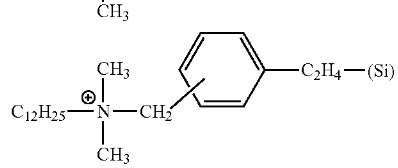

-continued
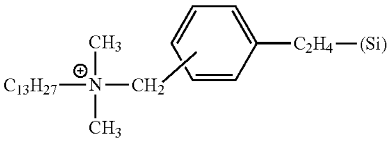
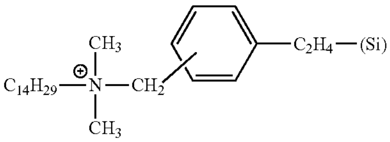
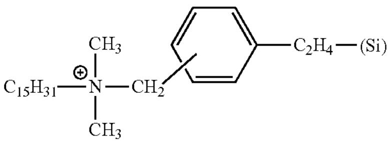
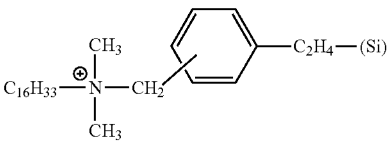
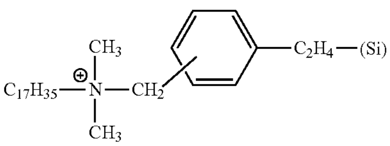
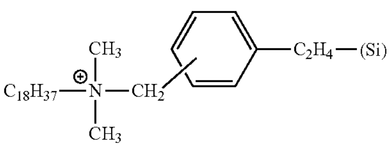
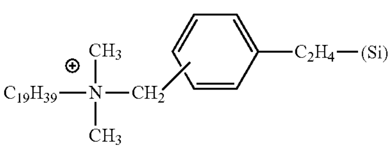
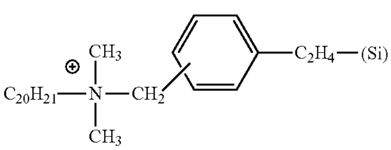
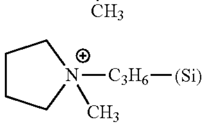
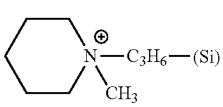
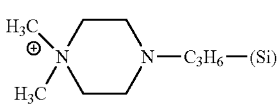
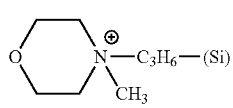
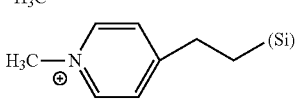
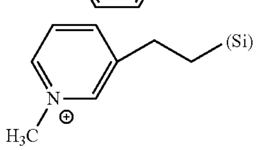
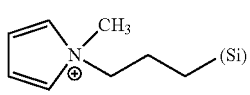
-continued
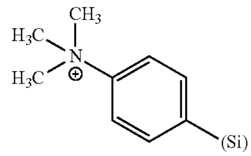
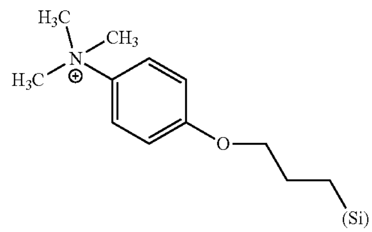
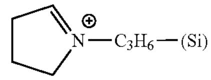
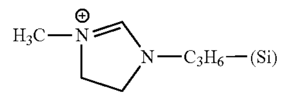
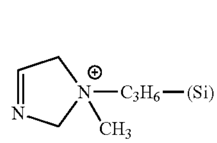
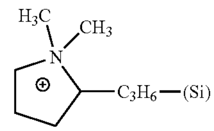
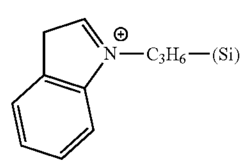
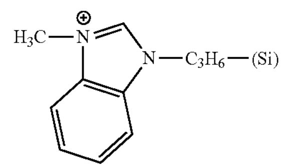
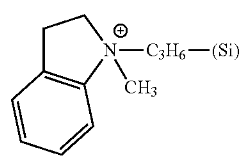
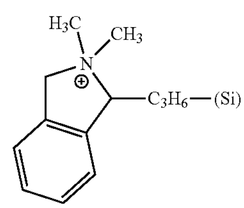
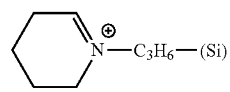
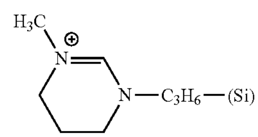
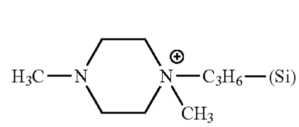
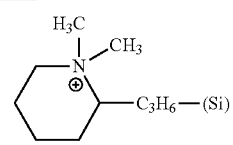
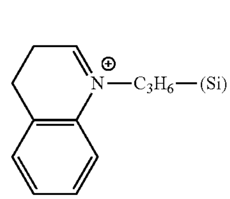
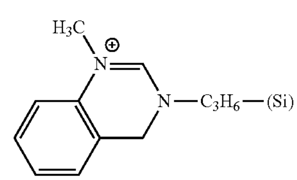
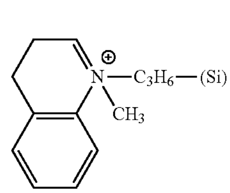
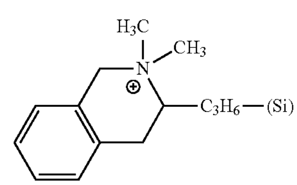

-continued
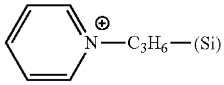
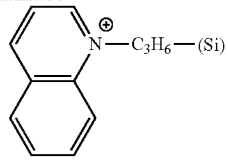
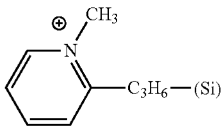
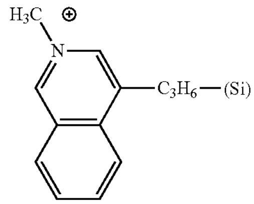
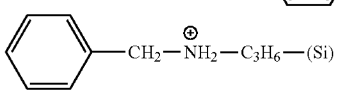
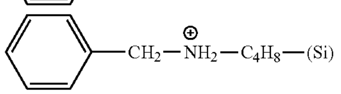
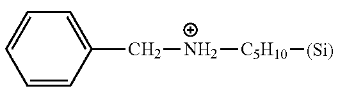
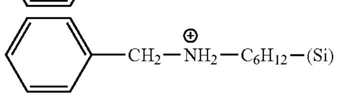
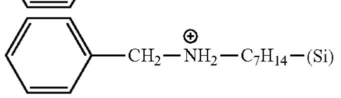
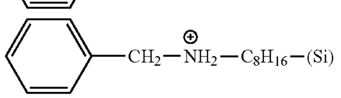
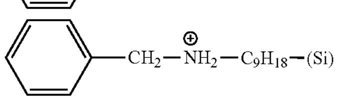
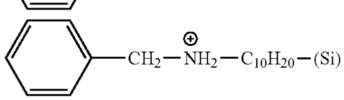
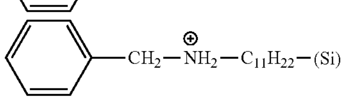
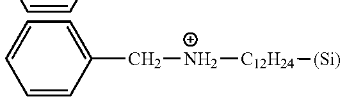
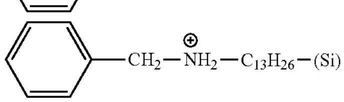
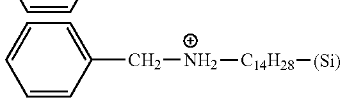
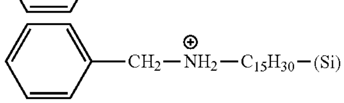
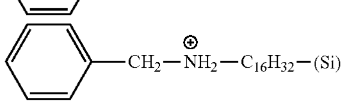
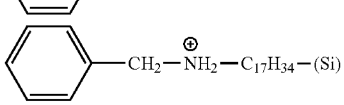
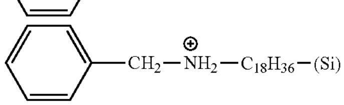
-continued
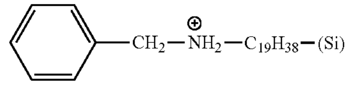
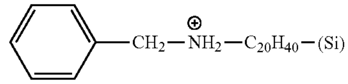
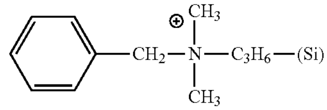
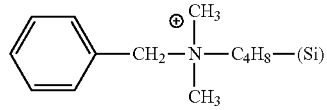
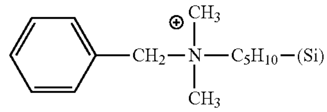
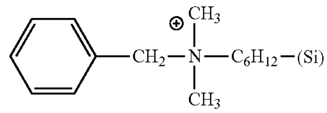
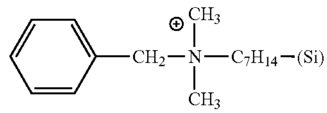
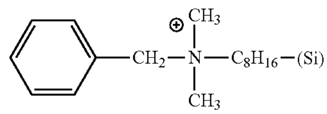
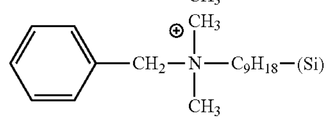
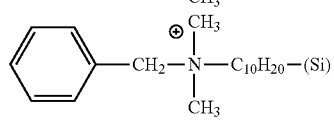
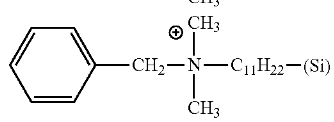
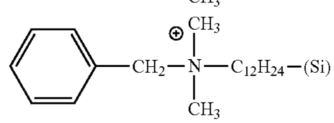
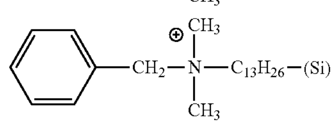
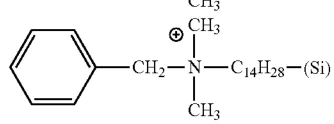
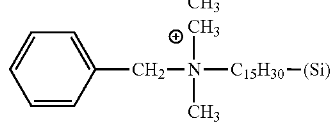
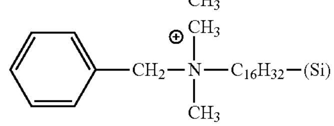

-continued
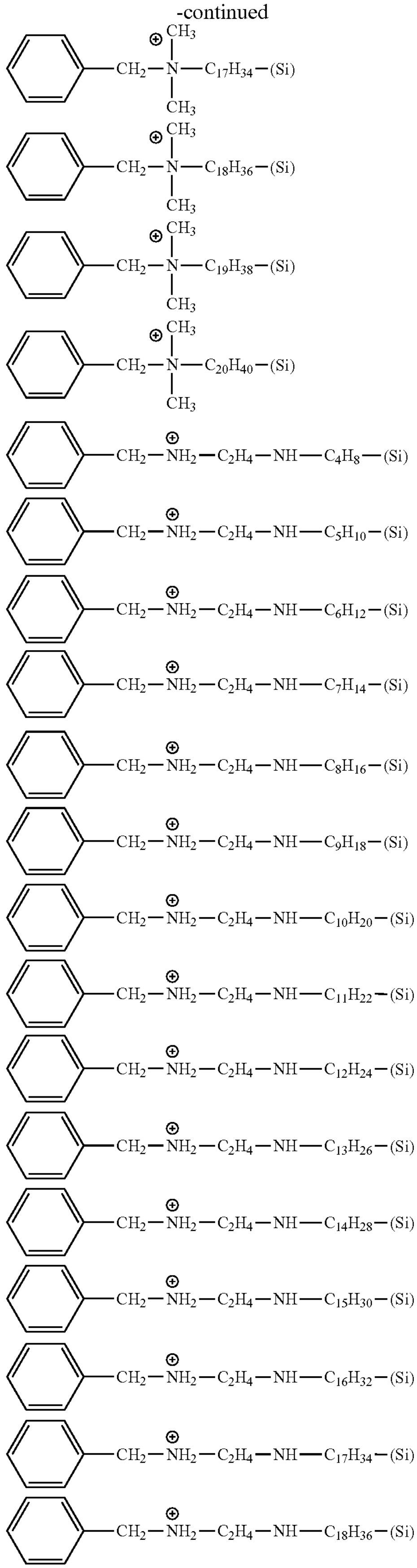
-continued
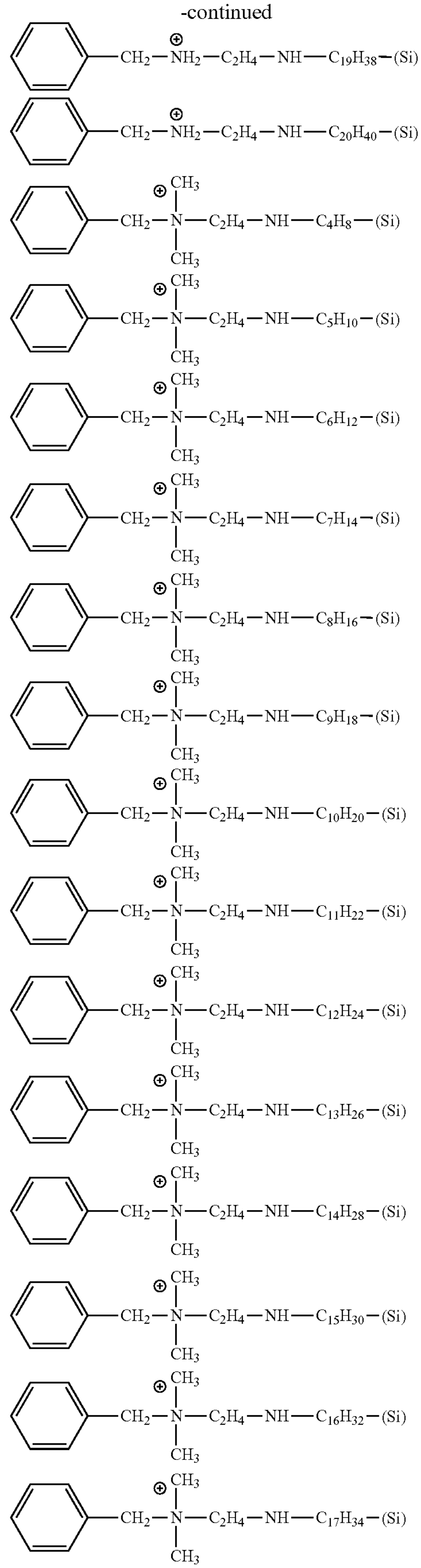

-continued
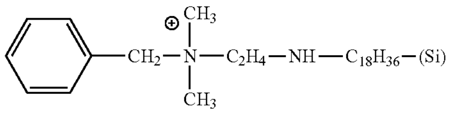
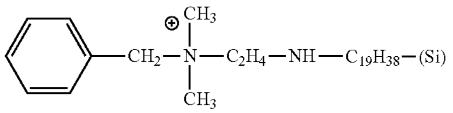
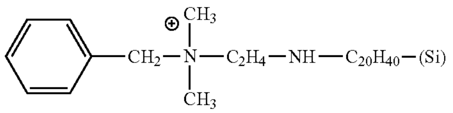
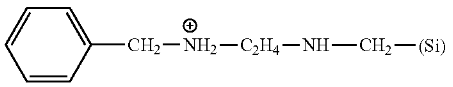
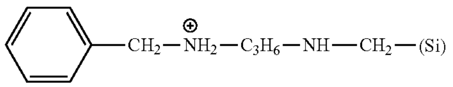
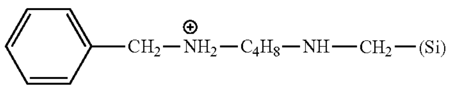
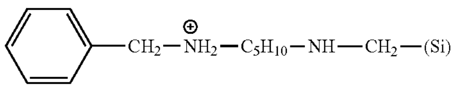
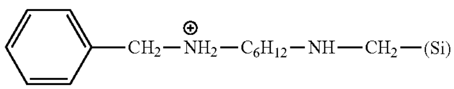
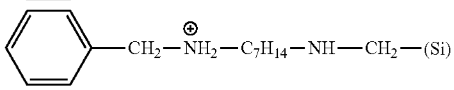
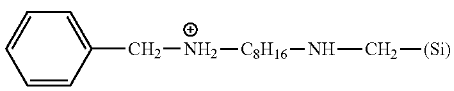
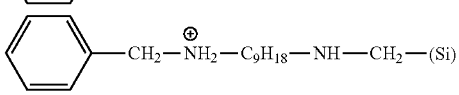
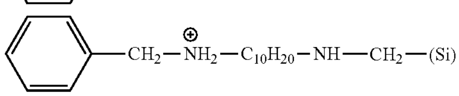
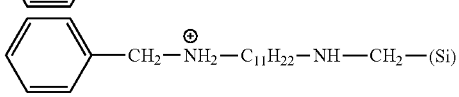
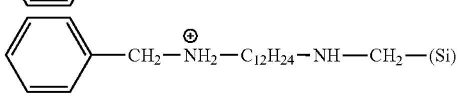
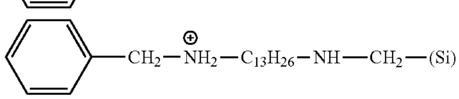
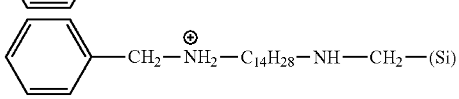
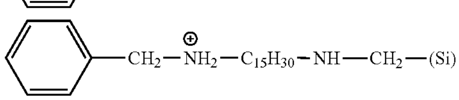
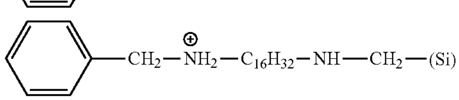
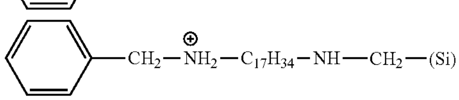
-continued
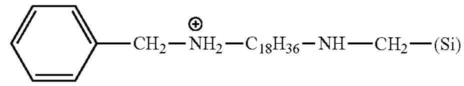
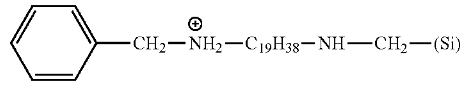
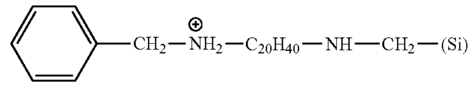
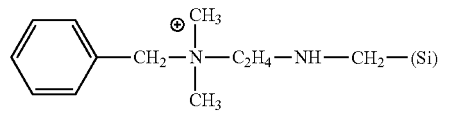
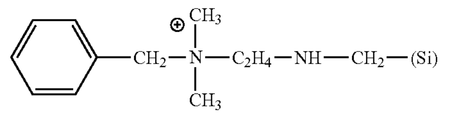
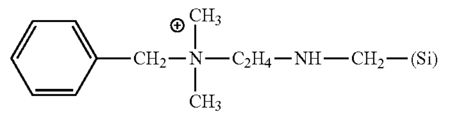
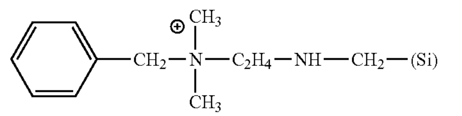
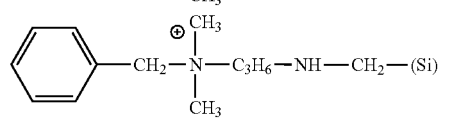
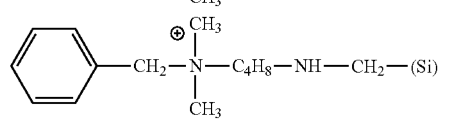
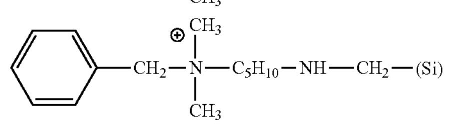
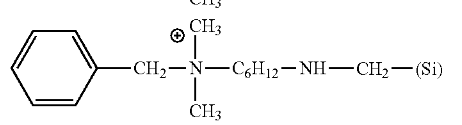
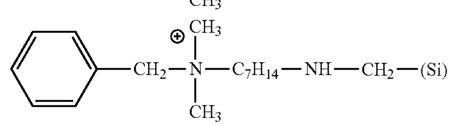
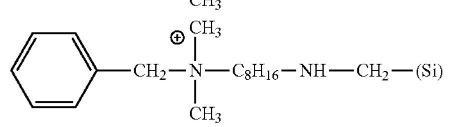
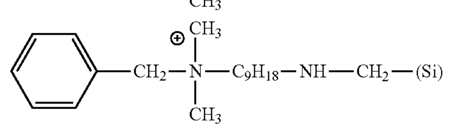
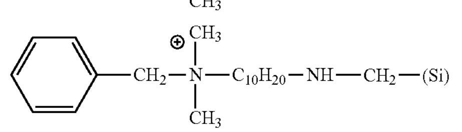
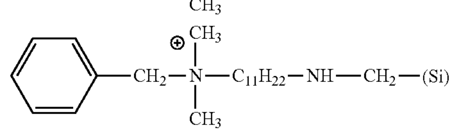

-continued
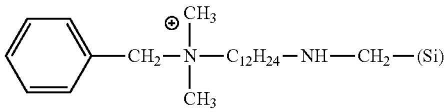
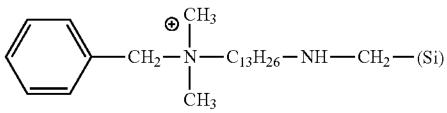
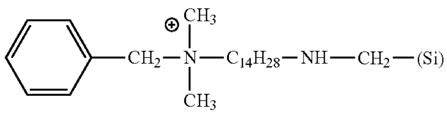
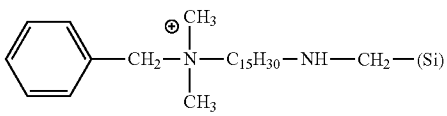
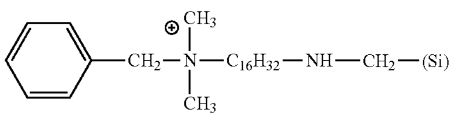
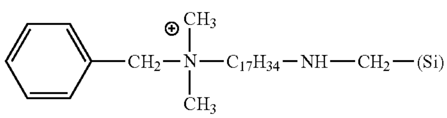
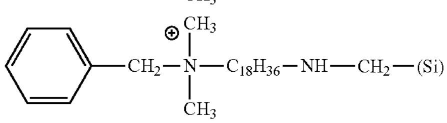
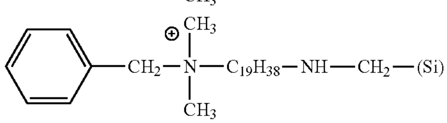
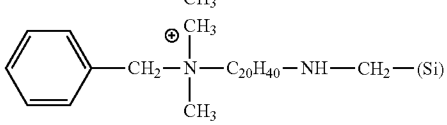
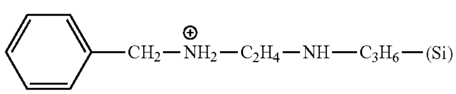
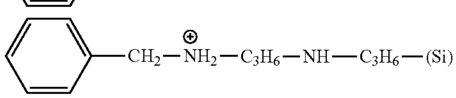
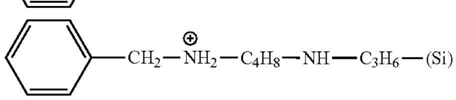
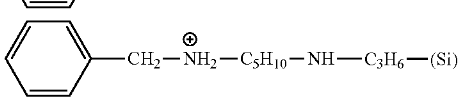
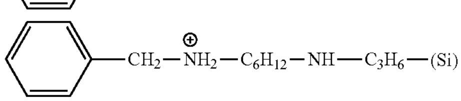
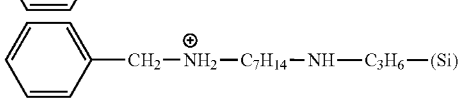
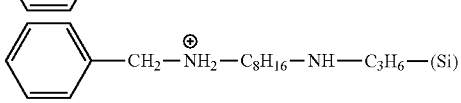
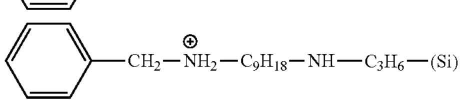
-continued
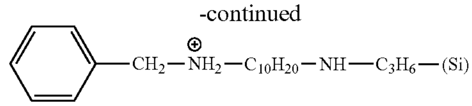
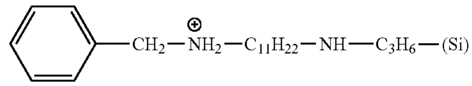
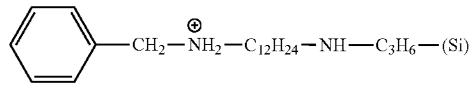
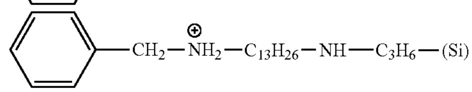
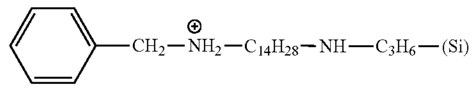
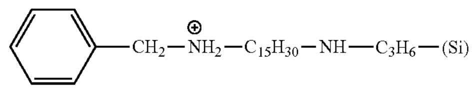
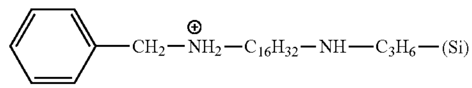
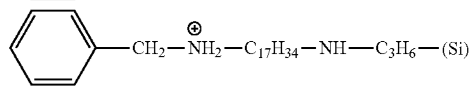
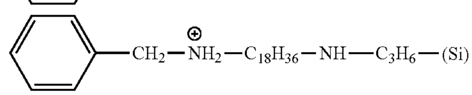
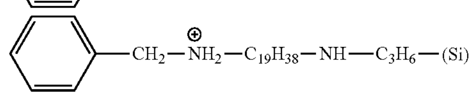
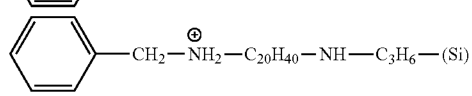
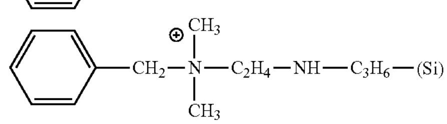
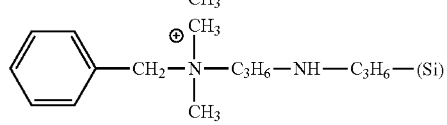
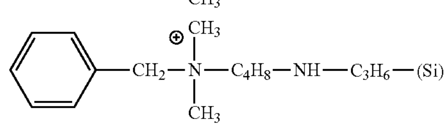
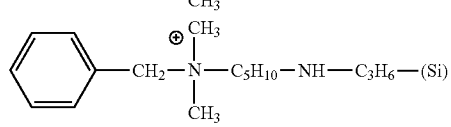
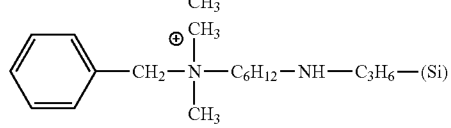
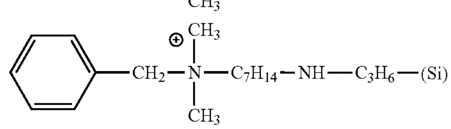
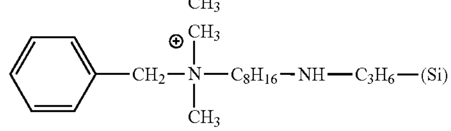

-continued

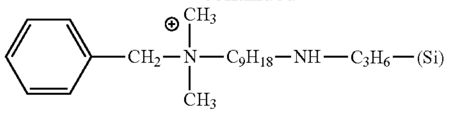

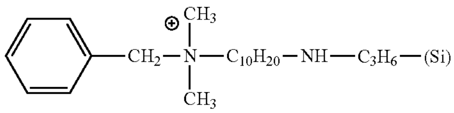

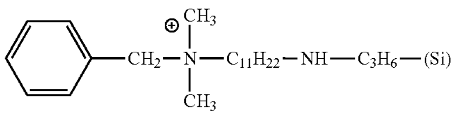

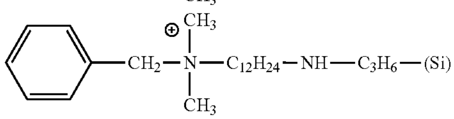

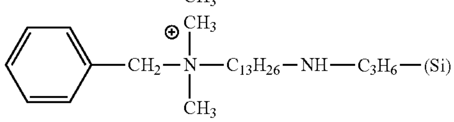

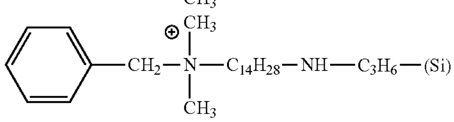

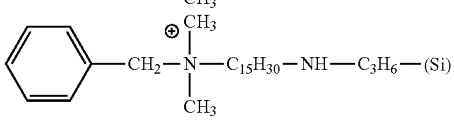

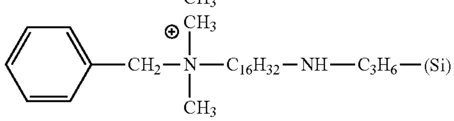

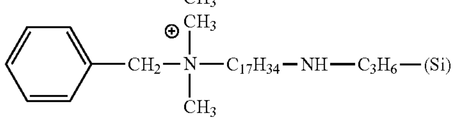

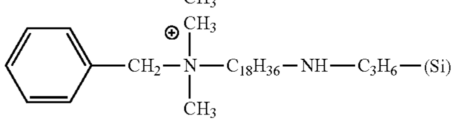

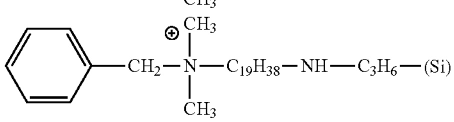

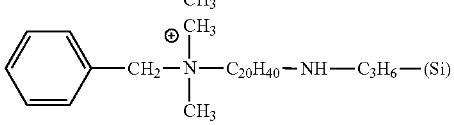

A hydrolysable silicon compound can be used simultaneously with (Xm-1), (Xm-2), (Xm-3), and (Xm-4) to produce (Xc-10). Examples of such a hydrolysable silicon compound include the silicon compound (A-1) shown by the general formula (1) and the silicon compound (A-2) shown by the general formula (2).

A reaction raw material for forming (Xc-10) can be prepared by: selecting at least one of the monomers (Xm-1), (Xm-2), (Xm-3), and (Xm-4) in addition to one or both of the hydrolysable monomers (A-1) and (A-2) described above; and mixing the selected monomers before or during the reaction. The reaction conditions may follow the same method as the method for synthesizing the thermosetting silicon-containing material (Sx).

The molecular weight of the silicon-containing compound (Xc-10) to be obtained can be adjusted not only through the selection of the monomers but also by controlling the reaction conditions during the polymerization. If a silicon-containing compound (Xc-10) having a weight-average molecular weight of more than 100,000 is used, foreign matters or coating spots are generated in some cases. Thus, it is preferable to use the silicon-containing compound (Xc-10) having a weight-average molecular weight of 100,000 or less, more preferably 200 to 50,000, further preferably 300 to 30,000. Regarding data on the weight-average molecular weight, the molecular weight is expressed in terms of polystyrene which is obtained by gel permeation chromatography (GPC) using a refractive index (RI) detector, tetrahydrofuran as an eluent, and polystyrene as a reference substance.

Note that one of the crosslinking catalysts (Xc-1), (Xc-2), (Xc-3), (Xc-4), and (Xc-10) can be used, or two or more thereof can be used in combination. The amount of the crosslinking catalyst to be added is preferably 0.01 to 50 parts by mass, more preferably 0.1 to 40 parts by mass, based on 100 parts by mass of the base polymer (the thermosetting silicon-containing material (Sx) obtained by the above method).

[Other Components]

(Organic Acid)

To improve the stability of the inventive composition for forming a silicon-containing resist underlayer film, it is preferable to add a monovalent, divalent, or more polyvalent organic acid having 1 to 30 carbon atoms. Examples of the acid added in this event include formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, trichloroacetic acid, oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, citric acid, and the like. Particularly, oxalic acid, maleic acid, formic acid, acetic acid, propionic acid, citric acid, and the like are preferable. Moreover, a mixture of two or more acids may be used to keep the stability. The amount of the acid to be added may be 0.001 to 25 parts by mass, preferably 0.01 to 15 parts by mass, more preferably 0.1 to 5 parts by mass, based on 100 parts by mass of the silicon contained in the composition for forming a silicon-containing resist underlayer film.

Otherwise, the organic acid(s) may be blended based on the pH of the composition for forming a silicon-containing resist underlayer film so as to satisfy preferably $0 \leq pH \leq 7$, more preferably $0.3 \leq pH \leq 6.5$, further preferably $0.5 \leq pH \leq 6$.

(Water)

In the present invention, water may be added to the composition for forming a silicon-containing resist underlayer film. When water is added, the polysiloxane compound in the composition for forming a silicon-containing resist underlayer film is hydrated, so that the lithography performance is improved. The water content in the solvent component of the composition for forming a silicon-containing resist underlayer film may be more than 0 mass % and less than 50 mass %, particularly preferably 0.3 to 30 mass %, further preferably 0.5 to 20 mass %. Within such ranges, favorable uniformity and lithography performance of the silicon-containing resist underlayer film can be achieved, and repellence can be suppressed.

The solvent including water is used in a total amount of preferably 100 to 100,000 parts by mass, particularly preferably 200 to 50,000 parts by mass, based on 100 parts by mass of the polysiloxane compound, which is the base polymer.

(Photo-Acid Generator)

In the present invention, a photo-acid generator may be added to the composition for forming a silicon-containing resist underlayer film. As the photo-acid generator used in the present invention, it is possible to add, specifically, the materials described in paragraphs (0160) to (0179) of JP 2009-126940 A.

Besides, the present invention may contain one or more compounds (photo-acid generators), each of which has an anion moiety and a cation moiety in one molecule, shown by the following general formula (P-0):

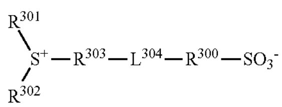

(P-0)

where $R^{300}$ represents a divalent organic group substituted with one or more fluorine atoms; $R^{301}$ and $R^{302}$ each independently represent a linear, branched, or cyclic monovalent hydrocarbon group having 1 to 20 carbon atoms optionally substituted with a hetero atom or optionally containing a hetero atom. $R^{303}$ represents a linear, branched, or cyclic divalent hydrocarbon group having 1 to 20 carbon atoms optionally substituted with a hetero atom or optionally containing a hetero atom. Moreover, $R^{301}$ and $R^{302}$, or $R^{301}$ and $R^{303}$, are optionally bonded to each other to form a ring with a sulfur atom in the formula. $L^{30}$ represents a single bond or a linear, branched, or cyclic divalent hydrocarbon group having 1 to 20 carbon atoms optionally substituted with a hetero atom or optionally containing a hetero atom.

When such a compound (photo-acid generator) is combined with the inventive composition for forming a silicon-containing resist underlayer film, it is possible to obtain a resist underlayer film that can contribute to the formation of an upper layer resist having a rectangular cross section while maintaining the LWR of the upper layer resist.

In the general formula (P-0), $R^{300}$ is a divalent organic group having one or more fluorine atoms as a result of substitution. The divalent organic group represents, for example, a linear, branched, or cyclic divalent hydrocarbon group, such as an alkylene group, an alkenylene group, and an arylene group having 1 to 20 carbon atoms. Specific examples of $R^{300}$ include ones having the following structures.

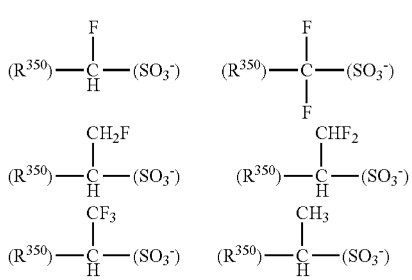

-continued

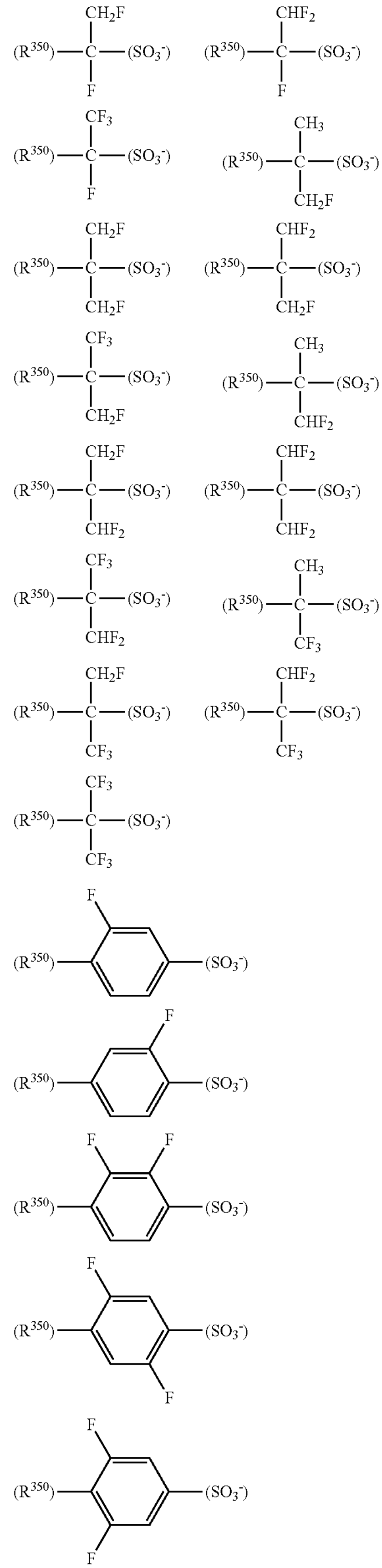

-continued
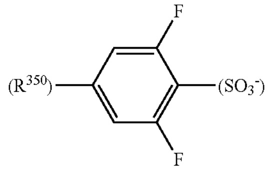
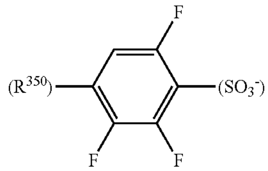
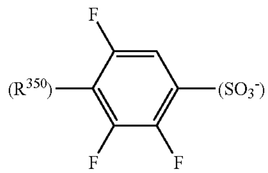
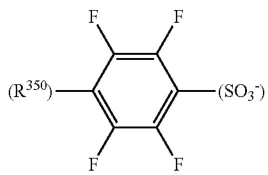
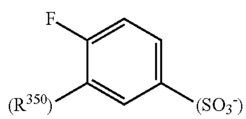
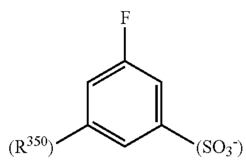
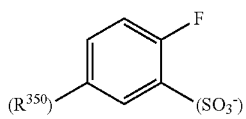
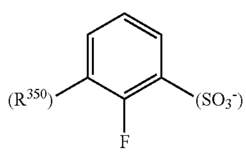
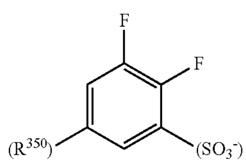
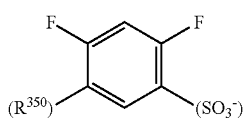
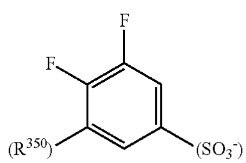
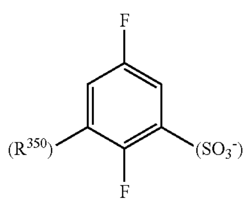
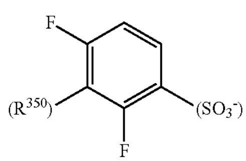
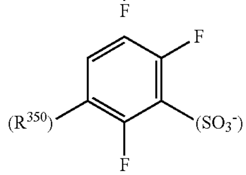
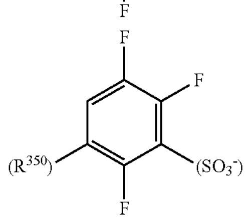
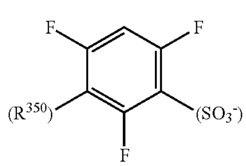
-continued
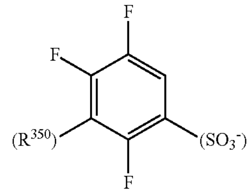
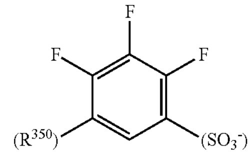
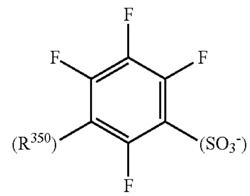
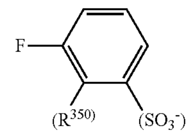
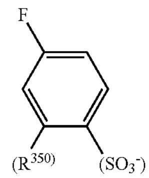
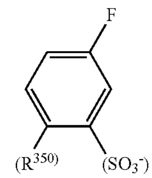
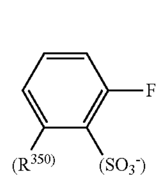
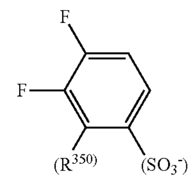
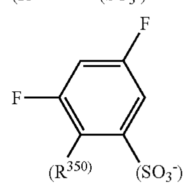
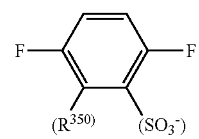
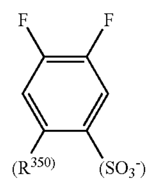
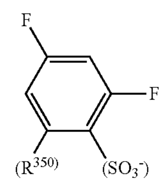
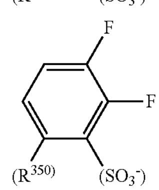
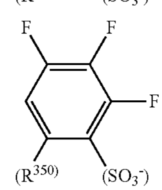
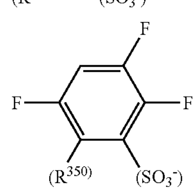
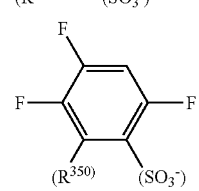
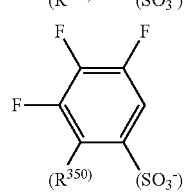
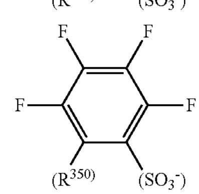
Note that, in the above formulae, ($SO_3^-$) is depicted to show a bonding site to the $SO_3^-$ group in the general formula (P-0). Moreover, ($R^{350}$) is depicted to show a bonding site to a portion where the cation moiety in the general formula (P-0) bonds to $R^{300}$ via $L^{304}$.

$R^{301}$ and $R^{302}$ each independently represent a linear, branched, or cyclic monovalent hydrocarbon group, such as an alkyl group, an alkenyl group, an oxoalkyl group, an aryl group, an aralkyl group, or an aryloxoalkyl group having 1 to 20 carbon atoms optionally substituted with a hetero atom or optionally containing a hetero atom. Examples of the alkyl group include a methyl group, an ethyl group, a propyl group, an isopropyl group, an n-butyl group, a sec-butyl group, a tert-butyl group, a pentyl group, a hexyl group, a heptyl group, an octyl group, a cyclopentyl group, a cyclohexyl group, a cycloheptyl group, a cyclopropylmethyl group, a 4-methylcyclohexyl group, a cyclohexylmethyl group, a norbornyl group, an adamantyl group, and the like. Examples of the alkenyl group include a vinyl group, an allyl group, a propenyl group, a butenyl group, a hexenyl group, a cyclohexenyl group, and the like. Examples of the oxoalkyl group include a 2-oxocyclopentyl group, a 2-oxocyclohexyl group, a 2-oxopropyl group, a 2-oxoethyl group, a 2-cyclopentyl-2-oxoethyl group, a 2-cyclohexyl-2-oxoethyl group, a 2-(4-methylcyclohexyl)-2-oxoethyl group, and the like. Examples of the aryl group include a phenyl group, a naphthyl group, a thienyl group, and the like; a 4-hydroxyphenyl group; alkoxyphenyl groups such as a 4-methoxyphenyl group, a 3-methoxyphenyl group, a 2-methoxyphenyl group, a 4-ethoxyphenyl group, a 4-tert-butoxyphenyl group, and a 3-tert-butoxyphenyl group; alkylphenyl groups such as a 2-methylphenyl group, a 3-methylphenyl group, a 4-methylphenyl group, a 4-ethylphenyl group, a 4-tert-butylphenyl group, a 4-n-butylphenyl group, and a 2,4-dimethylphenyl group; alkylnaphthyl groups such as a methylnaphthyl group and an ethylnaphthyl group; alkoxynaphthyl groups such as a methoxynaphthyl group, an ethoxynaphthyl group, an n-propoxynaphthyl group, and an n-butoxynaphthyl group; dialkylnaphthyl groups such as a dimethylnaphthyl group and a diethylnaphthyl group; dialkoxynaphthyl groups such as a dimethoxynaphthyl group and a diethoxynaphthyl group; and the like. Examples of the aralkyl group include a benzyl group, a 1-phenylethyl group, a 2-phenylethyl group, and the like. Examples of the aryloxoalkyl group include 2-aryl-2-oxoethyl groups such as a 2-phenyl-2-oxoethyl group, a 2-(1-naphthyl)-2-oxoethyl group, and a 2-(2-naphthyl)-2-oxoethyl group; and the like. Additionally, $R^{301}$ and $R^{302}$ may be bonded to each other to form a ring together with the sulfur atom in the formula; in this case, examples of the ring include groups shown by the following formulae.

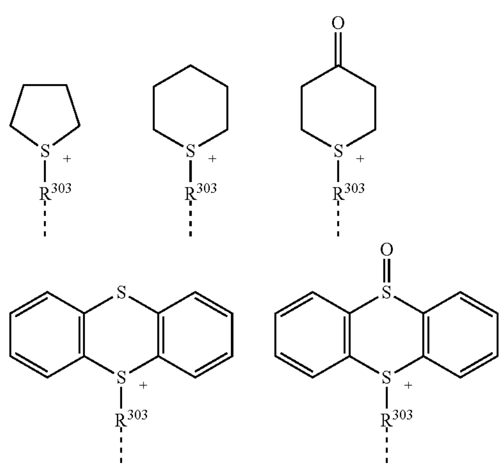

-continued

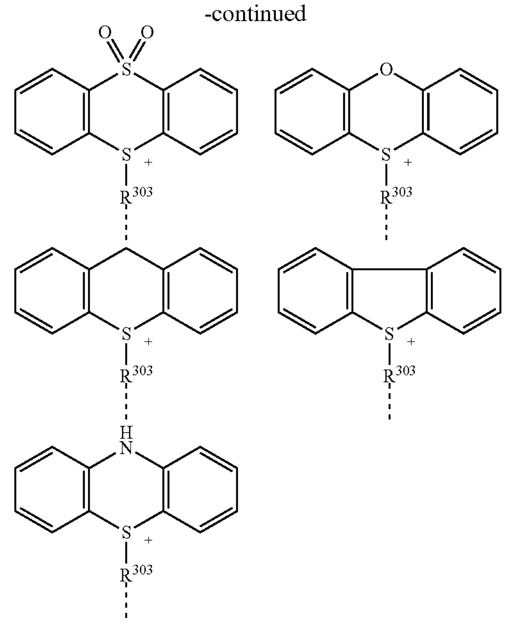

(A broken line represents a bond.)

In the general formula (p-0), $R^{303}$ represents a linear, branched, or cyclic divalent hydrocarbon group having 1 to 20 carbon atoms optionally substituted with a hetero atom or optionally containing a hetero atom. Specific examples of $R^{303}$ include linear alkanediyl groups such as a methylene group, an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, an undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group, and a heptadecane-1,17-diyl group; saturated cyclic hydrocarbon groups such as a cyclopentanediyl group, a cyclohexanediyl group, a norbornanediyl group, and an adamantanediyl group; and unsaturated cyclic hydrocarbon groups such as a phenylene group and a naphthylene group. Additionally, some of the hydrogen atoms of these groups may be substituted with an alkyl group such as a methyl group, an ethyl group, a propyl group, an n-butyl group, and a tert-butyl group. Alternatively, such hydrogen atoms may be substituted with a hetero atom such as an oxygen atom, a sulfur atom, a nitrogen atom, and a halogen atom. As a result, a hydroxy group, a cyano group, a carbonyl group, an ether bond, an ester bond, a sulfonic acid ester bond, a carbonate bond, a lactone ring, a sultone ring, carboxylic anhydride, a haloalkyl group, or the like may be formed. Further, $R^{301}$ and $R^{303}$ may be bonded to each other to form a ring together with the sulfur atom in the formula; in this case, examples of the ring include groups shown by the following formulae.

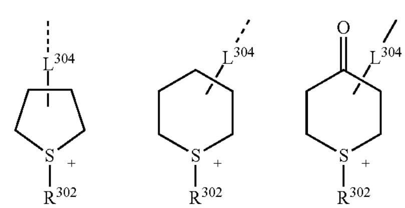

-continued

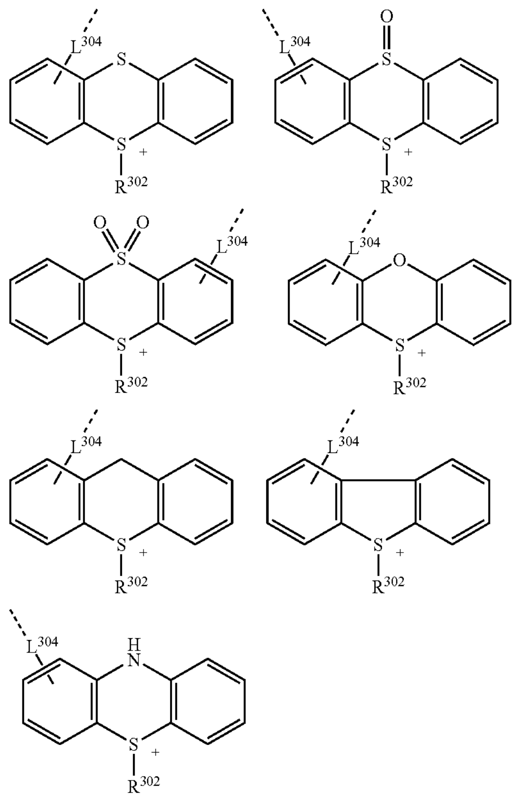

(A broken line represents a bond.)

In the general formula (P-0), $L^{304}$ represents a single bond or a linear, branched, or cyclic divalent hydrocarbon group having 1 to 20 carbon atoms optionally substituted with a hetero atom or optionally containing a hetero atom. Specific examples of $L^{304}$ include linear alkanediyl groups such as a methylene group, an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, an undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group, and a heptadecane-1,17-diyl group; saturated cyclic hydrocarbon groups such as a cyclopentanediyl group, a cyclohexanediyl group, a norbornanediyl group, and an adamantanediyl group; and unsaturated cyclic hydrocarbon groups such as a phenylene group and a naphthylene group. Additionally, some of the hydrogen atoms of these groups may be substituted with an alkyl group such as a methyl group, an ethyl group, a propyl group, an n-butyl group, and a tert-butyl group. Alternatively, such hydrogen atoms may be substituted with a hetero atom such as an oxygen atom, a sulfur atom, a nitrogen atom, and a halogen atom. As a result, a hydroxy group, a cyano group, a carbonyl group, an ether bond, an ester bond, a sulfonic acid ester bond, a carbonate bond, a lactone ring, a sultone ring, carboxylic anhydride, a haloalkyl group, or the like may be formed.

The compound (photo-acid generator) shown by the general formula (P-0) is preferably shown by the following general formula (P-1):

(P-1)

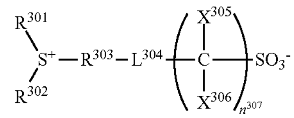

In the general formula (P-1), $X^{305}$ and $X^{306}$ each independently represent a hydrogen atom, a fluorine atom, or a trifluoromethyl group, but not all of $X^{305}$'s and $X^{306}$'s are hydrogen atoms simultaneously; $n^{307}$ represents an integer of 1 to 4; and $R^{301}$, $R^{302}$, $R^{303}$, and $L^{304}$ are as defined above.

The photo-acid generator shown by the general formula (P-0) is more preferably shown by the following general formula (P-1-1).

(P-1-1)

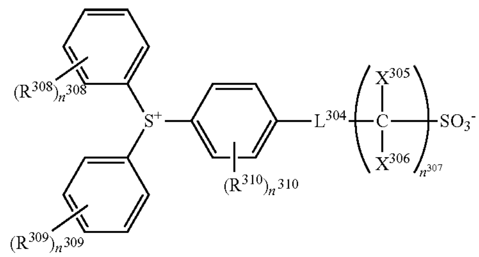

In the general formula (P-1-1), $R^{308}$, $R^{309}$, and $R^{310}$ each independently represent a hydrogen atom or a linear, branched, or cyclic monovalent hydrocarbon group having 1 to 20 carbon atoms optionally containing a hetero atom. Specific examples of the monovalent hydrocarbon group include a methyl group, an ethyl group, a propyl group, an isopropyl group, an n-butyl group, a sec-butyl group, a tert-butyl group, a tert-amyl group, an n-pentyl group, an n-hexyl group, an n-octyl group, an n-nonyl group, an n-decyl group, a cyclopentyl group, a cyclohexyl group, a 2-ethylhexyl group, a cyclopentylmethyl group, a cyclopentylethyl group, a cyclopentylbutyl group, a cyclohexylmethyl group, a cyclohexylethyl group, a cyclohexylbutyl group, a norbornyl group, an oxanorbornyl group, a tricyclo[$5.2.1.0^{2,6}$]decanyl group, an adamantyl group, and the like. Additionally, some of the hydrogen atoms of these groups may be substituted with a hetero atom such as an oxygen atom, a sulfur atom, a nitrogen atom, and a halogen atom. The monovalent hydrocarbon group may contain a hetero atom such as an oxygen atom, a sulfur atom, and a nitrogen atom. As a result, a hydroxy group, a cyano group, a carbonyl group, an ether bond, an ester bond, a sulfonic acid ester bond, a carbonate bond, a lactone ring, a sultone ring, carboxylic anhydride, a haloalkyl group, or the like may be formed or contained. The monovalent hydrocarbon group is preferably a methyl group, a methoxy group, a tert-butyl group, or a tert-butoxy group.

In the general formula (P-1-1), $n^{308}$ and $n^{309}$ each represent an integer of 0 to 5, preferably 0 or 1. $n^{310}$ represents an integer of 0 to 4, preferably 0 or 2. $L^{304}$, $X^{305}$, $X^{306}$, and $n^{307}$ are as defined above.

The compound (photo-acid generator) shown by the general formula (P-0) is further preferably shown by the following general formula (P-1-2).

(P-1-2)
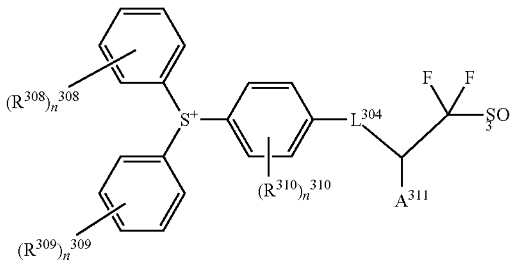
In the general formula (P-1-2), $A^{311}$ represents a hydrogen atom or a trifluoromethyl group. $R^{308}$, $R^{309}$, $R^{310}$, $n^{308}$, $n^{309}$, $n^{310}$, and L304 are as defined above.
More specific examples of the photo-acid generators shown by the general formulae (P-0), (P-1), (P-1-1), and (P-1-2) include ones with structures shown below. Nevertheless, the photo-acid generator is not limited thereto.
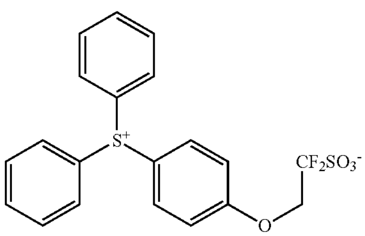
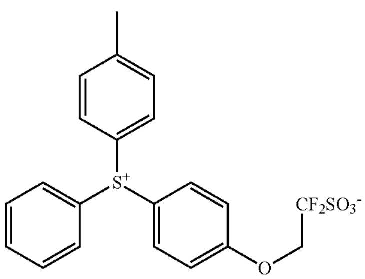
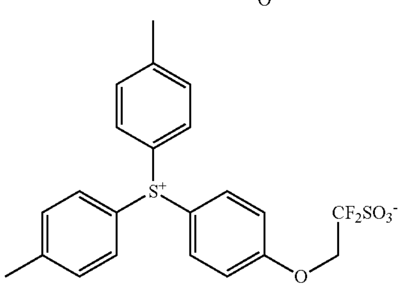
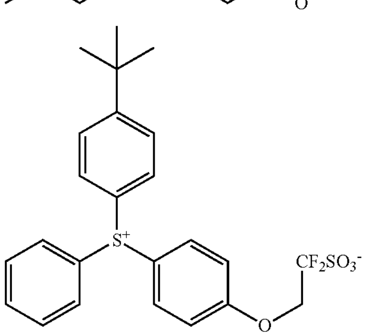
-continued
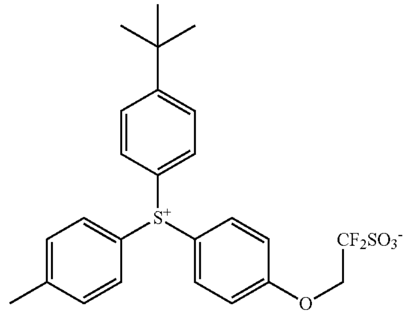
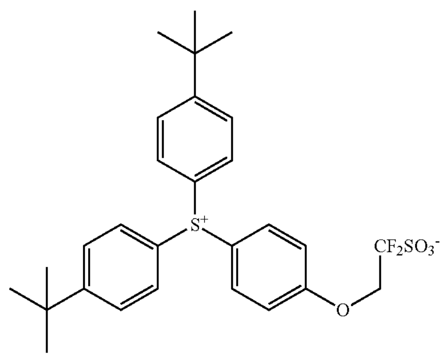
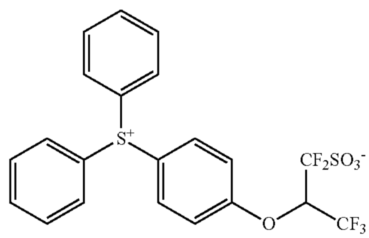
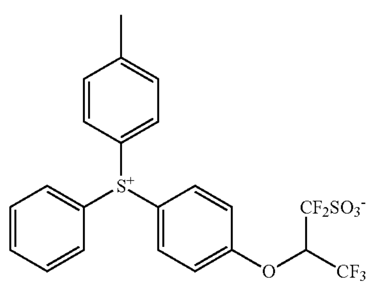
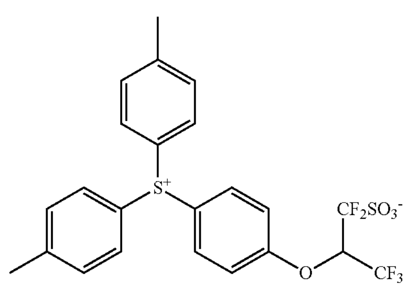

-continued
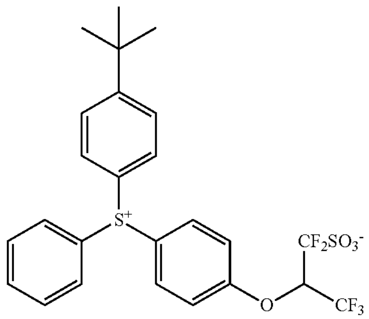
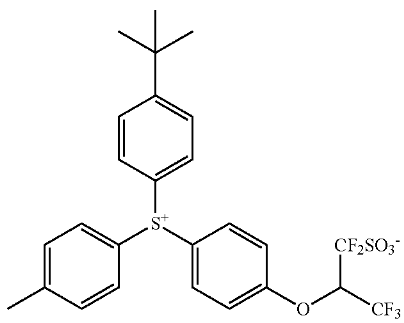
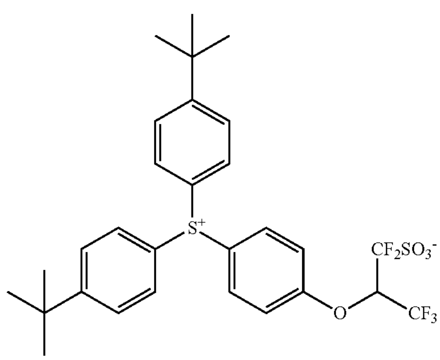
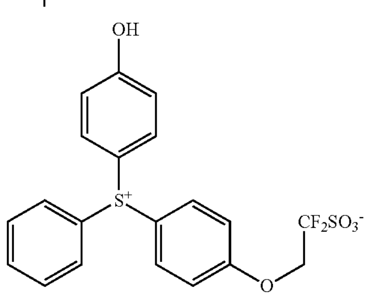
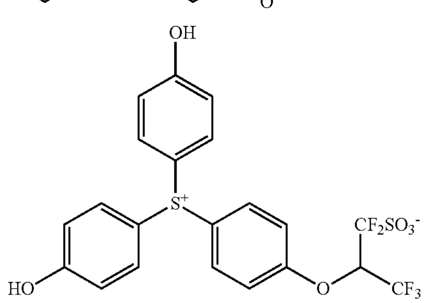
-continued
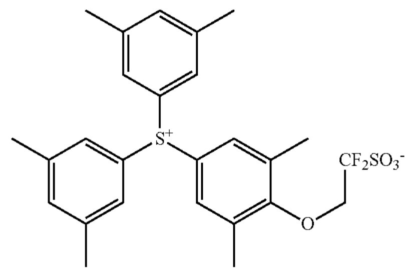
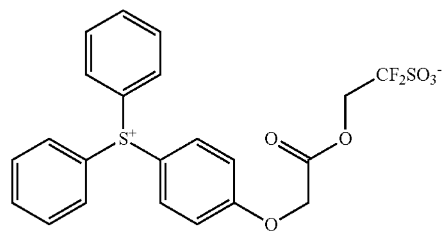
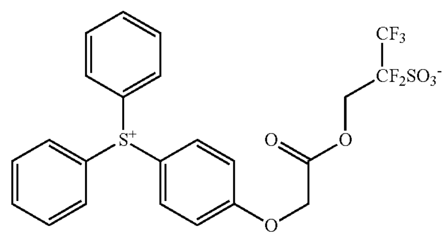
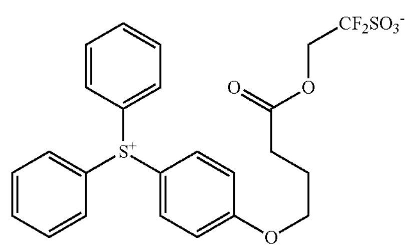
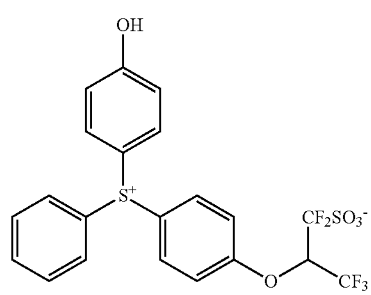
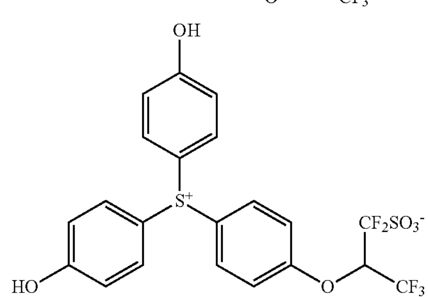

-continued
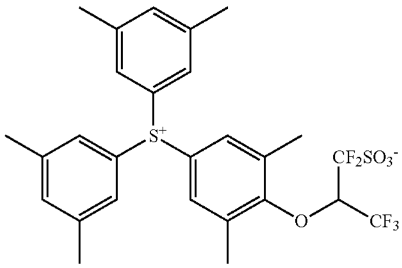
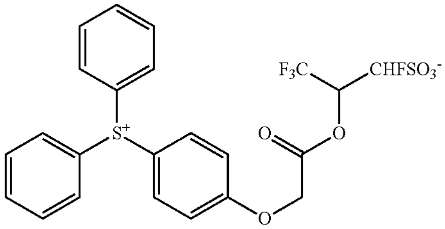
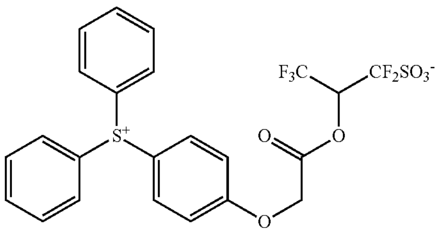
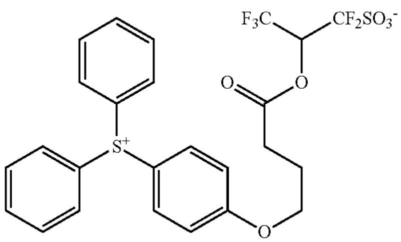
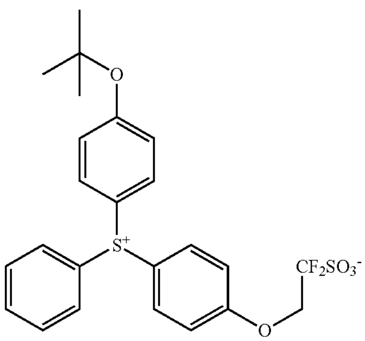
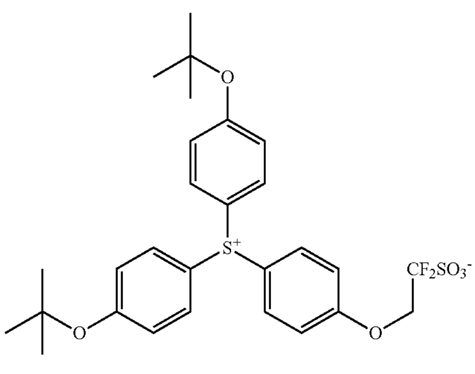
-continued
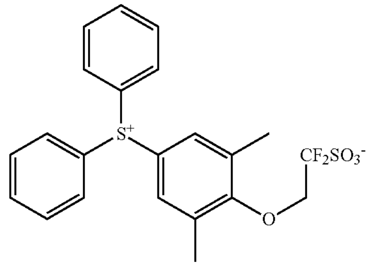
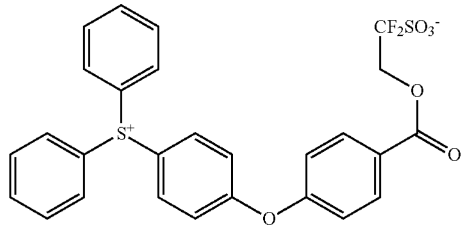
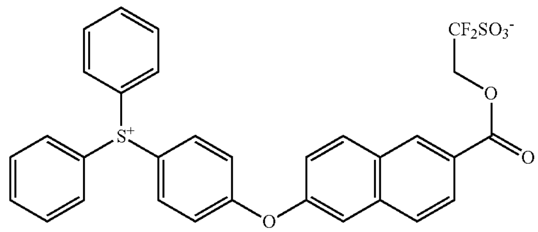
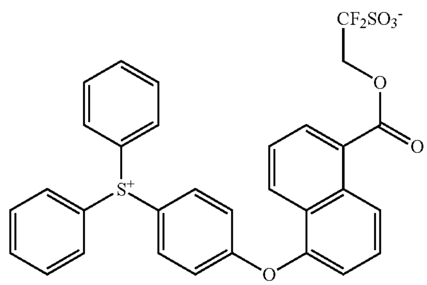
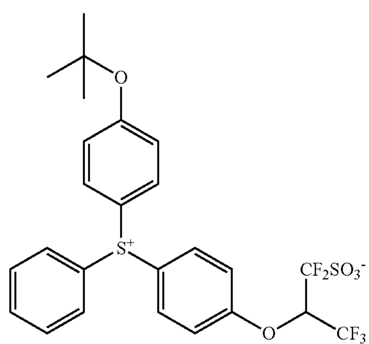
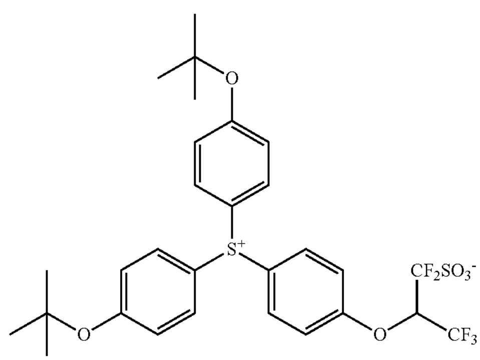

-continued
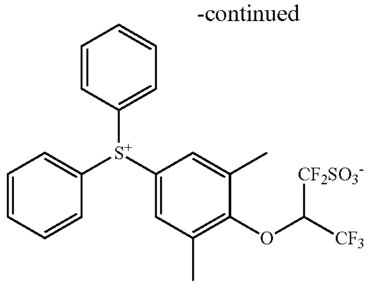
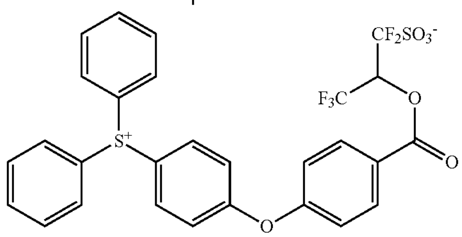
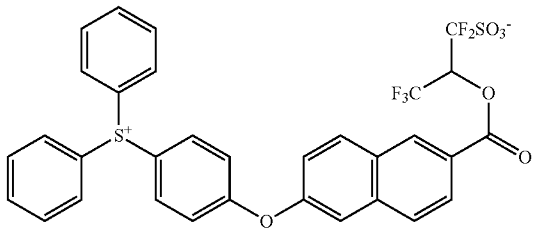
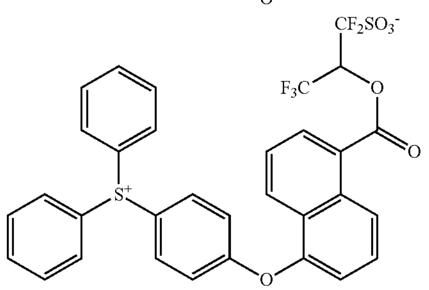
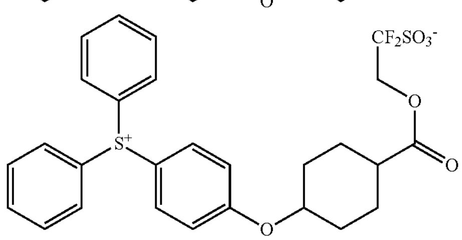
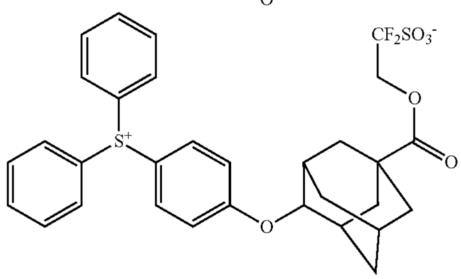
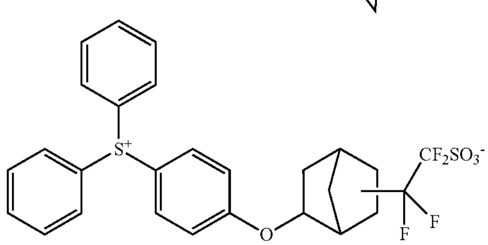
-continued
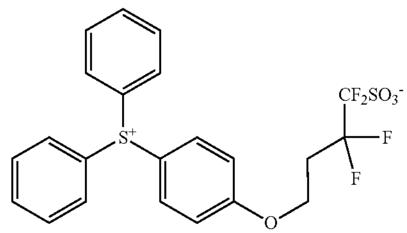
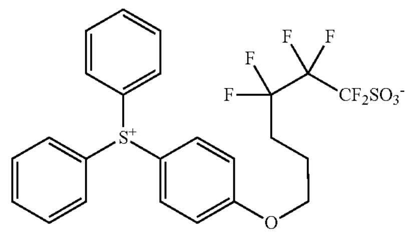
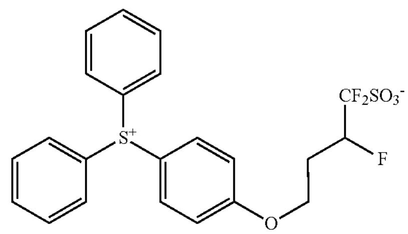
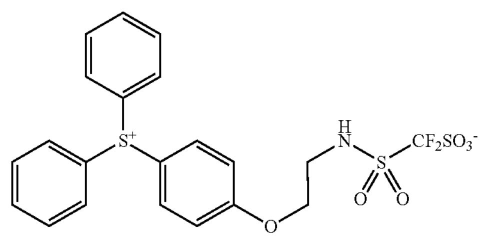
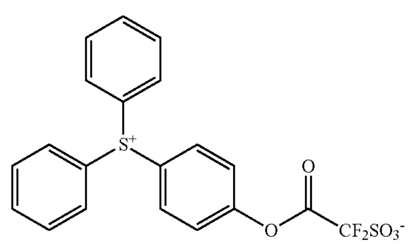
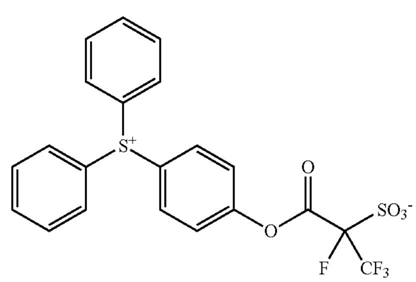
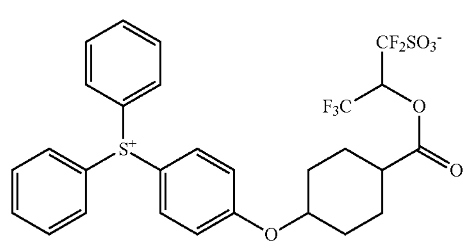

-continued
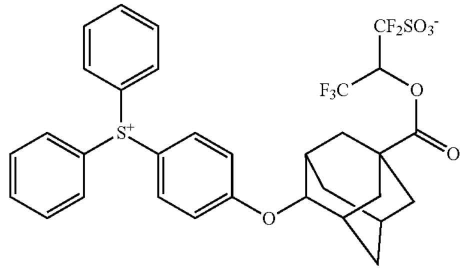
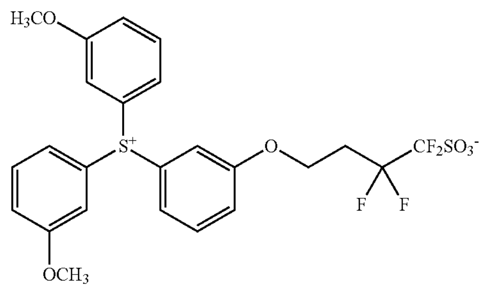
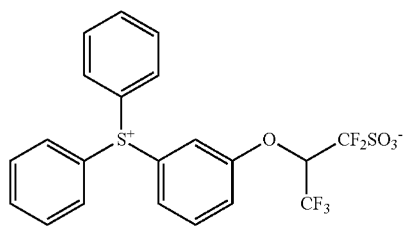
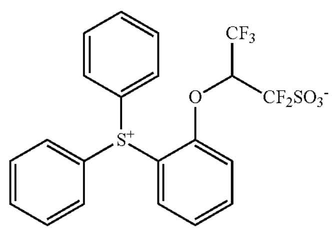
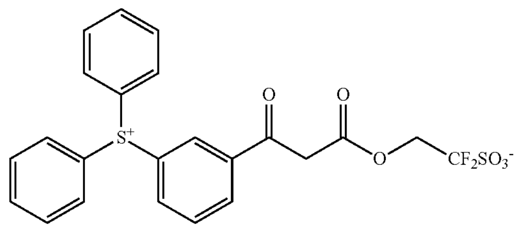
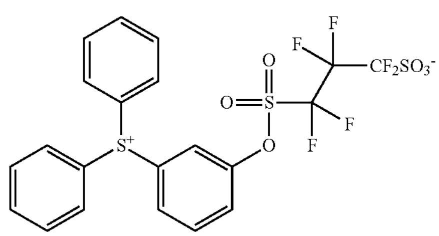
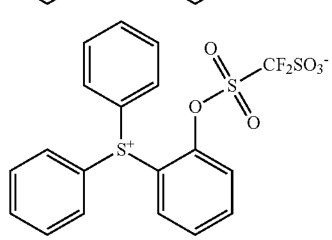
-continued
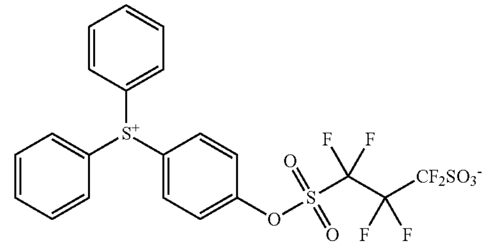
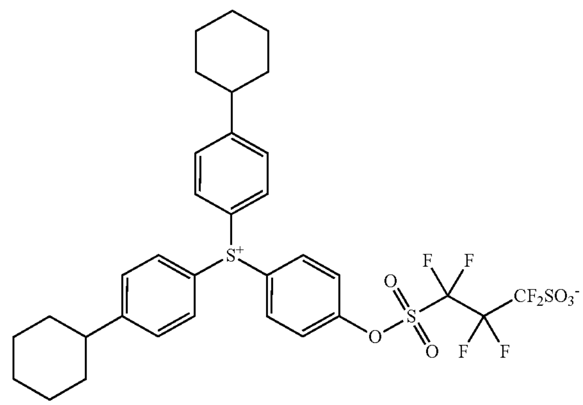
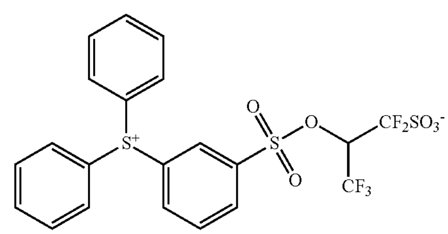
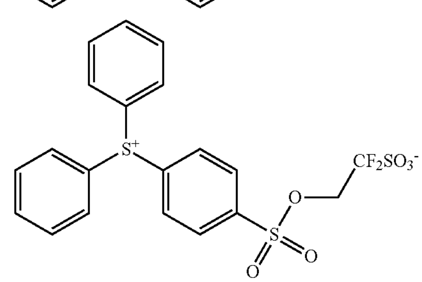
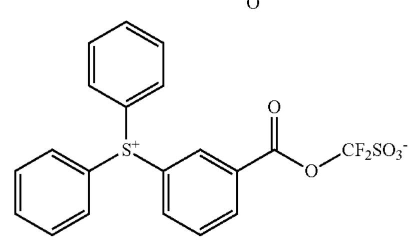
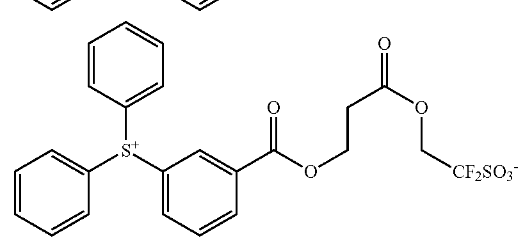

-continued
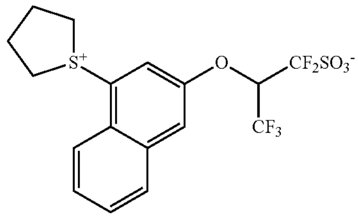
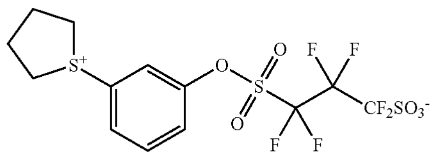
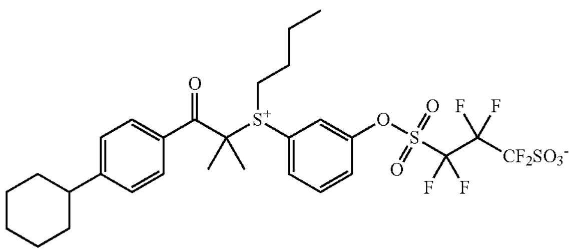
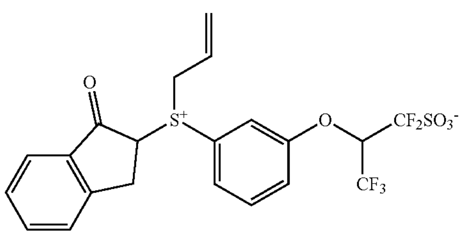
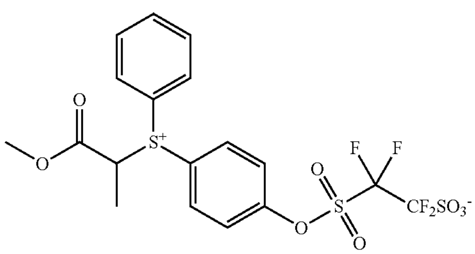
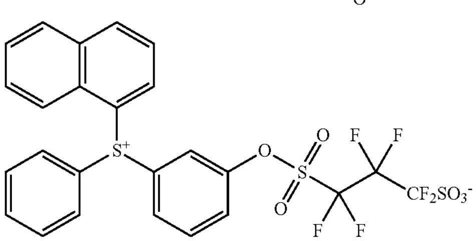
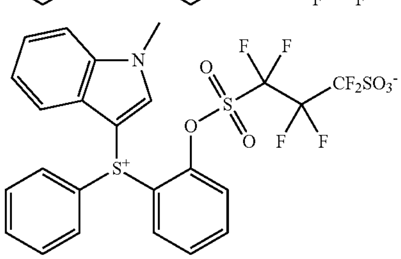
-continued
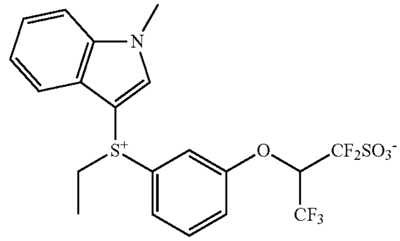
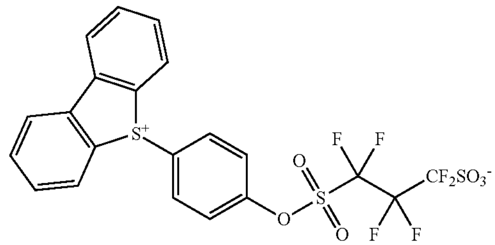
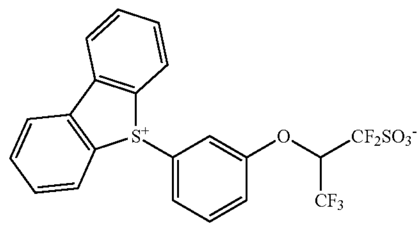
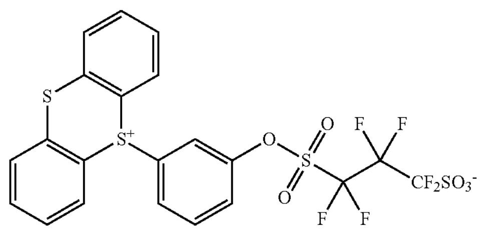
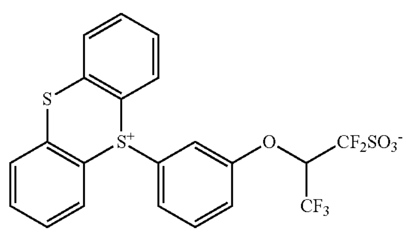
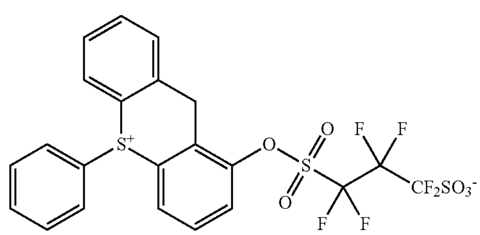
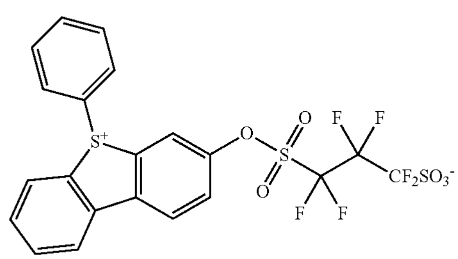

-continued
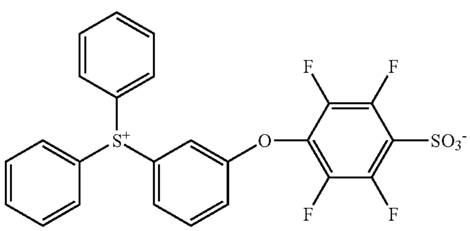
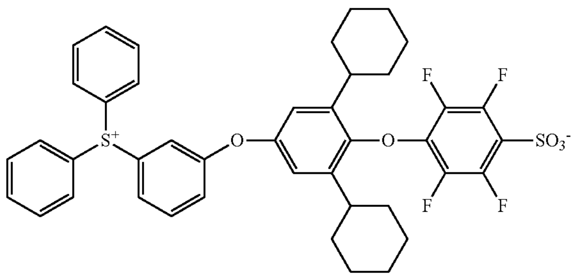
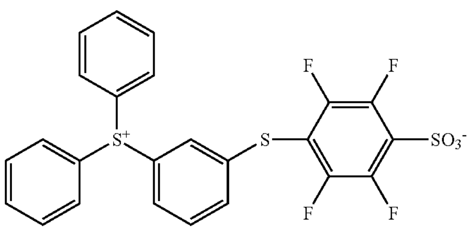
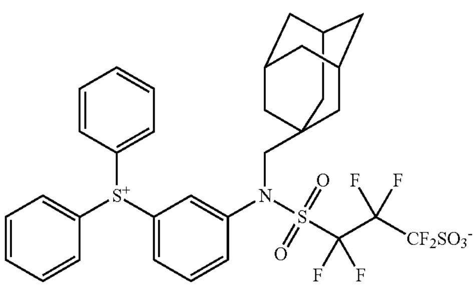
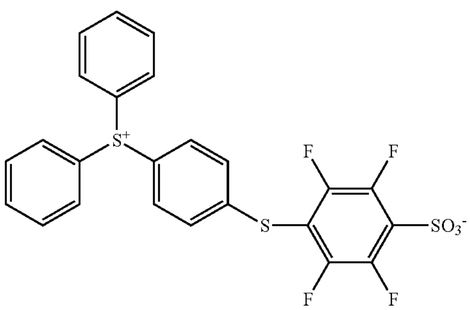
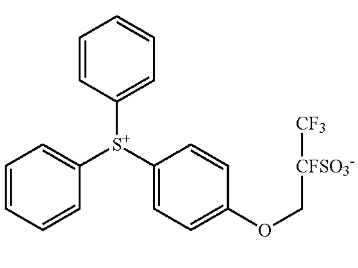
-continued
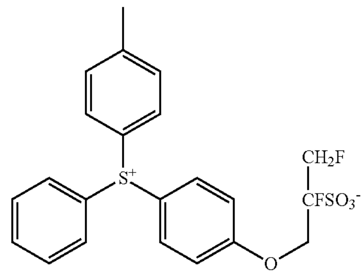
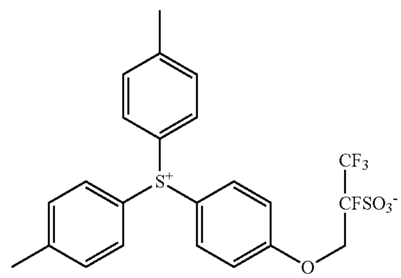
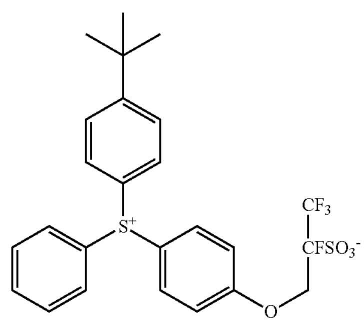
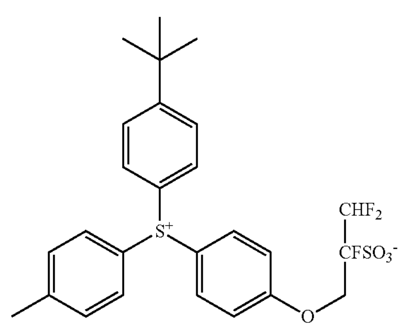
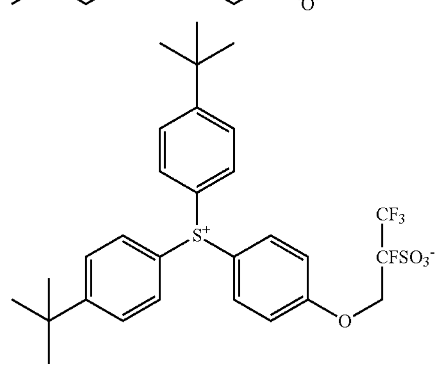

-continued
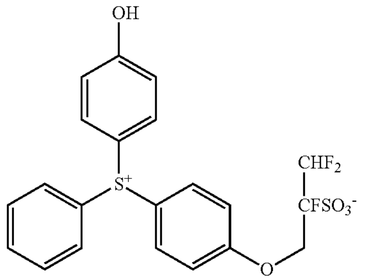
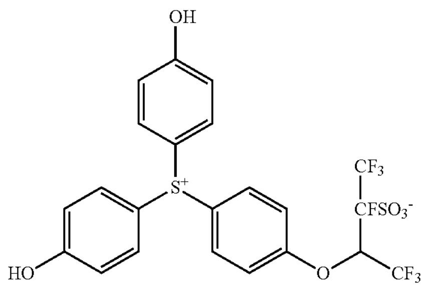
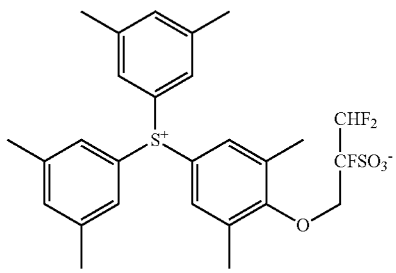
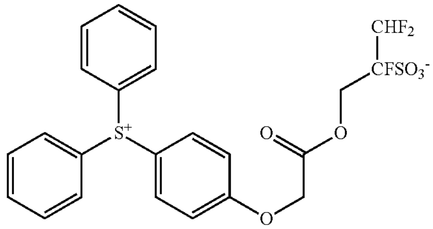
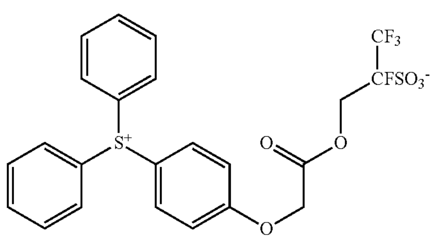
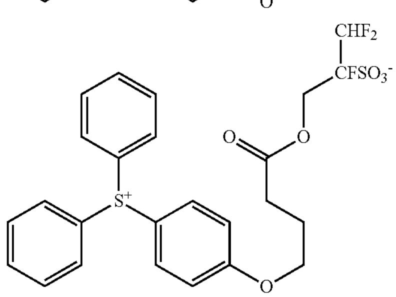
-continued
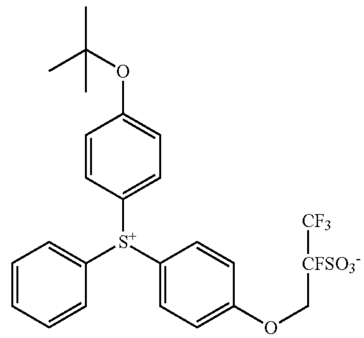
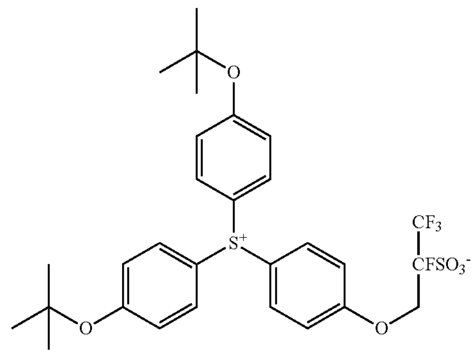
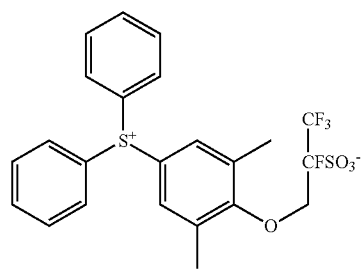
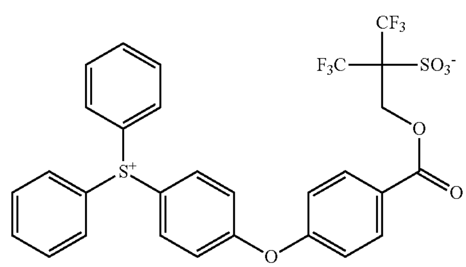
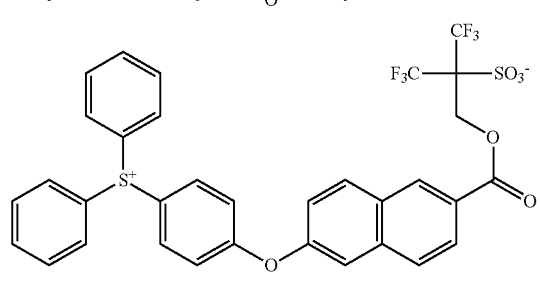

-continued

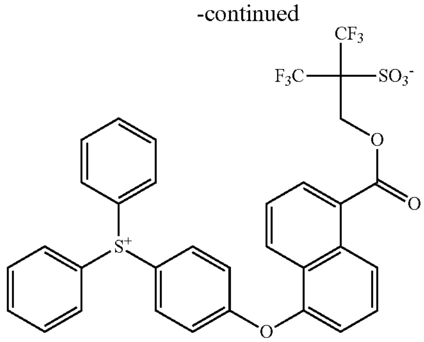

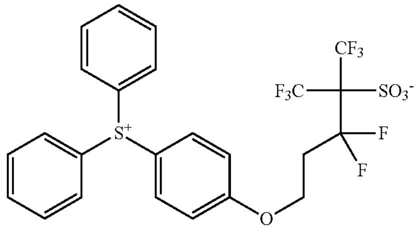

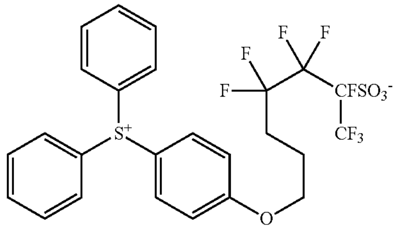

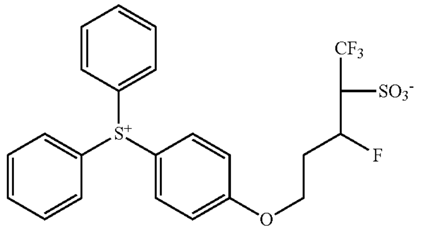

The compound shown by the general formula (P-0) can be added in an amount of 0.001 to 40 parts by mass, preferably 0.1 to 40 parts by mass, further preferably 0.1 to 20 parts by mass, based on 100 parts by mass of the thermally cross-linkable polysiloxane. By adding photo-acid generators as described above, the residue of an exposed part of a resist is reduced, so that a pattern with small LWR can be formed.

(Stabilizer)

Further, in the present invention, a stabilizer can be added to the composition for forming a silicon-containing resist underlayer film. As the stabilizer, a monohydric, dihydric, or polyhydric alcohol having a cyclic ether substituent can be added. Particularly, adding stabilizers shown in paragraphs (0181) and (0182) of JP 2009-126940 A enables stability improvement of the composition for forming a silicon-containing resist underlayer film.

(Surfactant)

Further, in the present invention, a surfactant can be blended into the composition for forming a silicon-containing resist underlayer film as necessary. Specifically, the materials described in paragraph (0185) of JP 2009-126940 A can be added as the surfactant.

(Other Components)

Further, in the present invention, a high-boiling-point solvent having a boiling point of 180° C. or higher can also be added to the composition for forming a silicon-containing resist underlayer film as necessary. Examples of the high-boiling-point solvent include 1-octanol, 2-ethylhexanol, 1-nonanol, 1-decanol, 1-undecanol, ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, glycerin, gamma-butyrolactone, tripropylene glycol monomethyl ether, diacetone alcohol, n-nonyl acetate, ethylene glycol monoethyl ether acetate, 1,2-diacetoxyethane, 1-acetoxy-2-methoxyethane, 1,2-diacetoxypropane, diethylene glycol monomethyl ether acetate, diethylene glycol monoethyl ether acetate, diethylene glycol mono-n-butyl ether acetate, propylene glycol monomethyl ether acetate, propylene glycol monopropyl ether acetate, propylene glycol monobutyl ether acetate, dipropylene glycol monomethyl ether acetate, dipropylene glycol monoethyl ether acetate, and the like.

The above-described composition for forming a silicon-containing resist underlayer film of the present invention makes it possible to form a resist underlayer film having favorable adhesiveness to resist patterns whether in negative development or positive development.

<Patterning Process>

Furthermore, the present invention provides a patterning process including:

forming an organic underlayer film on a body to be processed by using a coating-type organic film material;

forming a silicon-containing resist underlayer film on the organic underlayer film by using the inventive composition for forming a silicon-containing resist underlayer film described above;

forming a photoresist film on the silicon-containing resist underlayer film by using a photoresist composition;

subjecting the photoresist film to exposure and development to form a resist pattern;

transferring the pattern to the silicon-containing resist underlayer film by dry etching while using the photoresist film having the formed pattern as a mask;

transferring the pattern to the organic underlayer film by dry etching while using the silicon-containing resist underlayer film having the transferred pattern as a mask; and further transferring the pattern to the body to be processed by dry etching while using the organic underlayer film having the transferred pattern as a mask.

Moreover, the present invention provides a patterning process including:

forming a hard mask mainly containing carbon on a body to be processed by a CVD method;

forming a silicon-containing resist underlayer film on the CVD hard mask by using the inventive composition for forming a silicon-containing resist underlayer film described above;

forming a photoresist film on the silicon-containing resist underlayer film by using a photoresist composition;

subjecting the photoresist film to exposure and development to form a resist pattern;

transferring the pattern to the silicon-containing resist underlayer film by dry etching while using the photoresist film having the formed pattern as a mask;

transferring the pattern to the CVD hard mask by dry etching while using the silicon-containing resist underlayer film having the transferred pattern as a mask; and further transferring the pattern to the body to be processed by dry etching while using the CVD hard mask having the transferred pattern as a mask.

Here, as the body to be processed, it is possible to use a semiconductor device substrate, or the semiconductor device substrate coated with a metal film, an alloy film, a metal carbide film, a metal oxide film, a metal nitride film, a metal oxycarbide film, a metal oxynitride film, or the like.

A silicon substrate is generally used as the semiconductor device substrate. However, the semiconductor device substrate is not particularly limited, and it is possible to use a substrate of a material such as Si, amorphous silicon (α-Si), p-Si, $SiO_2$, SiN, SiON, W, TiN, and Al different from the material of the layer to be processed.

As the metal of the body to be processed, it is possible to use silicon, gallium, titanium, tungsten, hafnium, zirconium, chromium, germanium, copper, silver, gold, indium, arsenic, palladium, tantalum, iridium, aluminum, iron, molybdenum, cobalt, or an alloy thereof. As a layer to be processed containing such a metal, it is possible to use, for example, Si, $SiO_2$, SiN, SiON, SiOC, p-Si, α-Si, TiN, WSi, BPSG, SOG, Cr, CrO, CrON, MoSi, W, Al, Cu, Al—Si, etc.; or various low dielectric constant films or etching stopper films thereof. Usually, the layer can be formed with a thickness of 50 to 10,000 nm, in particular, 100 to 5,000 nm.

When a coating-type organic underlayer film is to be formed on the body to be processed (under the silicon-containing resist underlayer film), it is preferable to use, as a coating-type organic film material, a material containing a compound having an aromatic ring. When such a material is used as the coating-type organic film material, the occurrence of pattern collapse can be further suppressed. In addition, it is further preferable to use a material containing a resin including a repeating unit having a hydroxy group directly bonded to the aromatic ring.

Meanwhile, when a CVD hard mask is to be formed on the body to be processed (under the silicon-containing resist underlayer film), a hard mask mainly containing carbon can be formed by a CVD method, and this can be carried out by a known method.

The silicon-containing resist underlayer film can be formed by coating the body to be processed with the inventive composition for forming a silicon-containing resist underlayer film by a spin-coating method or the like. After spin-coating, it is desirable to bake the body to be processed in order to evaporate the solvent to prevent from mixing with the photoresist film, or in order to promote crosslinking reaction. The baking temperature is preferably 50 to 500° C., and the baking time is preferably 10 to 300 seconds. Although dependent on the structure of the device to be produced, a temperature of 400° C. or lower is particularly preferable for reducing heat damage to the device.

In the inventive patterning processes, the photoresist film material is not particularly limited as long as the material includes a chemically-amplified photoresist composition. Note that since both positive development using an alkaline developer and negative development using an organic solvent developer can be adopted in the present invention, a positive photoresist film material or a negative photoresist film material can be appropriately selected in accordance with the development method.

For example, when the exposure process in the present invention is an exposure process by ArF excimer laser beam, any resist composition for a normal ArF excimer laser beam can be used as the photoresist film material.

Many candidates for such a resist composition for an ArF excimer laser beam are already known, and the known resins are broadly divided into poly(meth)acrylic types, COMA (Cyclo Olefin Maleic Anhydride) types, COMA-(meth)acryl hybrid types, ROMP (Ring Opening Metathesis Polymerization) types, polynorbornene types, and the like. In particular, a resist composition containing a poly(meth)acrylic resin ensures etching resistance by introducing an alicyclic skeleton to a side chain, and therefore, resolution performance is more excellent than other types of resins. Thus, such a resist composition is preferably used.

In the inventive patterning processes, the resist pattern in the photoresist film is preferably formed by a lithography using light with a wavelength of 10 nm or more to 300 nm or less, a direct drawing by electron beam, a nanoimprinting, or a combination thereof. In addition, when the resist pattern is formed, the resist pattern is preferably developed by alkaline development or organic solvent development. In the inventive patterning processes, such means for forming and developing a resist pattern can be suitably used.

In addition, when transferring, by dry etching, the resist pattern formed in the photoresist film to the silicon-containing resist underlayer film, the organic underlayer film or CVD hard mask, and the body to be processed, the dry etching can be performed by a known method.

According to the inventive patterning process as described above, it is possible to form a fine pattern while suppressing pattern collapse in a patterning process in which a coating-type organic underlayer film or a CVD hard mask is formed under a silicon-containing resist underlayer film in cases of both negative development and positive development.

EXAMPLE

Hereinafter, the present invention will be specifically described with reference to Synthesis Examples, Examples, and Comparative Examples. However, the present invention is not limited thereto. Note that, in the following examples, "%" means "mass %". In addition, the molecular weight measurement was carried out by GPC. The weight-average molecular weight by GPC in terms of polystyrene is referred to as "Mw", and dispersity as "Mw/Mn".

<(1) Synthesis of Silicon Compound (A-1)>

[Synthesis Example 1-1] Synthesis of Silicon Compound (A-1-1)

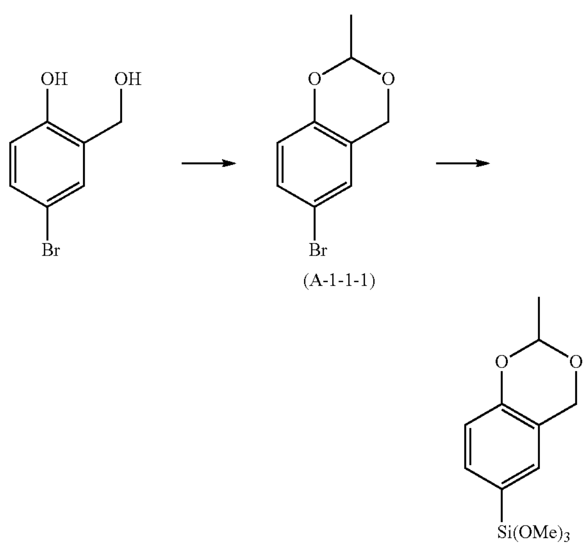

(A-1-1-1)

(A-1-1)

In an $N_2$ atmosphere, 38.0 g of 5-bromo-2-hydroxybenzyl alcohol, 14.9 g of ethyl vinyl ether, and 80 g of tetrahydrofuran were mixed. 3.6 g of p-toluenesulfonic acid monohydrate was added thereto, the temperature was raised to 40° C., and the mixture was stirred for 3 hours. After cooling the resultant to room temperature, 2.1 g of trimethylamine was added and stirred at room temperature for 1 hour. 150 mL of methyl isobutyl ketone was added, washed with water, and concentrated under reduced pressure. The resulting crude product was distilled under reduced pressure to obtain 36.8 g of a bromine product (A-1-1-1) as a fraction at 67° C./10 Pa.

In an $N_2$ atmosphere, 3.9 g of magnesium and 10 g of tetrahydrofuran were mixed, and the temperature was raised to 60° C. A mixed liquid of 36.8 g of the bromine product (A-1-1-1) and 90 g of tetrahydrofuran was slowly dropped thereto. The mixture was stirred at 60° C. for 1 hour, then cooled to room temperature to prepare a Grignard reagent (A-1-1-2).

In an $N_2$ atmosphere, 73.5 g of tetramethoxysilane was heated to 45° C., and the Grignard reagent (A-1-1-2) prepared above was slowly dropped thereto. The reaction liquid was heated to 55° C. and stirred for 2 hours. After cooling to room temperature, the reaction liquid was filtered and concentrated under reduced pressure. The resulting crude product was distilled under reduced pressure to obtain 16.5 g of a silicon compound (A-1-1) as a fraction at 92° C./20 Pa. The IR, 1H NMR, and 13C NMR analysis results of the synthesized silicon compound (A-1-1) are shown below.

IR (D-ATR):

ν=2942, 2841, 1605, 1577, 1493, 1405, 1272, 1254, 1191, 1156, 1093, 919, 810, 752, 724, 693 $cm^{-1}$

1H NMR (600 MHz, DMSO-d6) δ7.33 (d, J=8.1 Hz, 1H), 7.25 (s, 1H), 6.85 (d, J=8.1 Hz, 1H), 5.28 (q, J=5.1 Hz, 1H), 4.97 (d, J=15.0 Hz, 1H), 4.83 (d, J=15.0 Hz, 1H), 3.50 (s, 9H), 1.43 (d, J=5.1 Hz, 3H)

13C NMR (600 MHz, DMSO-d6) δ154.7, 134.1, 131.8, 121.0, 120.6, 115.9, 96.9, 65.6, 50.3, 20.4

[Synthesis Example 1-2] Synthesis of Silicon Compound

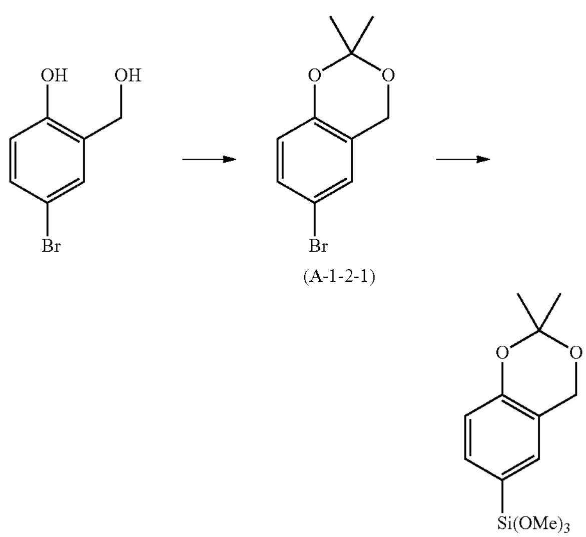

(A-1-2-1)

(A-1-2)

In an $N_2$ atmosphere, 101.5 g of 5-bromo-2-hydroxybenzyl alcohol, 57.3 g of 2,2-dimethoxypropane, and 200 g of acetone were mixed. 9.5 g of p-toluenesulfonic acid monohydrate was added thereto, the temperature was raised to 40° C., and the mixture was stirred for 3 hours. After cooling the resultant to room temperature, 5.6 g of trimethylamine was added and stirred at room temperature for 1 hour. 400 mL of methyl isobutyl ketone was added, washed with water, and concentrated under reduced pressure. The resulting crude product was distilled under reduced pressure to obtain 80.0 g of a bromine product (A-1-2-1) as a fraction at 73° C./20 Pa.

In an $N_2$ atmosphere, 8.0 g of magnesium and 20 g of tetrahydrofuran were mixed, and the temperature was raised to 60° C. A mixed liquid of 80.0 g of the bromine product (A-1-2-1) and 180 g of tetrahydrofuran was slowly dropped thereto. The mixture was stirred at 60° C. for 1 hour, then cooled to room temperature to prepare a Grignard reagent (A-1-2-2).

In an $N_2$ atmosphere, 150.2 g of tetramethoxysilane was heated to 45° C., and the Grignard reagent (A-1-2-2) prepared above was slowly dropped thereto. The reaction liquid was heated to 55° C. and stirred for 2 hours. After cooling to room temperature, the reaction liquid was filtered and concentrated under reduced pressure. The resulting crude product was distilled under reduced pressure to obtain 13.1 g of a silicon compound (A-1-2) as a fraction at 109° C./30 Pa. The IR, 1H NMR, and 13C NMR analysis results of the synthesized silicon compound (A-1-2) are shown below.

IR (D-ATR):

ν=2943, 2841, 1605, 1577, 1493, 1385, 1374, 1275, 1200, 1142, 1103, 956, 912, 812, 737, 724, 686 $cm^{-1}$

1H NMR (600 MHz, DMSO-d6) δ7.33 (d, J=8.4 Hz, 1H), 7.26 (s, 1H), 6.81 (d, J=8.4 Hz, 1H), 4.83 (s, 2H), 3.48 (s, 9H), 1.46 (s, 6H)

13C NMR (600 MHz, DMSO-d6) δ153.0, 134.1, 131.6, 119.9, 119.5, 116.3, 99.6, 59.9, 50.3, 24.6

<(2) Synthesis of Thermosetting Silicon-Containing Material>

Thermosetting silicon-containing materials were synthesized in the following manner by using the silicon compounds (A-1-1) and (A-1-2) and the following monomers (A-2-0) to (A-2-14).

Synthesis Example 2-1

To a mixture containing 120 g of methanol, 0.1 g of 10% nitric acid, and 60 g of deionized water, a mixture containing 108.1 g of the silicon compound (A-1-1) and 15.2 g of a monomer (A-2-2) was added and maintained at 40° C. for 12 hours to perform hydrolysis condensation. After completion of the reaction, 400 g of propylene glycol monoethyl ether (PGEE) was added thereto. Then, the water used for the hydrolysis condensation and by-produced alcohol were distilled off under reduced pressure. Thus, 430 g of a PGEE solution of a thermosetting silicon-containing material 2-1 was obtained (compound concentration: 20%). The molecular weight of the material was measured in terms of polystyrene and found Mw=1,800.

[Synthesis Example 2-2] to [Synthesis Example 2-16]

[Synthesis Example 2-2] to [Synthesis Example 2-16] were carried out under the same conditions as in Synthesis Example 2-1 by using monomers shown in Tables 1 and 2 to obtain the target products.

Comparative Synthesis Example 2-1

To a mixture containing 120 g of methanol, 0.1 g of 70% nitric acid, and 60 g of deionized water, a mixture containing 5.0 g of a monomer (A-2-0), 3.4 g of a monomer (A-2-1), and 68.5 g of a monomer (A-2-2) was added and maintained at 40° C. for 12 hours to perform hydrolysis condensation. After completion of the reaction, 300 g of PGEE was added thereto. Then, by-produced alcohol and excess water were distilled off under reduced pressure. Thus, 160 g of a PGEE solution of a polysiloxane compound 2-1 was obtained (compound concentration: 20%). The molecular weight of the polysiloxane compound 2-1 was measured in terms of polystyrene, and found Mw=2,300.

Comparative Synthesis Example 2-2

To a mixture containing 120 g of methanol, 1 g of methanesulfonic acid, and 60 g of deionized water, a mixture containing 13.6 g of the monomer (A-2-1), 38.1 g of the monomer (A-2-2), and 40.6 g of the monomer (A-2-11) was added and maintained at 40° C. for 12 hours to perform hydrolysis condensation. After completion of the reaction, 300 g of PGEE was added thereto. Then, by-produced alcohol and excess water were distilled off under reduced pressure. Thus, 260 g of a PGEE solution of a polysiloxane compound 2-2 was obtained (compound concentration: 20%). The molecular weight of the polysiloxane compound 2-2 was measured in terms of polystyrene and found Mw=3, 400.

Synthesis Example 3

To a mixture containing 120 g of methanol, 0.1 g of 10% nitric acid, and 60 g of deionized water, a mixture containing 61.3 g of the monomer (A-2-1) and 12.9 g of a monomer (A-2-14) was added and maintained at 40° C. for 12 hours to perform hydrolysis condensation. After completion of the reaction, 300 g of propylene glycol monoethyl ether (PGEE) was added thereto. Then, the water used for the hydrolysis condensation and by-produced alcohol were distilled off under reduced pressure. Thus, 200 g of a PGEE solution of an ammonium salt-containing polysiloxane compound Z-1 was obtained (compound concentration: 20%). The molecular weight of the ammonium salt-containing polysiloxane compound Z-1 was measured in terms of polystyrene and found Mw=1,500.

TABLE 1

| Synthesis Example | Reaction raw material | Mw |
|---|---|---|
| 2-1 | Silicon compound (A-1-1): 108.1 g, Monomer (A-2-2): 15.2 g | 1,800 |
| 2-2 | Silicon compound (A-1-2): 71.1 g, Monomer (A-2-2): 38.1 g | 2,000 |
| 2-3 | Silicon compound (A-1-1): 20.3 g, Monomer (A-2-1): 6.8 g, Monomer (A-2-2): 57.1 g | 2,600 |
| 2-4 | Silicon compound (A-1-2): 21.3 g, Monomer (A-2-1): 6.8 g, Monomer (A-2-2): 57.1 g | 2,600 |
| 2-5 | Silicon compound (A-1-1): 13.5 g, Monomer (A-2-0): 5.0 g, Monomer (A-2-1): 6.8 g, Monomer (A-2-2): 57.1 g | 2,500 |
| 2-6 | Silicon compound (A-1-2): 14.2 g, Monomer (A-2-0): 5.0 g, Monomer (A-2-1): 6.8 g, Monomer (A-2-2): 57.1 g | 2,500 |
| 2-7 | Silicon compound (A-1-1): 13.5 g, Monomer (A-2-1): 6.8 g, Monomer (A-2-3): 72.9 g, Monomer (A-2-4): 11.8 g | 2,200 |
| 2-8 | Silicon compound (A-1-1): 13.5 g, Monomer (A-2-1): 6.8 g, Monomer (A-2-3): 72.9 g, Monomer (A-2-5): 12.7 g | 2,100 |
| 2-9 | Silicon compound (A-1-1): 13.5 g, Monomer (A-2-1): 6.8 g, Monomer (A-2-3): 72.9 g, Monomer (A-2-6): 13.9 g | 2,400 |
| 2-10 | Silicon compound (A-1-1): 13.5 g, Monomer (A-2-1): 6.8 g, Monomer (A-2-3): 72.9 g, Monomer (A-2-7): 13.2 g | 2,300 |

TABLE 2

| Synthesis Example | Reaction raw material | Mw |
|---|---|---|
| 2-11 | Silicon compound (A-1-1): 13.5 g, Monomer (A-2-1): 6.8 g, Monomer (A-2-3): 72.9 g, Monomer (A-2-8): 14.5 g | 2,200 |
| 2-12 | Silicon compound (A-1-1): 13.5 g, Monomer (A-2-1): 6.8 g, Monomer (A-2-2): 53.3 g, Monomer (A-2-9): 12.3 g | 2,500 |
| 2-13 | Silicon compound (A-1-1): 13.5 g, Monomer (A-2-1): 6.8 g, Monomer (A-2-2): 53.3 g, Monomer (A-2-10): 10.2 g | 2,400 |
| 2-14 | Silicon compound (A-1-1): 13.5 g, Monomer (A-2-1): 6.8 g, Monomer (A-2-2): 53.3 g, Monomer (A-2-11): 13.5 g | 2,500 |
| 2-15 | Silicon compound (A-1-1): 6.8 g, Monomer (A-2-0): 5.0 g, Monomer (A-2-1): 6.8 g, Monomer (A-2-2): 53.3 g, Monomer (A-2-12): 17.7 g | 2,300 |
| 2-16 | Silicon compound (A-1-1): 13.5 g, Monomer (A-2-1): 6.8 g, Monomer (A-2-2): 53.3 g, Monomer (A-2-13): 16.0 g | 2,400 |
| Comparative 2-1 | Monomer (A-2-0): 5.0 g, Monomer (A-2-1): 3.4 g, Monomer (A-2-2): 68.5 g | 2,300 |
| Comparative 2-2 | Monomer (A-2-1): 13.6 g, Monomer (A-2-3): 38.1 g, Monomer (A-2-11): 40.6 g | 3,400 |

Monomer (A-2-0) $PhSi(OCH_3)_3$

Monomer (A-2-1) $CH_3Si(OCH_3)_3$

Monomer (A-2-2) $Si(OCH_3)_4$

Monomer (A-2-3) $Si(OC_2H_5)_4$ (A-2-4)

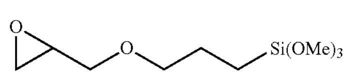

(A-2-5)

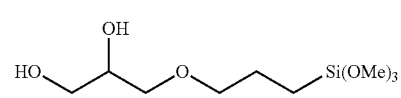

-continued (A-2-6)

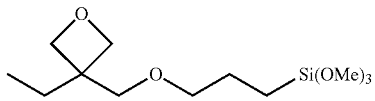

(A-2-7)

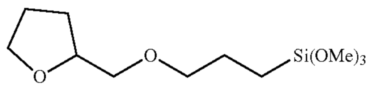

(A-2-8)

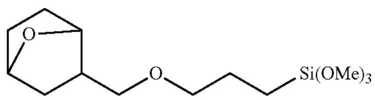

(A-2-9)

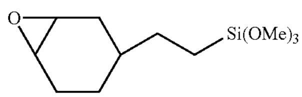

(A-2-10)

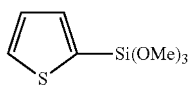

(A-2-11)

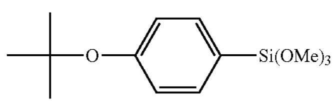

(A-2-12)

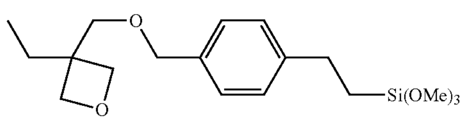

-continued (A-2-13)

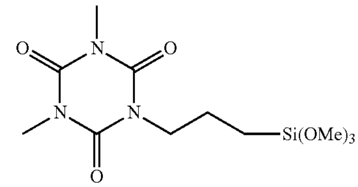

(A-2-14)

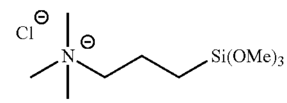

<Examples and Comparative Examples>

[Preparation of Composition Solutions for Forming Silicon-Containing Resist Underlayer Film]

Polysiloxanes (thermosetting silicon-containing materials: Synthesis Examples 2-1 to 16) obtained in the Synthesis Examples, crosslinking catalysts or the polysiloxane compound Z-1, comparative polysiloxane compounds 2-1 and 2-2, photo-acid generators, acid, solvents, and water were mixed at ratios shown in Tables 3 to 6. Each mixture was filtered through a 0.1-μm filter made of fluorinated resin. Thus, composition solutions for forming a silicon-containing resist underlayer film were prepared and referred to as Sol. 1 to Sol. 57.

TABLE 3

| No. | Polysiloxane (parts by mass) | Crosslinking catalyst (parts by mass) | Photo-acid generator (parts by mass) | Acid (parts by mass) | Solvent (parts by mass) | Water (parts by mass) |
|---|---|---|---|---|---|---|
| Sol.1 | Synthesis Example 2-1 (1) | $TPSNO_3$ (0.01) | none | maleic acid (0.01) | PGEE (100) | water (10) |
| Sol.2 | Synthesis Example 2-2 (1) | $TPSNO_3$ (0.01) | none | maleic acid (0.01) | PGEE (100) | water (10) |
| Sol.3 | Synthesis Example 2-3 (1) | $TPSNO_3$ (0.01) | none | maleic acid (0.01) | PGEE (100) | water (10) |
| Sol.4 | Synthesis Example 2-3 (1) | TPSMA (0.01) | none | maleic acid (0.01) | PGEE (100) | water (10) |
| Sol.5 | Synthesis Example 2-3 (1) | QMAMA (0.01) | none | maleic acid (0.01) | PGEE (100) | water (10) |
| Sol.6 | Synthesis Example 2-3 (1) | QMATFA (0.01) | none | maleic acid (0.01) | PGEE (100) | water (10) |
| Sol.7 | Synthesis Example 2-3 (1) | $TPSNO_3$ (0.01) | none | maleic acid (0.01) | PGEE (100) | water (10) |
| Sol.8 | Synthesis Example 2-3 (1) | $QBANO_3$ (0.01) | none | maleic acid (0.01) | PGEE (100) | water (10) |
| Sol.9 | Synthesis Example 2-3 (1) | PhICl (0.01) | none | maleic acid (0.01) | PGEE (100) | water (10) |
| Sol.10 | Synthesis Example 2-3 (1) | Z-1 (0.01) | none | maleic acid (0.01) | PGEE (100) | water (10) |
| Sol.11 | Synthesis Example 2-3 (1) | $TPSNO_3$ (0.01) | TPSNf (0.01) | maleic acid (0.01) | PGEE (100) | water (10) |

TABLE 3-continued

| No. | Polysiloxane (parts by mass) | Crosslinking catalyst (parts by mass) | Photo-acid generator (parts by mass) | Acid (parts by mass) | Solvent (parts by mass) | Water (parts by mass) |
|---|---|---|---|---|---|---|
| Sol.12 | Synthesis Example 2-3 (1) | $TPSNO_3$ (0.01) | TPSNf (0.01) | maleic acid (0.01) | PGEE(90) GBL(10) | water (10) |
| Sol.13 | Synthesis Example 2-3 (1) | $TPSNO_3$ (0.01) | PAG-1 (0.01) | maleic acid (0.01) | PGEE (100) | water (10) |
| Sol.14 | Synthesis Example 2-3 (1) | $QBANO_3$ (0.01) | TPSNf (0.01) | maleic acid (0.01) | PGEE (100) | water (10) |
| Sol.15 | Synthesis Example 2-3 (1) | $QBANO_3$ (0.01) | TPSNf (0.01) | maleic acid (0.01) | PGEE(90) GBL(10) | water (10) |

TABLE 4

| No. | Polysiloxane (parts by mass) | Crosslinking catalyst (parts by mass) | Photo-acid generator (parts by mass) | Acid (parts by mass) | Solvent (parts by mass) | Water (parts by mass) |
|---|---|---|---|---|---|---|
| Sol.16 | Synthesis Example 2-4 (1) | $TPSNO_3$ (0.01) | none | maleic acid (0.01) | PGEE (100) | water (10) |
| Sol.17 | Synthesis Example 2-5 (1) | $TPSNO_3$ (0.01) | none | maleic acid (0.01) | PGEE (100) | water (10) |
| Sol.18 | Synthesis Example 2-6 (1) | $TPSNO_3$ (0.01) | none | maleic acid (0.01) | PGEE (100) | water (10) |
| Sol.19 | Synthesis Example 2-7 (1) | $QBANO_3$ (0.01) | none | maleic acid (0.01) | PGEE (100) | water (10) |
| Sol.20 | Synthesis Example 2-8 (1) | $QBANO_3$ (0.01) | none | maleic acid (0.01) | PGEE (100) | water (10) |
| Sol.21 | Synthesis Example 2-9 (1) | $TMPANO_3$ (0.01) | none | maleic acid (0.01) | PGEE (100) | water (10) |
| Sol.22 | Synthesis Example 2-10 (1) | $TMPANO_3$ (0.01) | none | maleic acid (0.01) | PGEE (100) | water (10) |
| Sol.23 | Synthesis Example 2-11 (1) | $TMPANO_3$ (0.01) | none | maleic acid (0.01) | PGEE(90) PGME(10) | water (10) |
| Sol.24 | Synthesis Example 2-12 (1) | $TMPANO_3$ (0.01) | PAG-l (0.01) | maleic acid (0.01) | PGEE (100) | water (10) |
| Sol.25 | Synthesis Example 2-13 (1) | $QBANO_3$ (0.01) | TPSNf (0.01) | maleic acid (0.01) | PGEE(90) DAA(10) | water (10) |
| Sol.26 | Synthesis Example 2-14 (1) | $QBANO_3$ (0.01) | PAG-l (0.01) | maleic acid (0.01) | PGEE (100) | water (10) |
| Sol.27 | Synthesis Example 2-15 (1) | $QBANO_3$ (0.01) | none | maleic acid (0.01) | PGEE (100) | water (10) |
| Sol.28 | Synthesis Example 2-16 (1) | $QBANO_3$ (0.01) | none | maleic acid (0.01) | PGEE (100) | water (10) |
| Sol.29 | Comparative polysiloxane compound 2-1 (1) | $TPSNO_3$ (0.01) | none | maleic acid (0.01) | PGEE (100) | water (10) |
| Sol.30 | Synthesis Example 2-1 (1) | $TPSNO_3$ (0.01) | none | maleic acid (0.01) | PGEE (300) | water (30) |
| Sol.31 | Synthesis Example 2-2 (1) | $TPSNO_3$ (0.01) | none | maleic acid (0.01) | PGEE (300) | water (30) |
| Sol.32 | Synthesis Example 2-3 (1) | $TPSNO_3$ (0.01) | none | maleic acid (0.01) | PGEE (300) | water (30) |

TABLE 5

| No. | Polysiloxane (parts by mass) | Crosslinking catalyst (parts by mass) | Photo-acid generator (parts by mass) | Acid (parts by mass) | Solvent (parts by mass) | Water (parts by mass) |
|---|---|---|---|---|---|---|
| Sol.33 | Synthesis Example 2-3 (1) | TPSMA (0.01) | none | maleic acid (0.01) | PGEE (300) | water (30) |
| Sol.34 | Synthesis Example 2-3 (1) | QMAMA (0.01) | none | maleic acid (0.01) | PGEE (300) | water (30) |
| Sol.35 | Synthesis Example 2-3 (1) | QMATFA (0.01) | none | maleic acid (0.01) | PGEE (300) | water (30) |
| Sol.36 | Synthesis Example 2-3 (1) | $TPSNO_3$ (0.01) | none | maleic acid (0.01) | PGEE (300) | water (30) |
| Sol.37 | Synthesis Example 2-3 (1) | $QBANO_3$ (0.01) | nne | maleic acid (0.01) | PGEE (300) | water (30) |
| Sol.38 | Synthesis Example 2-3 (1) | PhICl (0.01) | none | maleic acid (0.01) | PGEE (300) | water (30) |
| Sol.39 | Synthesis Example 2-3 (1) | Z-1 (0.01) | none | maleic acid (0.01) | PGEE (300) | water (30) |
| Sol.40 | Synthesis Example 2-3 (1) | $TPSNO_3$ (0.01) | TPSNf (0.01) | maleic acid (0.01) | PGEE (300) | water (30) |
| Sol.41 | Synthesis Example 2-3 (1) | $TPSNO_3$ (0.01) | PAG-1 (0.01) | maleic acid (0.01) | PGEE (300) | water (30) |
| Sol.42 | Synthesis Example 2-3 (1) | $QBANO_3$ (0.01) | TPSNf (0.01) | maleic acid (0.01) | PGEE (300) | water (30) |
| Sol.43 | Synthesis Example 2-4 (1) | $TPSNO_3$ (0.01) | none | maleic acid (0.01) | PGEE (300) | water (30) |
| Sol.44 | Synthesis Example 2-5 (1) | $TPSNO_3$ (0.01) | none | maleic acid (0.01) | PGEE (300) | water (30) |
| Sol.45 | Synthesis Example 2-6 (1) | $TPSNO_3$ (0.01) | none | maleic acid (0.01) | PGEE (300) | water (30) |
| Sol.46 | Synthesis Example 2-7 (1) | $QBANO_3$ (0.01) | none | maleic acid (0.01) | PGEE (300) | water (30) |
| Sol.47 | Synthesis Example 2-8 (1) | $QBANO_3$ (0.01) | none | maleic acid (0.01) | PGEE (300) | water (30) |
| Sol.48 | Synthesis Example 2-9 (1) | $TMPANO_3$ (0.01) | none | maleic acid (0.01) | PGEE (300) | water (30) |
| Sol.49 | Synthesis Example 2-10 (1) | $TMPANO_3$ (0.01) | none | maleic acid (0.01) | PGEE (300) | water (30) |
| Sol.50 | Synthesis Example 2-11 (1) | $TMPANO_3$ (0.01) | none | maleic acid (0.01) | PGEE (300) | water (30) |

TABLE 6

| No. | Polysiloxane (parts by mass) | Crosslinking catalyst (parts by mass) | Photo-acid generator (parts by mass) | Acid (parts by mass) | Solvent (parts by mass) | Water (parts by mass) |
|---|---|---|---|---|---|---|
| Sol.51 | Synthesis Example 2-12 (1) | $TMPANO_3$ (0.01) | PAG-1 (0.01) | maleic acid (0.01) | PGEE (300) | water (30) |
| Sol.52 | Synthesis Example 2-13 (1) | $QBANO_3$ (0.01) | TPSNf (0.01) | maleic acid (0.01) | PGEE (300) | water (30) |
| Sol.53 | Synthesis Example 2-14 (1) | $QBANO_3$ (0.01) | PAG-1 (0.01) | maleic acid (0.01) | PGEE (300) | water (30) |

TABLE 6-continued

| No. | Polysiloxane (parts by mass) | Crosslinking catalyst (parts by mass) | Photo-acid generator (parts by mass) | Acid (parts by mass) | Solvent (parts by mass) | Water (parts by mass) |
|---|---|---|---|---|---|---|
| Sol.54 | Synthesis Example 2-15 (1) | $QBANO_3$ (0.01) | none | maleic acid (0.01) | PGEE (300) | water (30) |
| Sol.55 | Synthesis Example 2-16 (1) | $QBANO_3$ (0.01) | none | maleic acid (0.01) | PGEE (300) | water (30) |
| Sol.56 | Comparative polysiloxane compound 2-1 (1) | $TPSNO_3$ (0.01) | none | maleic acid (0.01) | PGEE (300) | water (30) |
| Sol.57 | Comparative polysiloxane compound 2-2 (1) | TPSMA (0.01) | none | maleic acid (0.01) | PGEE (300) | water (30) |

$TPSNO_3$: triphenylsulfonium nitrate
TPSMA: mono(triphenylsulfonium)maleate
QMAMA: mono(tetramethylammonium)maleate
QMATFA: tetramethylammonium trifluoroacetate
$QBANO_3$: tetrabutylammonium nitrate
$Ph_2ICl$: diphenyliodonium chloride
$TMPANO_3$: trimethylphenylammonium nitrate
Z-1: PGEE solution containing 20% polysiloxane compound Z-1
TPSNf: triphenylsulfonium nonafluorobutanesulfonate
PAG-1: see the following formula

PAG-1

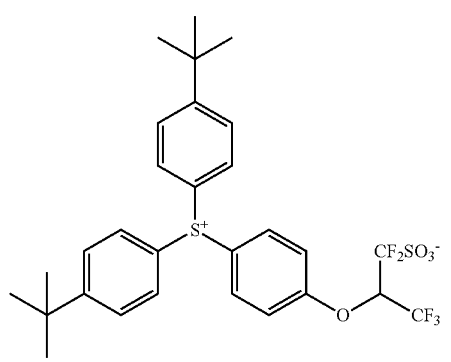

PGEE: propylene glycol monoethyl ether
PGME: propylene glycol monomethyl ether
GBL: gamma-butyrolactone
DAA: diacetone alcohol

[Test with ArF Photo-Exposure and Positive Development Resist]

Patterning Test: Examples 1-1 to 1-28, Comparative Example 1-1

A silicon wafer was spin-coated with the following naphthalene skeleton-containing resin (UL polymer 1) composition and heated at 350° C. for 60 seconds to form an organic underlayer film with a film thickness of 200 nm. One of the composition solutions Sol. 1 to 29 for forming a silicon-containing resist underlayer film was spin-coated thereon and heated at 240° C. for 60 seconds. Thus, silicon-containing resist underlayer films each having a film thickness of 35 nm were formed as Films 1 to 29.

Naphthalene skeleton-containing resin: UL polymer 1

Molecular weight (Mw)=4,200

Dispersity (Mw/Mn)=3.35

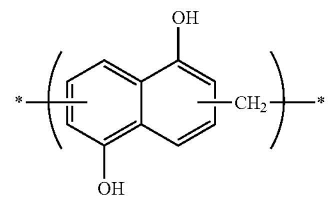

Subsequently, the ArF photoresist solution (PR-1) for positive development shown in Table 7 was applied to each silicon-containing resist underlayer film and baked at 110° C. for 60 seconds to form a photoresist film with a film thickness of 100 nm. Furthermore, the liquid immersion top coat material (TC-1) shown in Table 8 was applied to the photoresist film and heated at 90° C. for 60 seconds to form a top coat with a film thickness of 50 nm.

Next, this was exposed with an ArF liquid immersion exposure apparatus (NSR-S610C manufactured by Nikon Corporation, NA: 1.30, σ: 0.98/0.65, 35° polarized dipole illumination, 6% halftone phase shift mask), baked (PEB) at 100° C. for 60 seconds, and developed with a 2.38 mass % tetramethylammonium hydroxide (TMAH) aqueous solution for 30 seconds to form a 42 nm 1:1 positive line-and-space pattern. After that, pattern collapse after the development was observed with an electron microscope (CG4000) manufactured by Hitachi High-Technologies Corporation, and the sectional profile after the development was observed with an electron microscope (S-9380) manufactured by Hitachi, Ltd. Tables 9 and 10 show the results.

TABLE 7

| No. | ArF resist polymer (parts by mass) | Acid generator (parts by mass) | Base (parts by mass) | Water-repellent polymer (parts by mass) | Solvent (parts by mass) |
|---|---|---|---|---|---|
| PR-1 | P1 (100) | PAG-1 (10.0) | Q1 (4.25) | FP1 (4.0) | PGMEA (2,200) GBL (300) |

PGMEA: propylene glycol monomethyl ether acetate

ArF resist polymer: P1

Molecular weight (Mw)=11,300

Dispersity (Mw/Mn)=1.89

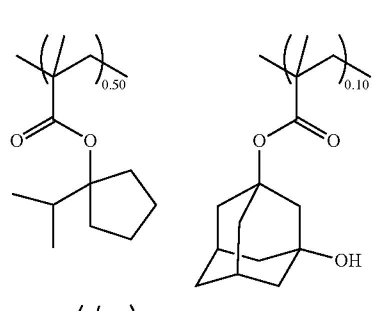

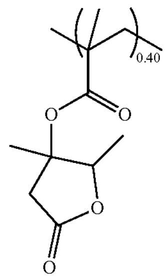

Base: Q 1

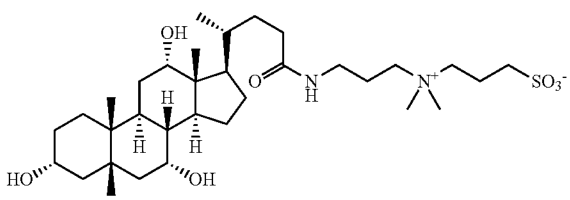

Water-repellent polymer: FP1

Molecular weight (Mw)=8,900

Dispersity (Mw/Mn)=1.96

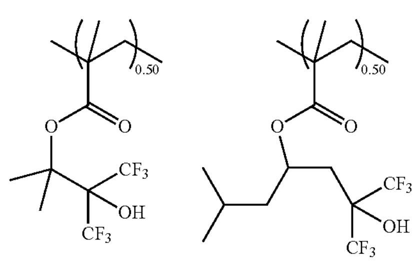

TABLE 8

| No. | Polymer (parts by mass) | Organic solvent (parts by mass) |
|---|---|---|
| TC-1 | top coat polymer (100) | diisoamyl ether (2700) 2-methyl-1-butanol (270) |

Top Coat Polymer

Molecular weight (Mw)=8,800

Dispersity (Mw/Mn)=1.69

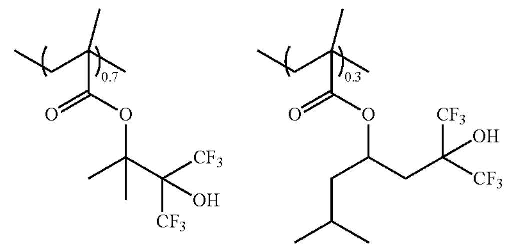

Top coat polymer

TABLE 9

| Example | Silicon-containing resist underlayer film | Pattern sectional profile after development | Pattern collapse at 42 nm |
|---|---|---|---|
| Example 1-1 | Film 1 | vertical profile | none |
| Example 1-2 | Film 2 | vertical profile | none |
| Example 1-3 | Film 3 | vertical profile | none |
| Example 1-4 | Film 4 | vertical profile | none |
| Example 1-5 | Film 5 | vertical profile | none |
| Example 1-6 | Film 6 | vertical profile | none |
| Example 1-7 | Film 7 | vertical profile | none |
| Example 1-8 | Film 8 | vertical profile | none |
| Example 1-9 | Film 9 | vertical profile | none |
| Example 1-10 | Film 10 | vertical profile | none |
| Example 1-11 | Film 11 | vertical profile | none |
| Example 1-12 | Film 12 | vertical profile | none |
| Example 1-13 | Film 13 | vertical profile | none |
| Example 1-14 | Film 14 | vertical profile | none |
| Example 1-15 | Film 15 | vertical profile | none |
| Example 1-16 | Film 16 | vertical profile | none |
| Example 1-17 | Film 17 | vertical profile | none |
| Example 1-18 | Film 18 | vertical profile | none |
| Example 1-19 | Film 19 | vertical profile | none |
| Example 1-20 | Film 20 | vertical profile | none |
| Example 1-21 | Film 21 | vertical profile | none |
| Example 1-22 | Film 22 | vertical profile | none |

TABLE 10

| Example | Silicon-containing resist underlayer film | Pattern sectional profile after development | Pattern collapse at 42 nm |
|---|---|---|---|
| Example 1-23 | Film 23 | vertical profile | none |
| Example 1-24 | Film 24 | vertical profile | none |
| Example 1-25 | Film 25 | vertical profile | none |
| Example 1-26 | Film 26 | vertical profile | none |
| Example 1-27 | Film 27 | vertical profile | none |
| Example 1-28 | Film 28 | vertical profile | none |
| Comparative Example 1-1 | Film 29 | impossible to observe cross section due to pattern collapse | collapse at 48 nm |

As shown in Tables 9 and 10, it was observed that in Examples 1-1 to 1-28, in which the inventive compositions for forming a silicon-containing resist underlayer film were used, pattern cross sections with vertical profiles were successfully obtained, and pattern collapse did not occur when the photoresist film materials for positive development were used. On the other hand, in Comparative Example 1-1, in which an inventive composition for forming a silicon-containing resist underlayer film was not used, pattern collapse occurred at 48 nm.

Pattern Etching Test: Examples 2-1 to 2-16

The pattern was transferred to the silicon-containing resist underlayer film by dry etching under the following conditions (1) while using the resist pattern formed in the above-described patterning test (Examples 1-1 to 1-3 and 1-16 to 1-28) by positive development as a mask. The pattern was then transferred to the organic underlayer film by dry etching under the following conditions (2). The sectional profile and pattern roughness of the obtained pattern were observed with the above-described electron microscopes. Table 11 shows the results.

(1) Etching Conditions with $CHF_3/CF_4$-Based Gas

Apparatus: a dry etching apparatus Telius SP manufactured by Tokyo Electron Limited Etching Conditions (1):

| | |
|---|---|
| Chamber pressure | 10 Pa |
| Upper/Lower RF power | 500 W/300 W |
| $CHF_3$ gas flow rate | 50 mL/min |
| $CF_4$ gas flow rate | 150 mL/min |
| Ar gas flow rate | 100 mL/min |
| Treatment time | 40 sec |

(2) Etching conditions with $O_2/N_2$-based gas

Apparatus: a dry etching apparatus Telius SP manufactured by Tokyo Electron Limited Etching Conditions (2):

| | |
|---|---|
| Chamber pressure | 2 Pa |
| Upper/Lower RF power | 1,000 W/300 W |
| $O_2$ gas flow rate | 300 mL/min |
| $N_2$ gas flow rate | 100 mL/min |
| Ar gas flow rate | 100 mL/min |
| Treatment time | 30 sec |

TABLE 11

| Example | Silicon-containing resist underlayer film | Pattern sectional profile of organic underlayer film after dry etching | Pattern roughness |
|---|---|---|---|
| Example 2-1 | Film 1 | vertical profile | 2.1 nm |
| Example 2-2 | Film 2 | vertical profile | 2.0 nm |
| Example 2-3 | Film 3 | vertical profile | 1.5 nm |
| Example 2-4 | Film 16 | vertical profile | 1.8 nm |
| Example 2-5 | Film 17 | vertical profile | 1.9 nm |
| Example 2-6 | Film 18 | vertical profile | 1.6 nm |
| Example 2-7 | Film 19 | vertical profile | 2.0 nm |
| Example 2-8 | Film 20 | vertical profile | 1.9 nm |
| Example 2-9 | Film 21 | vertical profile | 1.6 nm |
| Example 2-10 | Film 22 | vertical profile | 2.0 nm |
| Example 2-11 | Film 23 | vertical profile | 1.9 nm |
| Example 2-12 | Film 24 | vertical profile | 1.7 nm |
| Example 2-13 | Film 25 | vertical profile | 1.9 nm |
| Example 2-14 | Film 26 | vertical profile | 1.8 nm |
| Example 2-15 | Film 27 | vertical profile | 1.6 nm |
| Example 2-16 | Film 28 | vertical profile | 1.8 nm |

As shown in Table 11, it was observed that when the inventive compositions for forming a silicon-containing resist underlayer film were used, the pattern sectional profile and pattern roughness after processing the organic underlayer films were also favorable in addition to the sectional profile of the resist patterns after the positive development.

[Test with ArF Photo-Exposure and Negative Development Resist]

Patterning Test: Examples 3-1 to 3-28, Comparative Example 2-1

In the same manner as the patterning test using the positive resist, an organic underlayer film was formed on a silicon wafer. Subsequently, one of the composition solutions Sol. 1 to 29 for forming a silicon-containing resist underlayer film was spin-coated thereon and heated at 240° C. for 60 seconds. Thus, silicon-containing resist underlayer films each having a film thickness of 35 nm were formed as Films 1 to 29.

Subsequently, the ArF photoresist solution (NR-1) for negative development shown in Table 12 was applied to each silicon-containing resist underlayer film and baked at 110° C. for 60 seconds to form a photoresist film with a film thickness of 100 nm.

Next, this was exposed with an ArF liquid immersion exposure apparatus (NSR-S610C manufactured by Nikon Corporation, NA: 1.30, σ: 0.98/0.65, 35° polarized dipole illumination, 6% halftone phase shift mask) and baked (PEB) at 100° C. for 60 seconds. With a rotation of 30 rpm, a developer of butyl acetate was discharged from a developer nozzle for 3 seconds. Then the rotation was stopped to perform puddle-development for 27 seconds, spin-drying was performed after rinsing with diisoamyl ether, and baking was performed at 100° C. for 20 seconds to evaporate the rinse solvent. By this patterning, a negative 1:1 line-and-space pattern of 42 nm was obtained. Pattern collapse after the development was observed with an electron microscope (CG4000) manufactured by Hitachi High-Technologies Corporation, and the sectional profile after the development was observed with an electron microscope (S-9380) manufactured by Hitachi, Ltd. Tables 13 and 14 show the results.

TABLE 12

| No. | ArF resist polymer (parts by mass) | Acid generator (parts by mass) | Base (parts by mass) | Water-repellent polymer (parts by mass) | Solvent (parts by mass) |
|---|---|---|---|---|---|
| NR-1 | P2 (100) | PAG3 (10.0) | Q2 (2.0) | FP1 (4.0) | PGMEA (2,200) GBL (300) |

ArF resist polymer: P2

Molecular weight (Mw)=8,900

Dispersity (Mw/Mn)=1.93

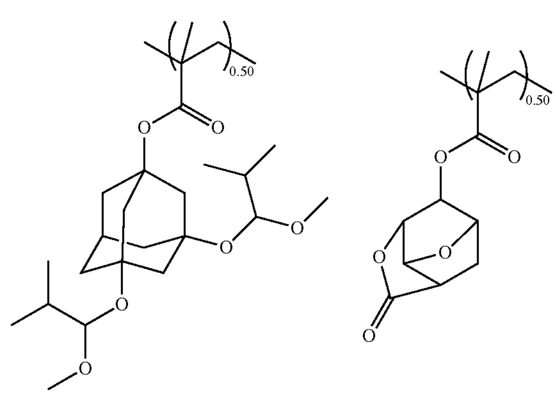

Acid generator: PAG3

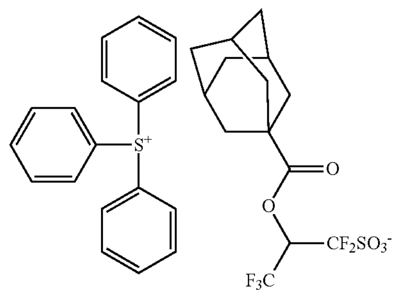

Base: $Q_2$

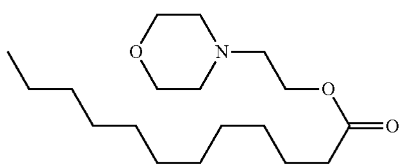 [SMILES: CCCCCCCCCCCC(=O)OCCN1CCOCC1]

TABLE 13

| Example | Silicon-containing resist underlayer film | Pattern sectional profile after development | Pattern collapse at 42 nm |
|---|---|---|---|
| Example 3-1 | Film 1 | vertical profile | none |
| Example 3-2 | Film 2 | vertical profile | none |
| Example 3-3 | Film 3 | vertical profile | none |
| Example 3-4 | Film 4 | vertical profile | none |
| Example 3-5 | Film 5 | vertical profile | none |
| Example 3-6 | Film 6 | vertical profile | none |
| Example 3-7 | Film 7 | vertical profile | none |
| Example 3-8 | Film 8 | vertical profile | none |
| Example 3-9 | Film 9 | vertical profile | none |
| Example 3-10 | Film 10 | vertical profile | none |
| Example 3-11 | Film 11 | vertical profile | none |
| Example 3-12 | Film 12 | vertical profile | none |
| Example 3-13 | Film 13 | vertical profile | none |
| Example 3-14 | Film 14 | vertical profile | none |
| Example 3-15 | Film 15 | vertical profile | none |
| Example 3-16 | Film 16 | vertical profile | none |
| Example 3-17 | Film 17 | vertical profile | none |
| Example 3-18 | Film 18 | vertical profile | none |
| Example 3-19 | Film 19 | vertical profile | none |
| Example 3-20 | Film 20 | vertical profile | none |
| Example 3-21 | Film 21 | vertical profile | none |
| Example 3-22 | Film 22 | vertical profile | none |

TABLE 14

| Example | Silicon-containing resist underlayer film | Pattern sectional profile after development | Pattern collapse at 42 nm |
|---|---|---|---|
| Example 3-23 | Film 23 | vertical profile | none |
| Example 3-24 | Film 24 | vertical profile | none |
| Example 3-25 | Film 25 | vertical profile | none |
| Example 3-26 | Film 26 | vertical profile | none |
| Example 3-27 | Film 27 | vertical profile | none |
| Example 3-28 | Film 28 | vertical profile | none |
| Comparative Example 2-1 | Film 29 | impossible to observe cross section due to pattern collapse | collapse at 45 nm |

As shown in Tables 13 and 14, it was observed that in Examples 3-1 to 3-28, in which the inventive compositions for forming a silicon-containing resist underlayer film were used, pattern cross sections with vertical profiles were successfully obtained, and pattern collapse did not occur when the photoresist film materials for negative development were used as well. On the other hand, in Comparative Example 2-1, in which an inventive composition for forming a silicon-containing resist underlayer film was not used, pattern collapse occurred at 45 nm.

Pattern Etching Test: Examples 4-1 to 4-16

The pattern was transferred to the silicon-containing resist underlayer film by dry etching under the conditions (1) in the same manner as the etching test for the positive development resist pattern while using the resist pattern formed in the above-described patterning test (Examples 3-1 to 3-3 and 3-16 to 3-28) by negative development as a mask. The pattern was then transferred to the organic underlayer film by dry etching under the conditions (2). The sectional profile and pattern roughness of the obtained pattern were observed with the above-described electron microscopes. Table 15 shows the results.

TABLE 15

| Example | Silicon-containing resist underlayer film | Pattern sectional profile of organic underlayer film after dry etching | Pattern roughness |
|---|---|---|---|
| Example 4-1 | Film 1 | vertical profile | 2.0 nm |
| Example 4-2 | Film 2 | vertical profile | 1.9 nm |
| Example 4-3 | Film 3 | vertical profile | 1.6 nm |
| Example 4-4 | Film 16 | vertical profile | 1.8 nm |
| Example 4-5 | Film 17 | vertical profile | 2.0 nm |
| Example 4-6 | Film 18 | vertical profile | 1.9 nm |
| Example 4-7 | Film 19 | vertical profile | 2.1 nm |
| Example 4-8 | Film 20 | vertical profile | 1.6 nm |
| Example 4-9 | Film 21 | vertical profile | 1.7 nm |
| Example 4-10 | Film 22 | vertical profile | 2.1 nm |
| Example 4-11 | Film 23 | vertical profile | 1.8 nm |
| Example 4-12 | Film 24 | vertical profile | 1.9 nm |
| Example 4-13 | Film 25 | vertical profile | 2.0 nm |
| Example 4-14 | Film 26 | vertical profile | 1.8 nm |
| Example 4-15 | Film 27 | vertical profile | 1.9 nm |
| Example 4-16 | Film 28 | vertical profile | 1.7 nm |

As shown in Table 15, it was observed that when the inventive compositions for forming a silicon-containing resist underlayer film were used, the pattern sectional profile and pattern roughness after processing the organic underlayer film were also favorable in addition to the sectional profile of the resist patterns after the negative development.

[Test with EUV Photo-Exposure and Positive Development Resist]

Examples 5-1 to 5-26, Comparative Example 3-1

A silicon wafer was coated with one of the composition solutions Sol. 30 to 56 for forming a silicon-containing resist underlayer film and heated at 240° C. for 60 seconds. Thus, silicon-containing films each having a film thickness of 25 nm were prepared as Films 30 to 56.

Subsequently, Films 30 to 56 were each spin-coated with a photoresist film material in which the following components were dissolved at ratios in Table 16 and prebaked at 105° C. for 60 seconds using a hot plate to prepare a resist film having a film thickness of 35 nm. The resultant was exposed using an EUV scanner NXE3300 manufactured by ASML (NA: 0.33, σ: 0.9/0.6, quadrupole illumination for an L/S pattern with a pitch of 36 nm (on-wafer size)), followed by PEB at 100° C. for 60 seconds on the hot plate and development with a 2.38 mass % TMAH aqueous solution for 30 seconds to obtain a line with a dimension of 18 nm. After that, pattern collapse after the development was observed with a CD-SEM (CG5000) manufactured by Hitachi High-Technologies Corporation, and the sectional profile after the development was observed with an electron microscope (S-4800) manufactured by Hitachi High-Technologies Corporation. Tables 17 and 18 show the results.

TABLE 16

| Components | Polymer | Quencher | Sensitizer | Surfactant | Organic solvents |
|---|---|---|---|---|---|
| Composition (parts by mass) | (100) | (4.0) | (2.1) | (0.25) | PGMEA (400)<br>CyHO (2000)<br>PGME (100) |

Surfactant: FC-4430 manufactured by 3M

PGMEA: propylene glycol monomethyl ether acetate

CyHO: cyclohexanone

PGME: propylene glycol monomethyl ether

Polymer

Polymer
Mw = 8,900
Mw/Mn = 1.89

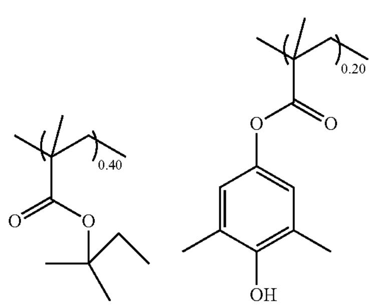

-continued

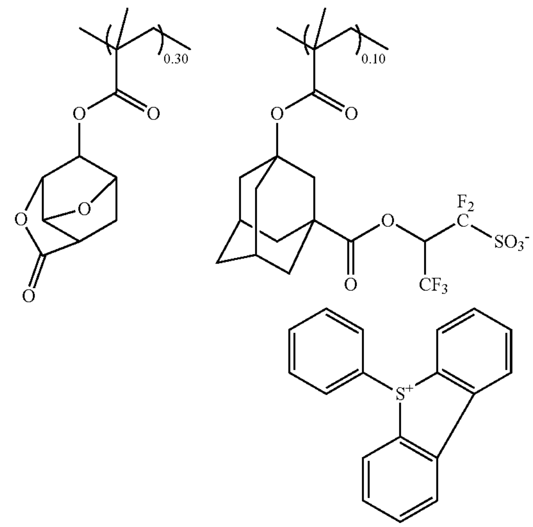

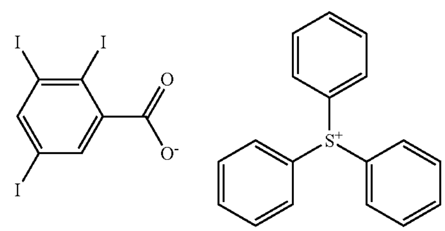

Quencher

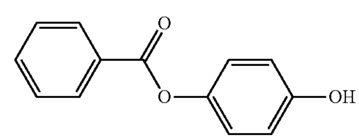

Sensitizer

TABLE 17

| Example | Silicon-containing resist underlayer film | Pattern sectional profile after development | Pattern collapse at 18 nm |
|---|---|---|---|
| Example 5-1 | Film 30 | vertical profile | none |
| Example 5-2 | Film 31 | vertical profile | none |
| Example 5-3 | Film 32 | vertical profile | none |
| Example 5-4 | Film 33 | vertical profile | none |
| Example 5-5 | Film 34 | vertical profile | none |
| Example 5-6 | Film 35 | vertical profile | none |
| Example 5-7 | Film 36 | vertical profile | none |
| Example 5-8 | Film 37 | vertical profile | none |
| Example 5-9 | Film 38 | vertical profile | none |
| Example 5-10 | Film 39 | vertical profile | none |
| Example 5-11 | Film 40 | vertical profile | none |
| Example 5-12 | Film 41 | vertical profile | none |
| Example 5-13 | Film 42 | vertical profile | none |
| Example 5-14 | Film 43 | vertical profile | none |
| Example 5-15 | Film 44 | vertical profile | none |
| Example 5-16 | Film 45 | vertical profile | none |
| Example 5-17 | Film 46 | vertical profile | none |
| Example 5-18 | Film 47 | vertical profile | none |
| Example 5-19 | Film 48 | vertical profile | none |
| Example 5-20 | Film 49 | vertical profile | none |
| Example 5-21 | Film 50 | vertical profile | none |
| Example 5-22 | Film 51 | vertical profile | none |

TABLE 18

| Example | Silicon-containing resist underlayer film | Pattern sectional profile after development | Pattern collapse at 18 nm |
|---|---|---|---|
| Example 5-23 | Film 52 | vertical profile | none |
| Example 5-24 | Film 53 | vertical profile | none |
| Example 5-25 | Film 54 | vertical profile | none |
| Example 5-26 | Film 55 | vertical profile | none |
| Comparative Example 3-1 | Film 56 | impossible to observe cross section due to pattern collapse | collapse at 46 nm |

As shown in Tables 17 and 18, it was observed that in Examples 5-1 to 5-26, in which the inventive compositions for forming a silicon-containing resist underlayer film were used, pattern cross sections with vertical profiles were successfully obtained, and pattern collapse did not occur when EUV photo-exposure was performed using the photoresist film materials for positive development. On the other hand, in Comparative Example 3-1, in which an inventive composition for forming a silicon-containing resist underlayer film was not used, pattern collapse occurred at 46 nm.

[Test with EUV Photo-Exposure and Negative Development Resist]

Examples 6-1 to 6-26, Comparative Examples 4-1 to 4-2

A silicon wafer was coated with one of the composition solutions Sol. 30 to 57 for forming a silicon-containing resist underlayer film and heated at 240° C. for 60 seconds. Thus, silicon-containing films each having a film thickness of 25 nm were prepared as Films 30 to 57.

Subsequently, Films 30 to 57 were each spin-coated with a photoresist film material in which the following components were dissolved at ratios in Table 19 and prebaked at 105° C. for 60 seconds using a hot plate to prepare a photoresist film having a film thickness of 60 nm. PRP-E1 of Table 19 is shown in Table 20, and PAG-E1 and Q-E1 are shown in Table 21. The resultant was exposed using an EUV scanner NXE3300 manufactured by ASML (NA: 0.33, σ: 0.9/0.6, quadrupole illumination for an L/S pattern with a pitch of 36 nm (on-wafer size)), followed by PEB at 100° C. for 60 seconds on the hot plate and development with butyl acetate for 30 seconds to obtain a line with a dimension of 18 nm. After that, pattern collapse after the development was observed with a CD-SEM (CG5000) manufactured by Hitachi High-Technologies Corporation, and the sectional profile after the development was observed with an electron microscope (S-4800) manufactured by Hitachi High-Technologies Corporation. Tables 22 and 23 show the results.

TABLE 19

| | Base resin (parts by mass) | Photo-acid generator (parts by mass) | Basic compound (parts by mass) | Surfactant (parts by mass) | Solvent (parts by mass) |
|---|---|---|---|---|---|
| PR-E1 | PRP-E1 (85) | PAG-E1 (15.0) | Q-E1 (0.3) | FC-4430 (0.1) | PGMEA (2800) CyHO (1400) |

Surfactant: FC-4430 manufactured by 3M

TABLE 20

| | Constitutional unit | | | | | |
|---|---|---|---|---|---|---|
| | Unit-1 | Unit-2 | Unit-3 | Unit-4 | Mw | Mw/Mn |
| PRP-E1 | 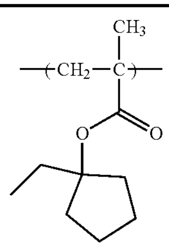 (50) | 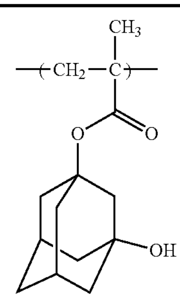 (10) | 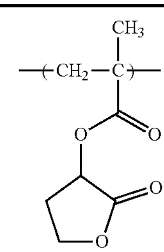 (20) | 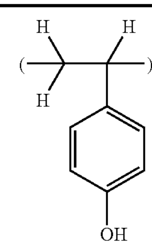 (20) | 9200 | 1.9 |

TABLE 21

| PAG-E1 | Q-E1 |
|---|---|
| 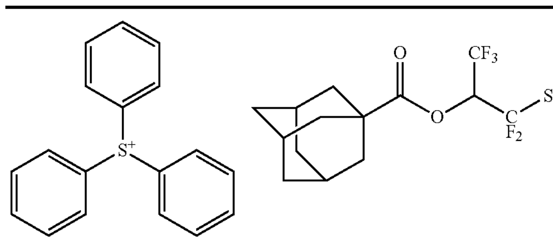 | 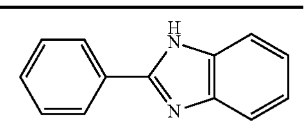 |

TABLE 22

| Example | Silicon-containing resist underlayer film | Pattern sectional profile after development | Pattern collapse at 18 nm |
|---|---|---|---|
| Example 6-1 | Film 30 | vertical profile | none |
| Example 6-2 | Film 31 | vertical profile | none |
| Example 6-3 | Film 32 | vertical profile | none |
| Example 6-4 | Film 33 | vertical profile | none |
| Example 6-5 | Film 34 | vertical profile | none |
| Example 6-6 | Film 35 | vertical profile | none |
| Example 6-7 | Film 36 | vertical profile | none |
| Example 6-8 | Film 37 | vertical profile | none |
| Example 6-9 | Film 38 | vertical profile | none |
| Example 6-10 | Film 39 | vertical profile | none |
| Example 6-11 | Film 40 | vertical profile | none |
| Example 6-12 | Film 41 | vertical profile | none |
| Example 6-13 | Film 42 | vertical profile | none |
| Example 6-14 | Film 43 | vertical profile | none |
| Example 6-15 | Film 44 | vertical profile | none |
| Example 6-16 | Film 45 | vertical profile | none |
| Example 6-17 | Film 46 | vertical profile | none |
| Example 6-18 | Film 47 | vertical profile | none |
| Example 6-19 | Film 48 | vertical profile | none |
| Example 6-20 | Film 49 | vertical profile | none |
| Example 6-21 | Film 50 | vertical profile | none |
| Example 6-22 | Film 51 | vertical profile | none |

TABLE 23

| Example | Silicon-containing resist underlayer film | Pattern sectional profile after development | Pattern collapse at 18 nm |
|---|---|---|---|
| Example 6-23 | Film 52 | vertical profile | none |
| Example 6-24 | Film 53 | vertical profile | none |
| Example 6-25 | Film 54 | vertical profile | none |
| Example 6-26 | Film 55 | vertical profile | none |
| Comparative Example 4-1 | Film 56 | impossible to observe cross section due to pattern collapse | collapse at 45 nm |
| Comparative Example 4-2 | Film 57 | impossible to observe cross section due to pattern collapse | collapse at 38 nm |

As shown in Tables 22 and 23, it was observed that in Examples 6-1 to 6-26, in which the inventive compositions for forming a silicon-containing resist underlayer film were used, pattern cross sections with vertical profiles were successfully obtained, and pattern collapse did not occur when EUV photo-exposure was performed using the photoresist film materials for negative development. On the other hand, in Comparative Examples 4-1 and 4-2, in which an inventive composition for forming a silicon-containing resist underlayer film was not used, pattern collapse occurred.

The above results have revealed that by using the inventive composition for forming a silicon-containing resist underlayer film, it possible to form a silicon-containing resist underlayer film having favorable adhesiveness to resist patterns in both negative development and positive development, and also having favorable adhesiveness to finer patterns as in EUV photo-exposure.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A composition for forming a silicon-containing resist underlayer film, comprising one or both of a hydrolysis product and a hydrolysis condensate of one or more silicon compounds (A-1) shown by the following general formula (1):

(1)

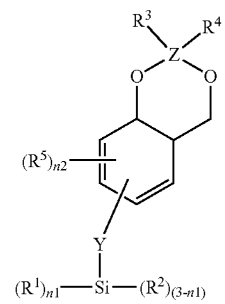

wherein in the general formula (1), $R^1$ represents a hydrogen atom or a monovalent organic group having 1 to 30 carbon atoms; $R^2$ represents an alkoxy group, an acyloxy group, or a halogen atom; n1 represents 0, 1, or 2; $R^3$ and $R^4$ each independently represent a hydrogen atom, or represent an organic group having 1 to 6 carbon atoms optionally containing a nitrogen atom, an oxygen atom, a sulfur atom, a halogen atom, or a silicon atom, $R^3$ and $R^4$ being optionally bonded with each other to form a ring; $R^5$ represents a monovalent organic group having 1 to 30 carbon atoms; n2 represents 0, 1, 2, or 3; Y represents a single bond or a divalent organic group having 1 to 6 carbon atoms optionally containing a silicon atom; and Z represents a carbon atom or a silicon atom.

2. The composition for forming a silicon-containing resist underlayer film according to claim 1, wherein the composition for forming a silicon-containing resist underlayer film comprises one or both of a hydrolysis product and a hydrolysis condensate of a mixture of the silicon compound (A-1) and one or more silicon compounds (A-2) shown by the following general formula (2):

$$R^6_m Si(R^7)_{(4-m)} \qquad (2)$$

wherein in the general formula (2), $R^6$ represents a hydrogen atom or a monovalent organic group having 1 to 30 carbon atoms optionally containing a carbon-oxygen single bond, a carbon-oxygen double bond, a silicon-silicon bond, a carbon-nitrogen bond, a carbon-sulfur bond, a protective group that is decomposed with an acid, an iodine atom, a phosphorous atom, or a fluorine atom; $R^7$ represents an alkoxy group, an acyloxy group, or a halogen atom; and "m" represents 0, 1, 2, or 3.

3. The composition for forming a silicon-containing resist underlayer film according to claim 1, further comprising a crosslinking catalyst.

4. The composition for forming a silicon-containing resist underlayer film according to claim 2, further comprising a crosslinking catalyst.

5. The composition for forming a silicon-containing resist underlayer film according to claim 3, wherein the crosslinking catalyst is a sulfonium salt, an iodonium salt, a phosphonium salt, an ammonium salt, an alkaline metal salt, or a polysiloxane having a structure partially containing any of a sulfonium salt, an iodonium salt, a phosphonium salt, and an ammonium salt.

6. The composition for forming a silicon-containing resist underlayer film according to claim 4, wherein the crosslinking catalyst is a sulfonium salt, an iodonium salt, a phosphonium salt, an ammonium salt, an alkaline metal salt, or a polysiloxane having a structure partially containing any of a sulfonium salt, an iodonium salt, a phosphonium salt, and an ammonium salt.

7. The composition for forming a silicon-containing resist underlayer film according to claim 1, further comprising one or more compounds shown by the following general formula (P-0):

(P-0)

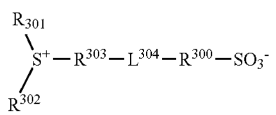

wherein $R^{300}$ represents a divalent organic group substituted with one or more fluorine atoms; $R^{301}$ and $R^{302}$ each independently represent a linear, branched, or cyclic monovalent hydrocarbon group having 1 to 20 carbon atoms optionally substituted with a hetero atom or optionally containing a hetero atom; $R^{303}$ represents a linear, branched, or cyclic divalent hydrocarbon group having 1 to 20 carbon atoms optionally substituted with a hetero atom or optionally containing a hetero atom; $R^{301}$ and $R^{302}$, or $R^{301}$ and $R^{303}$, are optionally bonded to each other to form a ring with a sulfur atom in the formula; and $L^{304}$ represents a single bond or a linear, branched, or cyclic divalent hydrocarbon group having 1 to 20 carbon atoms optionally substituted with a hetero atom or optionally containing a hetero atom.

8. The composition for forming a silicon-containing resist underlayer film according to claim 7, wherein the compound shown by the general formula (P-0) is a compound shown by the following general formula (P-1):

(P-1)

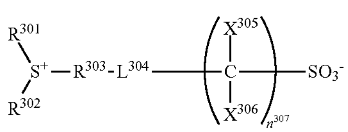

wherein $X^{303}$ and $X^{306}$ each independently represent a hydrogen atom, a fluorine atom, or a trifluoromethyl group, but not all of $X^{305}$'s and $X^{306}$'s are hydrogen atoms simultaneously; $n^{307}$ represents an integer of 1 to 4; and $R^{301}$, $R^{302}$, $R^{303}$, and $L^{304}$ are as defined above.

9. A patterning process comprising:

forming an organic underlayer film on a body to be processed by using a coating-type organic underlayer film material;

forming a silicon-containing resist underlayer film on the organic underlayer film by using the composition for forming a silicon-containing resist underlayer film according to claim 1;

forming a photoresist film on the silicon-containing resist underlayer film by using a photoresist composition;

subjecting the photoresist film to exposure and development to form a resist pattern;

transferring the pattern to the silicon-containing resist underlayer film by dry etching while using the photoresist film having the formed pattern as a mask;

transferring the pattern to the organic underlayer film by dry etching while using the silicon-containing resist underlayer film having the transferred pattern as a mask; and further transferring the pattern to the body to be processed by dry etching while using the organic underlayer film having the transferred pattern as a mask.

10. A patterning process comprising:

forming a hard mask mainly containing carbon on a body to be processed by a CVD method;

forming a silicon-containing resist underlayer film on the CVD hard mask by using the composition for forming a silicon-containing resist underlayer film according to claim 1;

forming a photoresist film on the silicon-containing resist underlayer film by using a photoresist composition;

subjecting the photoresist film to exposure and development to form a resist pattern;

transferring the pattern to the silicon-containing resist underlayer film by dry etching while using the photoresist film having the formed pattern as a mask;

transferring the pattern to the CVD hard mask by dry etching while using the silicon-containing resist underlayer film having the transferred pattern as a mask; and further transferring the pattern to the body to be processed by dry etching while using the CVD hard mask having the transferred pattern as a mask.

11. The patterning process according to claim 9, wherein the resist pattern is formed by a lithography using light with a wavelength of 10 nm or more to 300 nm or less, a direct drawing by electron beam, a nanoimprinting, or a combination thereof.

12. The patterning process according to claim 10, wherein the resist pattern is formed by a lithography using light with a wavelength of 10 nm or more to 300 nm or less, a direct drawing by electron beam, a nanoimprinting, or a combination thereof.

13. The patterning process according to claim 9, wherein when the resist pattern is formed, the resist pattern is developed by alkaline development or organic solvent development.

14. The patterning process according to claim 10, wherein when the resist pattern is formed, the resist pattern is developed by alkaline development or organic solvent development.

15. The patterning process according to claim 9, wherein the body to be processed is a semiconductor device substrate, or the semiconductor device substrate coated with a metal film, an alloy film, a metal carbide film, a metal oxide film, a metal nitride film, a metal oxycarbide film, or a metal oxynitride film.

16. The patterning process according to claim 10, wherein the body to be processed is a semiconductor device substrate, or the semiconductor device substrate coated with a metal film, an alloy film, a metal carbide film, a metal oxide film, a metal nitride film, a metal oxycarbide film, or a metal oxynitride film.

17. The patterning process according to claim 9, wherein the metal of the body to be processed is silicon, gallium, titanium, tungsten, hafnium, zirconium, chromium, germanium, copper, silver, gold, indium, arsenic, palladium, tantalum, iridium, aluminum, iron, molybdenum, cobalt, or an alloy thereof.

18. The patterning process according to claim 10, wherein the metal of the body to be processed is silicon, gallium, titanium, tungsten, hafnium, zirconium, chromium, germanium, copper, silver, gold, indium, arsenic, palladium, tantalum, iridium, aluminum, iron, molybdenum, cobalt, or an alloy thereof.

19. A silicon compound shown by the following general formula (1):

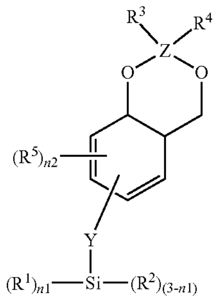
(1)

wherein in the general formula (1), $R^1$ represents a hydrogen atom or a monovalent organic group having 1 to 30 carbon atoms; $R^2$ represents an alkoxy group, an acyloxy group, or a halogen atom; n1 represents 0, 1, or 2; $R^3$ and $R^4$ each independently represent a hydrogen atom, or represent an organic group having 1 to 6 carbon atoms optionally containing a nitrogen atom, an oxygen atom, a sulfur atom, a halogen atom, or a silicon atom, $R^3$ and $R^4$ being optionally bonded with each other to form a ring; $R^5$ represents a monovalent organic group having 1 to 30 carbon atoms; n2 represents 0, 1, 2, or 3; Y represents a single bond or a divalent organic group having 1 to 6 carbon atoms optionally containing a silicon atom; and Z represents a carbon atom or a silicon atom.

* * * * *